US008614048B2

(12) United States Patent
Ichikawa et al.

(10) Patent No.: US 8,614,048 B2
(45) Date of Patent: Dec. 24, 2013

(54) RESIN, RESIST COMPOSITION AND METHOD FOR PRODUCING RESIST PATTERN

(75) Inventors: Koji Ichikawa, Osaka (JP); Masahiko Shimada, Osaka (JP); Takashi Nishimura, Osaka (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 183 days.

(21) Appl. No.: 13/237,250

(22) Filed: Sep. 20, 2011

(65) Prior Publication Data

US 2012/0070778 A1 Mar. 22, 2012

(30) Foreign Application Priority Data

Sep. 21, 2010 (JP) ................................ 2010-210490

(51) Int. Cl.
*G03F 7/004* (2006.01)
*G03F 7/40* (2006.01)
*C08F 26/06* (2006.01)
*C08F 126/06* (2006.01)
*C08F 226/06* (2006.01)

(52) U.S. Cl.
USPC ........ 430/270.1; 430/322; 430/330; 430/331; 526/258

(58) Field of Classification Search
USPC ................ 430/270.1, 322, 330, 331; 526/258
See application file for complete search history.

(56) References Cited

U.S. PATENT DOCUMENTS 3,779,778 A 12/1973 Smith et al.
3,849,137 A 11/1974 Barzynski et al.
4,576,902 A 3/1986 Saenger et al.
4,760,152 A * 7/1988 Tracy et al. .................. 548/551
4,822,716 A 4/1989 Onishi et al.
4,857,437 A 8/1989 Banks et al.
4,923,694 A * 5/1990 Shih et al. .................. 424/70.15
5,017,453 A 5/1991 Onishi et al.
5,073,476 A 12/1991 Meier et al.
5,166,291 A * 11/1992 Atkins et al. .................. 523/508
5,198,520 A 3/1993 Onishi et al.
5,260,410 A 11/1993 Schwalm
5,280,092 A * 1/1994 Chuang ........................ 526/201
5,453,341 A 9/1995 Schwalm
7,488,567 B2 * 2/2009 Harada et al. ............. 430/270.1
7,750,100 B2 * 7/2010 Hoefer et al. ................ 526/264
7,754,714 B2 7/2010 Li et al.
7,858,633 B2 12/2010 Li et al.
7,868,013 B2 1/2011 Li et al.
7,923,200 B2 * 4/2011 Thiyagarajan et al. ....... 430/313
7,951,912 B2 * 5/2011 Stahl et al. .................... 530/333
7,985,528 B2 * 7/2011 Nishi et al. ................. 430/270.1
8,263,307 B2 * 9/2012 Irie et al. .................... 430/270.1
8,329,384 B2 * 12/2012 Watanabe et al. ............ 430/312
8,343,709 B2 * 1/2013 Fujimaki et al. ......... 430/270.15
2002/0058201 A1 5/2002 Miyaji et al.
2005/0101740 A1 * 5/2005 Mougin ........................ 525/242
2005/0192301 A1 9/2005 Li
2005/0238594 A1 * 10/2005 Mougin .......................... 424/59
2006/0035891 A1 2/2006 Li et al.
2006/0167249 A1 7/2006 Argade et al.
2006/0199100 A1 9/2006 Kanda
2007/0231747 A1 * 10/2007 Onimaru et al. .............. 430/311
2007/0290174 A1 * 12/2007 Arnold et al. ............ 252/301.35
2007/0299060 A1 12/2007 Li et al.
2008/0009494 A1 1/2008 Li et al.
2009/0202945 A1 8/2009 Nakagawa et al.
2010/0113725 A1 * 5/2010 Bergmann et al. ............ 526/212
2010/0166985 A1 * 7/2010 Brockmeyer et al. ........ 428/32.1
2010/0323296 A1 * 12/2010 Ichikawa et al. ........... 430/286.1
2011/0053082 A1 * 3/2011 Ichikawa et al. ........... 430/270.1
2011/0152518 A1 6/2011 Li et al.
2012/0148954 A1 * 6/2012 Fukumoto et al. ......... 430/283.1
2012/0219919 A1 * 8/2012 Thiyagarajan et al. ....... 430/331

FOREIGN PATENT DOCUMENTS

DE 3711757 A * 10/1988
DE 39 14 407 A1 10/1990
EP 0 126 712 A1 11/1984
EP 1510533 A1 * 3/2005
JP 55-164824 A 12/1980
JP 61167662 A * 7/1986
JP 62-69263 A 3/1987
JP 62-153853 A 7/1987
JP 63-146029 A 6/1988
JP 63-146038 A 6/1988
JP 63-26653 A 7/1988
JP 63-163452 A 7/1988
JP 02059701 A * 2/1990
JP 11-52575 A 2/1999
JP 2002-226436 A 8/2002
JP 2006-276851 A 10/2006
JP 2007-514775 A 6/2007
JP 2009079091 A * 4/2009
WO WO 2005/063722 A1 7/2005
WO WO 2011/024953 A1 3/2011

* cited by examiner

*Primary Examiner* — Amanda C. Walke
(74) *Attorney, Agent, or Firm* — Birch, Stewart, Kolasch & Birch, LLP

(57) ABSTRACT

A resin having a structural unit derived from a compound represented by the following formula (I), wherein $R^1$, $A^1$ and ring $X^1$ are as defined in the instant specification:

(I)

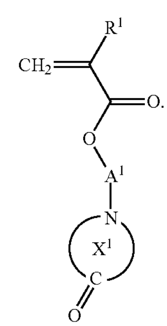

12 Claims, No Drawings

RESIN, RESIST COMPOSITION AND METHOD FOR PRODUCING RESIST PATTERN

CROSS-REFERENCE TO RELATED APPLICATIONS

This application claims priority to Japanese Application No. 2010-210490 filed on Sep. 21, 2010. The entire disclosures of Japanese Application No. 2010-210490 is incorporated hereinto by reference.

BACKGROUND OF THE INVENTION

1. Field of the Invention

The present invention relates to a resin, a resist composition and a method for producing a resist pattern.

2. Background Information

Various kinds of photolithographic technique in which short wavelength light such as ArF excimer laser (193 nm of wavelength) is a exposure light source have been actively studied in the past as the semiconductor microfabrication. A resist composition used for such photolithographic technique contains a resin which is insoluble or poorly soluble in aqueous alkali solution, but becomes soluble in aqueous alkali solution by the action of acid. Such resin is a mixed resin include a resin having structural units below

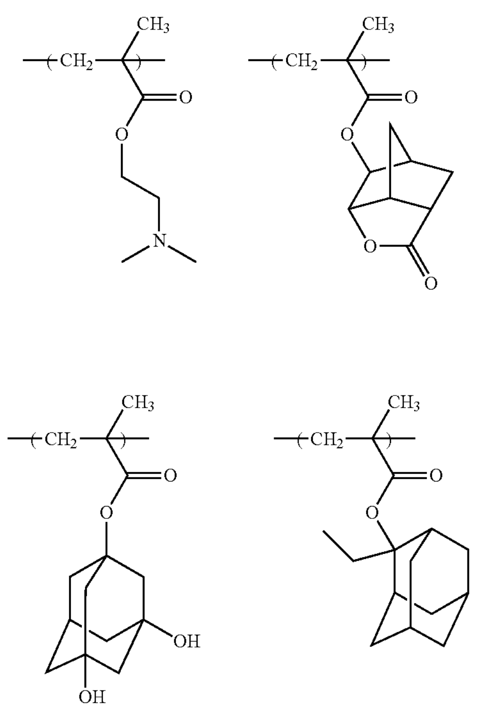

and another resin having structural units below (see, Example 1 of JP-2006-276851-A).

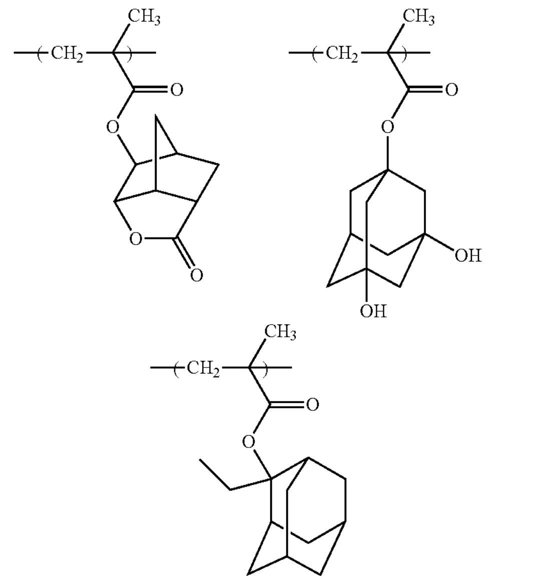

However, with the conventional resist composition containing the above resin, the mask error factor (MEF) of the obtained resist pattern may be not always satisfied with.

SUMMARY OF THE INVENTION

The present invention provides following inventions.

<1> A resin having a structural unit derived from a compound represented by the formula (I).

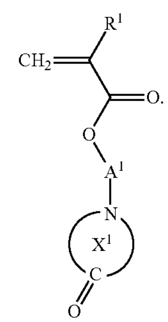

(I)

wherein $R^1$ represents a $C_1$ to $C_6$ alkyl group that optionally has a halogen atom, a hydrogen atom or a halogen atom;

$A^1$ represents an optionally substituted $C_1$ to $C_6$ alkanediyl group or a group represented by the formula (a-1);

$$-A^{10}-(X^{10}-A^{11})_s-X^{11}-A^{12}- \quad \text{(a-1)}$$

wherein s represents an integer of 0 to 2;

$A^{10}$ and $A^{11}$ in each occurrence independently represent an optionally substituted $C_1$ to $C_5$ aliphatic hydrocarbon group;

$A^{12}$ represents an optionally substituted $C_1$ to $C_5$ aliphatic hydrocarbon group or a single bond;

$X^{10}$ and $X^{11}$ in each occurrence independently represents an oxygen atom, a carbonyl group, a carbonyloxy group or an oxycarbonyl group;

provided that a total number of the carbon atom of $A^{10}$, $A^{11}$, $A^{12}$, $X^{10}$ and $X^{11}$ is 12 or less;

ring $X^1$ represents a $C_2$ to $C_{36}$ heterocyclic ring, a hydrogen atom contained in the heterocyclic ring may be substituted with a halogen atom, a hydroxy group, a $C_1$ to $C_{24}$ hydrocarbon group, a $C_1$ to $C_{12}$ alkoxy group, a $C_2$ to $C_4$ acyl group or a $C_2$ to $C_4$ acyloxy group.

<2> The resin according to <1>, wherein the compound represented by the formula (I) is a compound represented by the formula (III).

(III)

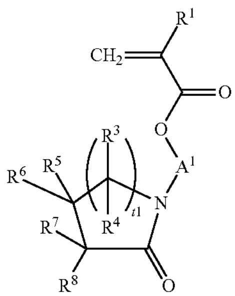

wherein $R^1$ and $A^1$ represent the same meaning as described above;

$R^3$, $R^4$, $R^5$, $R^6$, $R^7$ and $R^8$ in each occurrence independently represent a hydrogen atom or a $C_1$ to $C_{24}$ hydrocarbon group, and at least two of $R^3$ to $R^8$ may be bonded together to form a $C_3$ to $C_{30}$ ring, a hydrogen atom contained in the hydrocarbon group or the ring may be replaced by a halogen atom, a hydroxy group, a $C_1$ to $C_{12}$ alkyl group, a $C_1$ to $C_{12}$ alkoxyl group, a $C_2$ to $C_4$ acyl group or a $C_2$ to $C_4$ acyloxy group, and a —$CH_2$— contained in the hydrocarbon group or the ring may be replaced by —CO— or —O—;

t1 represents an integer of 0 to 3.

<3> The resin according to <1>, wherein the compound represented by the formula (I) is a compound represented by the formula (IV);

(IV)

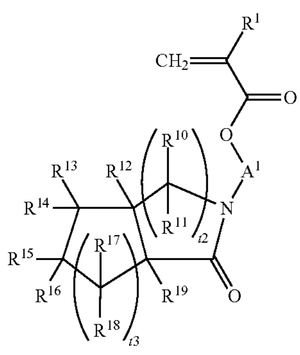

wherein $R^1$ and $A^1$ represent the same meaning as described above;

$R^{10}$, $R^{11}$, $R^{12}$, $R^{13}$, $R^{14}$, $R^{15}$, $R^{16}$, $R^{17}$, $R^{18}$ and $R^{19}$ in each occurrence independently represent a hydrogen atom or a $C_1$ to $C_{12}$ hydrocarbon group, and at least two of $R^{10}$ to $R^{19}$ may be bonded together to form a $C_3$ to $C_{24}$ ring, a hydrogen atom contained in the hydrocarbon group or the ring may be replaced by a halogen atom, a hydroxy group, a $C_1$ to $C_{12}$ alkyl group, a $C_1$ to $C_{12}$ alkoxyl group, a $C_2$ to $C_4$ acyl group or a $C_2$ to $C_4$ acyloxy group, and a —$CH_2$— contained in the hydrocarbon group or the ring may be replaced by —CO— or —O—;

t2 and t3 independently represent an integer of 0 to 3.

<4> The resin according to <1>, wherein the compound represented by the formula (I) is a compound represented by the formula (V)

(V)

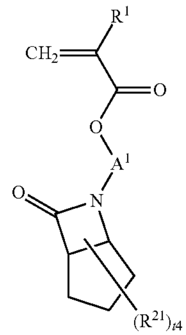

wherein $R^1$ and $A^1$ represent the same meaning as described above;

$R^{21}$ in each occurrence represents a halogen atom, a hydroxy group, a $C_1$ to $C_{12}$ alkyl group, a $C_1$ to $C_{12}$ alkoxyl group, a $C_2$ to $C_4$ acyl group or a $C_2$ to $C_4$ acyloxy group;

t4 represents an integer of 0 to 8.

<5> The resin according to <1>, which comprising an acid-labile group, and being insoluble or poorly soluble in aqueous alkali solution, but becoming soluble in aqueous alkali solution by the action of acid.

<6> A resist composition comprising a resin according to any one of <1> to <5>, and an acid generator.

<7> The resist composition according to <6>, wherein further comprising a solvent.

<8> The resist composition according to any one of <6> or <7>, which further comprises a basic compound.

<9> A method for producing a resist pattern comprising steps of;

(1) applying the resist composition according to any one of <6> to <8> onto a substrate;

(2) drying the applied composition to form a composition layer;

(3) exposing the composition layer using an exposure apparatus;

(4) heating the exposed composition layer; and (5) developing the heated composition layer using a developing apparatus.

According to a resin or a resist composition of the present invention, it is possible to produce a resist pattern with excellent MEF at producing the resist pattern.

DETAILED DESCRIPTION OF THE PREFERRED EMBODIMENTS

<Resin (A)>

The resin (A) has a structural unit derived from a compound represented by the formula (I) (hereinafter may be referred to as "compound (I)").

(I)

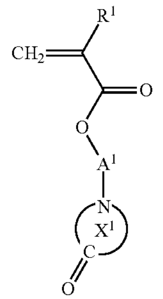

wherein $R^1$ represents a $C_1$ to $C_6$ alkyl group that optionally has a halogen atom, a hydrogen atom or a halogen atom; $A^1$ represents an optionally substituted $C_1$ to $C_6$ alkanediyl group or a group represented by the formula (a-1);

(a-1)

$$—A^{10}—(X^{10}—A^{11})_s—X^{11}—A^{12}—$$

wherein s represents an integer of 0 to 2;

$A^{10}$ and $A^{11}$ in each occurrence independently represent an optionally substituted $C_1$ to $C_5$ aliphatic hydrocarbon group;

$A^{12}$ represents an optionally substituted $C_1$ to $C_5$ aliphatic hydrocarbon group or a single bond;

$X^{10}$ and $X^{11}$ in each occurrence independently represents an oxygen atom, a carbonyl group, a carbonyloxy group or an oxycarbonyl group;

provided that a total number of the carbon atom of $A^{10}$, $A^{11}$, $A^{12}$, $X^{10}$ and $X^{11}$ is 12 or less;

ring $X^1$ represents a $C_2$ to $C_{36}$ heterocyclic ring, a hydrogen atom contained in the heterocyclic ring may be substituted with a halogen atom, a hydroxy group, a $C_1$ to $C_{24}$ hydrocarbon group, a $C_1$ to $C_{12}$ alkoxy group, a $C_2$ to $C_4$ acyl group or a $C_2$ to $C_4$ acyloxy group.

Examples of the halogen atom of $R^1$ include fluorine, chlorine, bromine and iodine atoms.

Examples of an alkyl group include methyl, ethyl, n-propyl, isopropyl, n-butyl, sec-butyl, tert-butyl, n-pentyl, n-hexyl and heptyl groups.

Examples of the alkyl group that has a halogen atom include trifluoromethyl, perfluoroethyl, perfluoropropyl, perfluoro-isopropyl, perfluorobutyl, perfluoro-sec-butyl, perfluoro-tert-butyl, perfluoropentyl and perfluorohexyl groups.

The alkanediyl group of the $A^1$ may be either a linear or a branched chain alkanediyl group. Examples of the alkanediyl group include a linear alkanediyl group such as methylene, ethylene, propane-1,3-diyl, propane-1,2-diyl, butane-1,4-diyl, pentane-1,5-diyl, pentane-1,4-diyl, hexane-1,6-diyl and hexane-1,5-diyl; a branched chain alkanediyl group such as 1-methyl-1,3-propylene, 2-methyl-1,3-propylene, 2-methyl-1,2-propylene, 1-methyl-1,4-butylene and 2-methyl-1,4-butylen groups.

Examples of the substituent of the alkanediyl group include a hydroxy group and a $C_1$ to $C_6$ alkoxy group.

The group (a-1) is a divalent group containing an atom or atomic group of an oxygen atom, a carbonyl group, a carbonyloxy group or an oxycarbonyl group such as $X^{10}$ and $X^{11}$.

Examples of the aliphatic hydrocarbon group of $A^{10}$, $A^{11}$ and $A^{12}$ in the group (a-1) include an alkyl group such as methyl, ethyl, n-propyl, isopropyl, n-butyl, sec-butyl and tert-butyl groups.

Examples of the group (a-1) containing an oxygen atom for $X^{11}$ include as below.

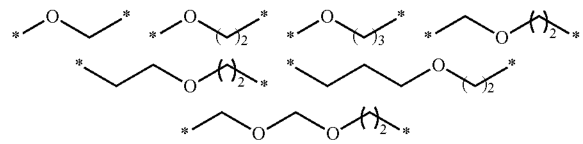

Examples of the group (a-1) containing a carbonyl group for $X^{11}$ include as below.

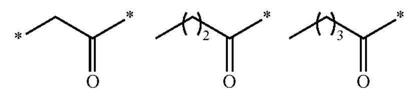

Examples of the group (a-1) containing a carbonyloxy group for $X^{11}$ include as below.

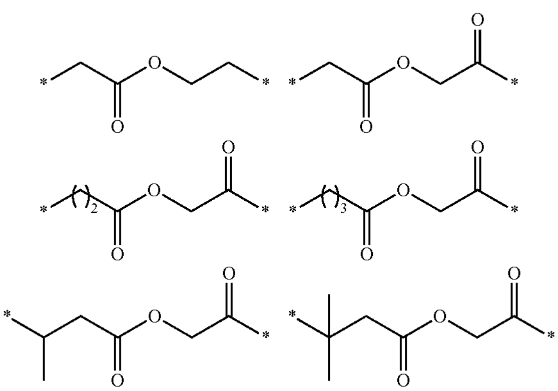

Examples of the group (a-1) containing an oxycarbonyl group for $X^{11}$ include as below.

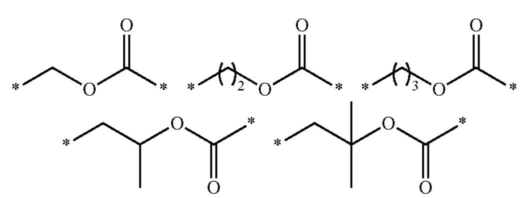

The heterocyclic ring of ring $X^1$ may have a hetero atom such as an oxygen atom and nitrogen atom other than a nitrogen atom bonding $A^1$ as an atom constituting the ring. Also, a $—CH_2—$ contained in the heterocyclic ring may be replaced by —O— or —CO—. The ring $X^1$ may have two or more —CO—, for example.

The ring $X^1$ may be any of an aromatic heterocyclic ring or a non-aromatic heterocyclic ring as long as it contains a carbon atom contained in at least one carbonyl group and at least one nitrogen atom as the ring constituting atom. The ring $X^1$ may be any of a monocyclic or a polycyclic group. Also, as described above, a $—CH_2—$ contained in the heterocyclic ring may be replaced by —O— or —CO—. Specific examples of the group represented by the formula below

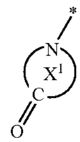
in the compound (I) include below. In the following groups, * represents a bond (the similar shall apply hereinafter for "bond"). In particular, the bond here represents a bonding site with $A^1$.
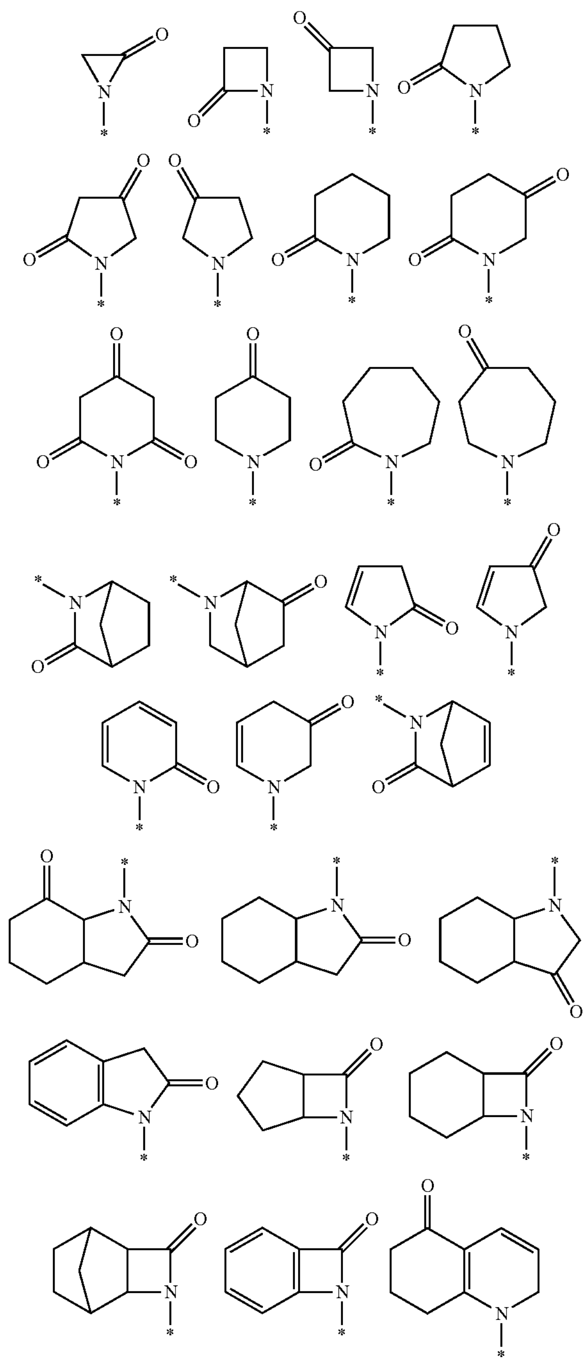
-continued
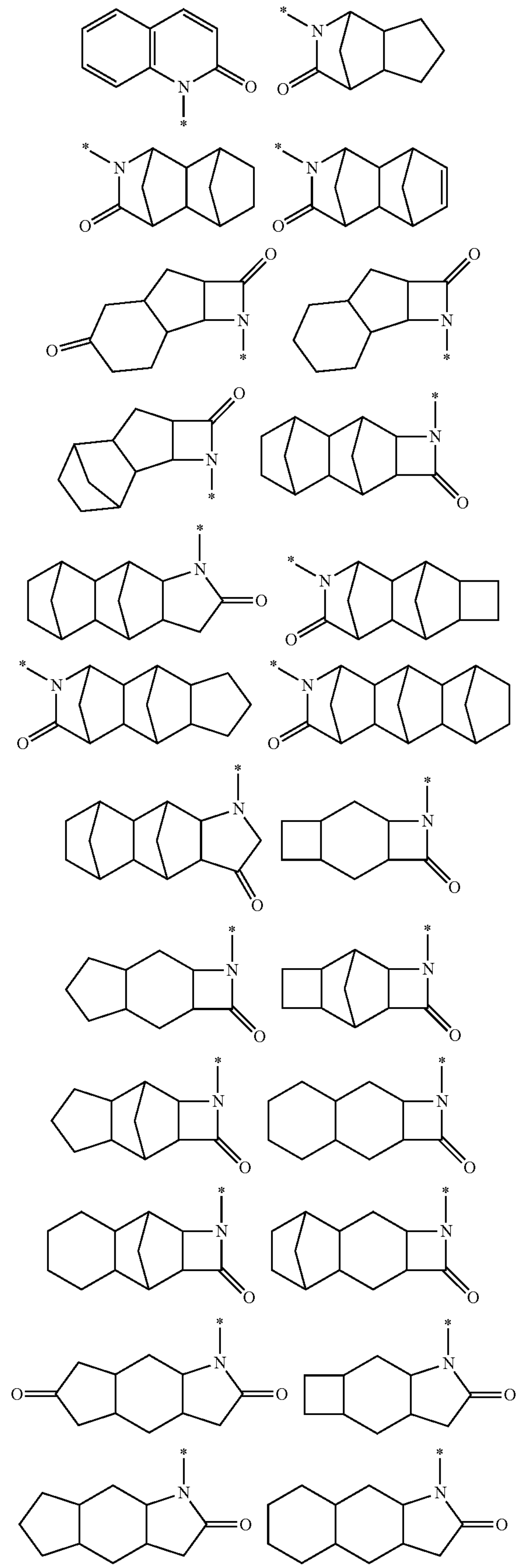

-continued

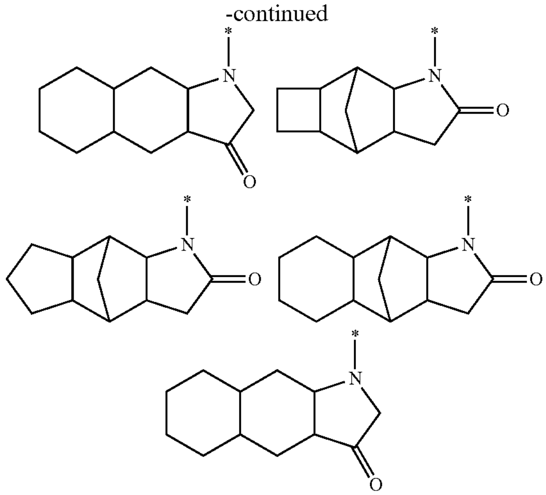

Also, a hydrogen bond contained in the heterocyclic ring may be substituted with a halogen atom, a hydroxy group, a $C_1$ to $C_{24}$ hydrocarbon group, a $C_1$ to $C_{12}$ alkoxy group, a $C_2$ to $C_4$ acyl group or a $C_2$ to $C_4$ acyloxy group.

The hydrocarbon group may be any of an aliphatic hydrocarbon group, an alicyclic group or an aromatic hydrocarbon group. Examples thereof include an aliphatic hydrocarbon group such as methyl, ethyl, n-propyl, iso-propyl, n-butyl, sec-butyl, tert-butyl, n-pentyl, n-hexyl, heptyl, 2-ethylhexyl, octyl, nonyl, decyl, undecyl and dodecyl groups; an alicyclic group such as cycloprophyl, cyclobutyl, cyclopentyl, cyclohexyl, cycloheptyl, cyclooctyl, cyclononyl, cyclodecyl, norbornyl, 1-adamantyl, 2-adamantyl and isobornyl groups; an aromatic group such as phenyl, naphthyl, anthryl, p-methylphenyl, p-tert-butylphenyl, p-adamantylphenyl, tolyl, xylyl, cumenyl, mesityl, biphenyl, phenanthryl, 2,6-diethylphenyl and 2-methyl-6-ethylphenyl groups. Examples of the hydrocarbon group include a combination thereof. Among these, a $C_1$ to $C_{12}$ alkyl group is preferable for the hydrocarbon group.

Examples of the alkoxyl group include methoxy, ethoxy, n-propoxy, iso-propoxy, n-butoxy, sec-butoxy, tert-butoxy, n-pentoxy, n-hexoxy, heptoxy, octoxy, 2-ethylhexoxy, nonyloxy, decyloxy, undecyloxy and dodecyloxy groups.

Examples of the acyl group include acetyl, propionyl and butyryl groups.

Examples of the acyloxy group include acetyloxy, propionyloxy, butyryloxy and isobutyryloxy groups.

In the formula (I), $R^1$ is preferably a hydrogen atom and a methyl group.

The group (a-1) of $A^1$ is preferably a divalent group having a carbonyl group and a divalent group having an oxygen atom, and more preferably a divalent group having a carbonyl group.

$X^1$ is preferably a 4 to 6-membered heterocyclic group, and may be a condensed ring of a 4 to 6-membered heterocyclic group and an alicyclic group. The —CO— is preferably positioned so as to be adjacent to the nitrogen atom. Here, "4-membered heterocyclic group" is a heterocyclic group having four atoms which constitutes a ring.

As the compound represented by the formula (I) having $X^1$ in which the —CO— is positioned so as to be adjacent to the nitrogen atom, a compound represented by the formula (III) (hereinafter may be referred to as "compound (III)") is preferable;

(III)

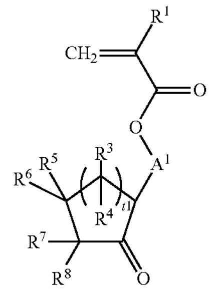

wherein $R^1$ and $A^1$ represent the same meaning as described above;

$R^3$, $R^4$, $R^5$, $R^6$, $R^7$ and $R^8$ in each occurrence independently represent a hydrogen atom or a $C_1$ to $C_{24}$ hydrocarbon group, and at least two of $R^3$ to $R^8$ may be bonded together to form a $C_3$ to $C_{30}$ ring, a hydrogen atom contained in the hydrocarbon group or the ring may be replaced by a halogen atom, a hydroxy group, a $C_1$ to $C_{12}$ alkyl group, a $C_1$ to $C_{12}$ alkoxyl group, a $C_2$ to $C_4$ acyl group or a $C_2$ to $C_4$ acyloxy group, and a —$CH_2$— contained in the hydrocarbon group or the ring may be replaced by —CO— or —O—;

t1 represents an integer of 0 to 3.

As the compound represented by the formula (I) in which at least two of $R^3$ to $R^8$ may be bonded together to form a $C_3$ to $C_{30}$ ring in the formula (III), a compound represented by the formula (IV) (hereinafter may be referred to as "compound (IV)") is preferable;

(IV)

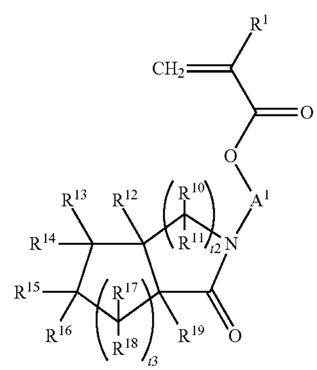

wherein $R^1$ and $A^1$ represent the same meaning as described above;

$R^{10}$, $R^{11}$, $R^{12}$, $R^{13}$, $R^{14}$, $R^{15}$, $R^{16}$, $R^{17}$, $R^{18}$ and $R^{19}$ in each occurrence independently represent a hydrogen atom or a $C_1$ to $C_{12}$ hydrocarbon group, and at least two of $R^{10}$ to $R^{19}$ may be bonded together to form a $C_3$ to $C_{24}$ ring, a hydrogen atom contained in the hydrocarbon group or the ring may be replaced by a halogen atom, a hydroxy group, a $C_1$ to $C_{12}$ alkyl group, a $C_1$ to $C_{12}$ alkoxyl group, a $C_2$ to $C_4$ acyl group or a $C_2$ to $C_4$ acyloxy group, and a —$CH_2$— contained in the hydrocarbon group or the ring may be replaced by —CO— or —O—;

t2 and t3 independently represent an integer of 0 to 3.

As the compound represented by the formula (I) in which at least two of $R^{10}$ to $R^{19}$ may be bonded together to form a ring in the formula (IV), a compound represented by the formula (VI) (hereinafter may be referred to as "compound (VI)") is preferable;

(VI)

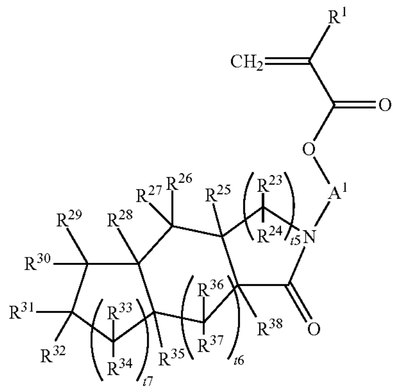

wherein $R^1$ and $A^1$ represent the same meaning as described above;

$R^{23}$, $R^{24}$, $R^{25}$, $R^{26}$, $R^{27}$, $R^{28}$, $R^{29}$, $R^{30}$, $R^{31}$, $R^{32}$, $R^{33}$, $R^{34}$, $R^{35}$, $R^{36}$, $R^{37}$ and $R^{38}$ in each occurrence independently represent a hydrogen atom or a $C_1$ to $C_{12}$ hydrocarbon group, and at least two of $R^{23}$ to $R^{38}$ may be bonded together to form a $C_3$ to $C_{18}$ ring, a hydrogen atom contained in the hydrocarbon group or the ring may be replaced by a halogen atom, a hydroxy group, a $C_1$ to $C_{12}$ alkyl group, a $C_1$ to $C_{12}$ alkoxyl group, a $C_2$ to $C_4$ acyl group or a $C_2$ to $C_4$ acyloxy group, and a —$CH_2$— contained in the hydrocarbon group or the ring may be replaced by —O— or —CO—;

t5, t6 and t7 independently represent an integer of 0 to 3.

As the compound represented by the formula (IV), a compound represented by the formula (V) (hereinafter may be referred to as "compound (V)") is preferable;

(V)

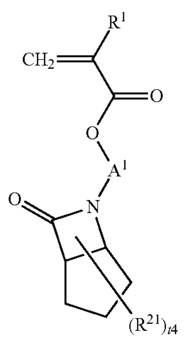

wherein $R^1$ and $A^1$ represent the same meaning as described above;

$R^{21}$ in each occurrence represents a halogen atom, a hydroxy group, a $C_1$ to $C_{12}$ alkyl group, a $C_1$ to $C_{12}$ alkoxyl group, a $C_2$ to $C_4$ acyl group or a $C_2$ to $C_4$ acyloxy group;

t4 represents an integer of 0 to 8.

As the compound represented by the formula (VI), a compound represented by the formula (VII) (hereinafter may be referred to as "compound (VII)") is preferable;

(VII)

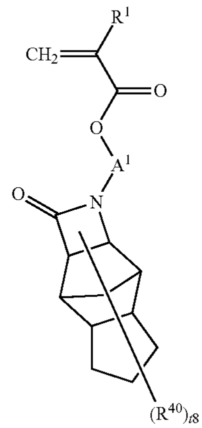

wherein $R^1$ and $A^1$ represent the same meaning as described above;

$R^{40}$ in each occurrence represents a halogen atom, a hydroxy group, a $C_1$ to $C_{12}$ alkyl group, a $C_1$ to $C_{12}$ alkoxyl group, a $C_2$ to $C_4$ acyl group or a $C_2$ to $C_4$ acyloxy group;

t8 represents an integer of 0 to 14.

Examples of the halogen atom, the alkyl group, the alkoxyl group, the acyl group and the acyloxy group of $R^3$ to $R^8$ in the compound (III), $R^{10}$ to $R^{19}$ in the compound (IV), $R^{21}$ in the compound (V), $R^{23}$ to $R^{38}$ in the compound (VI), $R^{40}$ in the compound (VII) include the same examples of the substituents of $X^1$.

t1 is preferably 0 or 1, and more preferably 0.

t2 is preferably 0 or 1, and more preferably 0.

t3 is preferably 1 or 2, and more preferably 1.

t5 is preferably 0 or 1, and more preferably 0.

t6 is preferably 0 or 1, and more preferably 0.

t7 is preferably 0 or 1, and more preferably 0.

Example of the compound (I) include compounds below.

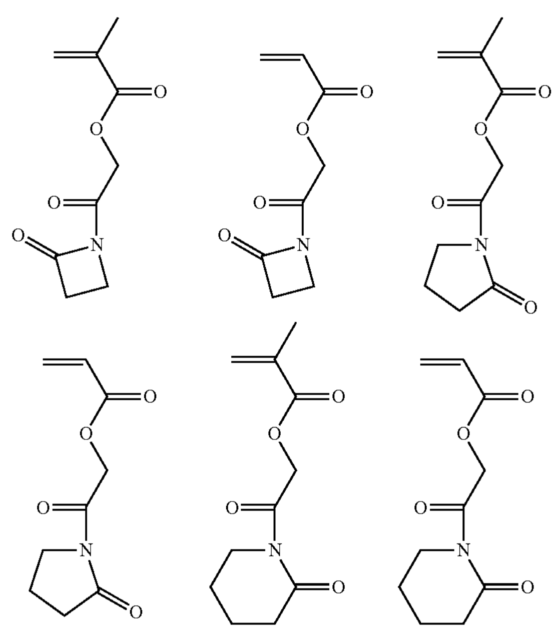

-continued
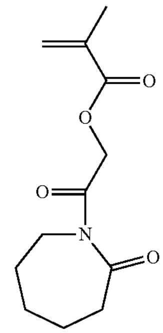
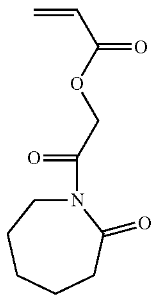
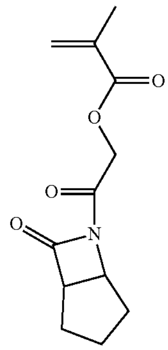
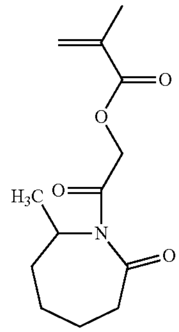
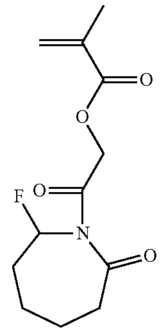
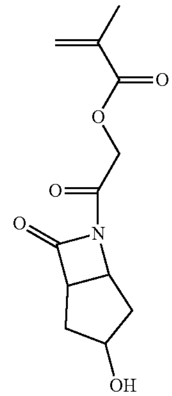
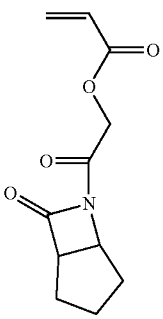
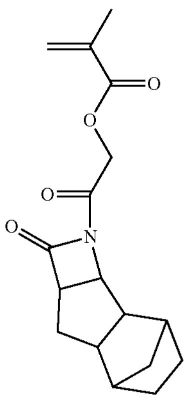
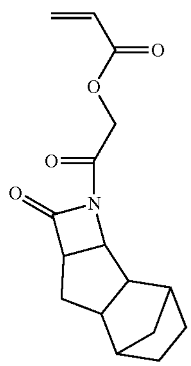
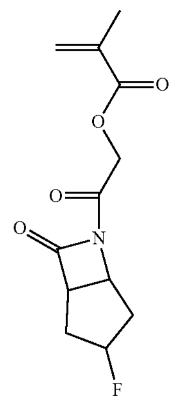
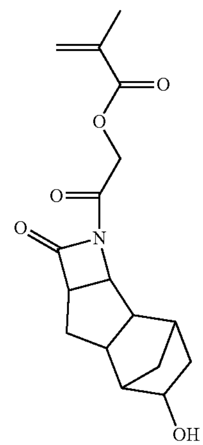
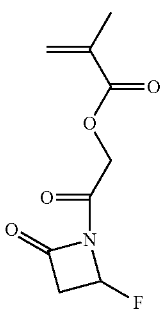
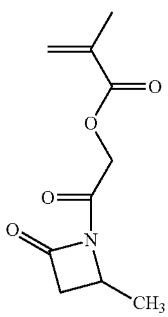
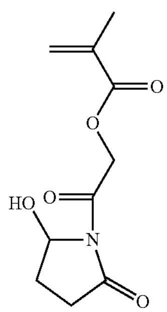
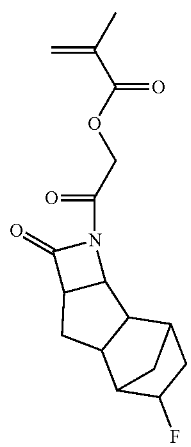
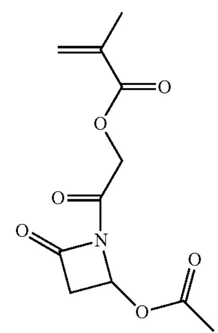
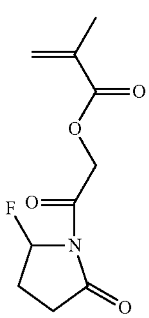
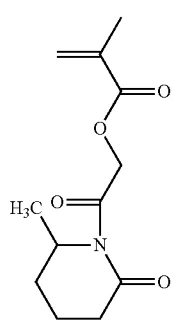
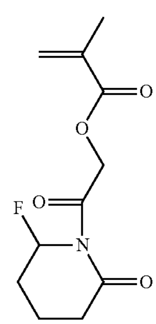
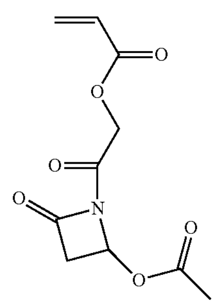
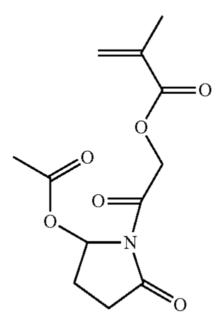

-continued
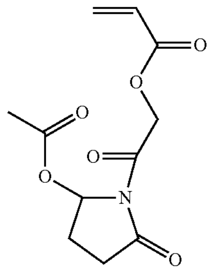
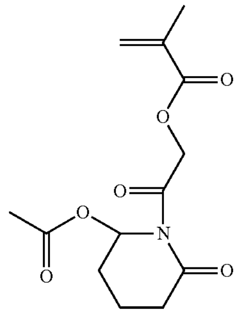
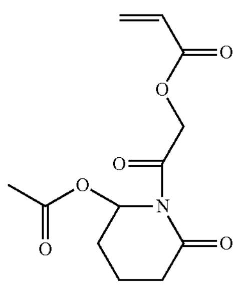
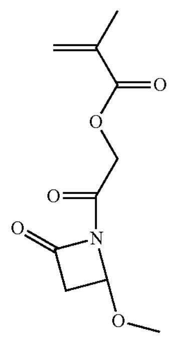
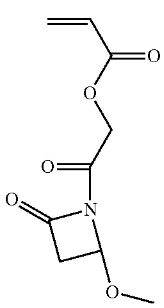
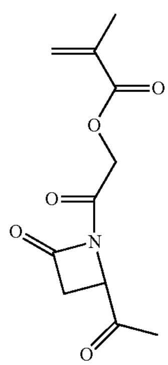
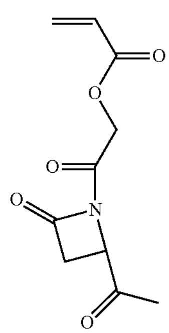
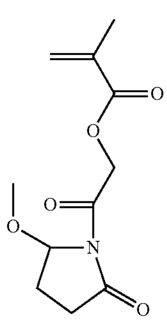
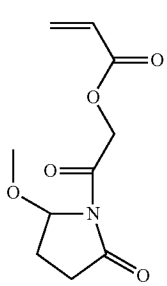
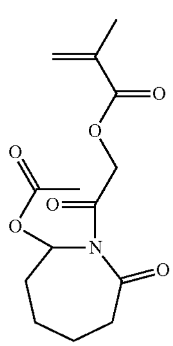
-continued
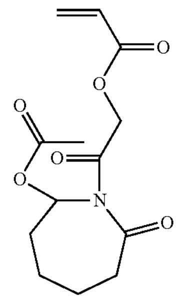
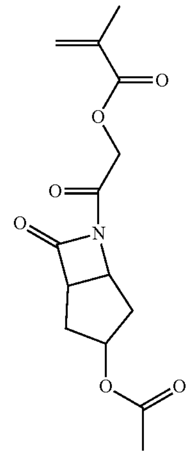
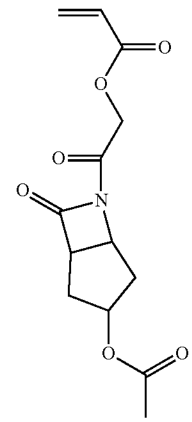
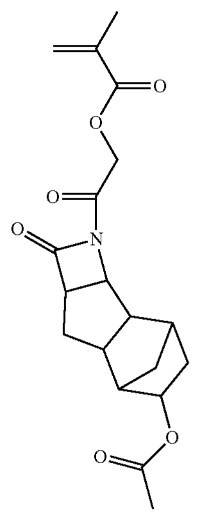
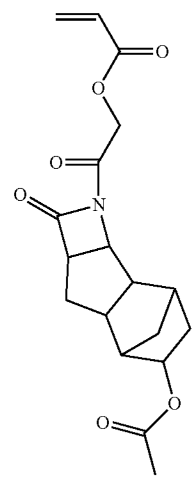
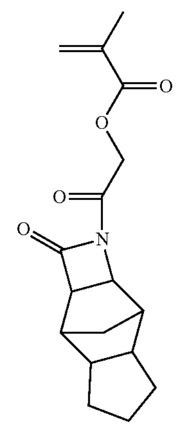
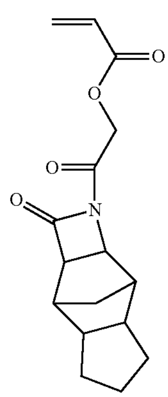
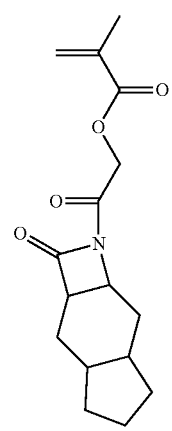
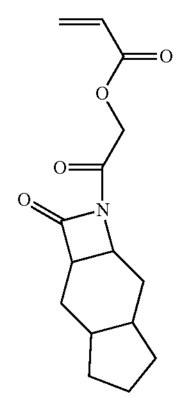

-continued

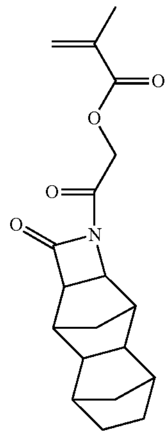

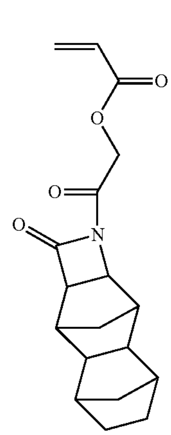

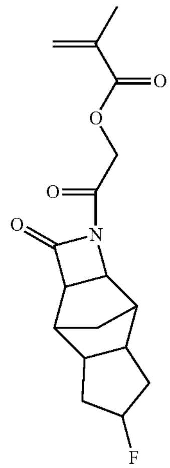

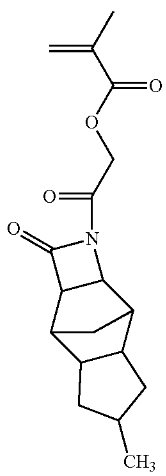

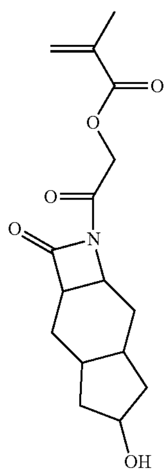

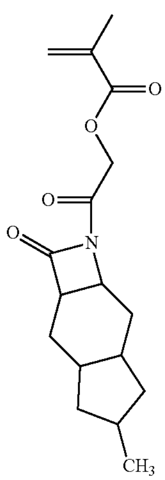

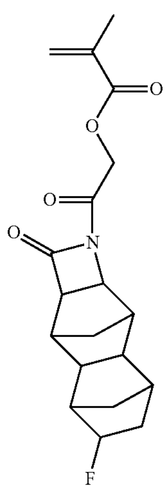

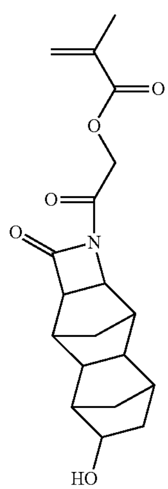

-continued

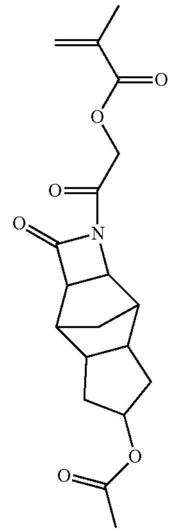

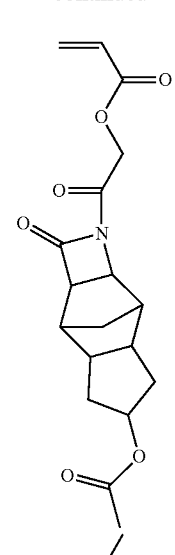

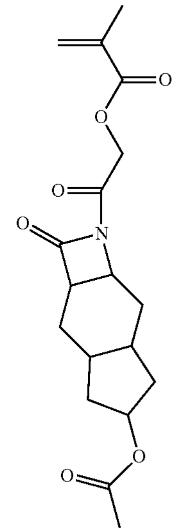

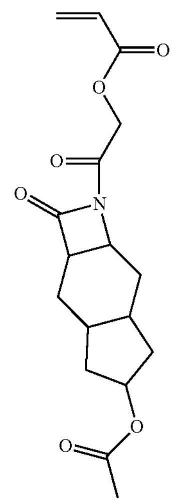

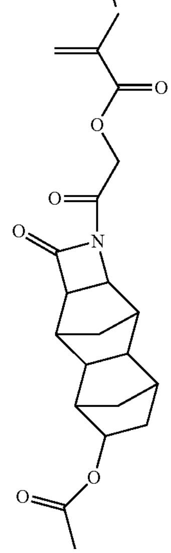

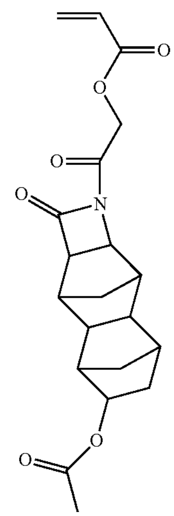

The compound (I) can be produced, for example, by a method below.

The compound (I) in which $A^1$ is —$CH_2$—CO— can be obtained by reacting a compound represented by the formula (Ia-a) with a compound represented by the formula (Ia-b) in presence of a catalyst in a solvent. Preferred examples of the catalyst include potassium carbonate and potassium iodide. Preferred examples of the solvent include dimethylformamide.

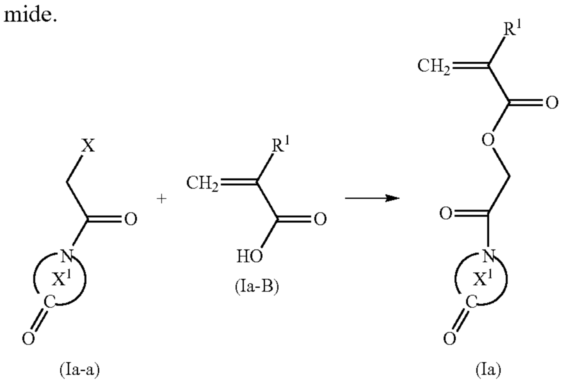

wherein $X^1$ and $R^1$ represent the same meaning as described above;

X represents a halogen atom.

Examples of the halogen atom include fluorine, chlorine, bromine or iodine atom. The chlorine atom is preferable.

Examples of the compound represented by the formula (Ia-b) include acrylic acid and methacrylic acid. Commercially available compounds are used as these.

The compound represented by the formula (Ia-a) can be obtained by reacting a compound represented by the formula (Ia-c) with a compound represented by the formula (Ia-d) in presence of a basic catalyst in a solvent. Preferred examples of the basic catalyst include pyridine. Preferred examples of the solvent include tetrahydrofuran.

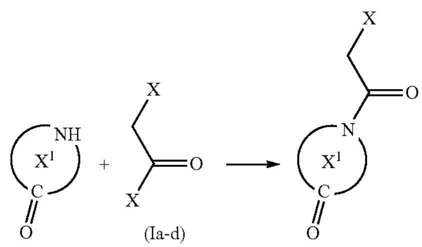

(Ia-c) (Ia-d) (Ia-a)

Examples of the compound represented by the formula (Ia-d) include chloroacetylchloride. Commercially available compounds are used as these.

Examples of the compound represented by the formula (Ia-c) include, for example, compounds below.

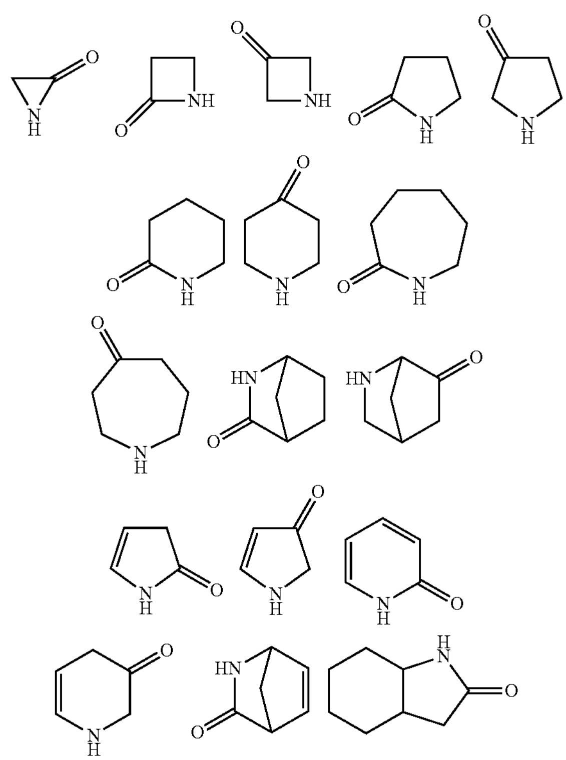

-continued

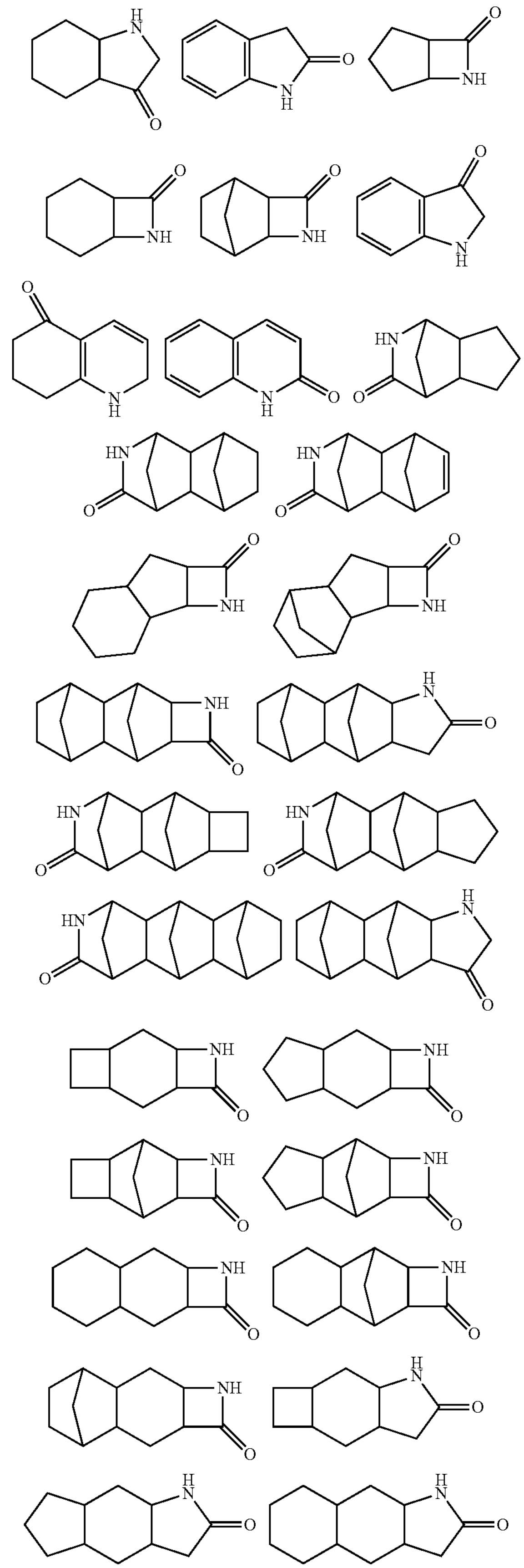

-continued

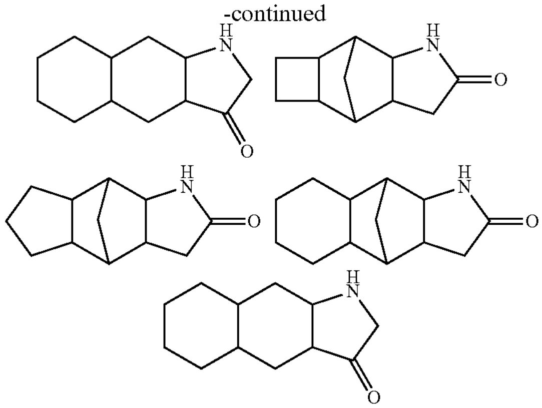

The compound represented by the formula (Ia-c-1) can be obtained by reacting cyclophentene with chlorosulfonyl isocyanate (see, JP2007-514775-A).

(Ia-c-1)

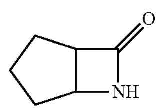

The proportion of the structural units derived from the compound (I) in the resin (A) is generally 1 to 100 weight %, preferably 5 to 95 weight %, and more preferably 10 to 80 weight %, with respect to the total weight of the resin (A).

The resin (A) is insoluble or poorly soluble in alkali aqueous solution and is converted into a resin soluble in an alkali aqueous solution by the action of an acid. Here "be converted into a resin soluble in an alkali aqueous solution by the action of an acid" means a resin that is insoluble or poorly soluble in aqueous alkali solution before contact with the acid becomes soluble in aqueous alkali solution after contact with an acid. Therefore, the resin (A) preferably has at least one structural unit derived from acid labile monomers described below or known monomers capable of providing acid labile groups.

In the present specification, any group exemplified below is applicable to any of the chemical formulae having a similar group with optionally selecting the number of carbon atoms, unless otherwise specified. The number attached to "C" means the carbon number of each group. When a group enables linear and branched chain and/or cyclic structures, all structures may be included and may simultaneously present in one group, unless otherwise specified. When there is a stereoisomeric form, all stereoisomeric forms are included. Each group enables monovalent, or di- or more-valent group depending on the bonded position and bonding form.

A hydrocarbon group includes an aliphatic hydrocarbon group and an aromatic group. The aliphatic hydrocarbon group includes a chain aliphatic hydrocarbon group, an alicyclic hydrocarbon group and a combination thereof.

Examples of a monovalent chain aliphatic hydrocarbon group include methyl, ethyl, propyl, butyl, pentyl, hexyl, heptyl, octyl, decyl, dodecyl, hexadecyl, pentadecyl, hexyldecyl, heptadecyl and octadecyl groups. The aliphatic hydrocarbon group may be any of a liner and a branched chain aliphatic hydrocarbon groups. The chain aliphatic hydrocarbon group may include a carbon-carbon double bond, but a saturated chain aliphatic hydrocarbon group, i.e., alkyl group, is preferable.

Examples of a divalent chain aliphatic hydrocarbon group include a group in which one hydrogen atom is removed from the above the monovalent chain aliphatic hydrocarbon group, i.e., alkanediyl group.

The cyclic aliphatic hydrocarbon group may be any of a monocyclic or a polycyclic aliphatic hydrocarbon groups. The cyclic aliphatic hydrocarbon group hereinafter may be referred to as "alicyclic hydrocarbon group". The alicyclic hydrocarbon group may include a carbon-carbon double bond, but a saturated alicyclic hydrocarbon group is preferable.

Examples of a monovalent alicyclic hydrocarbon group include a group in which one hydrogen atom is removed from an alicyclic hydrocarbon. Examples of a divalent alicyclic hydrocarbon group include a group in which two hydrogen atoms are removed from the alicyclic hydrocarbon group.

Examples of the alicyclic hydrocarbon typically include a cycloalkane below.

(KA-1)

(KA-2)

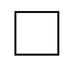

(KA-3)

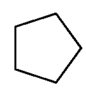

(KA-4)

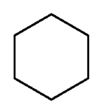

(KA-5)

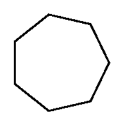

(KA-6)

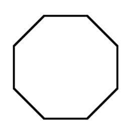

(KA-7)

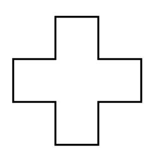

(KA-8)

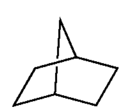

(KA-9)

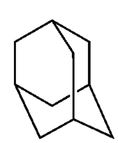

(KA-10)

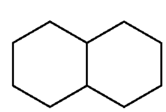

-continued (KA-11)

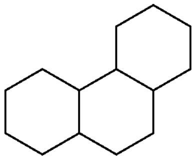

(KA-12)

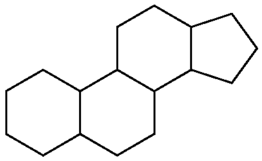

(KA-13)

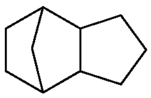

(KA-14)

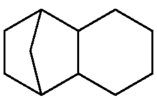

(KA-15)

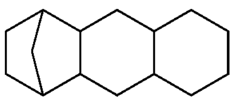

(KA-16)

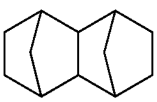

(KA-17)

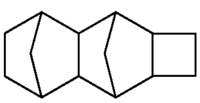

(KA-18)

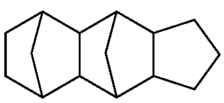

(KA-19)

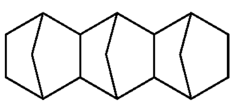

(KA-20)

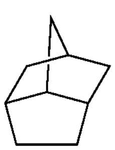

(KA-21)

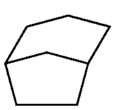

(KA-22)

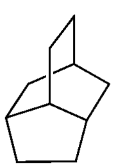

Examples of the aromatic hydrocarbon group typically include an aryl group such as phenyl, naphthyl, anthryl, biphenyl, phenanthryl and fluorenyl groups.

The aliphatic hydrocarbon group and the aromatic hydrocarbon group may be substituted with a substituent.

Typical examples of the substituent of the aliphatic hydrocarbon group include a halogen atom, an alkoxy group, an acyl group, an aryl group, an aralkyl group and an aryloxy group.

Typical examples of the substituent of the aromatic hydrocarbon group include a halogen atom, an alkoxy group, an acyl group, an alkyl group and an aryloxy group.

Examples of the halogen atom include fluorine, chlorine, bromine and iodine atoms.

Examples of the alkoxyl group include methoxy, ethoxy, prop oxy, butoxy, pentyloxy, hexyloxy, heptyloxy, octyloxy, decyloxy and dodecyloxy groups. The alkoxyl group may be any of a liner and a branched chain alkoxyl groups.

Examples of the acyl group include a group bonding a carbonyl group to the alkyl group, such as, acetyl, propionyl, butyryl, valeryl, hexylcarbonyl, heptylcarbonyl, octylcarbonyl, decylcarbonyl and dodecylcarbonyl groups, and a group bonding a carbonyl group to the aryl group, such as, benzoyl group. The alkyl group in the acyl group may be any of a liner and a branched chain alkyl groups.

Examples of the aryloxy group include a group bonding an oxygen atom to the above aryl group.

Examples of the aralkyl group include benzyl, phenethyl, phenylpropyl, naphthylmethyl and naphthylethyl groups.

"(meth)acrylic monomer" means at least one monomer having a structure of "$CH_2{=}CH{-}CO{-}$" or "$CH_2{=}C(CH_3){-}CO{-}$", as well as "(meth)acrylate" and "(meth) acrylic acid" mean "at least one acrylate or methacrylate" and "at least one acrylic acid or methacrylic acid", respectively.

<Acid-Labile Monomer>

The resin (A) preferably has a structural unit derived from a monomer having an acid-labile group in addition to the structural unit derived from the compound (I). The monomer having an acid-labile group may be used as a single compound or as a mixture of two or more compounds when the resin (A) is produced.

The acid-labile group contained in the acid-labile monomer means a hydrophilic group which is protected by a protecting group which can be removed in contact with the acid. Thus, the resin containing a structural unit derived from the acid-labile monomer, which is insoluble or poorly soluble in alkali aqueous solution, provides the hydrophilic group by deprotecting the protecting group through the action of an acid and is converted into a resin soluble in an alkali aqueous solution. Examples of the hydrophilic group include a hydroxy group and a carboxy group, and a carboxy group is preferable.

Examples of the acid-labile group when the hydrophilic group is carboxy group include a group in which a hydrogen atom of the carboxyl group (i.e., —COOH) is placed with an organic group and an atom of the organic group which bonds to —O— of the carboxyl group is tertiary carbon atom.

Among such the acid-labile group, preferred examples thereof include a group represented by the formula (I) below. Hereinafter the group represented by the formula (1) may refer to as an "acid-labile group (1)".

(1)

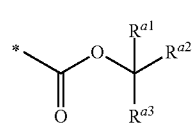

wherein $R^{a1}$, $R^{a2}$ and $R^{a3}$ independently represent a $C_1$ to $C_8$ aliphatic hydrocarbon group or $R^{a1}$ and $R^{a2}$ may be bonded together with a carbon atom bonded to $R^{a1}$ and $R^{a2}$ to form a $C_3$ to $C_{20}$ ring, a —$CH_2$— contained in the aliphatic hydrocarbon group or the ring may be replaced by —O—, —S— or —CO—, * represents a bond.

Examples of the aliphatic hydrocarbon group of $R^{a1}$ to $R^{a3}$ include an alkyl group and an alicyclic hydrocarbon group.

Examples of the alkyl group and the alicyclic hydrocarbon group include the same examples described above.

When $R^{a1}$ and $R^{a2}$ are bonded together to form a ring, examples of the group —C($R^{a1}$)($R^{a2}$)($R^{a3}$) include a group below. The ring preferably has 3 to 12 carbon atoms.

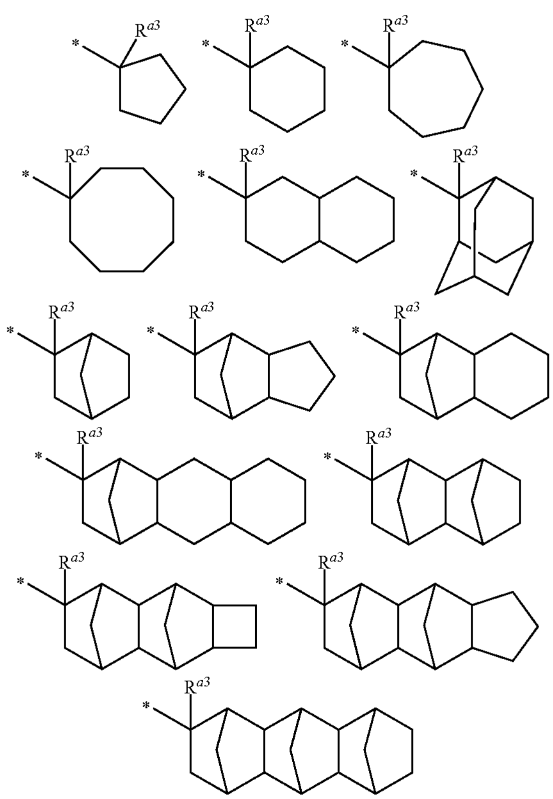

Specific examples of the acid-labile group include, for example,

- 1,1-dialkylalkoxycarbonyl group (a group in which $R^{a1}$ to $R^{a3}$ are alkyl groups, preferably tert-butoxycarbonyl group, in the formula (1)),
- 2-alkyladamantane-2-yloxycarbonyl group (a group in which $R^{a1}$, $R^{a2}$ and a carbon atom forms adamantyl group, and $R^{a1}$ is alkyl group, in the formula (1)), and
- 1-(adamantine-1-yl)-1-alkylalkoxycarbonyl group (a group in which $R^{a1}$ and $R^{a2}$ are alkyl group, and $R^{a3}$ is adamantyl group, in the formula (1)).

Examples of the acid-labile group when the hydrophilic group is a hydroxy group include a group in which a hydrogen atom of the hydroxy group is replaced with an organic group and resulting in having an acetal structure or a ketal structure. Among such the acid-labile group, preferred examples thereof include a group represented by the formula (2) below. Hereinafter the group represented by the formula (2) may refer to as an "acid-labile group (2)".

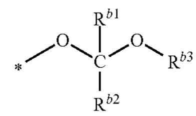

(2)

wherein $R^{b1}$ and $R^{b2}$ independently represent a hydrogen atom or a $C_1$ to $C_{12}$ hydrocarbon group, $R^{b3}$ represents a $C_1$ to $C_{20}$ hydrocarbon group, or $R^{b2}$ and $R^{b3}$ may be bonded together with a carbon atom and an oxygen atom bonded to $R^{b2}$ and $R^{b3}$ respectively to form a $C_3$ to $C_{20}$ ring. A —$CH_2$— contained in the hydrocarbon group and the ring may be replaced by —O—, —S— or —CO—, * represents a bond.

The hydrocarbon group of $R^{b1}$ to $R^{b3}$ includes any of an aliphatic hydrocarbon group and an aromatic hydrocarbon group.

Examples of the aliphatic hydrocarbon group and the aromatic hydrocarbon group include the same examples described above.

Examples of the ring which is formed by bonding with $R^{b2}$ and $R^{b3}$ include the same rings which are formed by bonding with $R^{a1}$ and $R^{a2}$.

At least one of $R^{b1}$ and $R^{b2}$ is preferably a hydrogen atom.

Specific examples of the acid-labile group (2) include a group below.

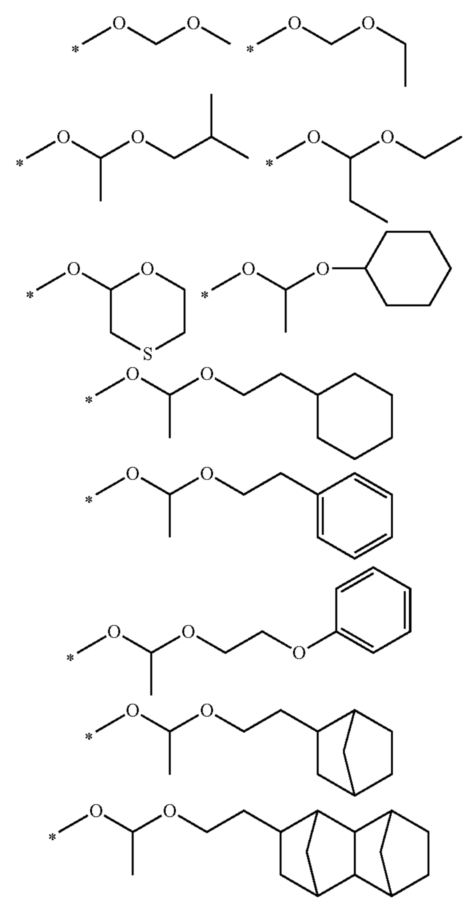

-continued

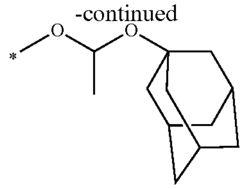

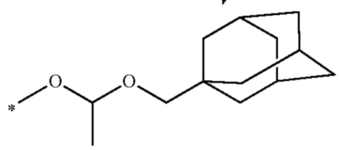

<Monomer (a1)>

The monomer having the acid-labile group (hereinafter may refer to as an "monomer (a1)) is preferably a monomer having an acid-labile group and a carbon-carbon double bond, and more preferably a (meth)acrylic monomer having the acid-labile group.

Preferable examples of the monomer (a1) include a monomer having an acid-labile group (1) and/or an acid-labile group (2) and a carbon-carbon double bond, and a (meth) acrylic monomer having an acid-labile group (1) is more preferable.

Among the (meth)acrylic monomer having an acid-labile group (1), it is preferably a monomer containing an acid-labile group (1) having a $C_5$ to $C_{20}$ alicyclic hydrocarbon structure. When a resin (A) which can be obtained by polymerizing monomers having bulky structure such as the alicyclic hydrocarbon group is used, the resist composition having excellent resolution tends to be obtained during the production of a resist pattern.

As the (meth)acrylic monomer containing an acid-labile group (1) having the alicyclic hydrocarbon structure, examples thereof include a monomer represented by the formula (a1-1) (hereinafter may be referred to as an "monomer (a1-1)") and a monomer represented by the formula (a1-2) (hereinafter may be referred to as an "monomer (a1-2)"). These may be used as a single compound or as a mixture of two or more compounds.

(a1-1)

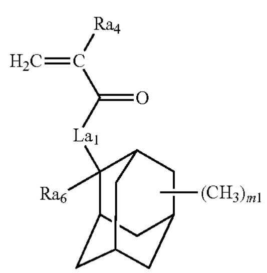

(a1-2)

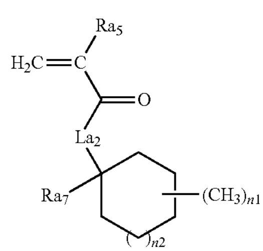

wherein $L^{a1}$ and $L^{a2}$ independently represent *—O— or *—O—$(CH_2)_{k1}$—CO—O—, k1 represents an integer of 1 to 7, * represents a bond to the carbonyl group (—CO—);

$R^{a4}$ and $R^{a5}$ independently represent a hydrogen atom or a methyl group;

$R^{a6}$ and $R^{a7}$ independently represent a $C_1$ to $C_{10}$ aliphatic hydrocarbon group;

m1 represents an integer 0 to 14;

n1 represents an integer 0 to 10; and n2 represents an integer 0 to 3.

In the formula (a1-1) and the formula (a1-2), $L^{a1}$ and $L^{a2}$ are preferably *—O— or *—O—$(CH_2)_{k1'}$—CO—O—, here k1' represents an integer of 1 to 4, more preferably *—O— or *—O—$CH_2$—CO—O—, and still more preferably *—O—.

$R^{a4}$ and $R^{a5}$ are preferably a methyl group.

The aliphatic hydrocarbon groups of $R^{a4}$ and $R^{a5}$ are independently preferably a $C_1$ to $C_8$ alkyl group or $C_3$ to $C_{10}$ alicyclic hydrocarbon group, more preferably a $C_1$ to $C_8$ alkyl group or $C_3$ to $C_8$ alicyclic hydrocarbon group, and still more preferably a $C_1$ to $C_6$ alkyl group or $C_3$ to $C_6$ alicyclic hydrocarbon group.

m1 is preferably an integer of 0 to 3, and more preferably 0 or 1.

n1 is preferably an integer of 0 to 3, and more preferably 0 or 1.

n2 is preferably 0 or 1, and more preferably 1.

Examples of the monomer (a1-1) include a group below.

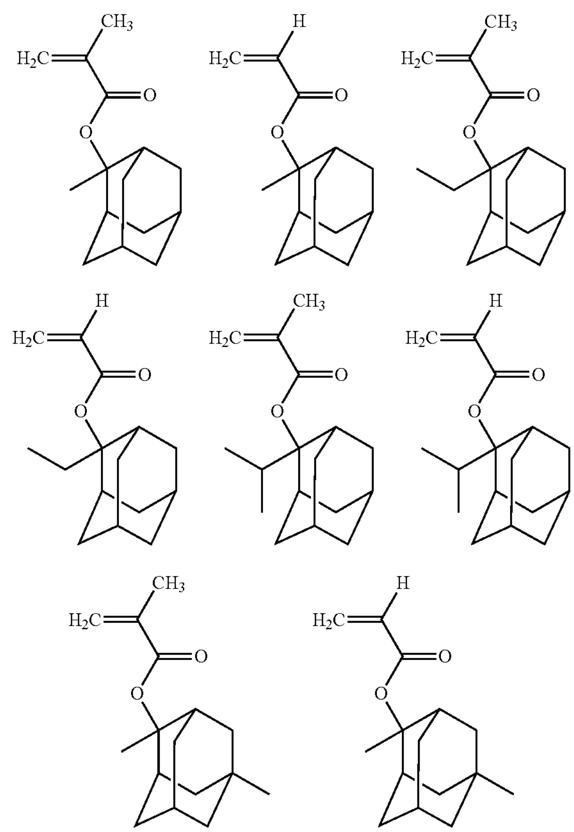

-continued
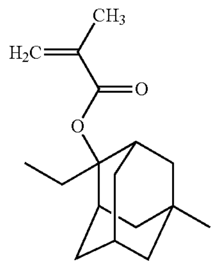
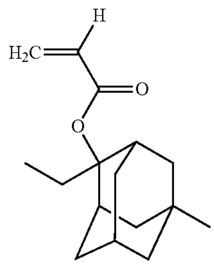
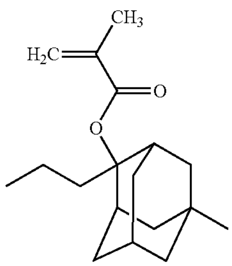
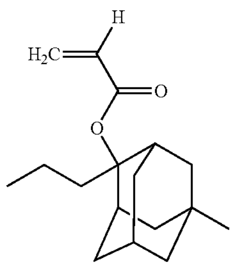
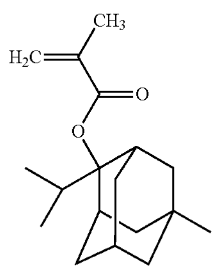
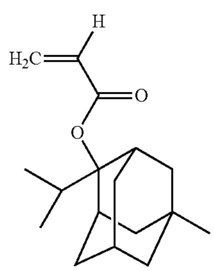
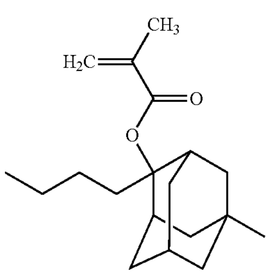
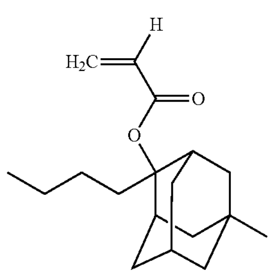
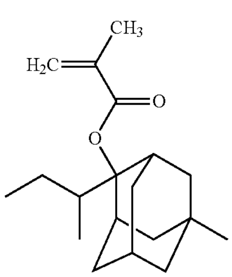
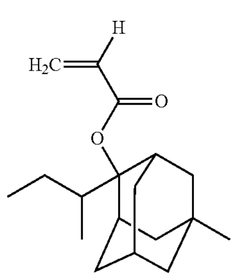
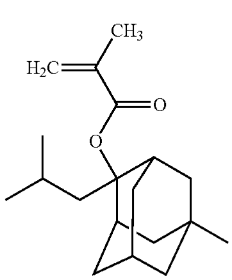
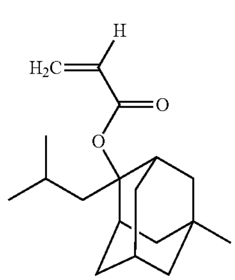
-continued
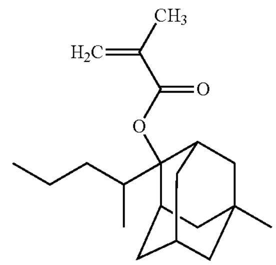
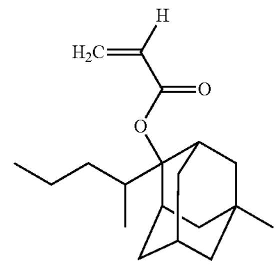
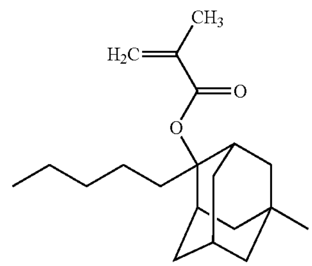
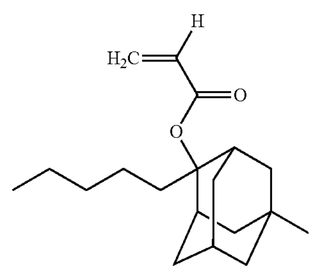
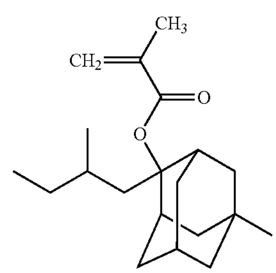
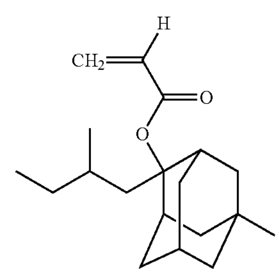
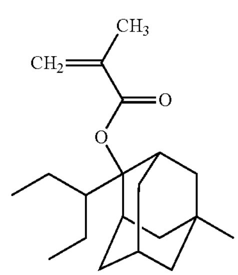
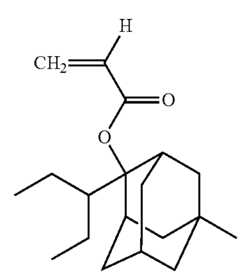
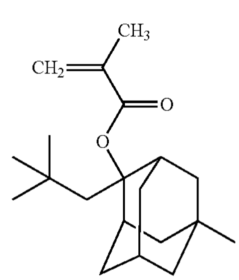
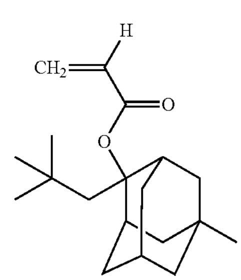

-continued
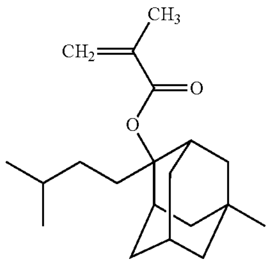
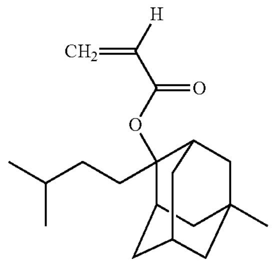
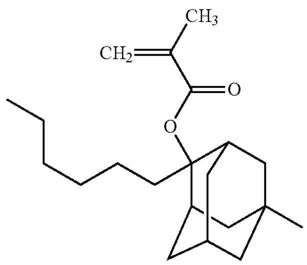
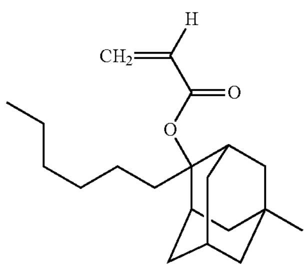
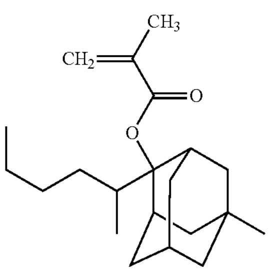
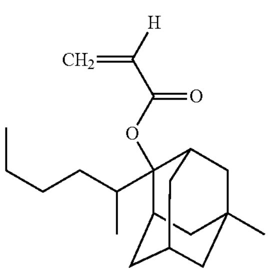
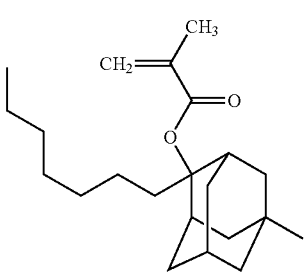
-continued
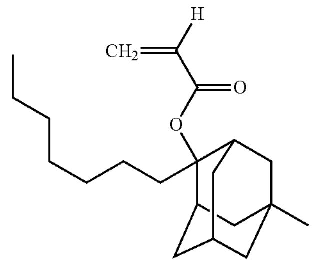
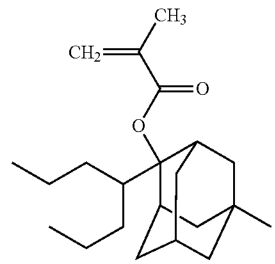
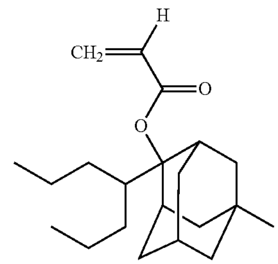
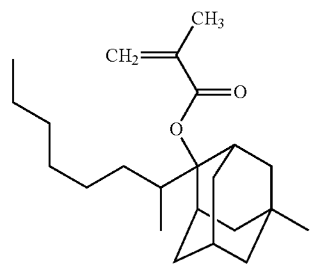
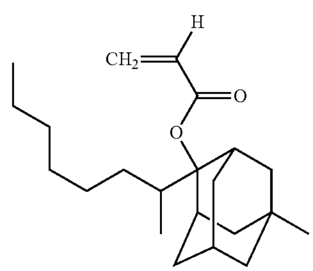
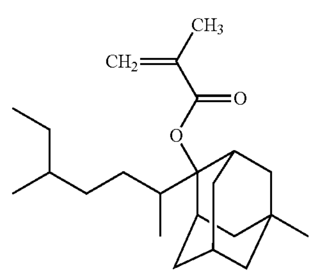
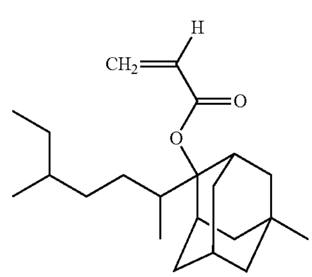

-continued
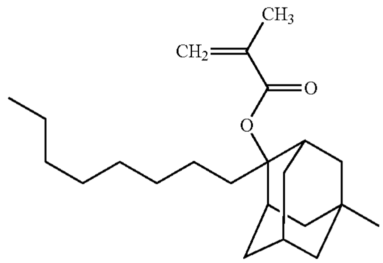
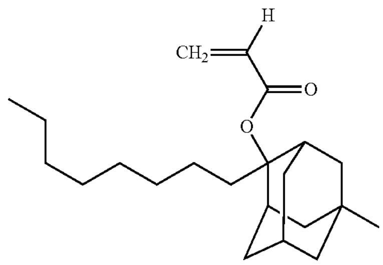
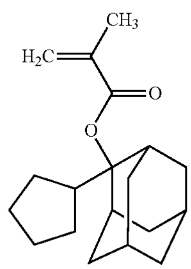
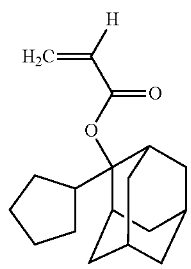
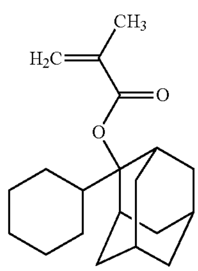
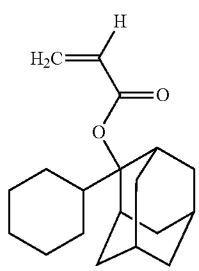
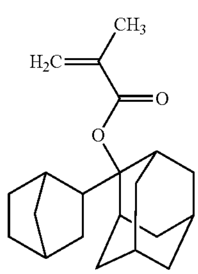
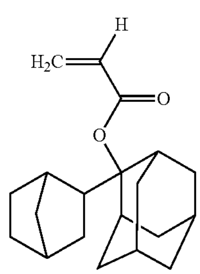
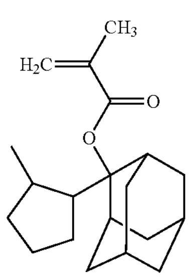
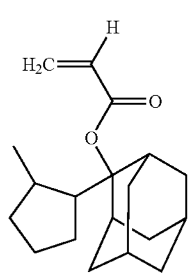
-continued
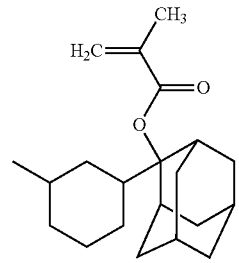
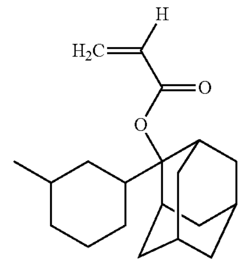
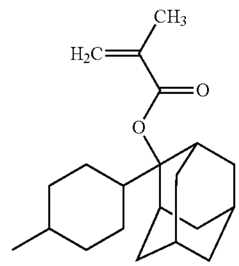
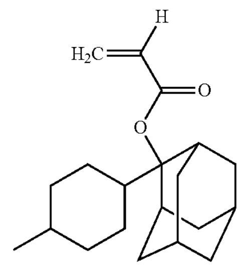
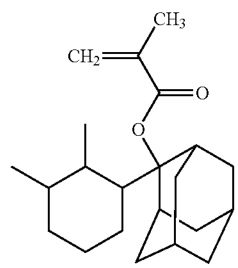
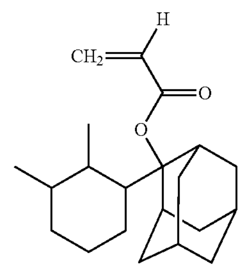
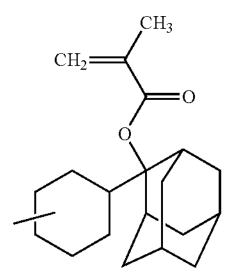
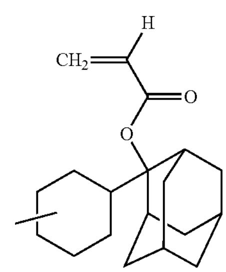
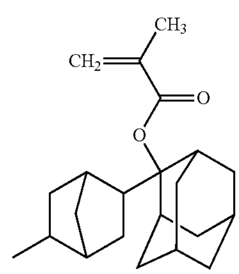
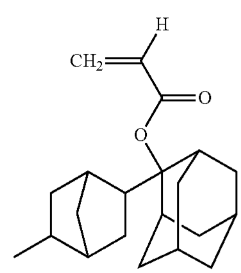
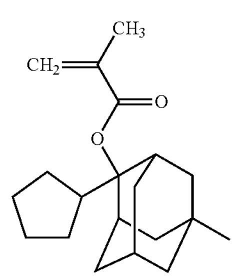
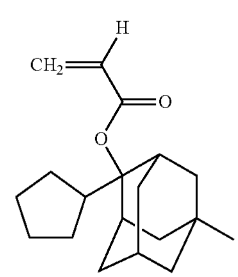

-continued
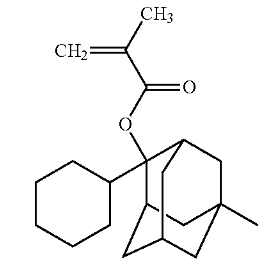
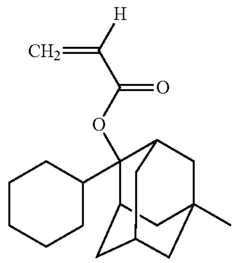
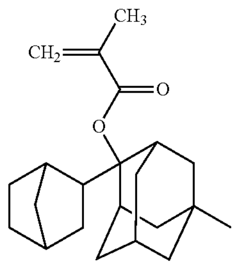
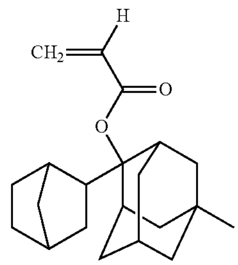
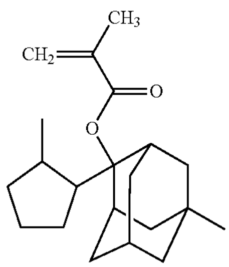
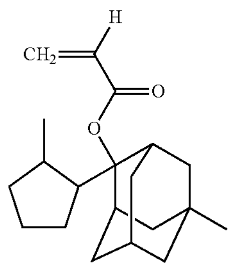
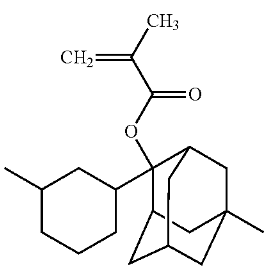
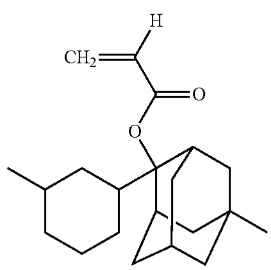
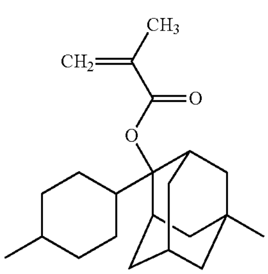
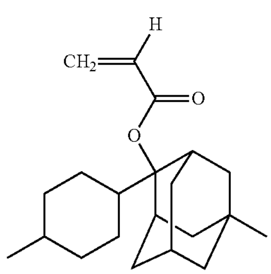
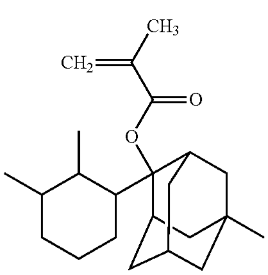
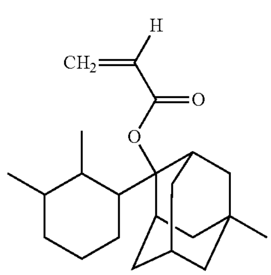
-continued
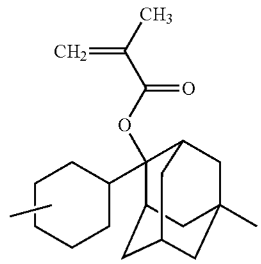
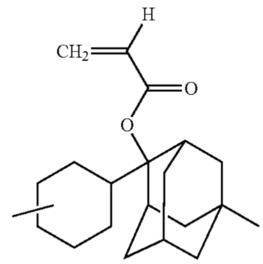
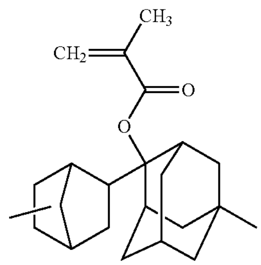
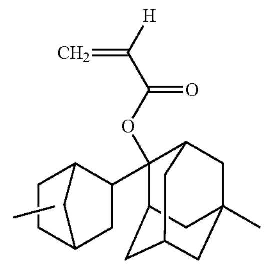
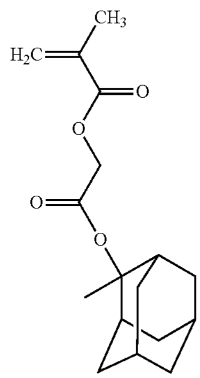
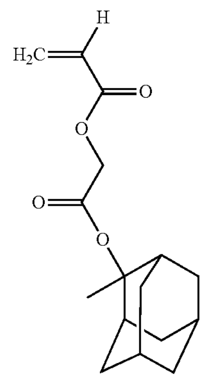
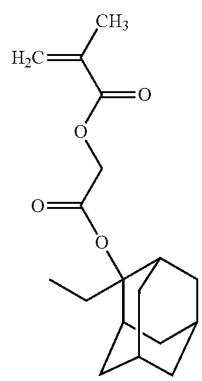
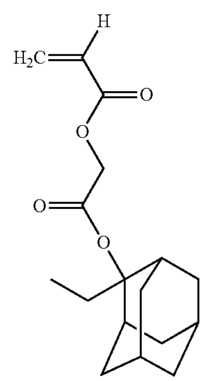
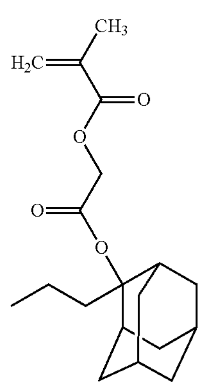
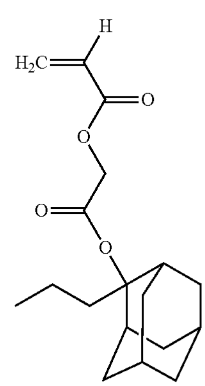

-continued
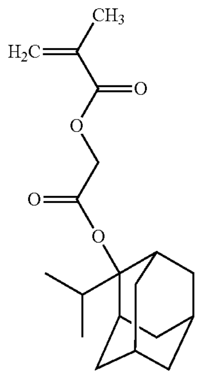
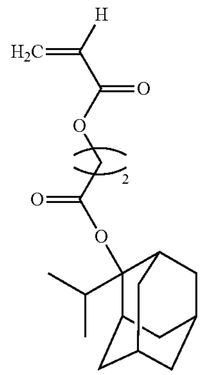
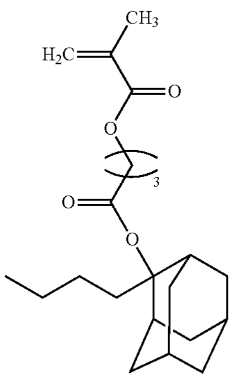
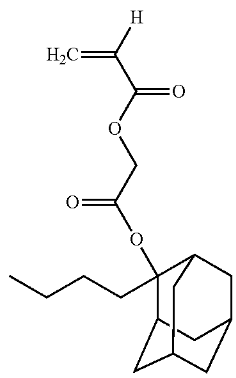
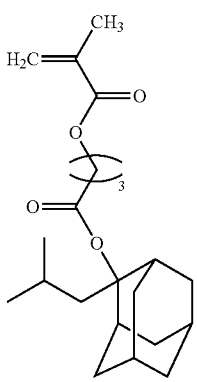
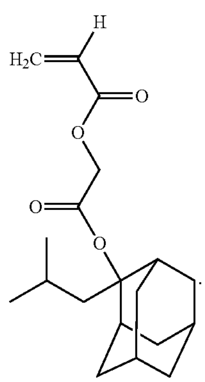
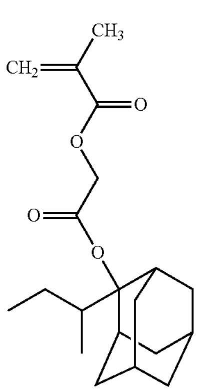
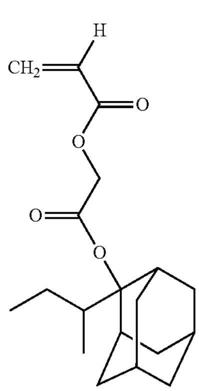
-continued
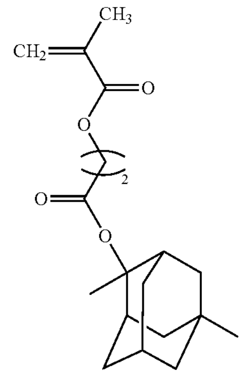
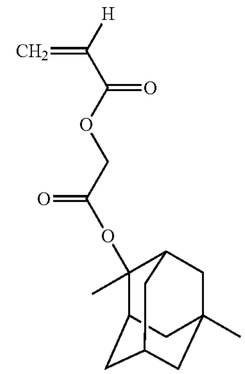
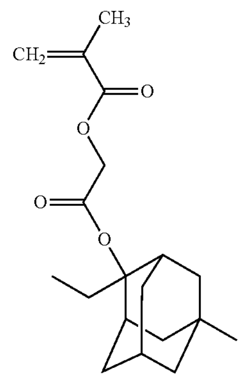
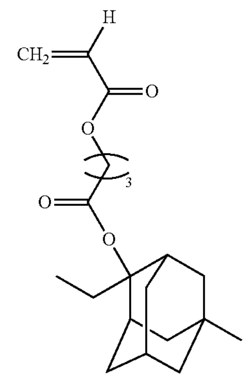
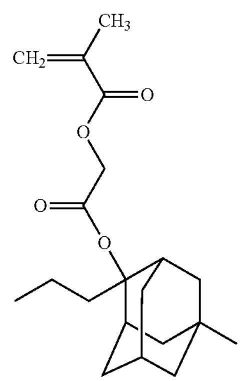
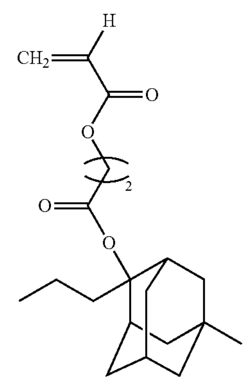
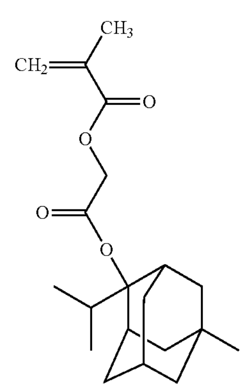
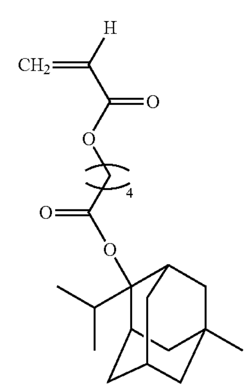

-continued
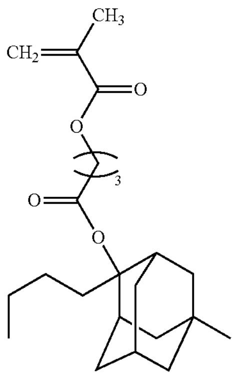
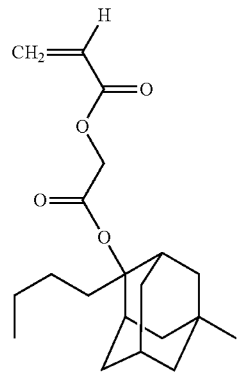
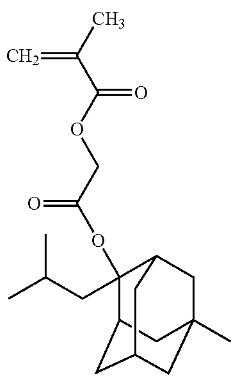
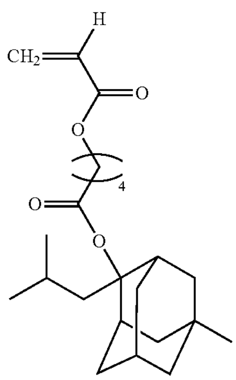
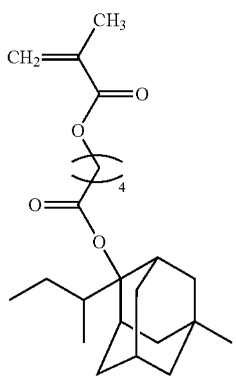
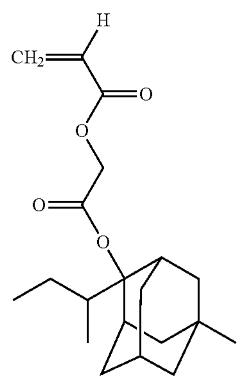
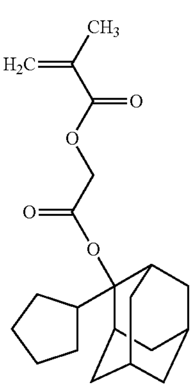
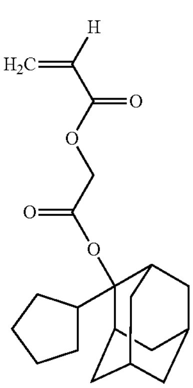
-continued
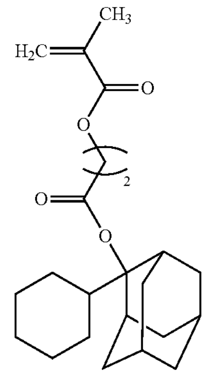
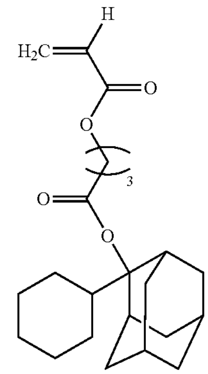
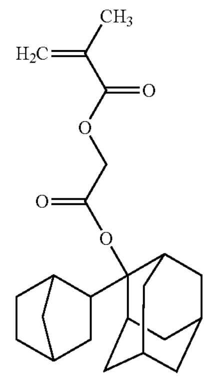
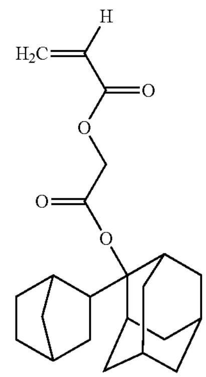
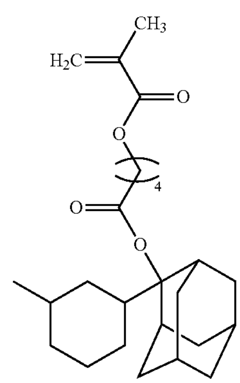
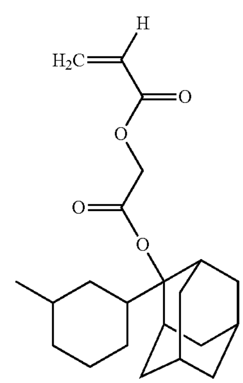
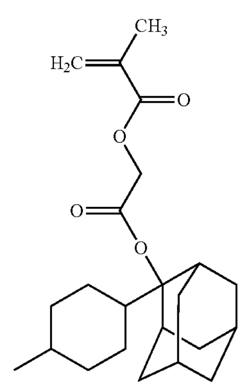
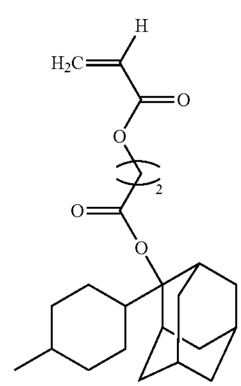

-continued
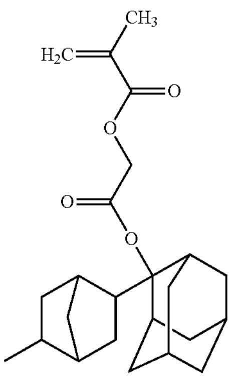
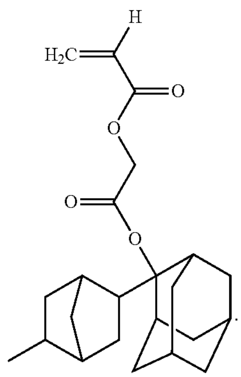
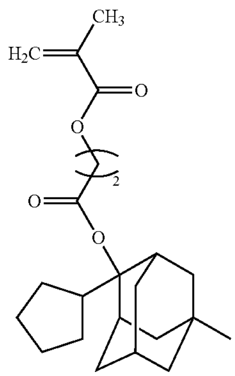
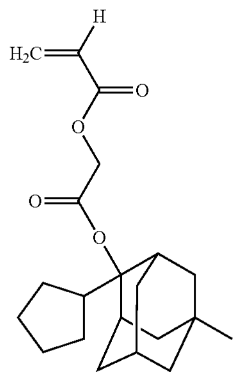
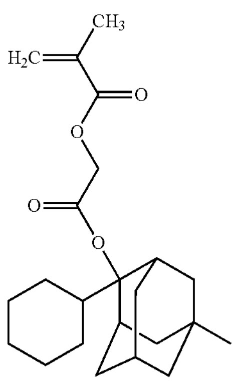
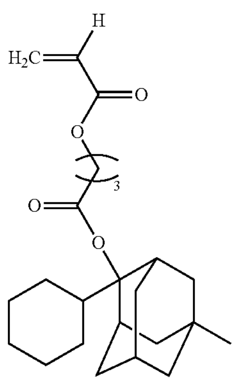
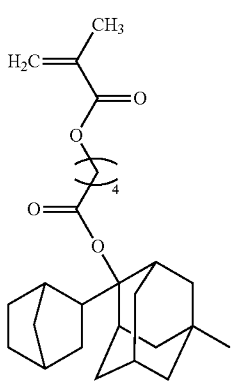
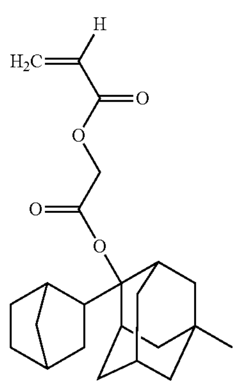
-continued
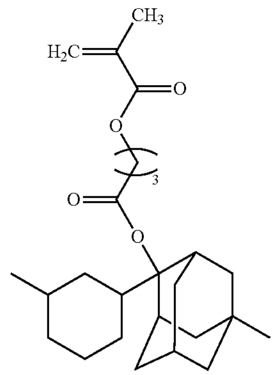
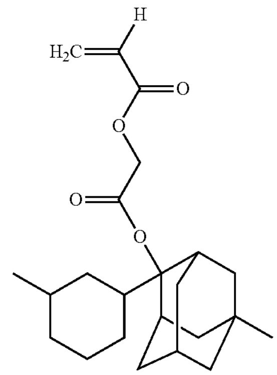
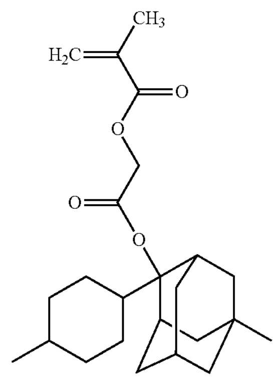
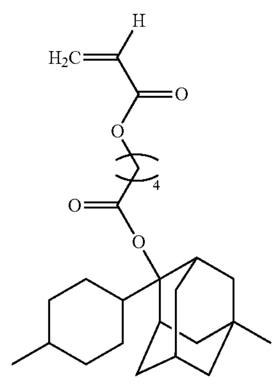
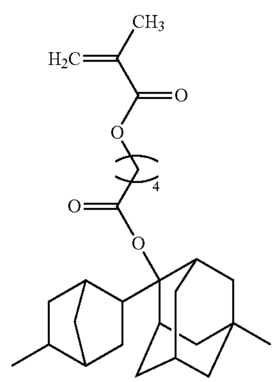
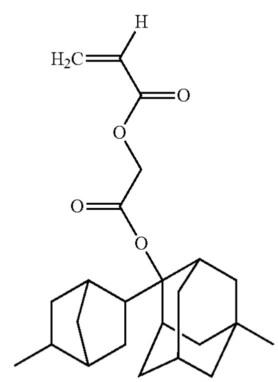
Among these, 2-methyladamantane-2-yl(meth)acrylate, 2-ethyladamantane-2-yl(meth)acrylate and 2-isopropyladamantane-2-yl(meth)acrylate are preferable, and 2-methyladamantane-2-yl methacrylate, 2-ethyladamantane-2-yl methacrylate and 2-isopropyladamantane-2-yl methacrylate are more preferable, as a monomer (a1-1).

Examples of the monomer (a1-2) include a group below.

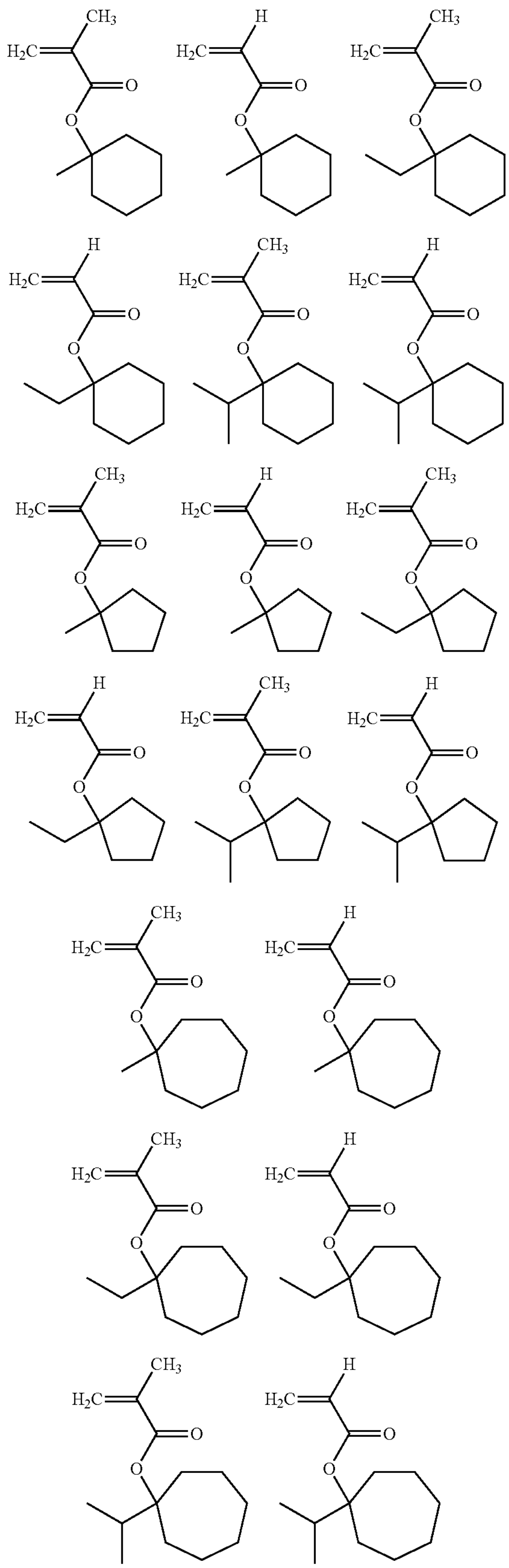

-continued

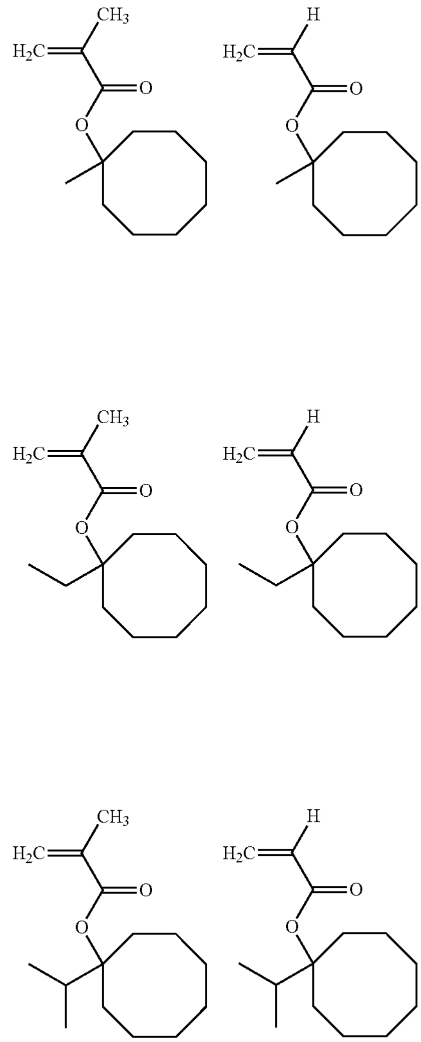

Among these, 1-ethylcyclohexane-1-yl(meth)acrylate is preferable, and 1-ethylcyclohexane-1-yl methacrylate is more preferable, as a monomer (a1-2).

When the resin (A) contains the structural unit derived from the monomer (a1-1) and/or the monomer (a1-2), the total proportion thereof is generally 10 to 95 mol %, preferably 15 to 90 mol %, and more preferably 20 to 85 mol %, with respect to the total structural units (100 mol %) of the resin (A).

For achieving the proportion of the structural units derived from the monomer (a1-1) and/or the structural units derived from the monomer (a1-2) within the above range, the amount of the monomer (a1-1) and/or the monomer (a1-2) used can be adjusted with respect to the total amount of the monomer used when the resin (A) is produced (the same shall apply hereinafter for corresponding adjustment of the proportion).

Examples of the monomers having an acid-labile group (1) and a carbon-carbon double bond include a monomer having norbornene ring presented by the formula (a1-3). Such monomer may be hereinafter referred to as "monomer (a1-3)".

(a1-3)

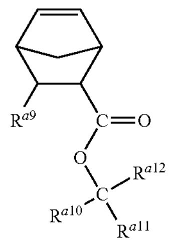

wherein $R^{a9}$ represents a hydrogen atom, a $C_1$ to $C_3$ alkyl group that optionally has a hydroxy group, a carboxy group, a cyano group or a —$COOR^{a13}$, $R^{a13}$ represents a $C_1$ to $C_{20}$ aliphatic hydrocarbon group, a hydrogen atom contained in the aliphatic hydrocarbon group may be replaced with a hydroxy group, a —$CH_2$— contained therein may be replaced by —O— or —CO—;

$R^{a10}$, $R^{a11}$ and $R^{a12}$ independently represent a $C_1$ to $C_{20}$ aliphatic hydrocarbon group, or $R^{a10}$ and $R^{a11}$ may be bonded together to form a $C_1$ to $C_{20}$ ring, a hydrogen atom contained in the aliphatic hydrocarbon group and the ring may be replaced with a hydroxy group or the like, a —$CH_2$— contained in the aliphatic hydrocarbon group and the ring may be replaced by —O— or —CO—.

Examples of the alkyl group having a hydroxy group of $R^{a9}$ include hydroxymethy and 2-hydroxyethyl groups.

The aliphatic hydrocarbon group of $R^{a13}$ is preferably a $C_1$ to $C_8$ alkyl group and a $C_3$ to $C_{20}$ alicyclic hydrocarbon group, examples of the —$COOR^{a13}$ group include a group in which a carbonyl group bonds to an alkoxy group, such as methoxycarbonyl and ethoxycarbonyl groups.

The aliphatic hydrocarbon group of $R^{a10}$ to $R^{a12}$ is any of a chain aliphatic hydrocarbon group, an alicyclic hydrocarbon group and a combination thereof. Examples of the aliphatic hydrocarbon group of $R^{a10}$ to $R^{a12}$ include methyl, ethyl, cyclohexyl, methylcyclohexyl, hydroxycyclohexyl, oxocyclohexyl and adamantyl groups.

Examples of the ring formed together with $R^{a10}$ and $R^{a11}$ include an alicyclic hydrocarbon group such as cyclohexane and adamantane ring.

Examples of the monomer having a norbornene ring (a1-3) include, for example, tert-butyl 5-norbornene-2-carboxylate, 1-cyclohexyl-1-methylethyl 5-norbornene-2-carboxylate, 1-methylcyclohexyl 5-norbornene-2-carboxylate, 2-methyl-2-adamantane-2-yl 5-norbornene-2-carboxylate, 2-ethyl-2-adamantane-2-yl 5-norbornene-2-carboxylate, 1-(4-methycyclohexyl)-1-methylethyl 5-norbornene-2-carboxylate, 1-(4-hydroxycyclohexyl)-1-methylethyl 5-norbornene-2-carboxylate, 1-methyl-(4-oxocyclohexyl)-1-ethyl 5-norbornene-2-carboxylate, and 1-(1-adamantane-1-yl)-1-methylethyl 5-norbornene-2-carboxylate.

A resin having a structural unit derived from the monomer (a1-3) can improve the resolution of the obtained resist composition because it has a bulky structure, and also can improve a dry-etching tolerance of the obtained resist composition because of incorporated a rigid norbornene ring into a main chain of the resin (A).

When the resin (A) contains the structural unit derived from the monomer represented by the formula (a1-3), the proportion thereof is generally 10 to 95 mol %, preferably 15 to 90 mol %, and more preferably 20 to 85 mol %, with respect to the total structural units constituting the resin (A) (100 mol %).

Examples of a monomer having an acid-labile group (2) and a carbon-carbon double bond include a monomer represented by the formula (a1-4). Such monomer may be hereinafter referred to as "monomer (a1-4)".

(a1-4)

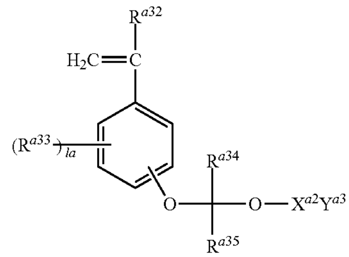

wherein $R^{a32}$ represents a hydrogen atom, a halogen atom or a $C_1$ to $C_6$ alkyl group that optionally has a halogen atom;

$R^{a33}$ in each occurrence independently represent a halogen atom, a hydroxy group, a $C_1$ to $C_6$ alkyl group, a $C_1$ to $C_6$ alkoxy group, a $C_2$ to $C_4$ acyl group, a $C_2$ to $C_4$ acyloxy group, an acryloyl group or methacryloyl group;

Ia represents an integer 0 to 4;

$R^{a34}$ and $R^{a35}$ independently represent a hydrogen atom or a $C_1$ to $C_{12}$ hydrocarbon group;

$X^{a2}$ represents a single bond or an optionally substituted $C_1$ to $C_{17}$ divalent aliphatic hydrocarbon group, a hydrogen atom contained therein may be substituted with a halogen atom, a hydroxy group, a $C_1$ to $C_6$ alkyl group, a $C_1$ to $C_6$ alkoxy group, a $C_2$ to $C_4$ acyl group or a $C_2$ to $C_4$ acyloxy group, and a —$CH_2$— contained therein may be replaced by —CO—, —O—, —S—, —$SO_2$— or —$N(R^c)$—, $R^c$ represents a hydrogen atom or a $C_1$ to $C_6$ alkyl group;

$Y^{a3}$ represents a $C_1$ to $C_{18}$ hydrocarbon group, a hydrogen atom contained therein may be substituted with a halogen atom, a hydroxy group, a $C_1$ to $C_6$ alkyl group, a $C_1$ to $C_6$ alkoxy group, a $C_2$ to $C_4$ acyl group, and a $C_2$ to $C_4$ acyloxy group.

Examples of the alkyl group that optionally has a halogen atom of $R^{a32}$ include trifluoromethyl, perfluoroethyl, perfluoropropyl, perfluoro-isopropyl, perfluorobutyl, perfluoro-sec-butyl, perfluoro-tert-butyl, perfluoropentyl, perfluorohexyl, trichloromethyl, triburomomethyl and triiodomethyl groups.

Examples of the halogen atom, the alkyl group, the alkoxy group and the like include the same examples described above.

Examples of the acyl group include acetyl, propionyl and butyryl groups.

Examples of the acyloxy group include acetyloxy, propionyloxy and butyryloxy groups.

In the formula (a1-4), the alkyl group of $R^{a32}$ and $R^{a33}$ is preferably a $C_1$ to $C_4$ alkyl group, more preferably a $C_1$ to $C_2$ alkyl group, and still more preferably methyl group.

The alkoxy group of $R^{a33}$ is preferably a $C_1$ to $C_4$ alkoxy group, more preferably a $C_1$ to $C_2$ alkoxy group, and still more preferably methoxy group.

Examples of the hydrocarbon group of $R^{a34}$ and $R^{a35}$ include any of a chain aliphatic hydrocarbon group, an alicyclic hydrocarbon group and an aromatic hydrocarbon group.

Preferred examples of the aliphatic group include iso-propyl, n-butyl, sec-butyl, tert-butyl, pentyl, hexyl, octyl, and 2-ethylhexyl groups.

Preferred examples of the alicyclic hydrocarbon group include a monocyclic or polycyclic saturated hydrocarbon groups such as cyclohexyl, adamantyl, 2-alkyl-adamantan-2-ly, 1-(1-adamantan-1-yl)-1-alkyl, alkane-1-yl, and isobornyl groups.

Preferred examples of the aromatic hydrocarbon group include phenyl, naphthyl, anthranil, p-methylphenyl, p-tert-butylphenyl, p-adamantylphenyl, tolyl, xylyl, cumenyl, mesityl, biphenyl, phenanthryl, 2,6-diethylphenyl and 2-methyl-6-ethylphenyl groups.

The aliphatic hydrocarbon group of $X^{a2}$ is preferably a chain aliphatic hydrocarbon group, and more preferably a saturated chain aliphatic hydrocarbon group.

The hydrocarbon group of $Y^{a3}$ is preferably a $C_3$ to $C_{18}$ alicyclic hydrocarbon group and a $C_6$ to $C_{18}$ aromatic hydrocarbon group.

Preferred examples of the substituent that may be optionally substituted to $X^{a2}$ and $Y^{a3}$ include a hydroxy group.

Examples of the monomer represented by the formula (a1-4) include a monomer below.

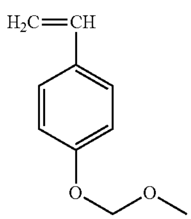
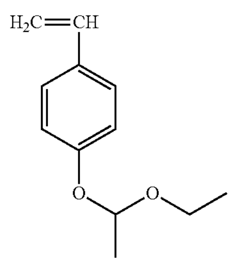
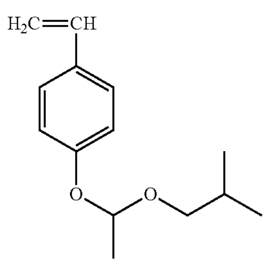
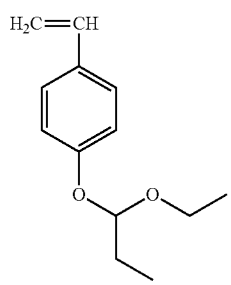
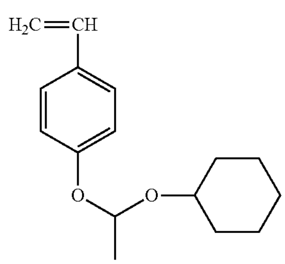
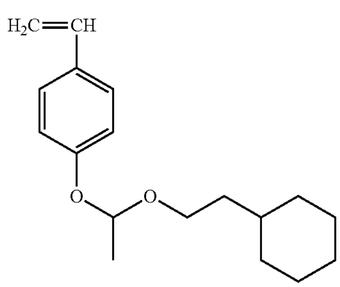

-continued

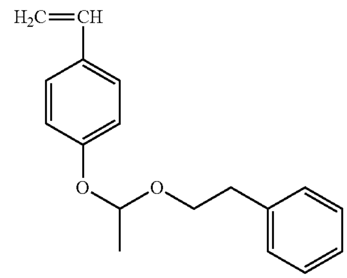
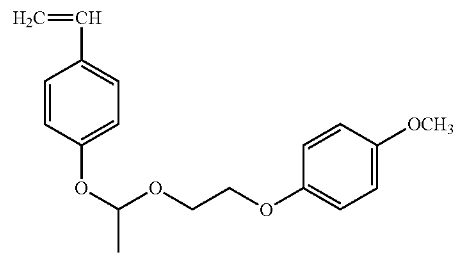
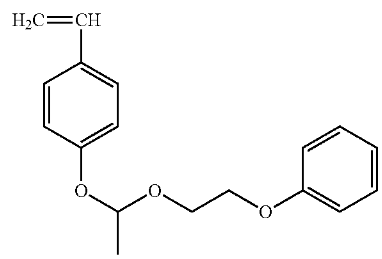
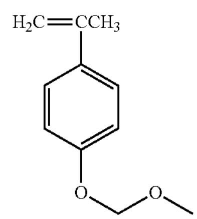
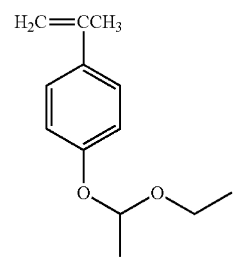
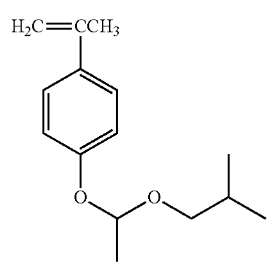
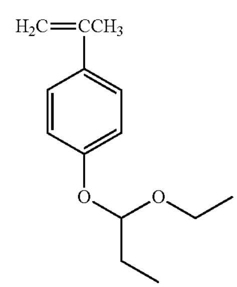
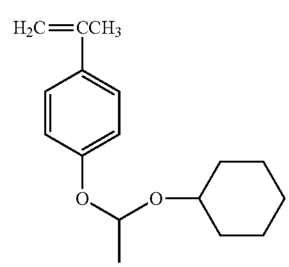

-continued
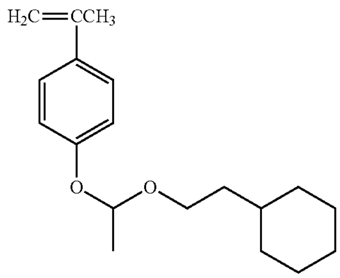
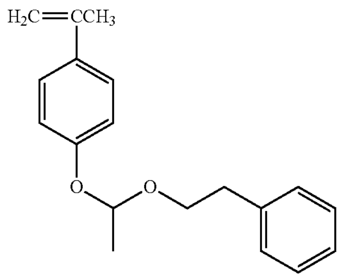
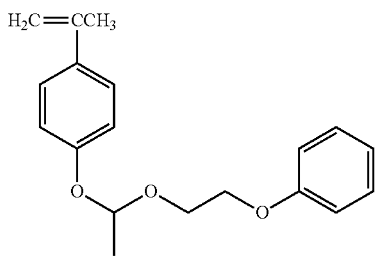
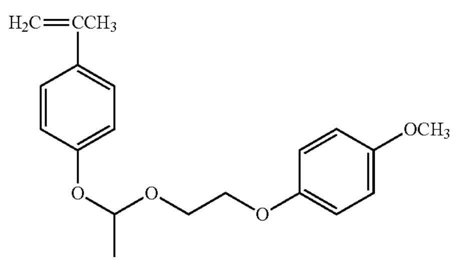
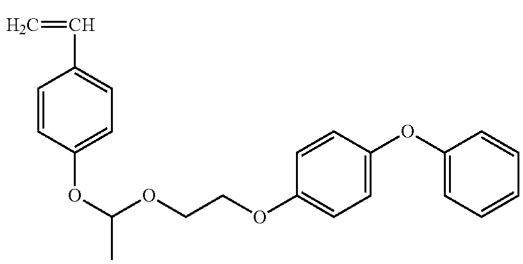
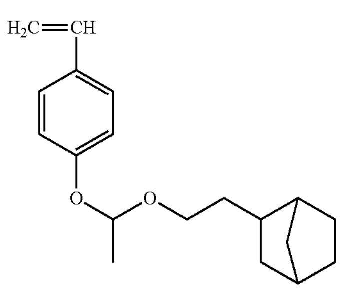
-continued
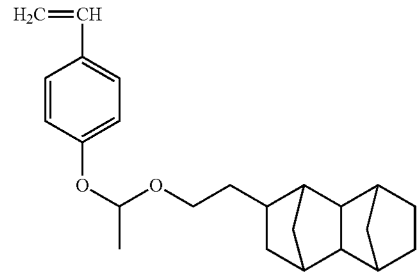
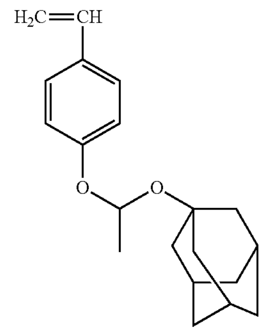
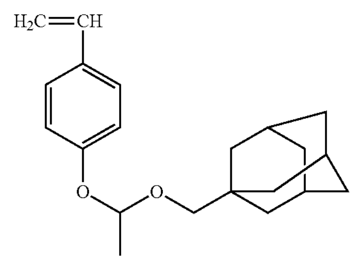
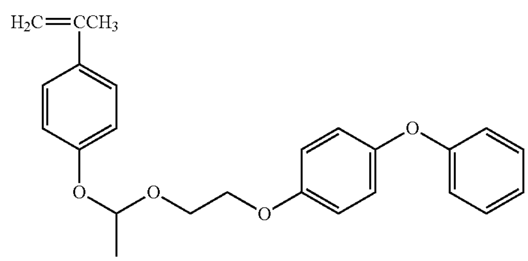
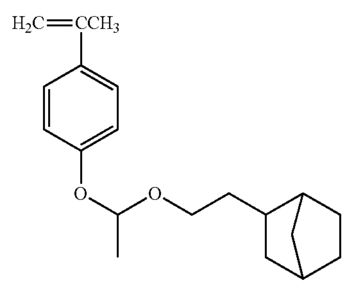
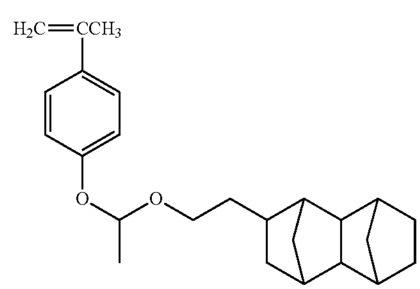

-continued
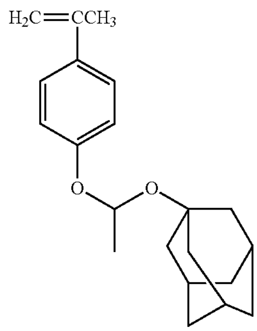
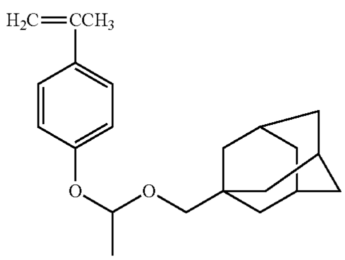
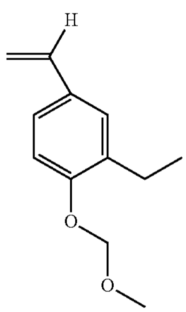
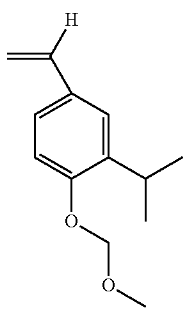
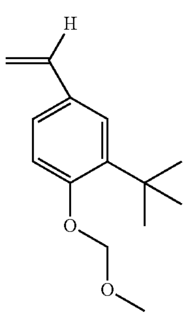
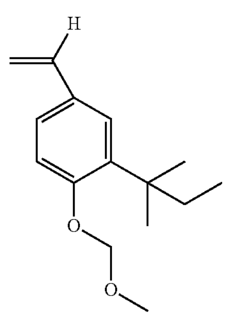
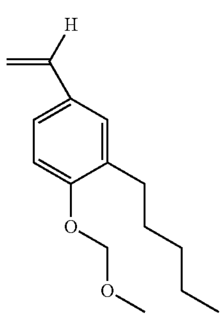
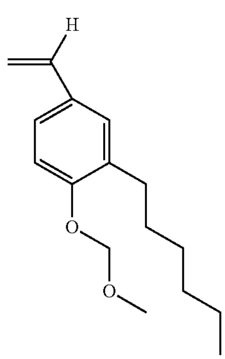
-continued
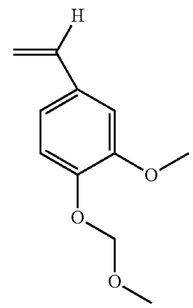
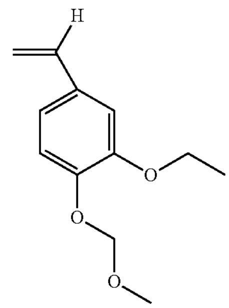
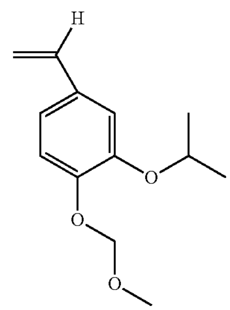
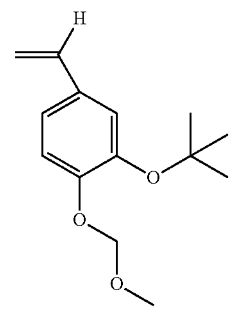
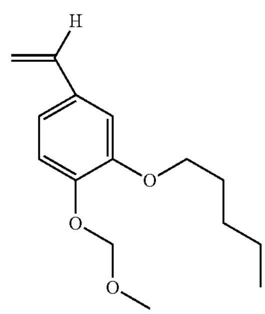
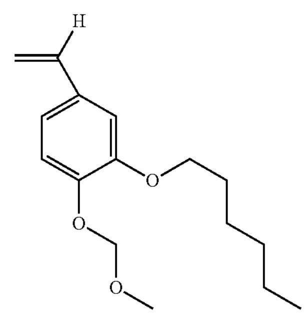
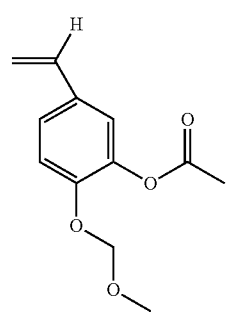
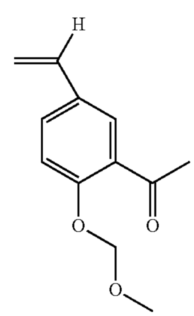
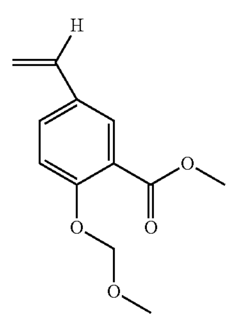
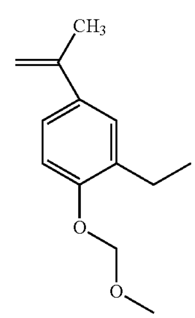

-continued

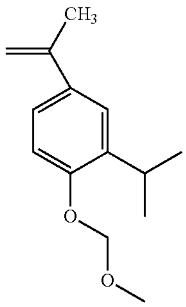

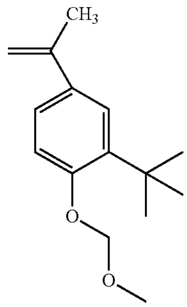

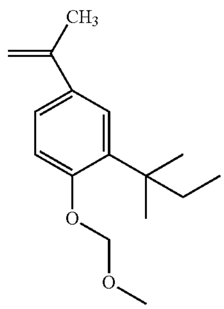

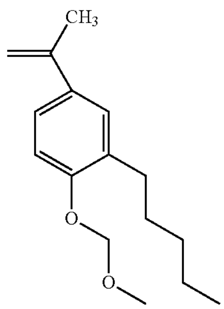

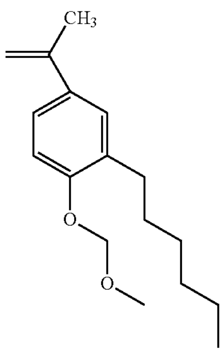

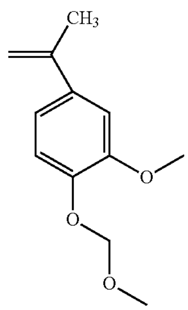

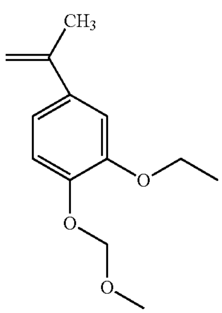

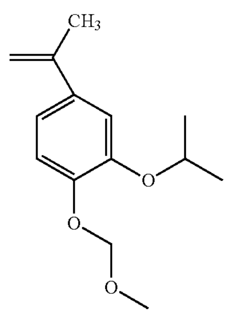

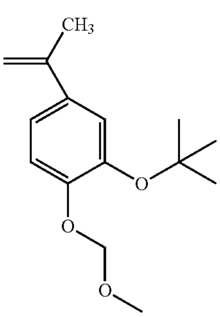

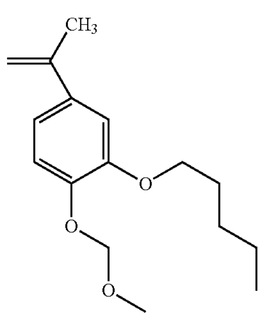

-continued

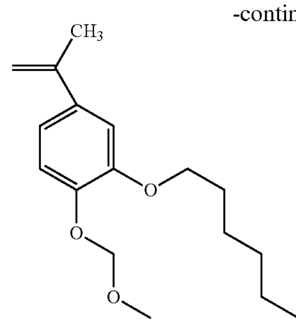

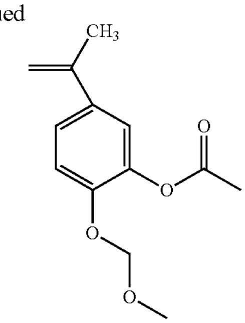

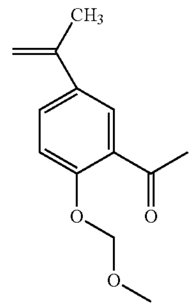

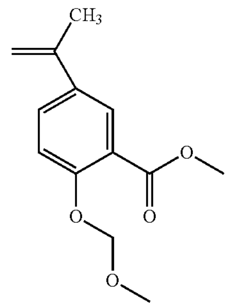

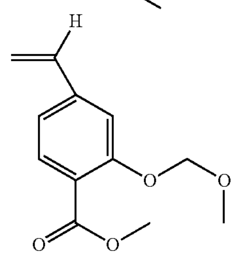

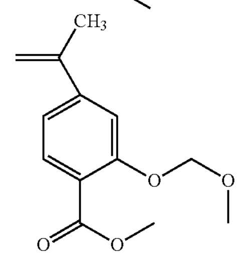

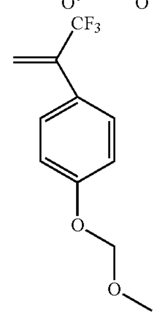

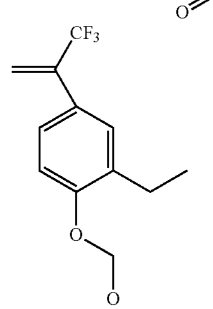

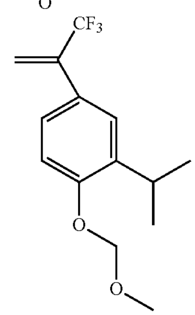

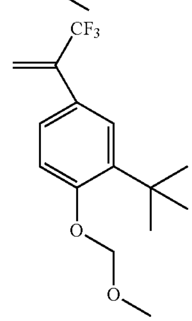

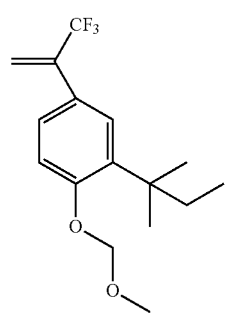

When the resin (A) contains the structural unit derived from the monomer represented by the formula (a1-4), the proportion thereof is generally 10 to 95 mol %, preferably 15 to 90 mol %, more preferably 20 to 85 mol %, with respect to the total structural units constituting the resin (A) (100 mol %).

Examples of a monomer having an acid-labile group (2) and a carbon-carbon double bond include a monomer represented by the formula (a1-5). Such monomer may be hereinafter referred to as "monomer (a1-5)".

(a1-5)

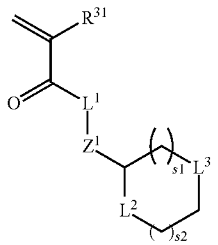

wherein $R^{31}$ represents a hydrogen atom, a halogen atom or a $C_1$ to $C_6$ alkyl group that optionally has a halogen atom;

$L^1$, $L^2$ and $L^3$ independently represent *—O—, *—S— or *—O—$(CH_2)_u$—CO—O—, k1 represents an integer of 1 to 7, * represents a bond to the carbonyl group (—CO—);

s1 represents an integer of 0 to 4;

s2 represents an integer of 0 to 4;

$Z^1$ represents a single bond or a $C_1$ to $C_6$ alkanediyl group, and a —$CH_2$-contained in the alkanediyl group may be replaced by —O— or —CO—.

In the formula (a1-5), $R^{31}$ is preferably a hydrogen atom, a methyl group or a trifluoromethyl group;

$L^1$ is preferably —O—;

$L^2$ and $L^3$ are independently preferably *—O— or *—S—, and more preferably —O— for one and —S— for another;

s1 is preferably 1;

s2 is preferably an integer of 0 to 2;

$Z^1$ is preferably a single bond or —$CH_2$—CO—O—.

Examples of the compound represented by the formula (a1-5) include compounds below.

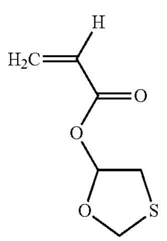
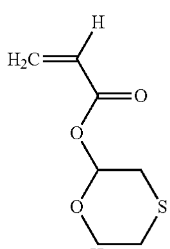
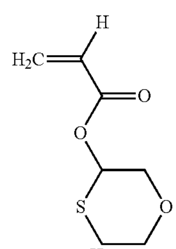
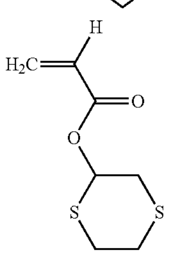
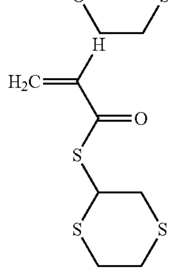
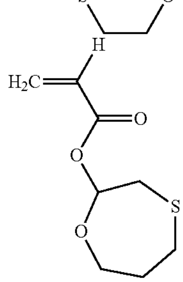
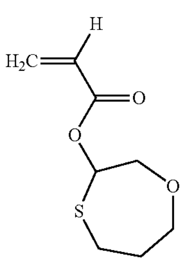
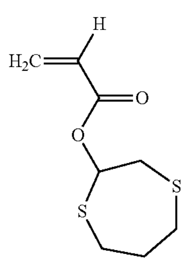
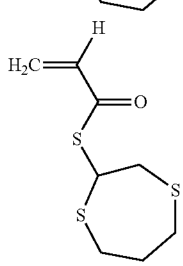

-continued

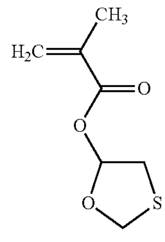
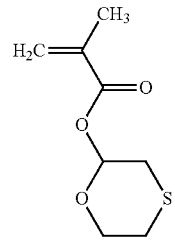
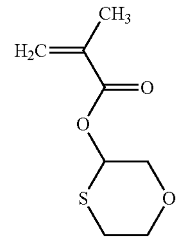
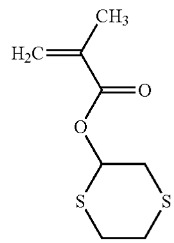
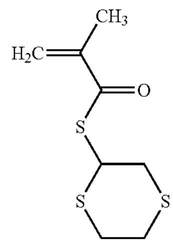
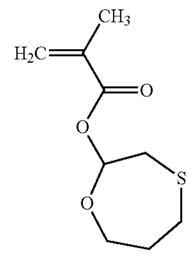
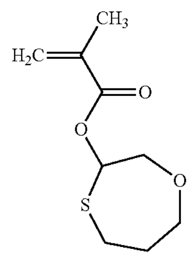
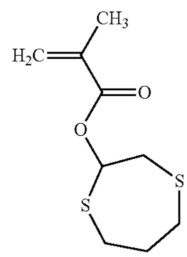
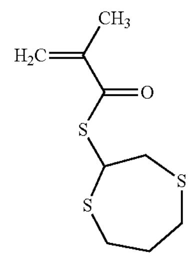
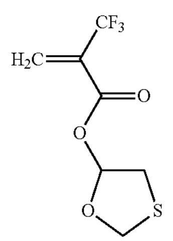
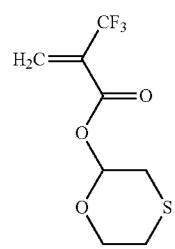
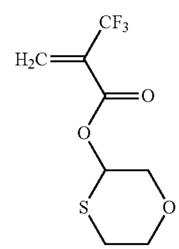
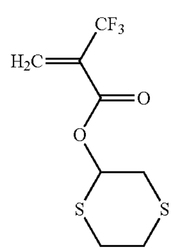
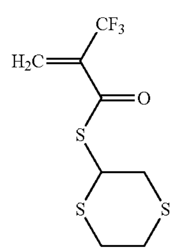
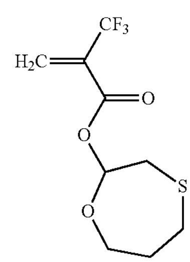
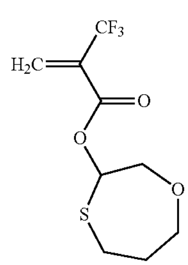
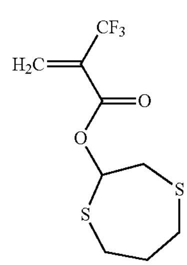
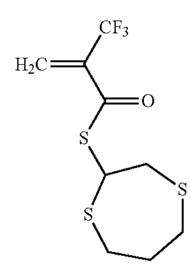

-continued

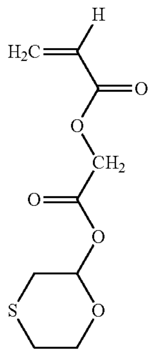
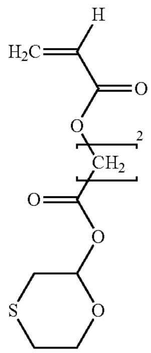
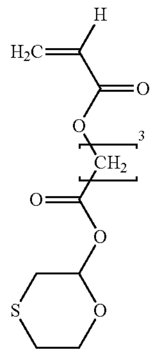
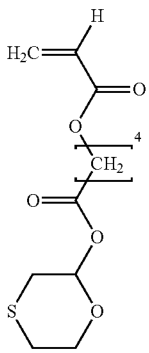
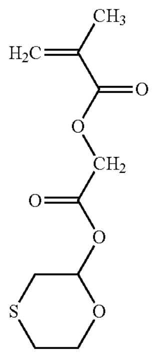
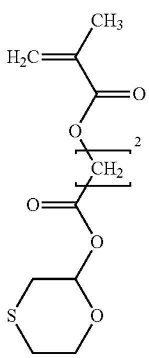
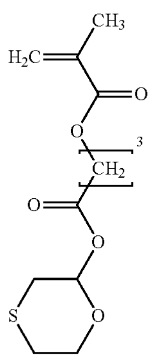
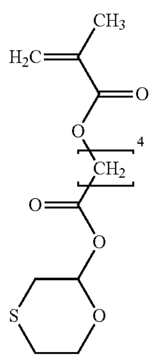
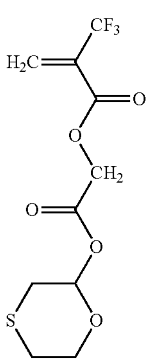
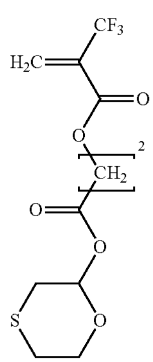

-continued

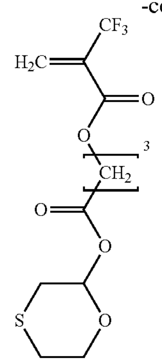
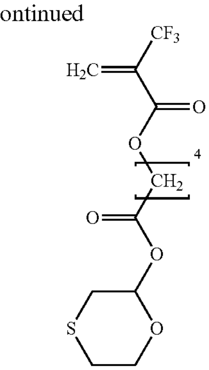

When the resin (A) contains the structural unit derived from the monomer represented by the formula (a1-5), the proportion thereof is generally 10 to 95 mol %, preferably 15 to 90 mol %, and more preferably 20 to 85 mol %, with respect to the total structural units constituting the resin (A)(100 mol %).

When the resin (A) contains the structural unit derived from the monomer (a1), the total proportion thereof is generally 10 to 95 mol %, preferably 20 to 80 mol %, with respect to the total structural units (100 mole %) of the resin (A).

<Acid-Stable Monomer>

The resin (A) is preferably a copolymer of the compound (I), the monomer having the acid-labile group (a1) and a monomer not having the acid-labile group (hereinafter may be referred to as an "acid-stable monomer").

The acid-stable monomer may be used as a single compound or as a mixture of two or more compounds.

When the resin (A) is produced with the acid-stable monomer, the proportion of the acid-stable monomer can be adjusted based on the amount of the acid-labile monomer (a1). For example, the ratio of [the acid-labile monomer (a1)]:[the acid-stable monomer] is preferably 10 to 80 mol %:90 to 20 mol %, and more preferably 20 to 60 mol %:80 to 40 mol %

As the acid-stable monomer, a monomer having a hydroxy group or a lactone ring is preferable. When a resin containing the structural unit derived from the acid-stable monomer having hydroxy group (hereinafter such acid-stable resin may be referred to as "acid-stable monomer (a2)") or the acid-stable monomer having a lactone ring (hereinafter such acid-stable resin may be referred to as "acid-stable monomer (a3)") is used, the adhesiveness of resist to a substrate and resolution of resist tend to be improved.

<Acid-Stable Monomer (a2)>

The acid-stable monomer (a2) is preferably selected depending on the kinds of an exposure light source at producing the resist pattern.

For example, when KrF excimer laser lithography (248 nm), or high-energy irradiation such as electron beam or EUV light is used for the resist composition, using the acid-stable monomer having a phenolic hydroxy group (a2-0) such as hydroxystyrene as the acid-stable monomer (a2) having the hydroxy group is preferable.

When ArF excimer laser lithography (193 nm), i.e., short wavelength excimer laser lithography is used, using the acid-stable monomer having a hydroxy adamantyl group represented by the formula (a2-1) as the acid-stable monomer (a2) having the hydroxy group is preferable.

The acid-stable monomer (a2) having the hydroxy group may be used as a single compound or as a mixture of two or more compounds.

Examples of the acid-stable monomer (a2) having phenolic hydroxy group include styrene monomer represented by the formula (a2-0) (hereinafter the monomer may be referred to as "acid-stable monomer (a2-0)") such as p- or m-hydroxy-styrene.

(a2-0)

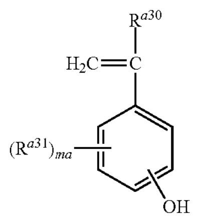

wherein $R^{a30}$ represents a hydrogen atom, a halogen atom or a $C_1$ to $C_6$ alkyl group that optionally has a halogen atom;

$R^{a31}$ in each occurrence independently represents a halogen atom, a hydroxy group, a $C_1$ to $C_6$ alkyl group, a $C_1$ to $C_6$ alkoxy group, a $C_2$ to $C_4$ acyl group, a $C_2$ to $C_4$ acyloxy group, an acryloyl group or methacryloyl group;

ma represents an integer 0 to 4.

In the formula (a2-0), examples of the alkyl group having a halogen atom of $R^{a30}$ include the same examples described in $R^{a32}$ of the formula (a1-4).

The alkyl group of $R^{a30}$ and $R^{a31}$ is preferably a $C_1$ to $C_4$ alkyl group, more preferably a $C_1$ to $C_2$ alkyl group, and still more preferably methyl group.

Examples of the alkoxy group of $R^{a31}$ include the same examples described in $R^{a33}$ of the formula (a1-4)

The alkoxy group of $R^{a31}$ is preferably a $C_1$ to $C_4$ alkoxy group, more preferably a $C_1$ to $C_2$ alkoxy group, and still more preferably methoxy group.

ma is preferably 0, 1 or 2, more preferably 0 or 1, and still more preferably 0.

When the resin (A) is produced using the acid-stable monomer (a2-0), a monomer in which the phenolic hydroxy group is protected by a protecting group can be used. Such protecting group may be a group which can be deprotected through contact with an acid or a base. Because the phenolic hydroxy group protected by the protecting group is deprotected through contact with the acid or the base, the acid-stable monomer (a2-0) can be easily obtained. However, because the resin (A) has the structural unit derived from the monomer having the acid-labile group (a1) as described above, when the phenolic hydroxy group protected by the protecting group is deprotected, the phenolic hydroxy group is preferably placed in contact with the base, so that the acid-labile group does not get seriously impaired. Examples of the protecting group which is deprotectable by the base include an acetyl group. Examples of the base include 4-dimethylaminopyrizine and triethylamine.

Specific examples of the acid-stable monomer (a2-0) include a monomer below.

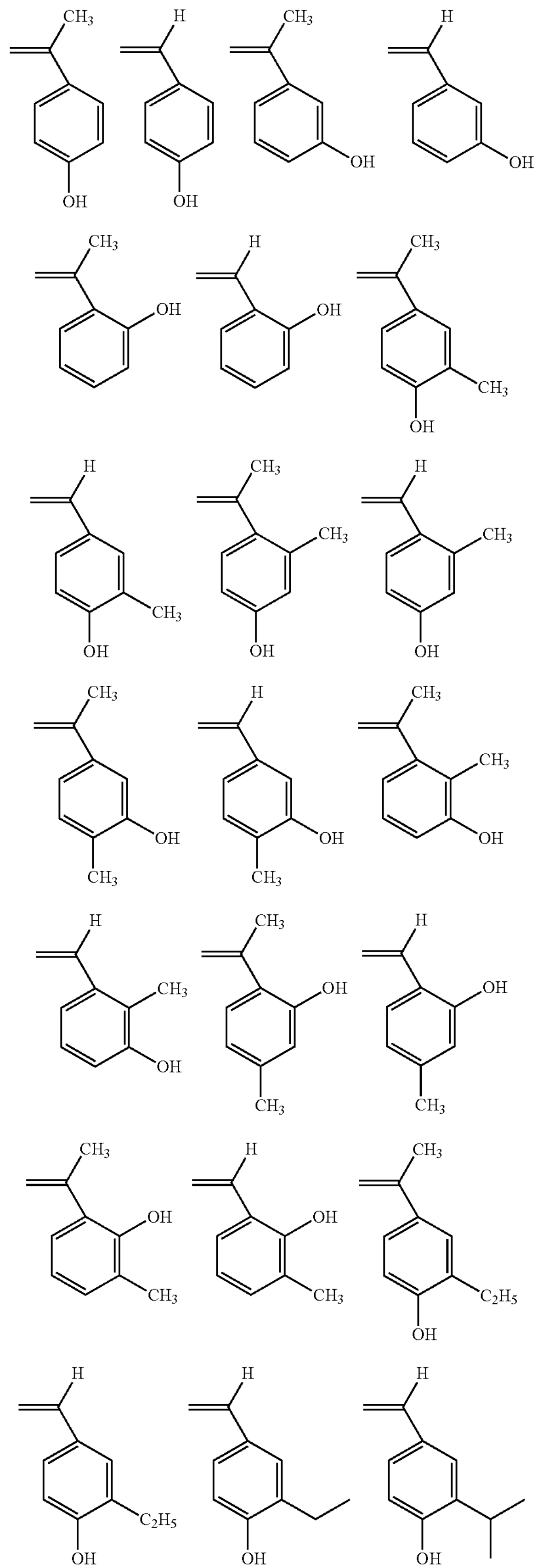

-continued

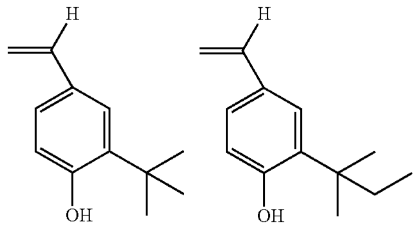

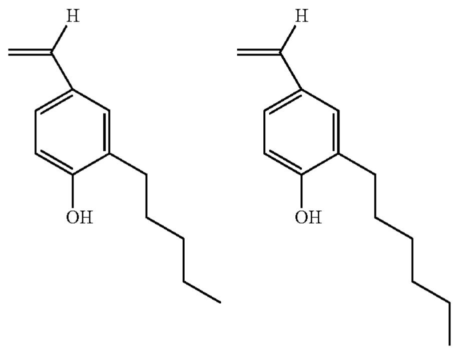

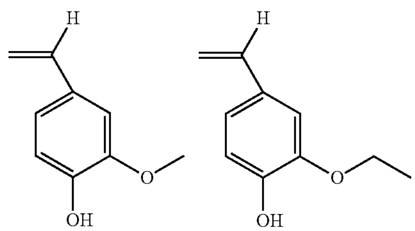

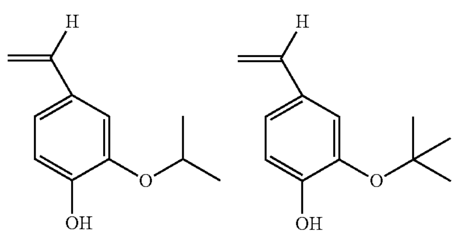

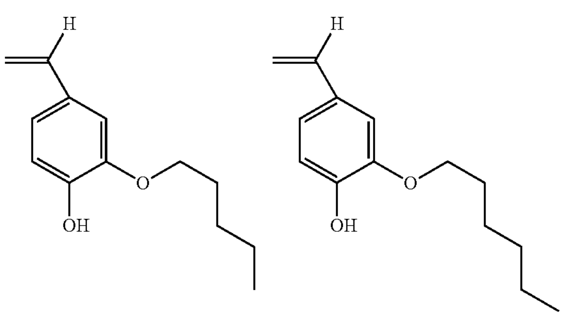

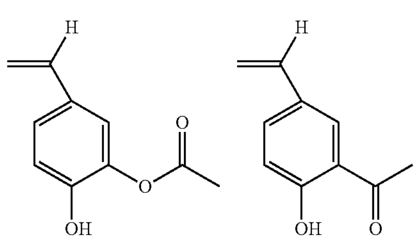

-continued

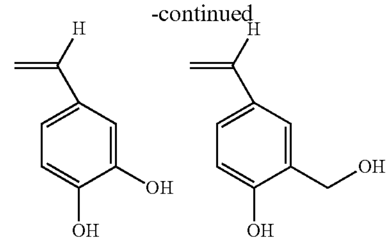

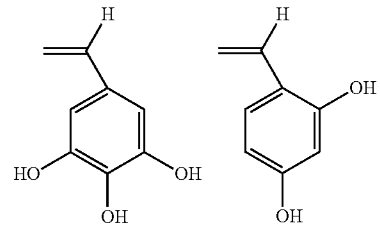

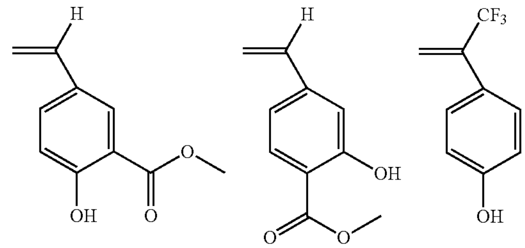

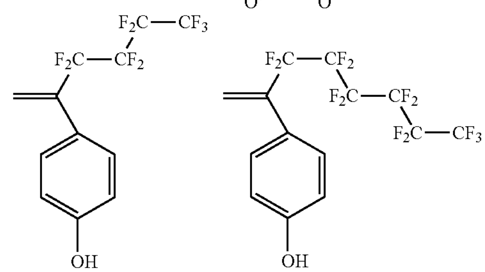

Among these, 4-hydroxystyrene and 4-hydroxy-α-methylstyrene are preferable. These 4-hydroxystyrene and 4-hydroxy-α-methylstyrene may be protected its phenolic hydroxy group by an appropriate protecting group.

When the resin (A) contains the structural unit derived from the monomer represented by the formula (a2-0), the proportion thereof is generally 5 to 95 mol %, preferably 10 to 80 mol %, and more preferably 15 to 80 mol %, with respect to the total structural units constituting the resin (A) (100 mol %).

Examples of the acid-stable monomer having a hydroxy adamantyl group include a monomer represented by the formula (a2-1) (hereinafter the monomer may be referred to as "acid-stable monomer (a2-1)").

(a2-1)

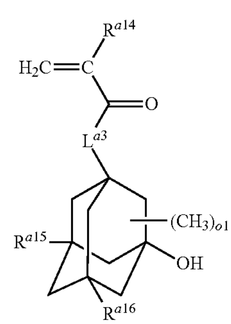

wherein $L^{a3}$ represents *—O— or *—O—$(CH_2)_{k2}$—CO—O—, k2 represents an integer of 1 to 7, * represents a bond to a carbonyl group (—CO—);

$R^{a14}$ represents a hydrogen atom or a methyl group;

$R^{a15}$ and $R^{a16}$ independently represent a hydrogen atom, a methyl group or a hydroxy group;

o1 represents an integer of 0 to 10.

In the formula (a2-1), $L^{a3}$ is preferably *—O—, *—O—$(CH_2)_{k2'}$—CO—O—, here k2' represents an integer of 1 to 4, and more preferably *—O— or *—O—$CH_2$—CO—O—, and still more preferably *—O—;

$R^{a14}$ is preferably a methyl group.

$R^{a15}$ is preferably a hydrogen atom.

$R^{a16}$ is preferably a hydrogen atom or a hydroxy group.

o1 is preferably an integer of 0 to 3, and more preferably an integer of 0 or 1.

Examples of the acid-stable monomer (a2-1) having the hydroxy adamantyl group include a monomer below. Among these, 3-hydroxyadamantane-1-yl(meth)acrylate, 3,5-dihydroxyadamantane-1-yl(meth)acrylate and 1-(3,5-dihydroxyadamantane-1-yl oxycarbonyl)methyl(meth)acrylate are preferable, and 3-hydroxyadamantane-1-yl(meth)acrylate and 3,5-dihydroxyadamantane-1-yl(meth)acrylate are more preferable, and 3-hydroxyadamantane-1-yl methacrylate and 3,5-dihydroxyadamantane-1-yl methacrylate are still more preferable.

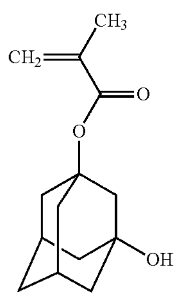
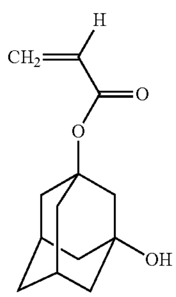
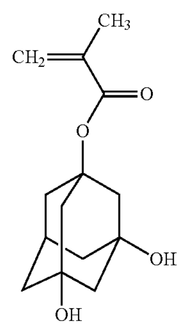
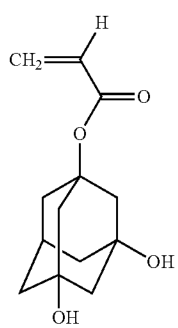
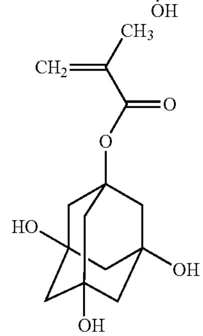
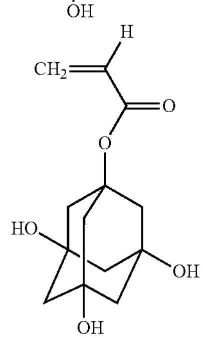
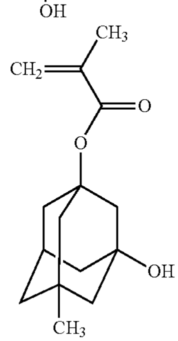

-continued

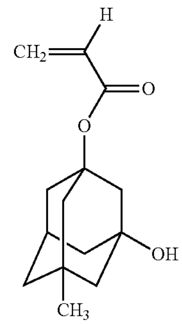
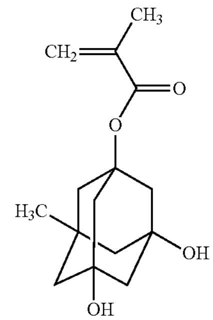
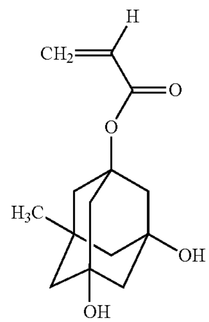
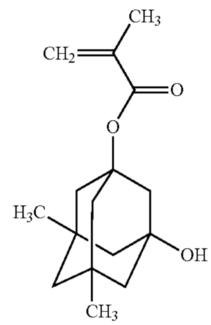
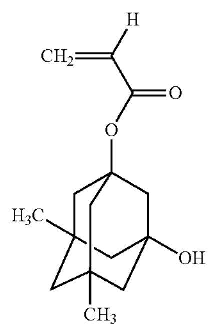
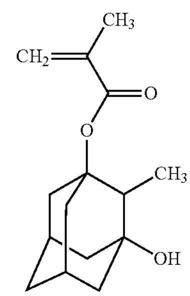
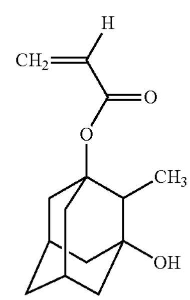
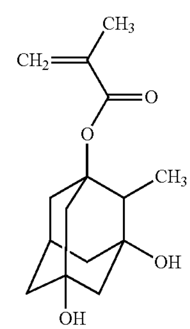
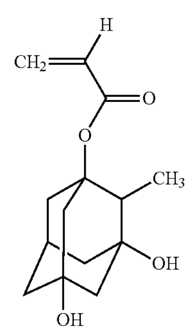
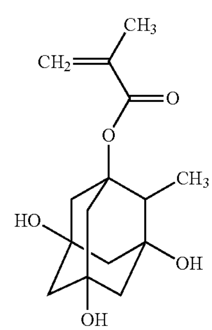

-continued
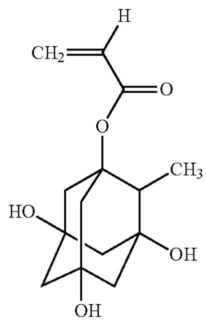
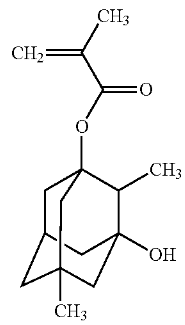
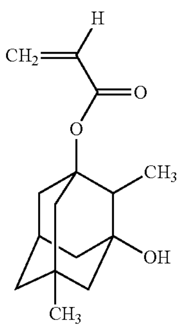
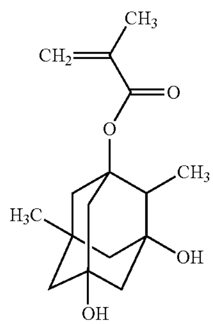
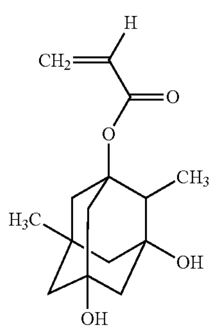
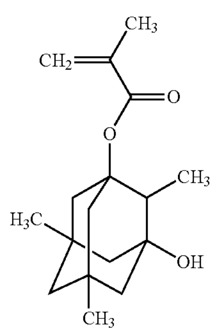
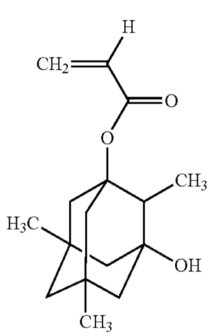
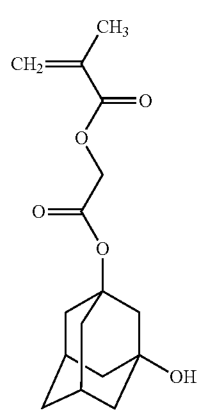
-continued
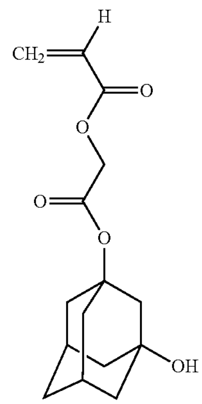
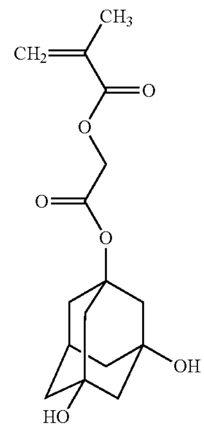
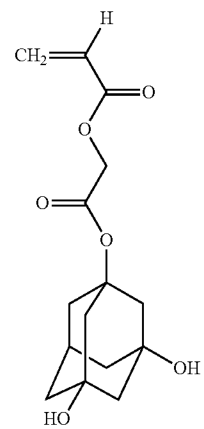
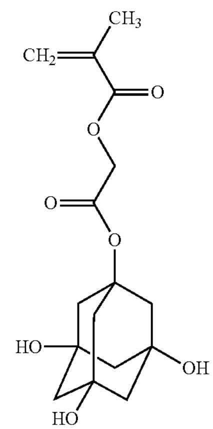
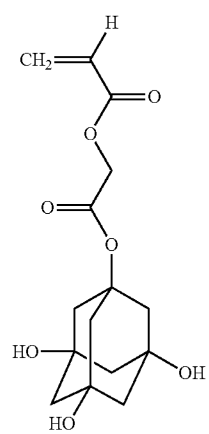
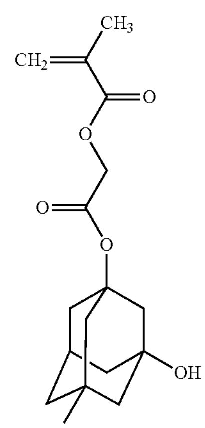
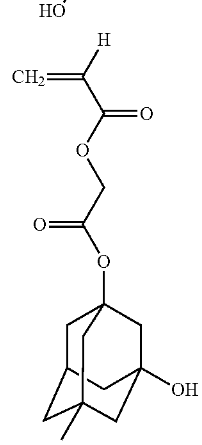
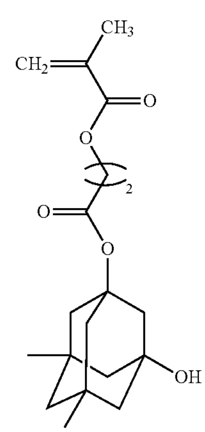

-continued

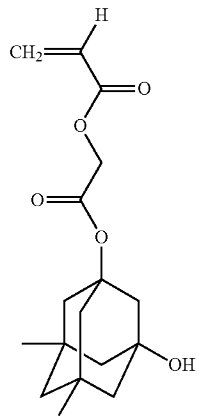

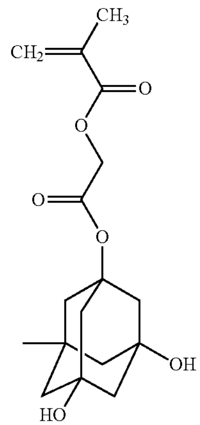

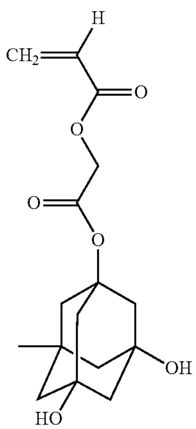

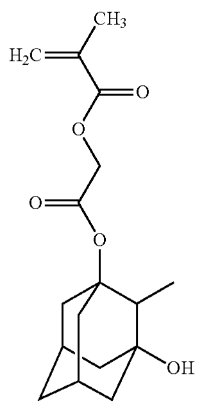

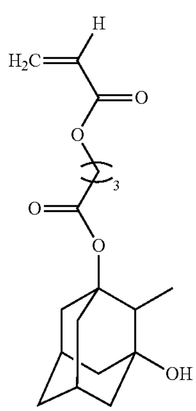

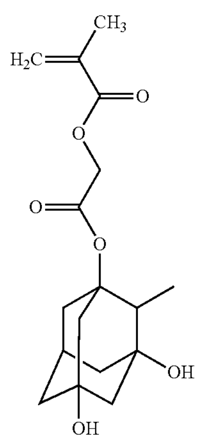

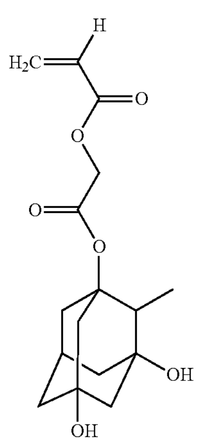

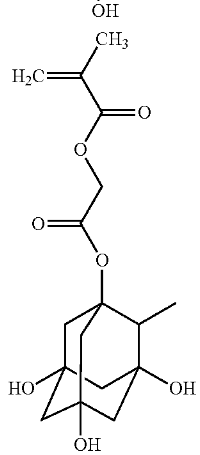

-continued

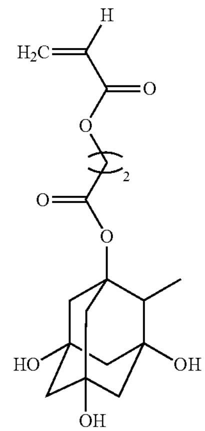

When the resin (A) contains the structural unit derived from the monomer represented by the formula (a2-1), the proportion thereof is generally 3 to 40 mol %, preferably 5 to 35 mol %, and more preferably 5 to 30 mol %, with respect to the total structural units constituting the resin (A) (100 mol %).

<Acid-Stable Monomer (a3)>

The lactone ring included in the acid-stable monomer (a3) may be a monocyclic compound such as β-propiolactone ring, γ-butyrolactone, δ-valerolactone, or a condensed ring with monocyclic lactone ring and other ring. Among these, γ-butyrolactone and condensed ring with γ-butyrolactone and other ring are preferable.

Examples of the acid-stable monomer (a3) having the lactone ring include monomers represented by any of the formula (a3-1), the formula (a3-2) or the formula (a3-3). Hereinafter these monomers may be referred to as "acid-stable monomer (a3-1)", "acid-stable monomer (a3-2)" or "acid-stable monomer (a3-3)". These monomers may be used as a single compound or as a mixture of two or more compounds.

(a3-1)

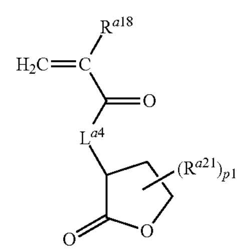

(a3-2)

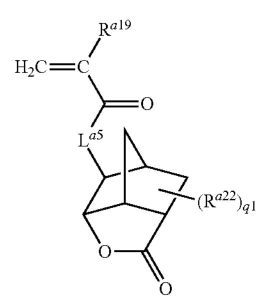

-continued (a3-3)

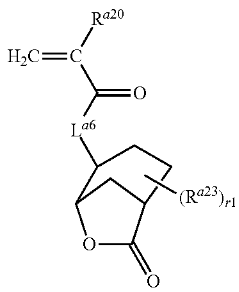

wherein $L^{a4}$, $L^{a6}$ and Lab independently represents *—O— or *—O—$(CH_2)_{k3}$—CO—O—, k3 represents an integer of 1 to 7, * represents a bond to a carbonyl group;

$R^{a18}$, $R^{a19}$ and $R^{a20}$ independently represent a hydrogen atom or a methyl group;

$R^{a21}$ in each occurrence represents a $C_1$ to $C_4$ alkyl group;

$R^{a22}$ and $R^{a23}$ in each occurrence independently represent a carboxy group, a cyano group or a $C_1$ to $C_4$ alkyl group;

p1 represents an integer of 0 to 5;

q1 and r1 independently represent an integer of 0 to 3.

In the formulae (a3-1) to (a3-3), $L^{a4}$ to Lab is independently preferably *—O—, *—O—$(CH_2)_{k3'}$, —CO—O—, here k3' represents an integer of 1 to 4, more preferably *—O— or *—O—$CH_2$—CO—O—, and still more preferably *—O—.

$R^{a18}$ to $R^{a20}$ is preferably a methyl group.

$R^{a21}$ is preferably a methyl group.

$R^{a22}$ and $R^{a23}$ are independently preferably a carboxy group, a cyano group or a methyl group.

p1, q1 and r1 are independently preferably an integer of 0 to 2, and more preferably 0 or 1.

Examples of the acid-stable monomers having γ-butyrolactone ring (a3-1) include a monomer below.

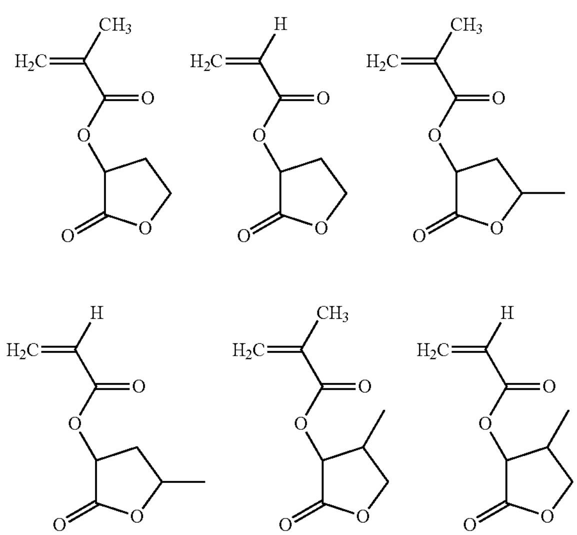

-continued

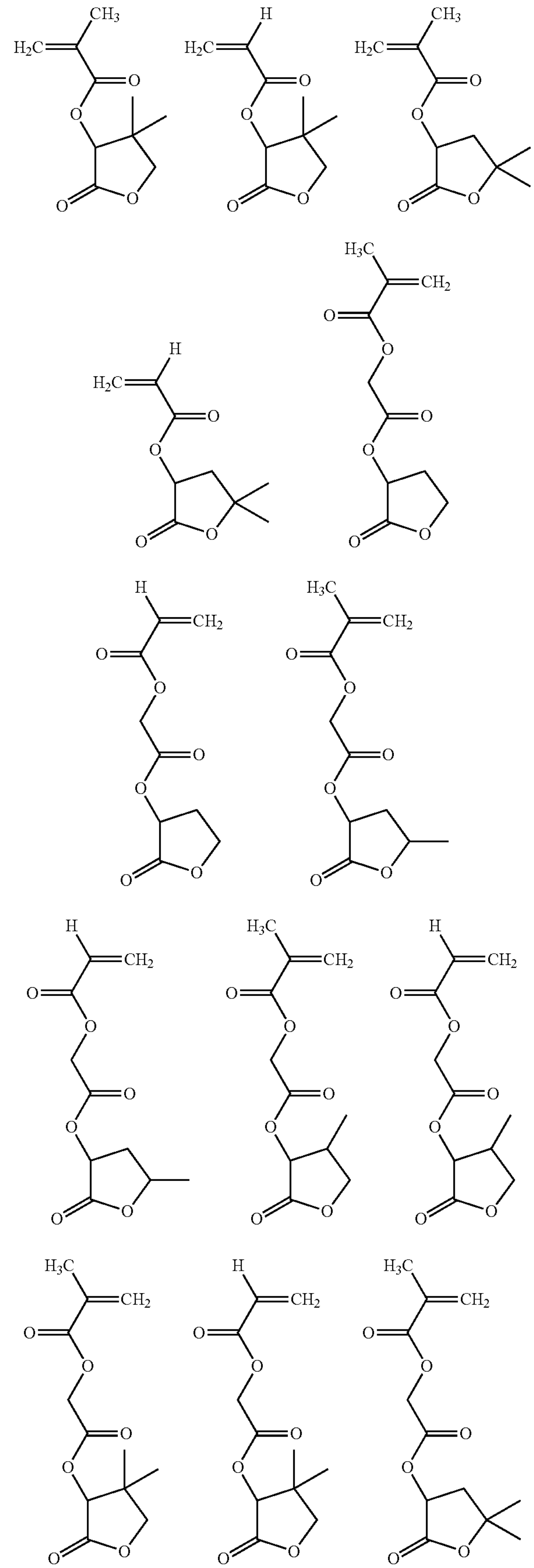

-continued
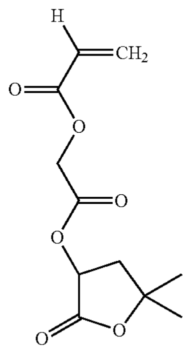
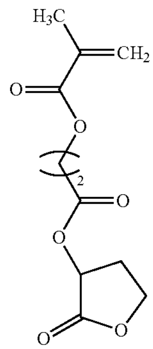
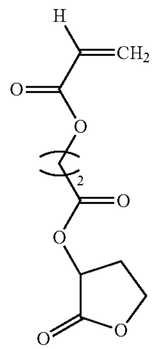
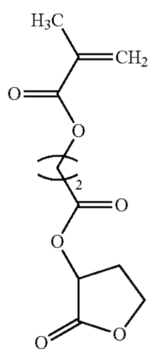
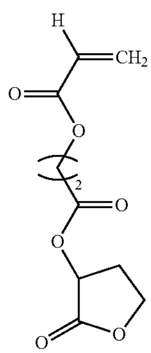
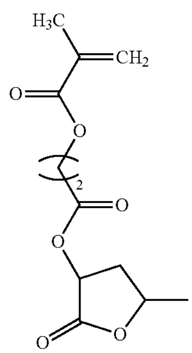
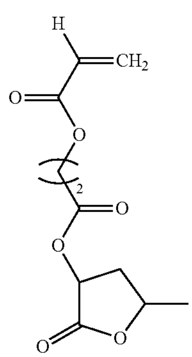
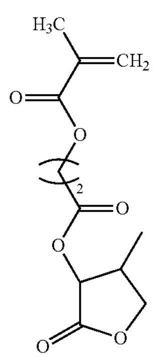
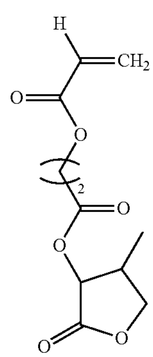
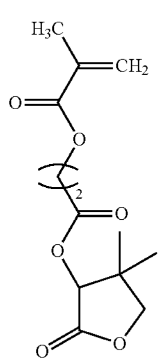
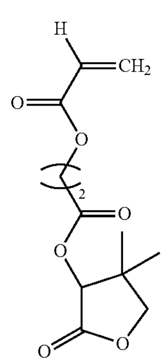
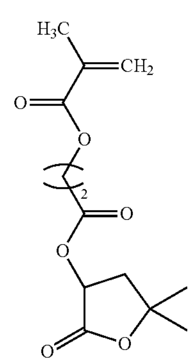
-continued
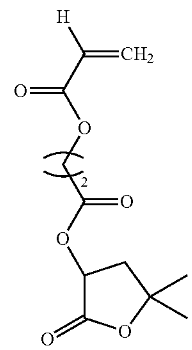
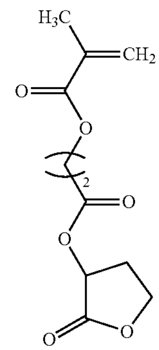
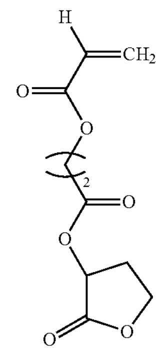
Examples of the acid-stable monomers having γ-butyrolactone ring and norbornene ring (a3-2) include a monomer below.
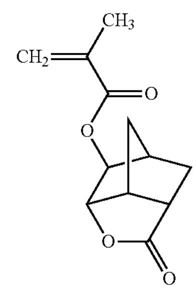
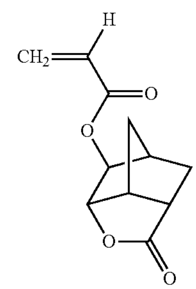
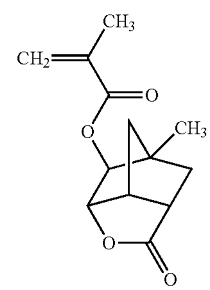
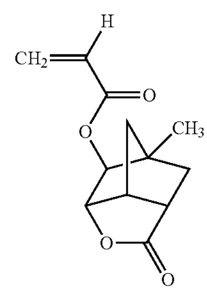
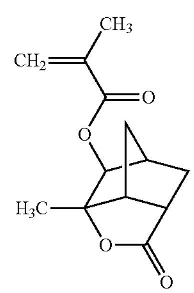
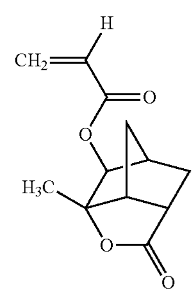
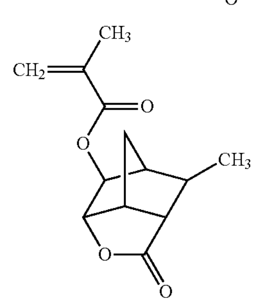
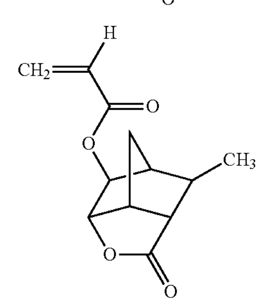

-continued
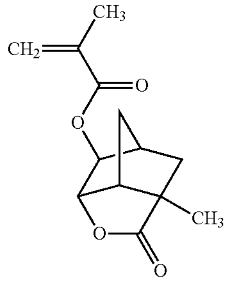
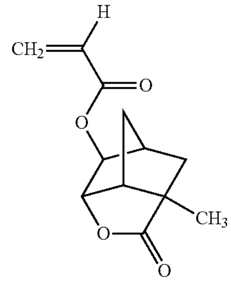
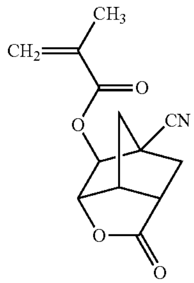
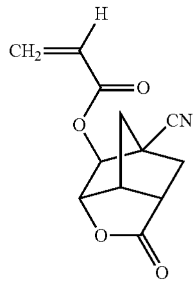
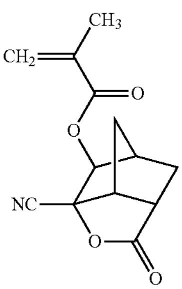
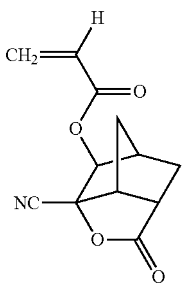
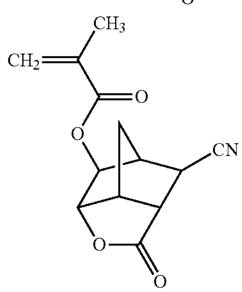
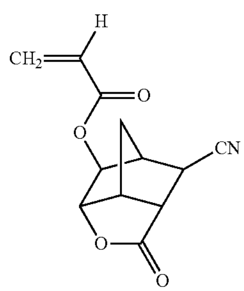
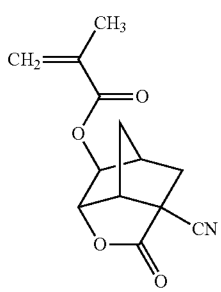
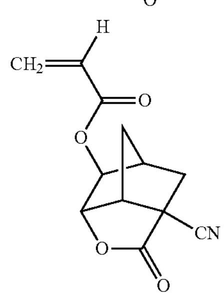
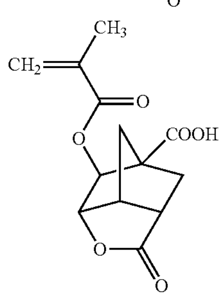
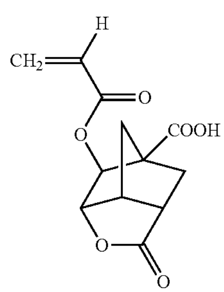
-continued
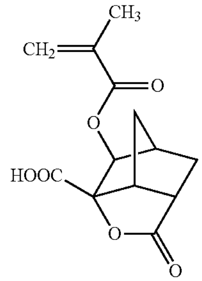
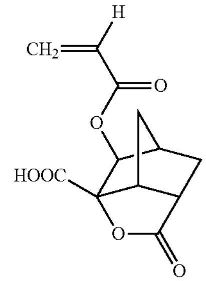
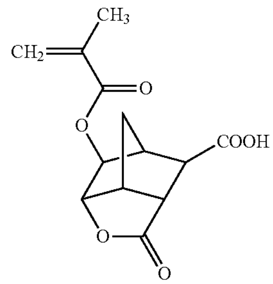
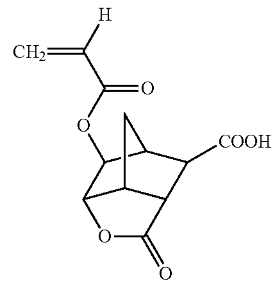
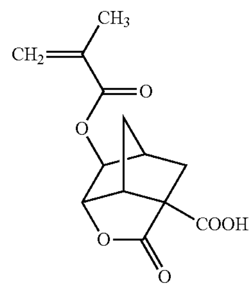
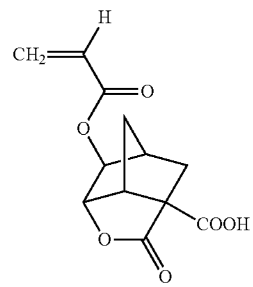
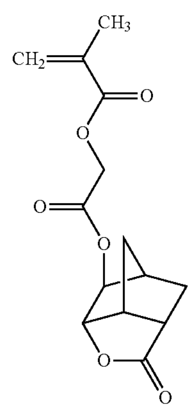
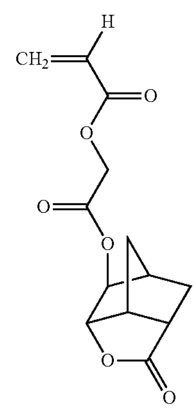
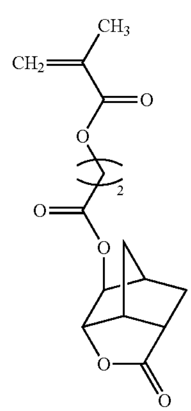
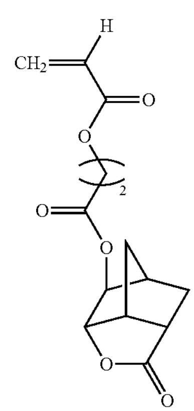

-continued
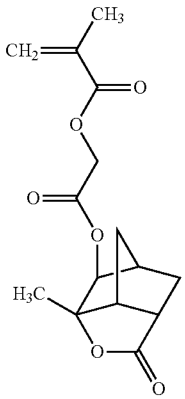
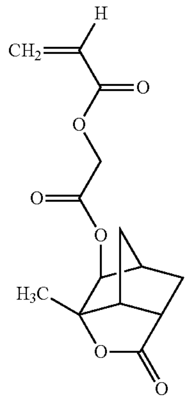
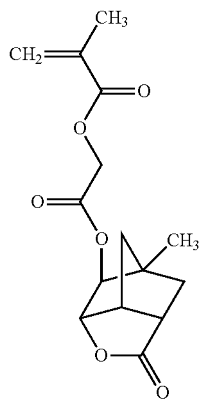
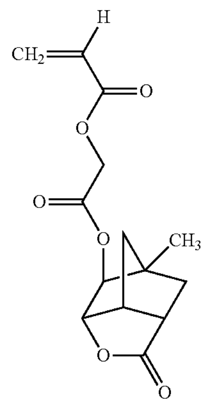
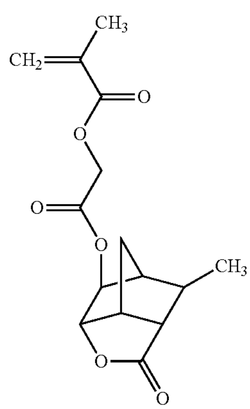
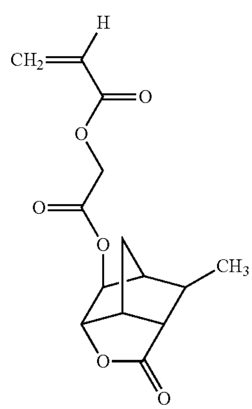
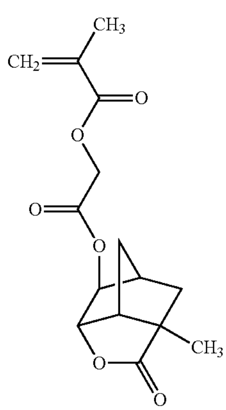
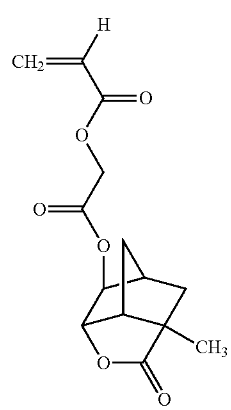
-continued
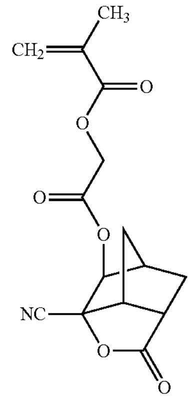
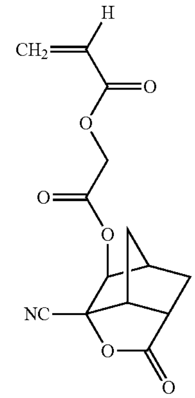
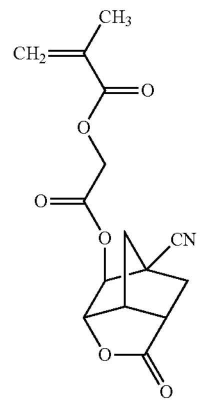
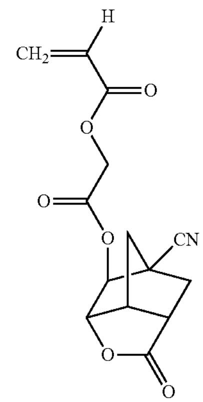
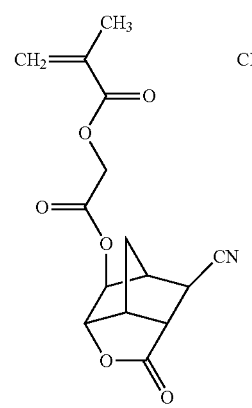
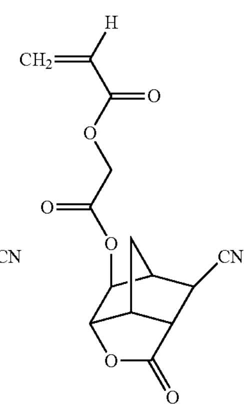
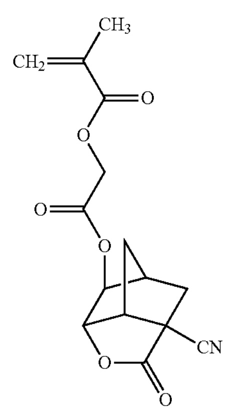
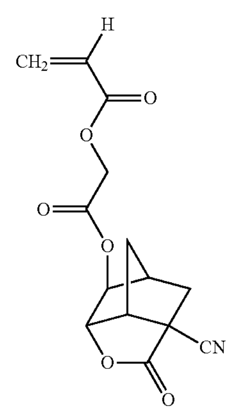

-continued
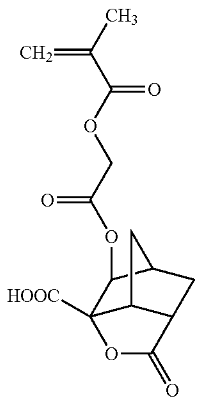
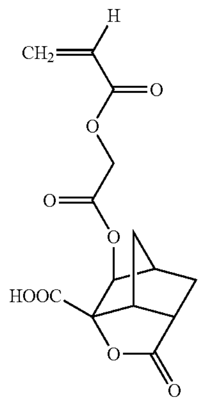
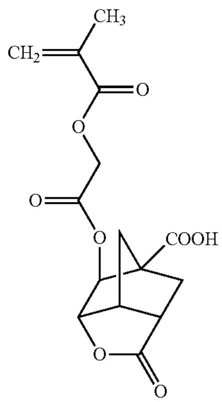
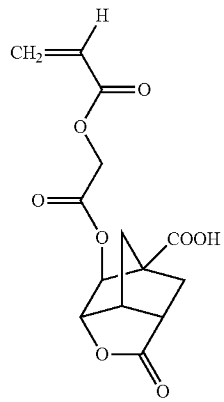
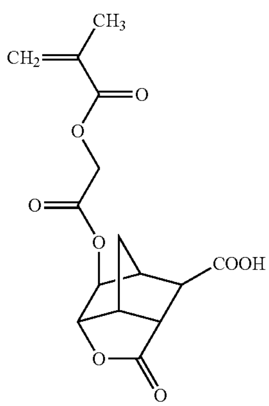
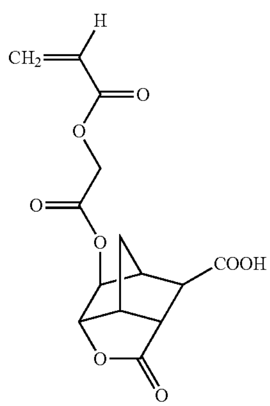
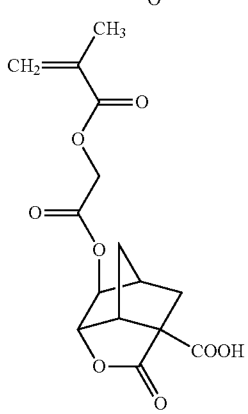
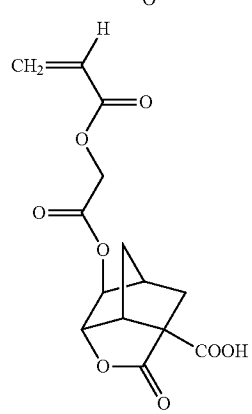
Examples of the acid-stable monomers having a condensed ring with γ-butyrolactone ring and cyclohexane ring (a3-3) include a monomer below.
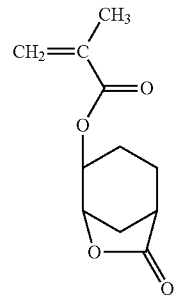
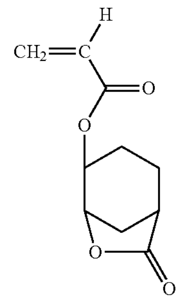
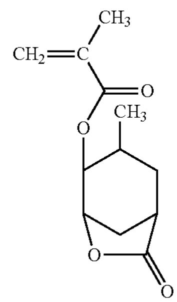
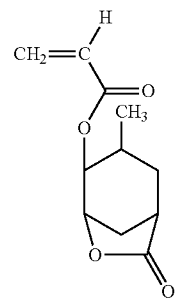
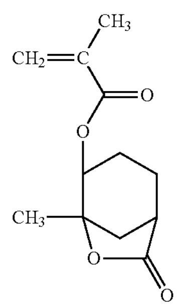
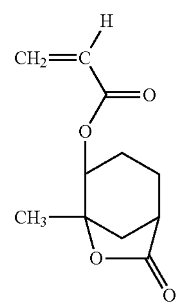
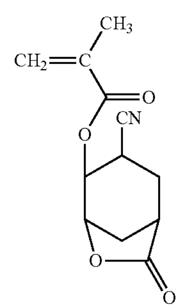
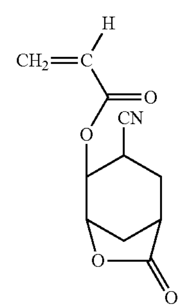
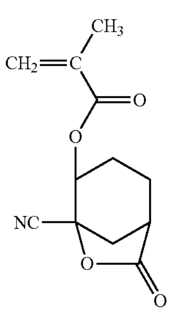
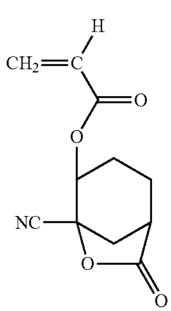

-continued
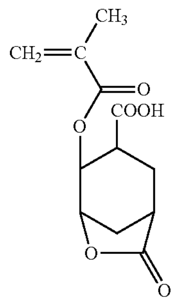
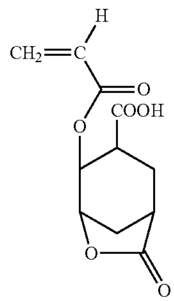
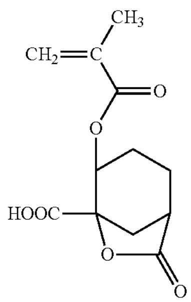
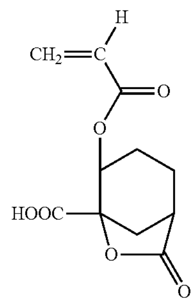
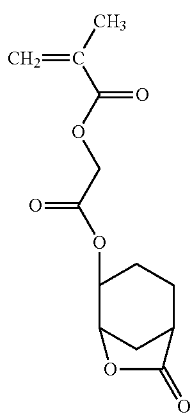
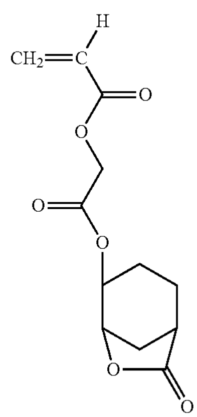
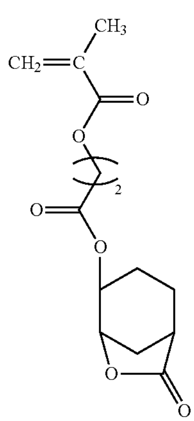
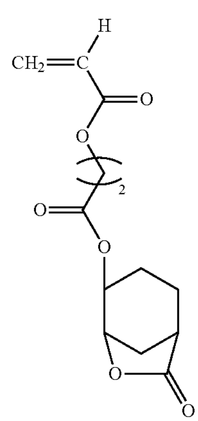
-continued
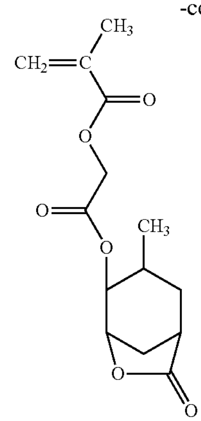
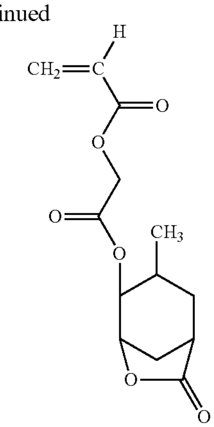
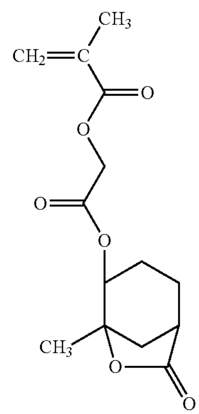
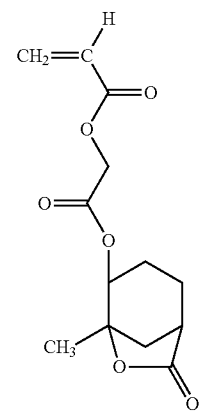
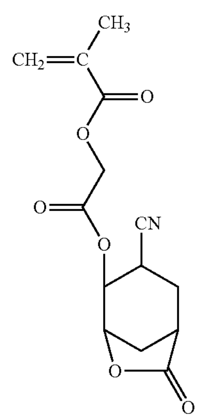
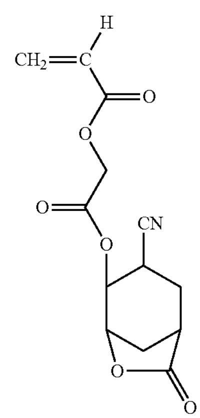
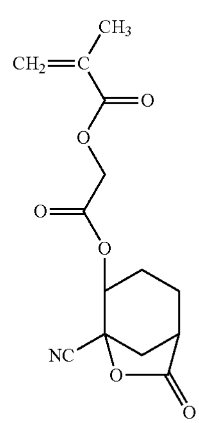
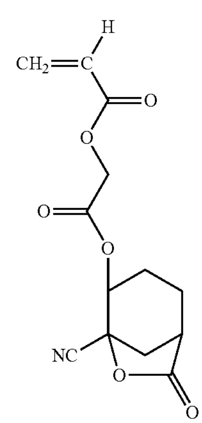

-continued

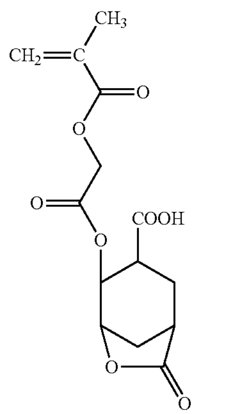
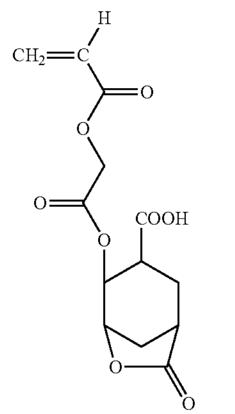
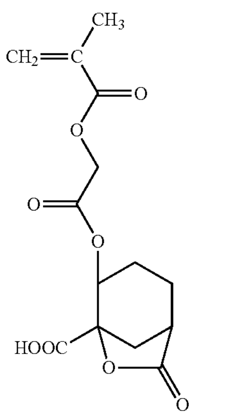
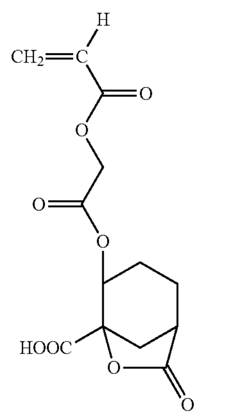

Among the acid-stable monomer having lactone ring (a3), (5-oxo-4-oxatricyclo[4.2.1.0$^{3,7}$]nonane-2-yl)(meth)acrylate, tetrahydro-2-oxo-3-furyl(meth)acrylate, and 2-(5-oxo-4-oxatricyclo[4.2.1.0$^{3,7}$]nonane-2-yloxy)-2-oxoethyl(meth)acrylate are preferable, and the (meth)acrylate compounds are more preferable.

When the resin (A) contains the structural unit derived from the monomer represented by the formula (a3-1), the structural unit derived from the monomer represented by the formula (a3-2) and/or the structural unit derived from the monomer represented by the formula (a3-3), the total proportion thereof is preferably 5 to 60 mol %, more preferably 5 to 50 mol %, still more preferably 10 to 40 mol % and further more preferably 15 to 40 mol %, with respect to the total structural units constituting the resin (A) (100 mil %).

When the resin (A) contains the structural unit derived from the monomer represented by the formula (a3-1), the structural unit derived from the monomer represented by the formula (a3-2) and the structural unit derived from the monomer represented by the formula (a3-3), the proportion thereof is generally 5 to 60 mol %, preferably 10 to 55 mol %, and more preferably 20 to 50 mol %, respectively, with respect to the total structural units constituting the resin (A) (100 mol %).

<Acid-Stable Monomer (a4)>

The acid-stable monomer (a4) has a group represented by the formula (3) below.

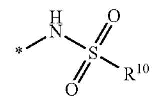
(3)

wherein $R^{10}$ represents a $C_1$ to $C_6$ fluorinated alkyl group; * represents a bond.

Examples of the fluorinated alkyl group of $R^{10}$ include difluoromethyl, trifluoromethyl, 1,1-difluoroethyl, 2,2-difluoroethyl, 2,2,2-trifluoroethyl, perfluoroethyl, 1,1,2,2-tetrafluoropropyl, 1,1,2,2,3,3-hexafluoropropyl, perfluoroethylmethyl, 1-(trifluoromethyl)-1,2,2,2-tetratrifluoroethyl, perfluoropropyl, 1,1,2,2-tetrafluorobutyl, 1,1,2,2,3,3-hexafluorobutyl, 1,1,2,2,3,3,4,4-octafluorobutyl, perfluorobutyl, 1,1-bis(trifluoro)methyl-2,2,2-trifluoroethyl, 2-(perfluoropropyl)ethyl, 1,1,2,2,3,3,4,4-octafluoropentyl, perfluoropentyl, 1,1,2,2,3,3,4,4,5,5-decafluoropentyl, 1,1-bis(trifluoromethyl)-2,2,3,3,3-pentafluoropropyl, 2-(perfluorobutyl)ethyl, 1,1,2,2,3,3,4,4,5,5-decafluorohexyl, 1,1,2,2,3,3,4,4,5,5,6,6-dodecafluorohexyl, perfluoropentylmethyl and perfluorohexyl groups.

The fluorinated alkyl group of $R^{10}$ preferably has 1 to 4 carbon atom, more preferably trifluoromethyl, perfluoroethyl and perfluoropropyl groups, and still more preferably trifluoromethyl group.

Specific examples of the acid stable monomer (a4) having the group represented by the formula (3) include a monomer below.

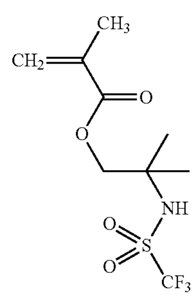
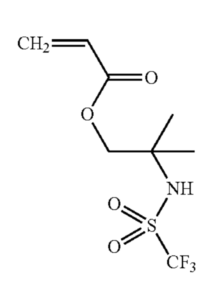
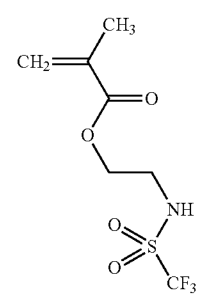
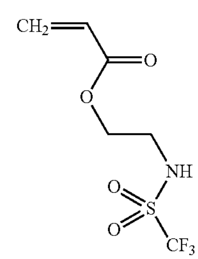

-continued
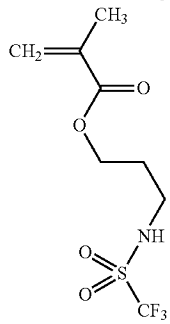
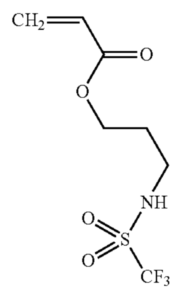
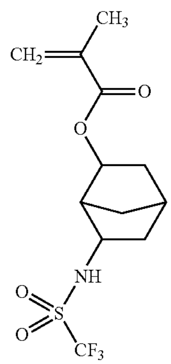
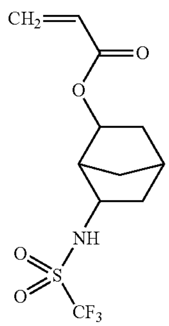
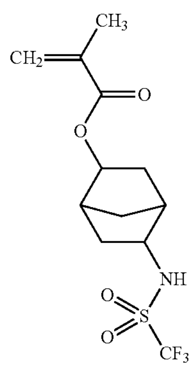
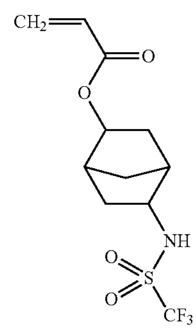
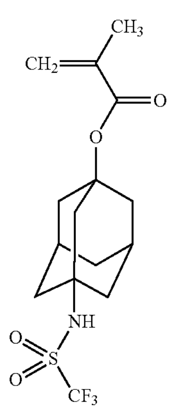
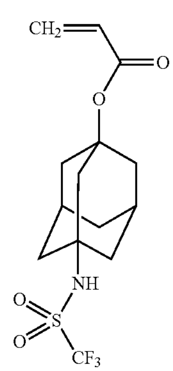
-continued
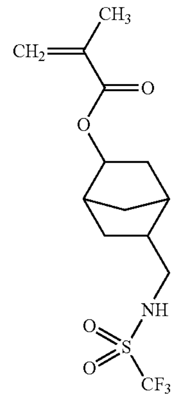
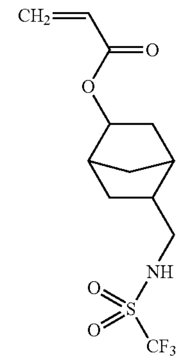
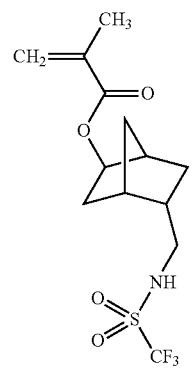
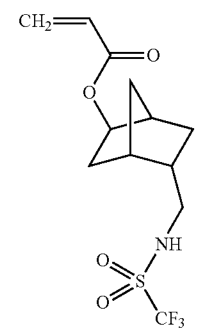
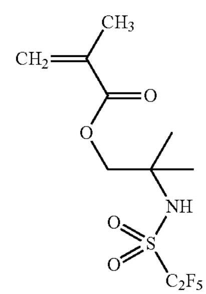
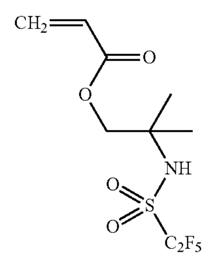
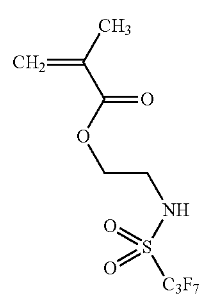
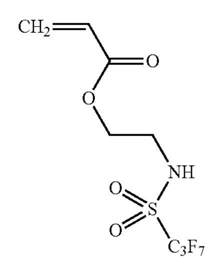
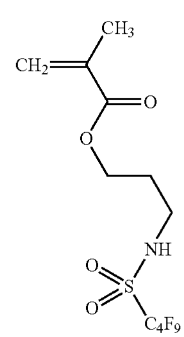
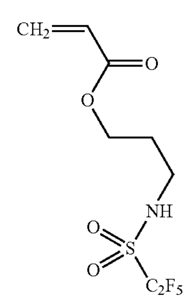

-continued

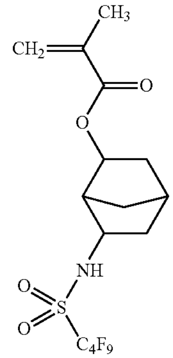
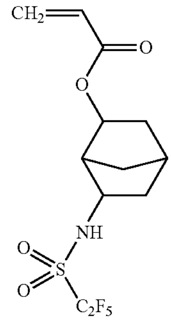
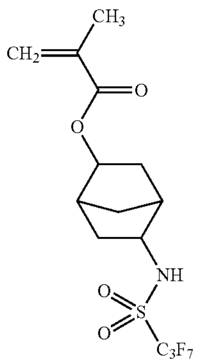
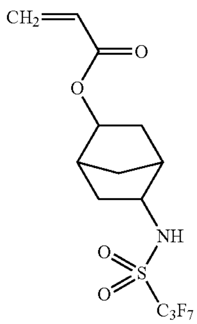
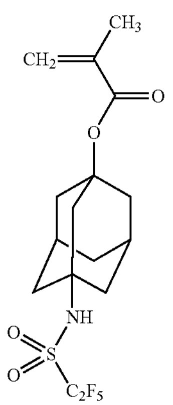
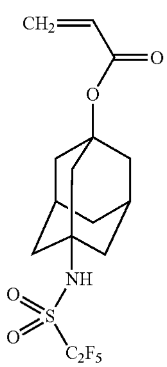
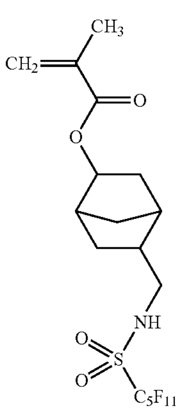
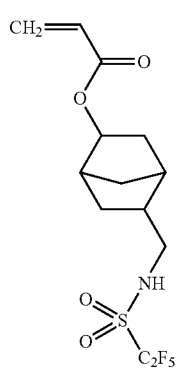

-continued

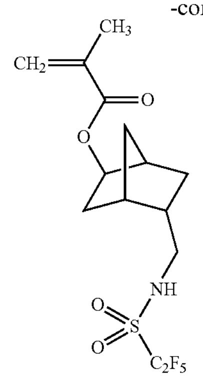
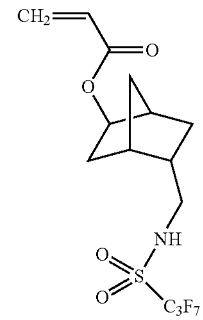
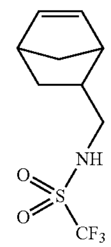
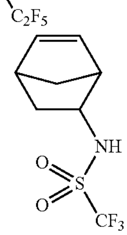
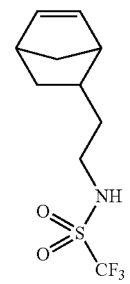
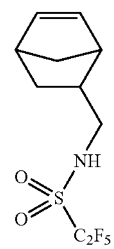
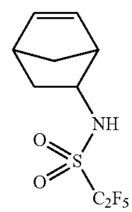
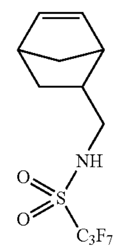
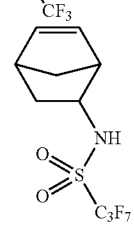

When the resin (A) contains the structural unit derived from the acid-stable monomer represented by the formula (a4) having the group represented by the formula (3), the proportion thereof is generally 1 to 30 mol %, preferably 3 to 25 mol %, and more preferably 5 to 20 mol %, with respect to the total structural units (100 mol %) of the resin (A).

<Acid-Stable Monomer (a5)>

The acid-stable monomer (a5) has a group represented by the formula (4).

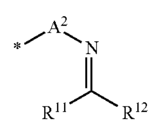

(4)

wherein $R^{11}$ represents an optionally substituted $C_6$ to $C_{12}$ aromatic hydrocarbon group;

$R^{12}$ represents an optionally substituted $C_1$ to $C_{12}$ hydrocarbon group, the hydrocarbon group may be contain a hetero atom;

$A^2$ represents a single bond, —$(CH_2)_{m10}$—$SO_2$—O—* or —$(CH_2)_{m10}$—CO—O—*, a —$CH_2$— contained in the [—$(CH_2)_{m10}$—] may be replaced by —O—, —CO— or —$SO_2$—, a hydrogen atom contained in the [—$(CH_2)_{m10}$—] may be replaced by a fluorine atom;

m10 represents an integer 1 to 12.

Examples of the aromatic hydrocarbon group of $R^{11}$ include the same examples described above.

A hydrogen atom contained in the aromatic hydrocarbon group may be replaced by a $C_1$ to $C_4$ alkyl group, a halogen atom, a phenyl group, a nitro group, a cyano group, a hydroxy group, a phenyloxy group and tert-butylphenyl group.

Specific examples of the preferable group for $R^{11}$ include a group below. * represents a bond to carbon atom.

($R^{11}$-1)

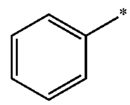

($R^{11}$-2)

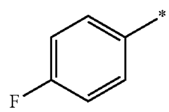

($R^{11}$-3)

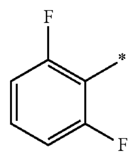

($R^{11}$-4)

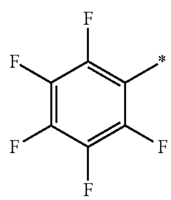

($R^{11}$-5)

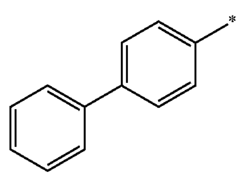

($R^{11}$-6)

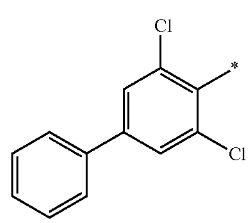

($R^{11}$-7)

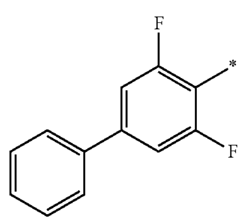

($R^{11}$-8)

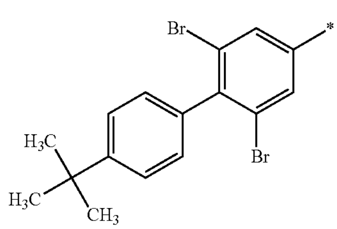

-continued ($R^{11}$-9)

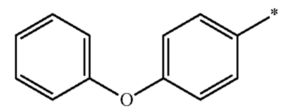

($R^{11}$-10)

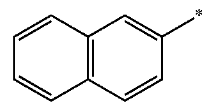

($R^{11}$-11)

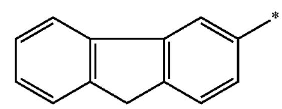

($R^{11}$-12)

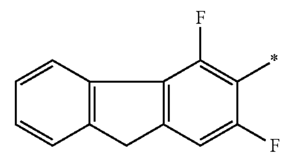

($R^{11}$-13)

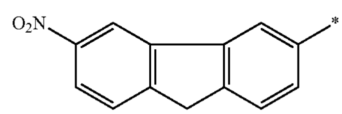

($R^{11}$-14)

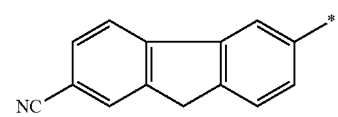

The hydrocarbon group of $R^{12}$ may be any of a chain aliphatic hydrocarbon group, an alicyclic hydrocarbon group and an aromatic hydrocarbon group.

Typical examples of the aliphatic hydrocarbon group are an alkyl group, and examples of the alkyl group include the same groups of $R^{a34}$ and $R^{a35}$ in the formula (a1-4).

When $R^{12}$ is an aliphatic hydrocarbon group or an alicyclic hydrocarbon group, these may contain a hetero atom. Examples of the hetero atom include a halogen atom, a sulfur atom, an oxygen atom and a nitrogen atom, and may include a configuration of linking group such as a sulfonyl group and a carbonyl group.

Specific examples of $R^{12}$ containing such hetero atom include a group below.

$*—CF_3$ ($R^{12}$-1)

$*—CN$ ($R^{12}$-2)

$*—CH_3$ ($R^{12}$-3)

$*—CF_2CH_3$ ($R^{12}$-4)

$*—CF_2CF_3$ ($R^{12}$-5)

$*—CF_2CF_2CF_3$ ($R^{12}$-6)

$*—CF_2C_2H_5$ ($R^{12}$-7)

$*—CF_2CF_2CF_2—CO_2—CH_3$ ($R^{12}$-8)

-continued
(R12-9)
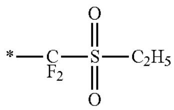
(R12-10)
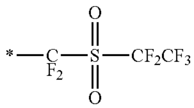
(R12-11)
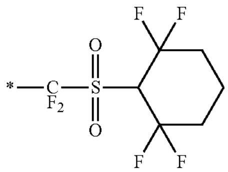
(R12-12)
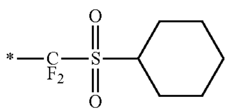
(R12-13)
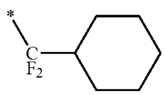
(R12-14)
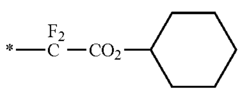
(R12-15)
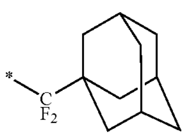
(R12-16)
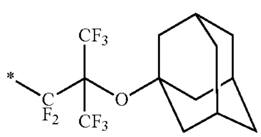
(R12-17)
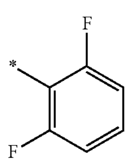
(R12-18)
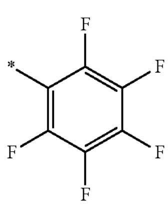
When $R^{12}$ is an aromatic hydrocarbon group, specific examples thereof include the same examples described above.
Specific examples of $A^2$ include a group below.
($A^2$-1)
($A^2$-2)
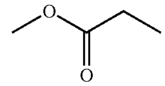
($A^2$-3)
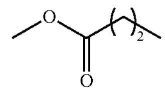
($A^2$-4)
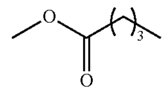
($A^2$-5)
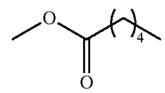
($A^2$-6)
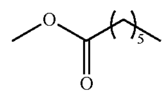
($A^2$-7)
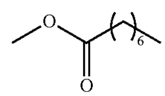
($A^2$-8)
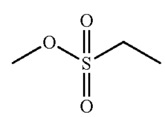
($A^2$-9)
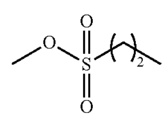
($A^2$-10)
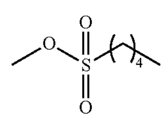
($A^2$-11)
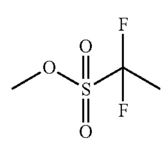
($A^2$-12)
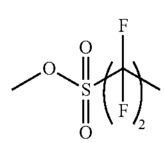
($A^2$-13)
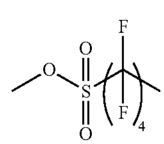

-continued (A$^2$-14)

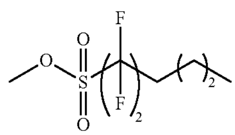

(A$^2$-15)

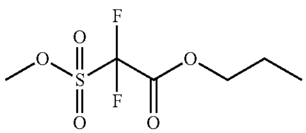

(A$^2$-16)

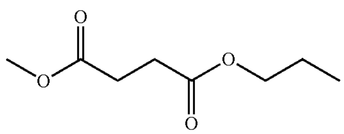

An acid-stable monomer (a5) containing a group represented by the formula (4) include an acid-stable monomer represented by the formula (a5-1).

(a5-1)

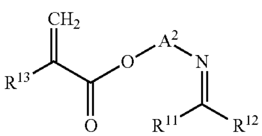

wherein $R^{13}$ represents a hydrogen atom or a methyl group; $R^{11}$, $R^{12}$ and $A^2$ are the same meanings described above.

Specific examples of the acid-stable monomer (a5-1) include a monomer below.

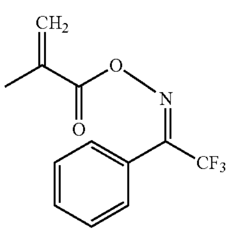

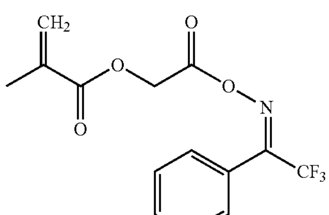

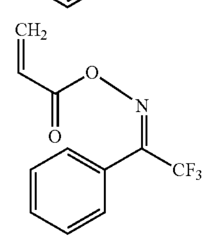

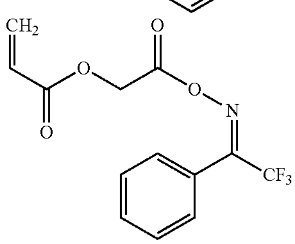

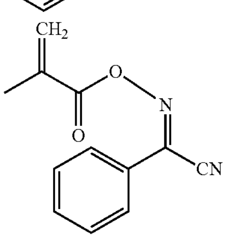

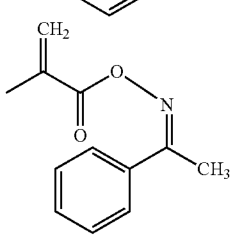

-continued

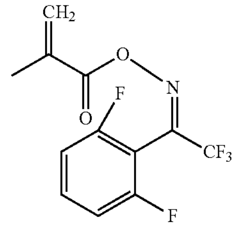

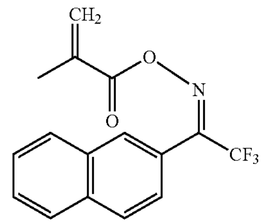

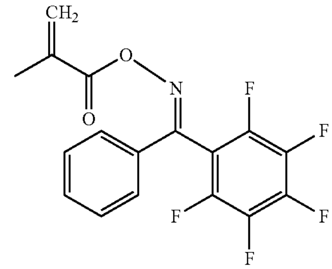

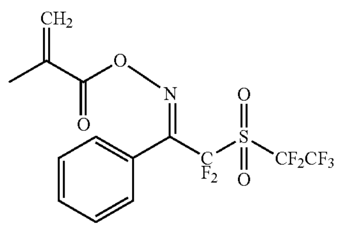

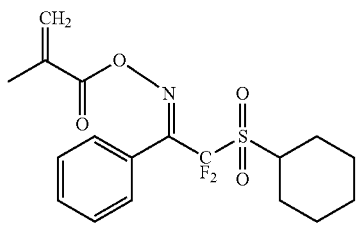

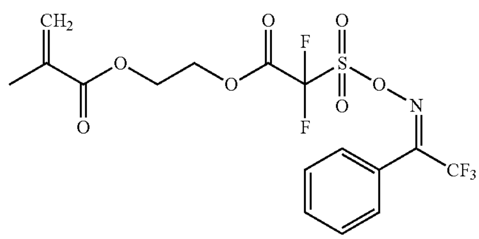

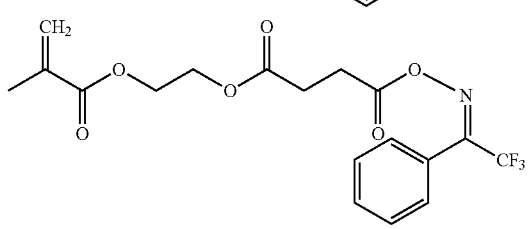

When the resin (A) contains the structural unit derived from the monomer represented by the formula (a5-1), the proportion thereof is generally 1 to 30 mol %, preferably 3 to 25 mol %, and more preferably 5 to 20 mol %, with respect to the total structural units (100 mol %) constituting the resin (A).

<Acid-Stable Monomer (a6)>

The acid-stable monomer (a6) is a (meth)acrylic monomer having an alicyclic hydrocarbon group such as a monomer represented by the formula (a6-1).

(a6-1)

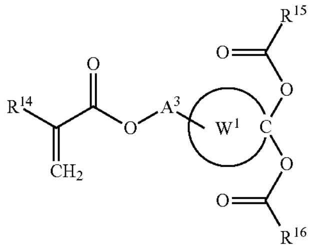

wherein ring $W^1$ represents a $C_3$ to $C_{36}$ alicyclic hydrocarbon ring;

$A^3$ represents a single bond or an $C_1$ to $C_{17}$ divalent aliphatic hydrocarbon group, and a —$CH_2$— contained in the aliphatic hydrocarbon group may be replaced by —O— or —CO—, provided that an atom bonded to —O— is a carbon atom;

$R^{14}$ represents a $C_1$ to $C_6$ alkyl group that optionally has a halogen atom, a hydrogen atom or a halogen atom;

$R^{15}$ and $R^{16}$ independently represent a $C_1$ to $C_6$ alkyl group that optionally has a halogen atom.

The alicyclic hydrocarbon group of ring $W^1$ includes a monocyclic or polycyclic hydrocarbon group, preferably a $C_5$ to $C_{18}$ alicyclic hydrocarbon group, and more preferably a $C_6$ to $C_{12}$ alicyclic hydrocarbon group. Examples thereof include a ring represented by the formula (KA-1) to the formula (KA-22). That is, the group illustrated below

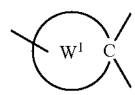

in the formula (a6-1) is a group in which one hydrogen atom bonded to an atom constituting any one of the ring represented by the formula (KA-1) to the formula (KA-22) is replaced with a bond to $A^3$, and other two hydrogen atoms bonded to another atom constituting the ring are replaced respectively with a bond to —O—CO—$R^{15}$ and a bond to —O—CO—$R^{16}$.

Examples of the ring $W^1$ preferably include a cyclohexane ring, an adamantane ring, a norbornene ring and a norbornane ring.

Examples of the divalent aliphatic hydrocarbon group of $A^3$ include a divalent chain alkanediyl group and a divalent alicyclic hydrocarbon group described above, and a combination thereof.

Examples of the combination of the alkanediyl group and the alicyclic hydrocarbon group include groups below.

($X^x$-A)

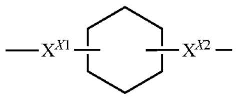

($X^x$-B)

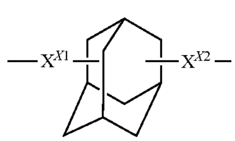

-continued ($X^x$-C)

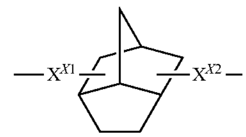

wherein $X^{X1}$ and $X^{X2}$ independently represent a $C_1$ to $C_6$ alkanediyl group or a single bond, provided that both of $X^{X1}$ and $X^{X2}$ are not a single bond, and the total carbon number of the group is 17 or less, respectively.

The aliphatic hydrocarbon group of $A^3$ may have a substituent.

Examples of $A^3$ in which a —$CH_2$— contained in the aliphatic hydrocarbon group is replaced by —O— or —CO— include, for example, the same example of the group (a-1) in the formula (I).

$A^3$ is preferably a single bond or a group represented by *—$(CH_2)$—CO—O—, s1 represents an integer of 1 to 6, * represent a bond, and more preferably a single bond or *—$CH_2$—CO—O—.

$R^{14}$ is preferably a hydrogen atom or a methyl group.

The halogen atom of $R^{14}$ to $R^{16}$ is preferably fluorine atom.

Examples of the alkyl group having a halogen atom include trifluoromethyl, perfluoroethyl, perfluoropropyl, perfluoroisopropyl and perfluorobutyl groups. Among these, trifluoromethyl, perfluoroethyl and perfluoropropyl are preferable.

Examples of the acid-stable monomer (a6-1) include acid-stable monomers below. $R^{14}$ to $R^{16}$ and $A^3$ are the same meaning defined above.

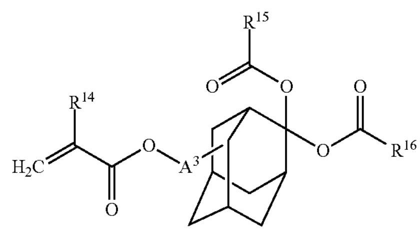

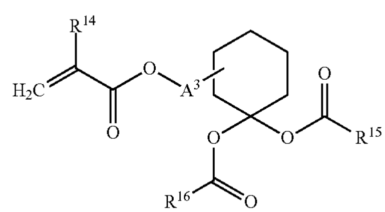

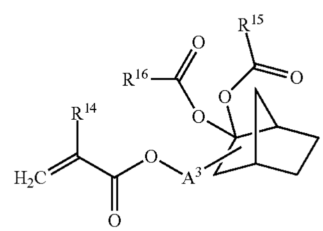

Among these, acid-stable monomers (a6-1) represented by the formula below are preferable.

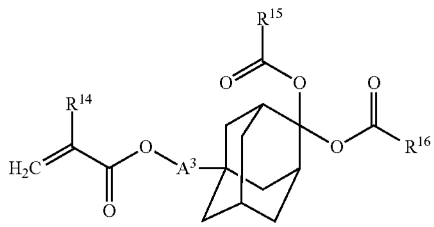
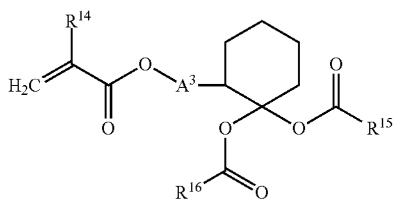
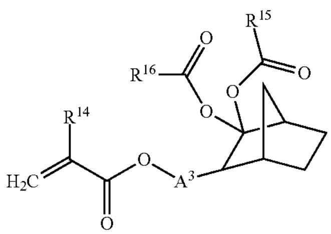
Specific examples of the acid-stable monomer (a6-1) include acid-stable monomer below.
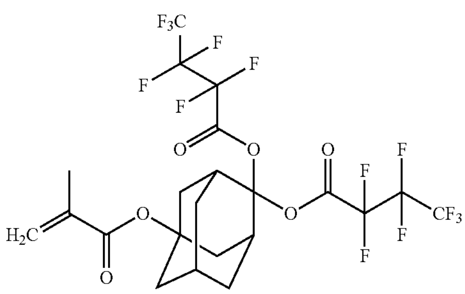
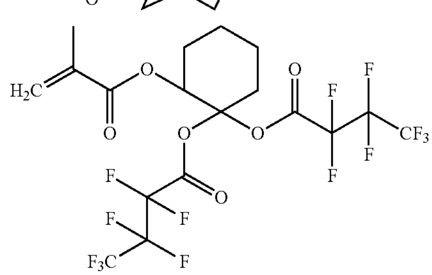
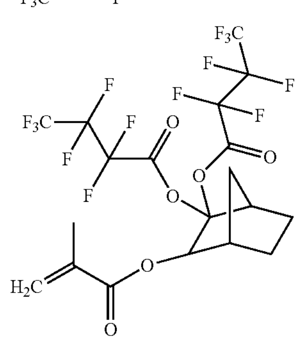
-continued
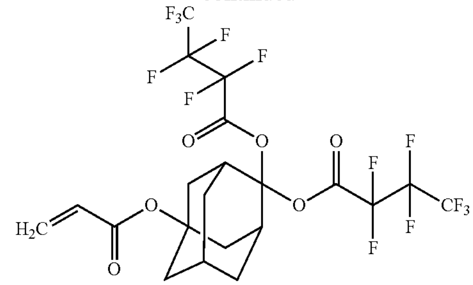
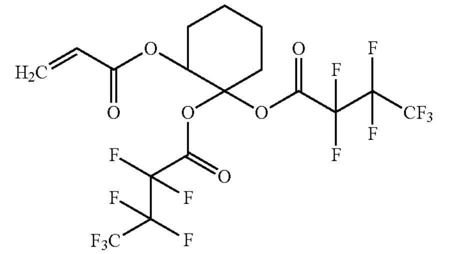
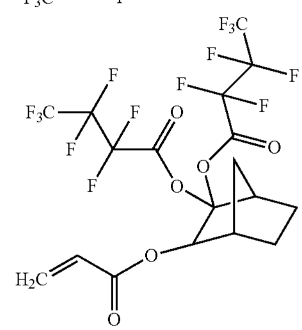
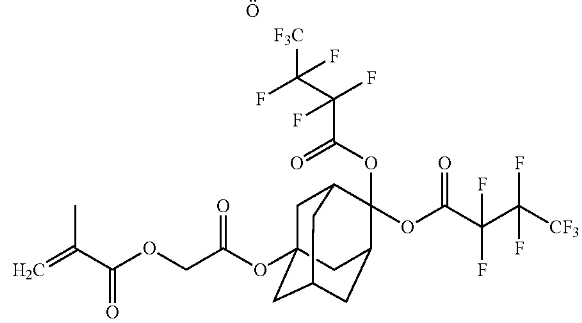
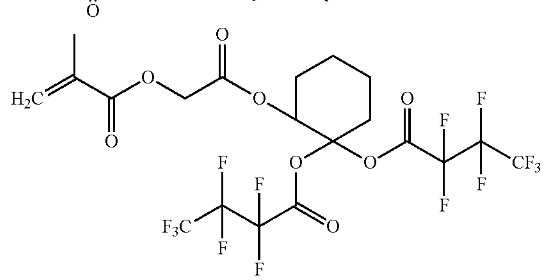
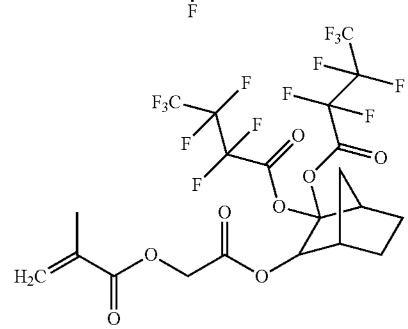

-continued

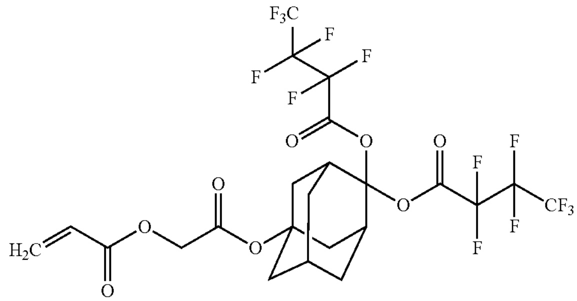

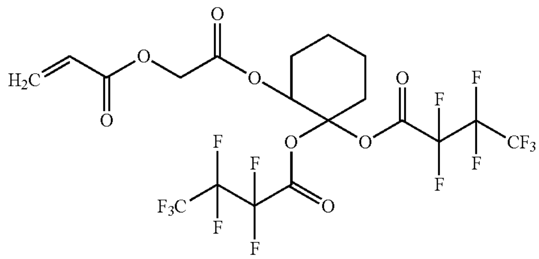

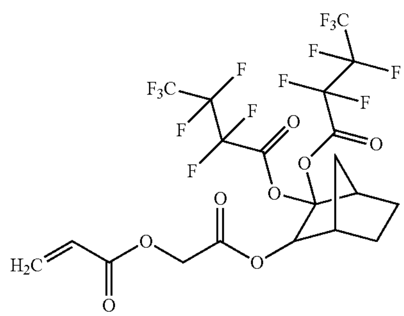

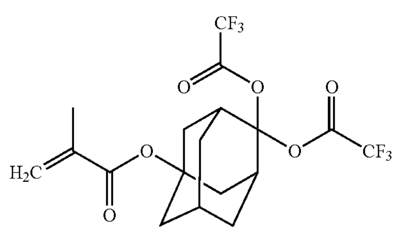

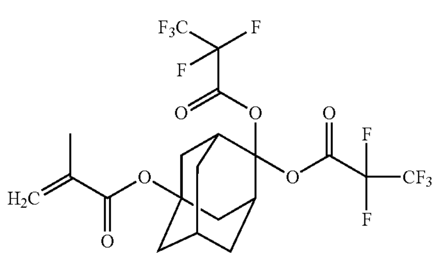

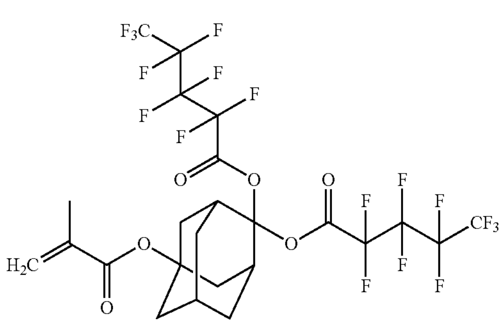

-continued

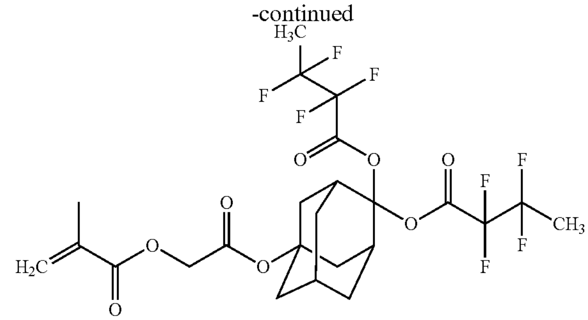

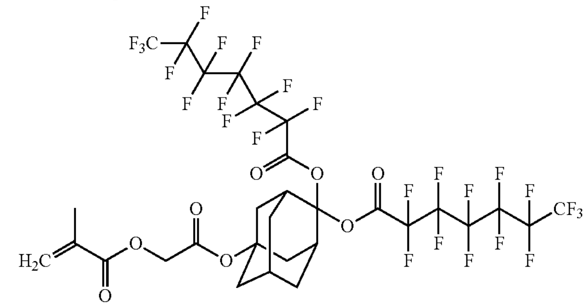

Preferable acid-stable monomer (a6-1) can be produced by reacting a compound represented by the formula (a6-1-a) and a compound represented by the formula (a6-1-b).

(a6-1-a)

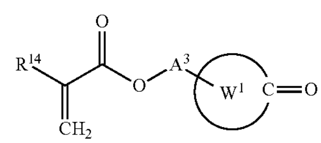

(a6-1-b)

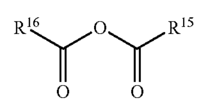

wherein $R^{14}$, $R^{15}$, $R^{16}$, $A^3$ and $W^1$ have the same meaning as defined above.

Typical compound represented by the formula (a6-1-a) is 1-methacryloyloxy-4-oxoadamantane described in JP2002-226436-A.

Examples of the compound represented by the formula (a6-1-b) include pentafluoropropionic anhydride, heptafluoro butyric anhydride and trifluoro butyric anhydride. The reaction is preferably carried out at around a boiling point of the compound represented by the formula (a6-1-b) used.

When the resin (A) contains the structural unit derived from the monomer represented by the formula (a6-1), the proportion thereof is generally 1 to 30 mol %, preferably 3 to 25 mol %, and more preferably 5 to 20 mol %, with respect to the total structural units (100 mol %) constituting the resin (A).

<Acid-Stable Monomer (a7)>

Examples of the acid-stable monomer other than the above include maleic anhydride represented by the formula (a7-1), itaconic anhydride represented by the formula (a7-2) or an acid-stable monomer having norbornene ring represented by the formula (a7-3), for example, hereinafter the monomers may be referred to as "acid-stable monomer (a7-1)", "acid-stable monomer (a7-2)" and "acid-stable monomer (a7-3)", respectively.

(a7-1)

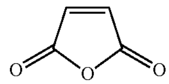

(a7-2)

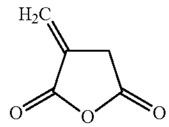

(a7-3)

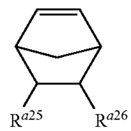

wherein $R^{a25}$ and $R^{a26}$ independently represent a hydrogen atom, a $C_1$ to $C_3$ alkyl group that optionally has a hydroxy group, a cyano group, a carboxy group or —COOR$^{a27}$, or $R^{a25}$ and $R^{a26}$ may be bonded together to form —CO—O—CO—, $R^{a27}$ represents a $C_1$ to $C_{18}$ aliphatic hydrocarbon group, a —$CH_2$-contained in the aliphatic hydrocarbon group may be replaced by —O— or —CO—, provided that excluding a group in which the —COOR$^{a27}$ is an acid-labile group, that is, $R^{a27}$ does not include a group in which the tertiary carbon atom bonds to —O—.

Examples of the alkyl group that optionally has a hydroxy group of $R^{a25}$ and $R^{a26}$ include, for example, methyl, ethyl, propyl, hydroxymethyl and 2-hydroxyethyl groups.

The aliphatic hydrocarbon group of $R^{a27}$ has preferably a $C_1$ to $C_8$ alkyl group and a $C_4$ to $C_{18}$ alicyclic hydrocarbon group, and more preferably a $C_1$ to $C_6$ alkyl group and a $C_4$ to $C_{12}$ alicyclic hydrocarbon group, and still more preferably a methyl, ethyl, propyl, 2-oxo-oxorane-3-yl and 2-oxo-oxorane-4-yl groups.

Specific examples of the acid-stable monomer (a7-3) having the norbornene ring include 2-norbornene, 2-hydroxy-5-norbornene, 5-norbornene-2-carboxylic acid, methyl 5-norbornene-2-carboxylate, 2-hydroxy-1-ethyl 5-norbornene-2-carboxylate, 5-norbornene-2-methanol and 5-norbornene-2,3-dicarboxylic acid anhydride.

When the resin (A) contains the structural unit derived from the monomer represented by the formula (a7-1), the monomer represented by the formula (a7-2) and/or the monomer represented by the formula (a7-3), the total proportion thereof is generally 2 to 40 mol %, preferably 3 to 30 mol %, and more preferably 5 to 20 mol %, with respect to the total structural units (100%) constituting the resin (A).

Further, examples of the acid-stable monomer other than the above include a monomer having a sultone ring represented by the formula (a7-4).

(a7-4)

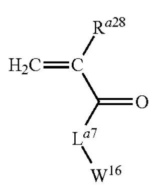

wherein $L^{a7}$ represents an oxygen atom or *-T-$(CH_2)_{k2}$—CO—O—, k2 represents an integer of 1 to 7, T represents an oxygen atom or NH, * represents a single bond to carbonyl group;

$R^{a28}$ represents a hydrogen atom or a methyl group;

$W^{16}$ represent a group having an optionally substituted sultone ring.

The sultone ring is a ring in which two of adjacent methylene groups are replaced by an oxygen atom and a sulfonyl group, respectively, and examples thereof include a ring below. The sultone ring group is a group in which a hydrogen atom contained in the sultone ring below is replaced by a bond, which correspond to a bond to $L^{a7}$ in the formula (a7-4)

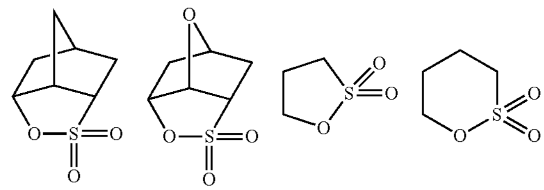

The group having an optionally substituted sultone ring means a group in which a hydrogen atom other than a hydrogen atom which has been replaced by a bond contained in the sultone ring is replaced by a substituent (monovalent group other than a hydrogen atom), and examples thereof include a hydroxy group, cyano group, a $C_1$ to $C_6$ alkyl group, a $C_1$ to $C_6$ fluorinated alkyl group, a $C_1$ to $C_6$ hydroxy alkyl group, a $C_1$ to $C_6$ alkoxy group, a $C_1$ to $C_7$ alkoxycarbonyl group, a $C_1$ to $C_7$ acyl group and a $C_1$ to $C_8$ acyloxy group.

Specific examples of the acid-stable monomer (a7-4) having a sultone ring include a monomer below.

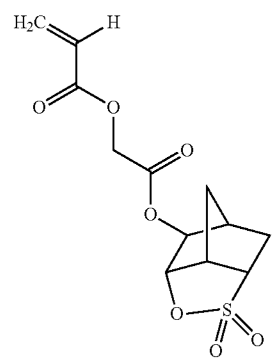

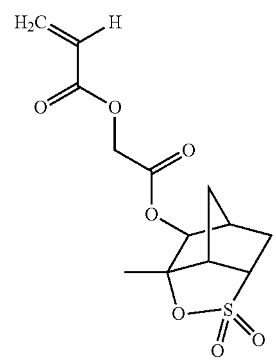

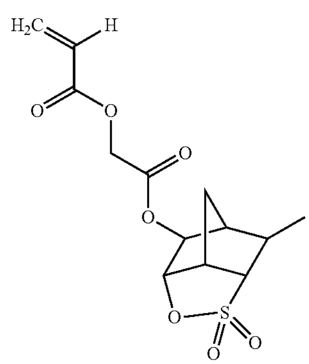

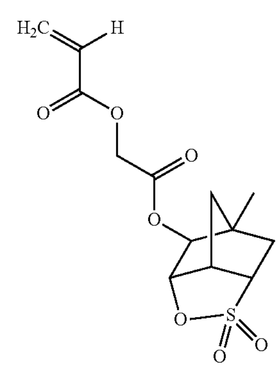

-continued
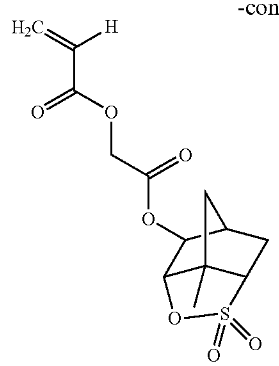
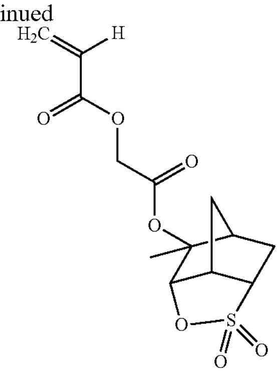
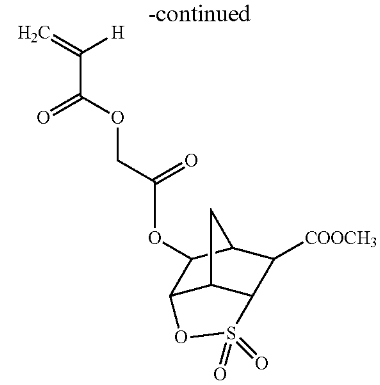
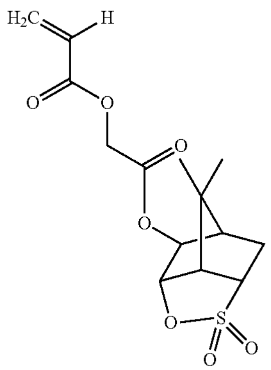
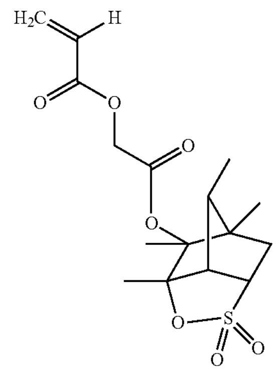
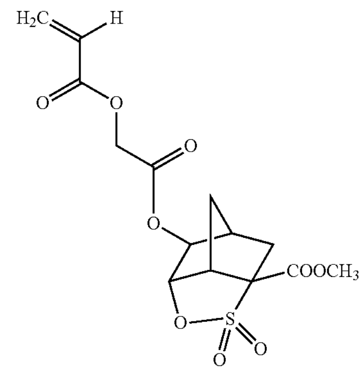
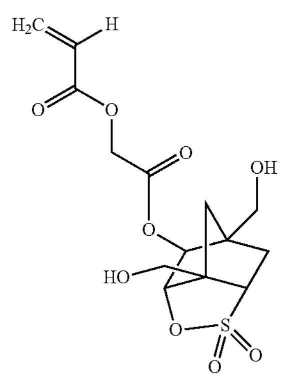
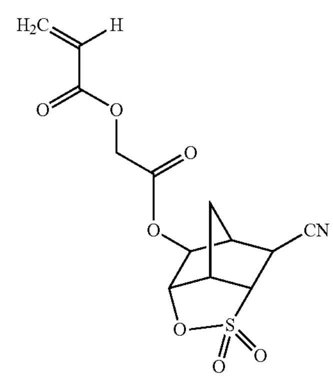
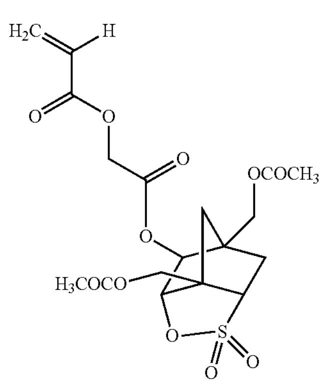
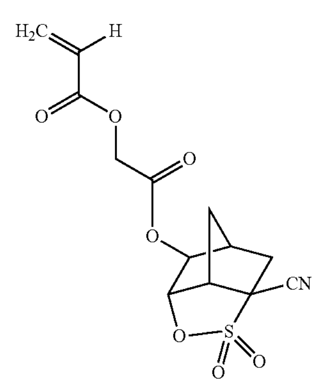

-continued
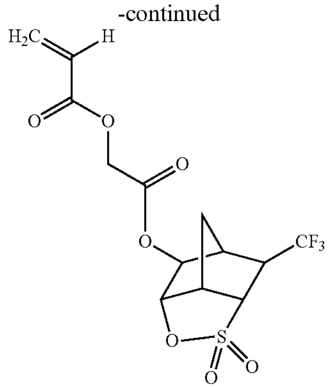
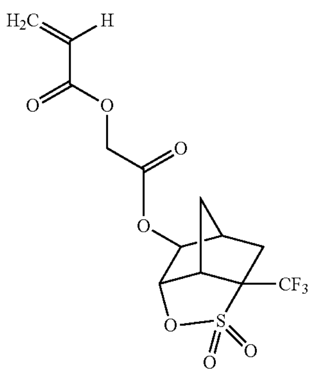
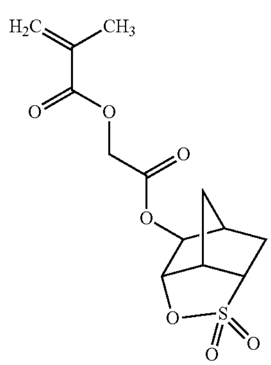
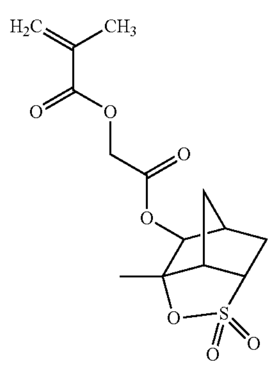
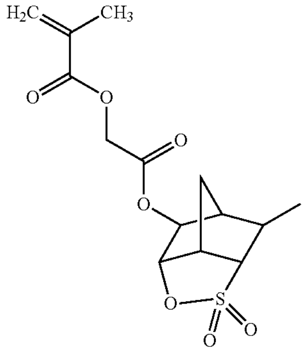
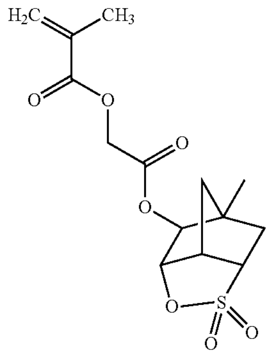
-continued
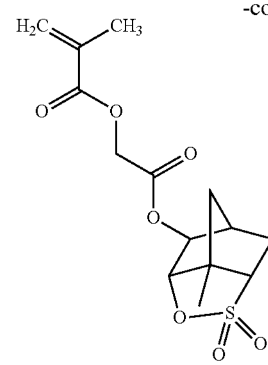
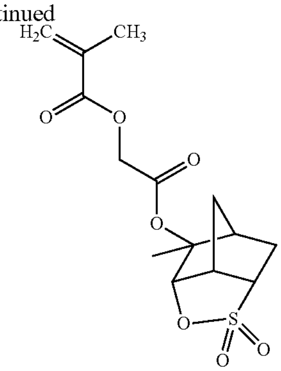
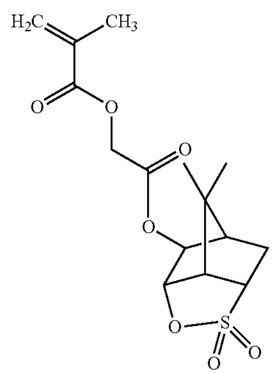
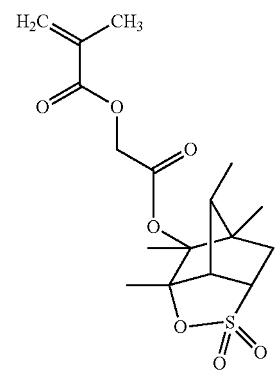
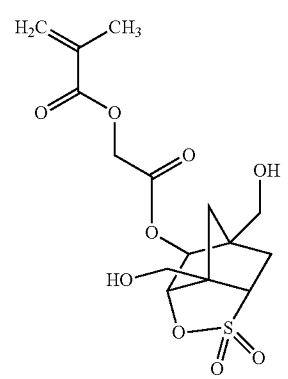
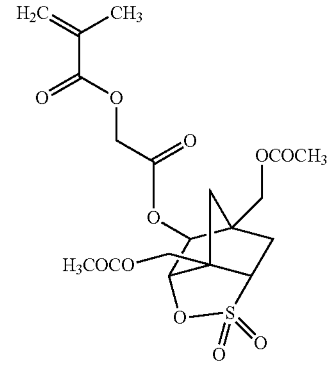

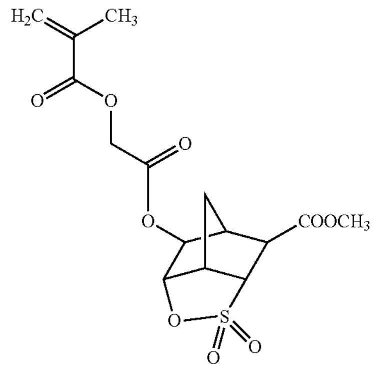
H2C
CH3
O
O
O
O
COOCH3
O
S
O
O
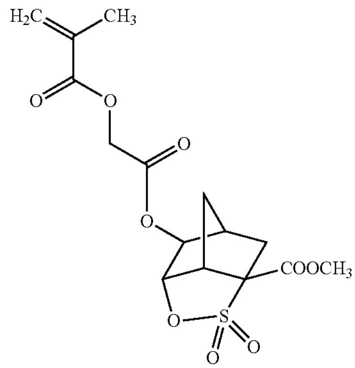
H2C
CH3
O
O
O
O
COOCH3
O
S
O
O
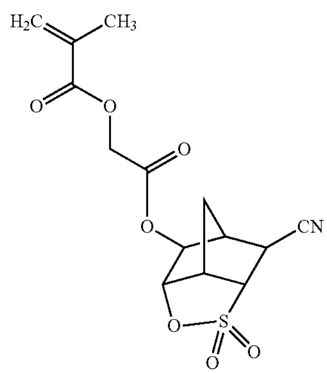
H2C
CH3
O
O
O
O
CN
O
S
O
O
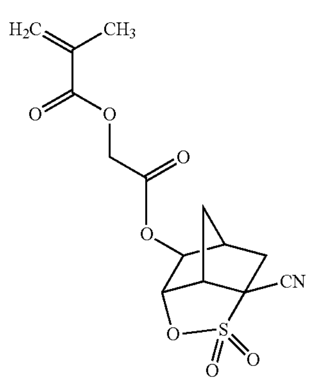
H2C
CH3
O
O
O
O
CN
O
S
O
O
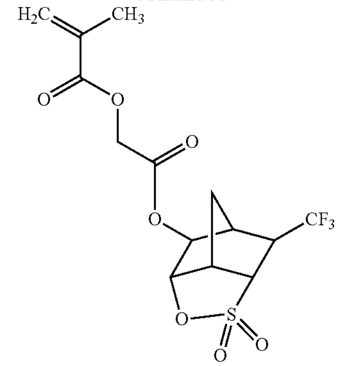
H2C
CH3
O
O
O
O
CF3
O
S
O
O
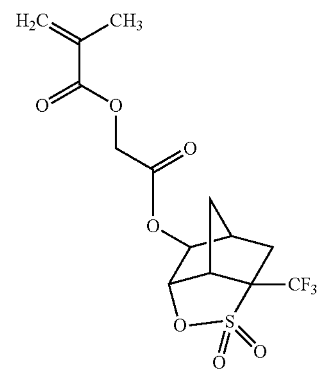
H2C
CH3
O
O
O
O
CF3
O
S
O
O
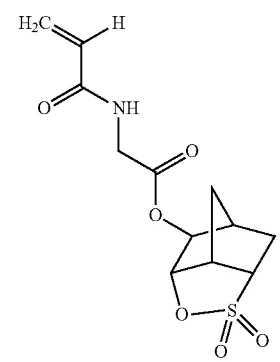
H2C
H
O
NH
O
O
O
S
O
O
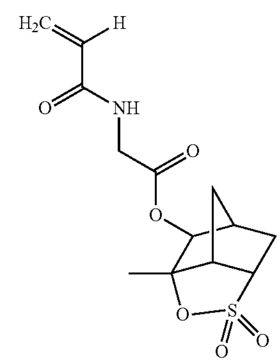
H2C
H
O
NH
O
O
O
S
O
O
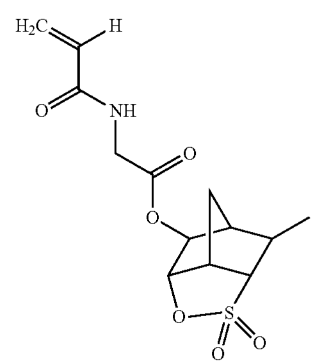
H2C
H
O
NH
O
O
O
S
O
O
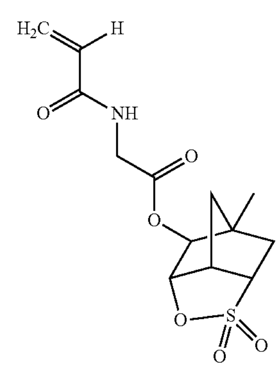
H2C
H
O
NH
O
O
O
S
O
O -continued
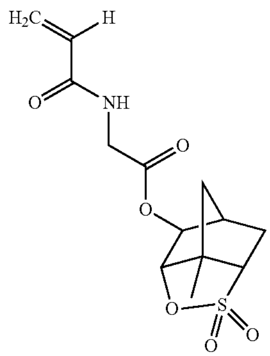
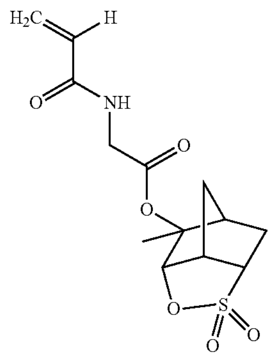
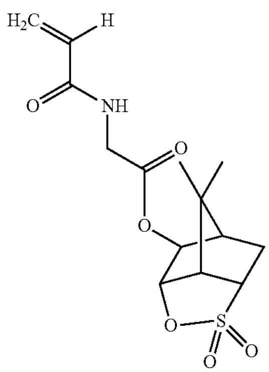
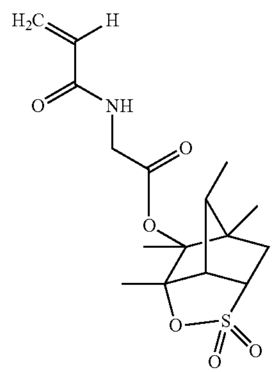
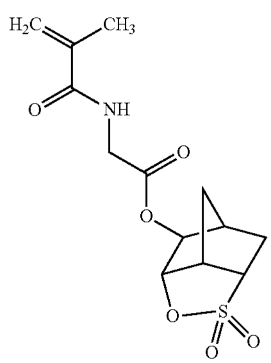
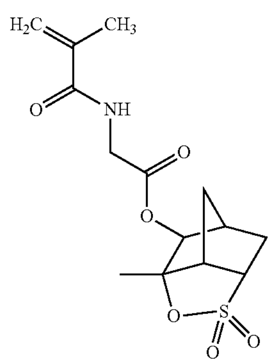
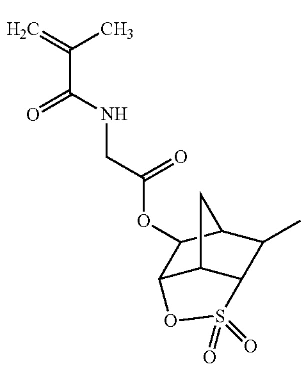
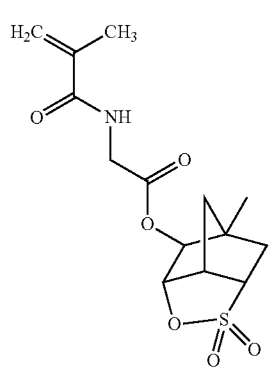
-continued
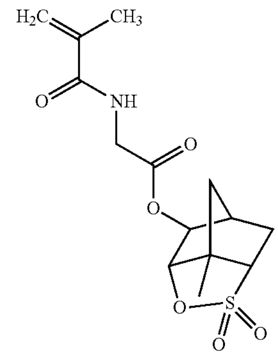
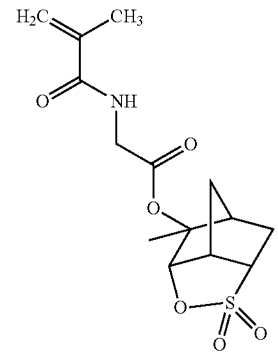
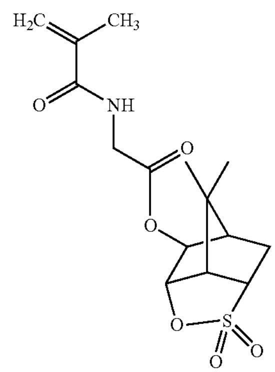
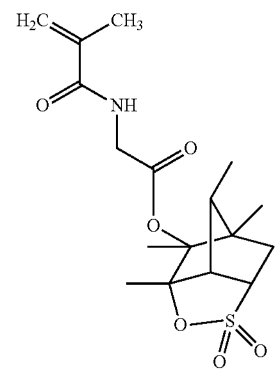
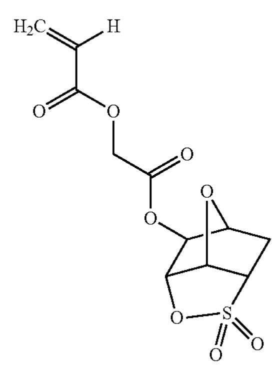
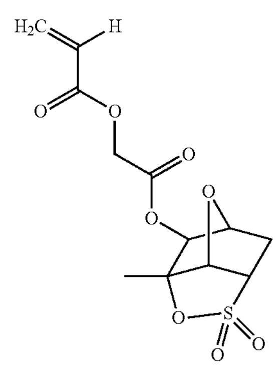
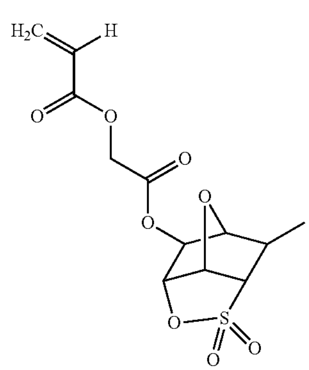
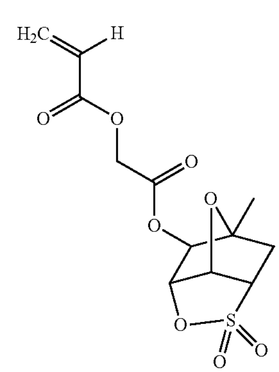

-continued
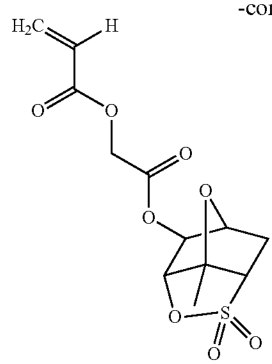
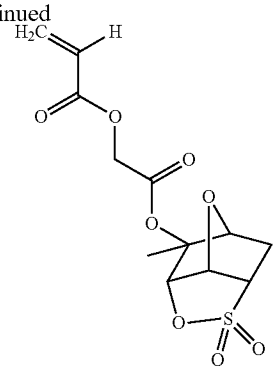
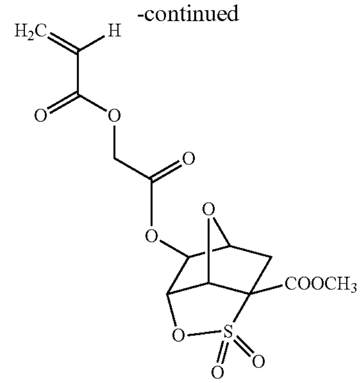
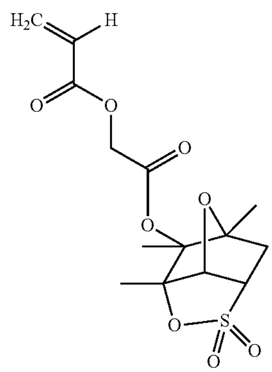
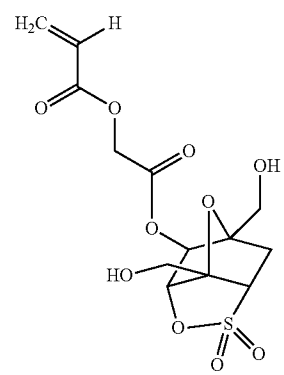
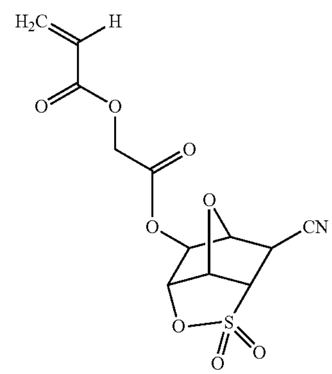
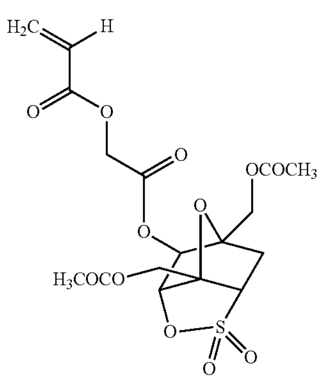
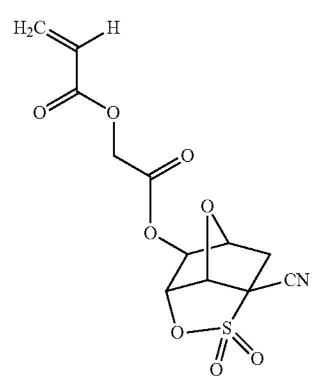
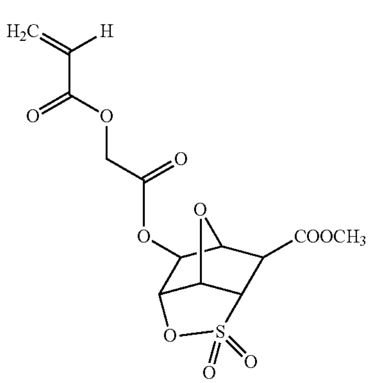
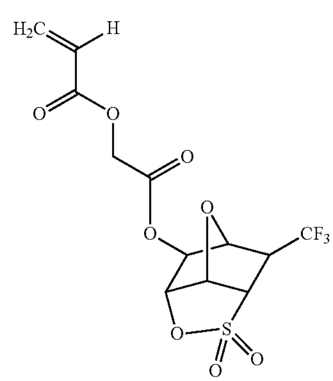

-continued
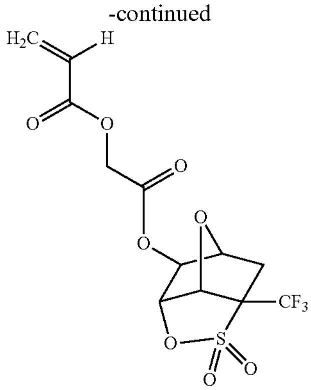
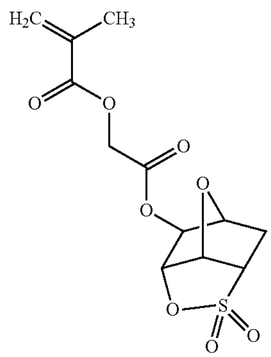
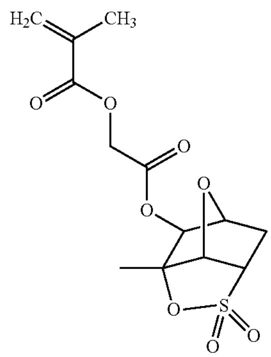
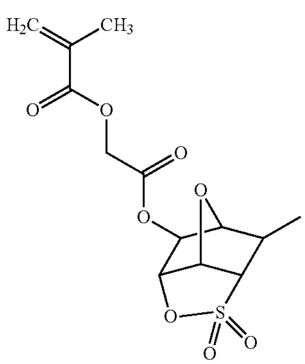
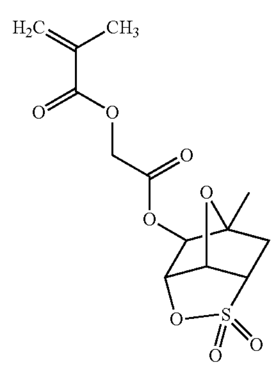
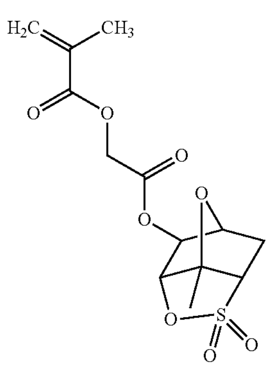
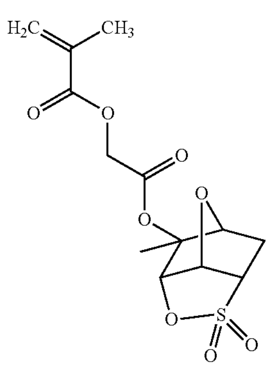
-continued
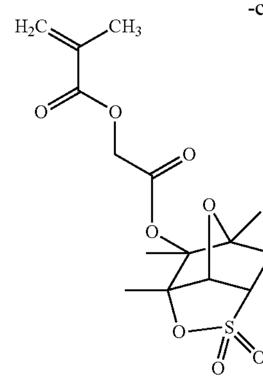
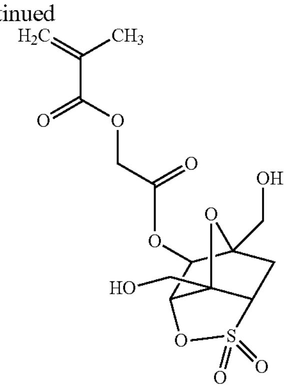
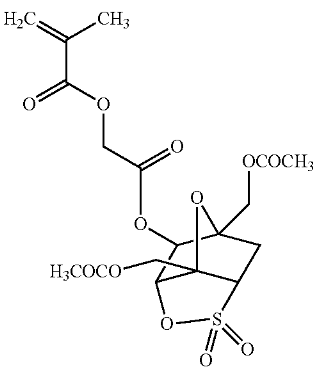
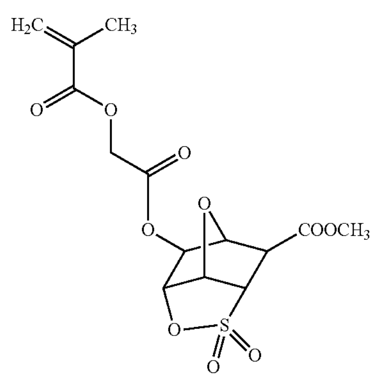
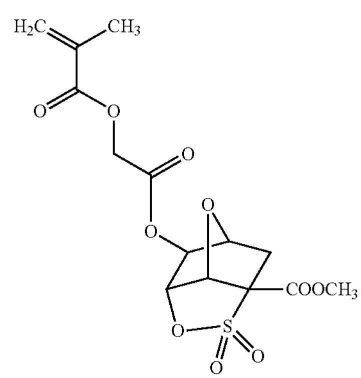

-continued
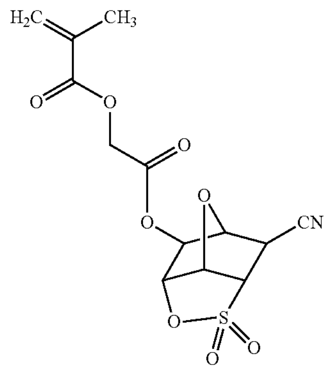
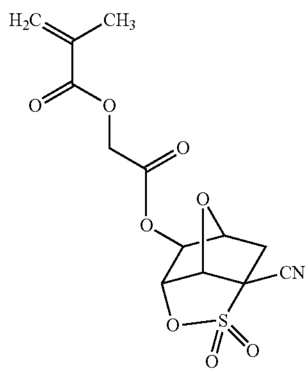
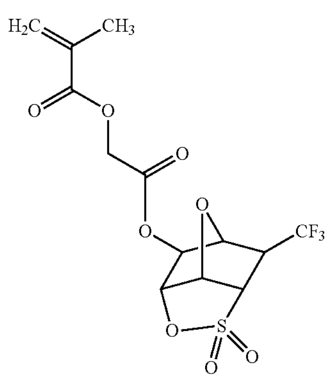
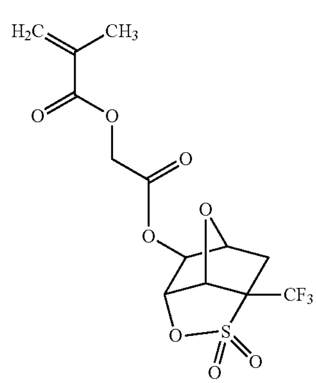
-continued
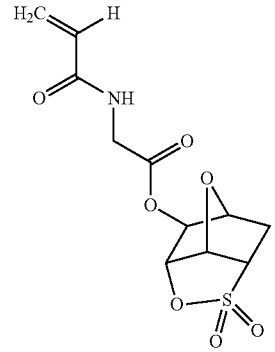
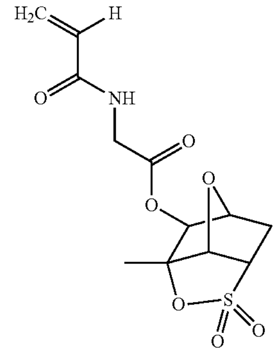
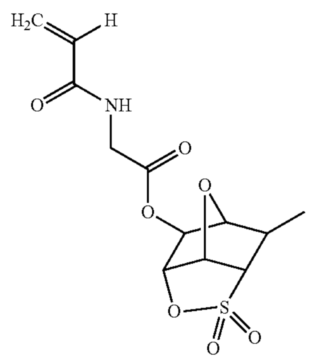
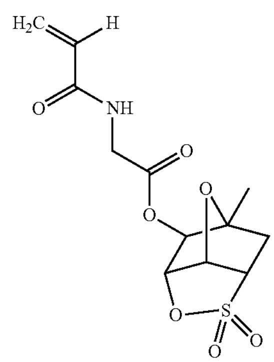
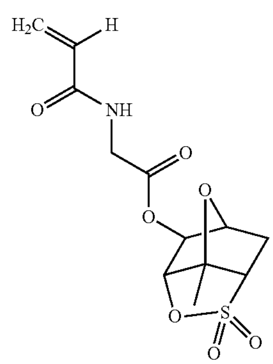
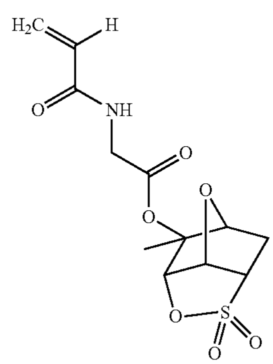
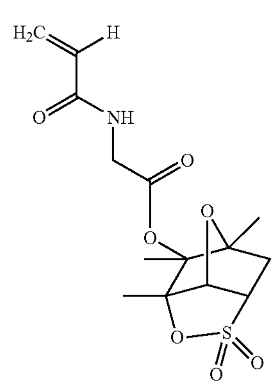
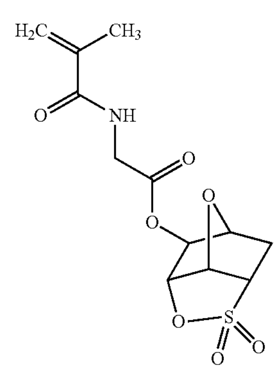

-continued
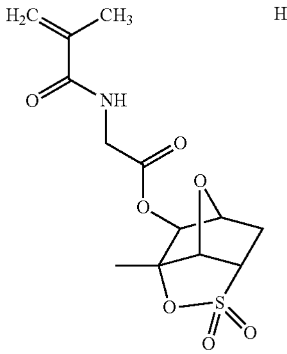
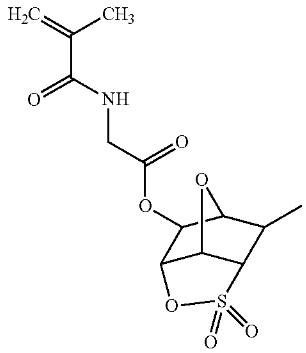
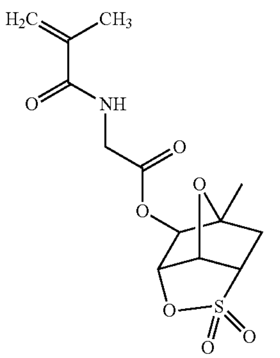
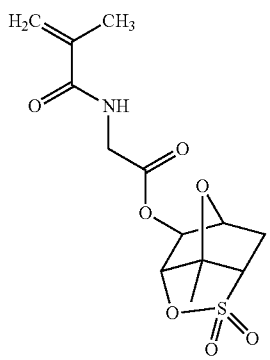
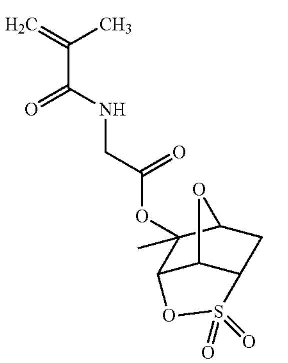
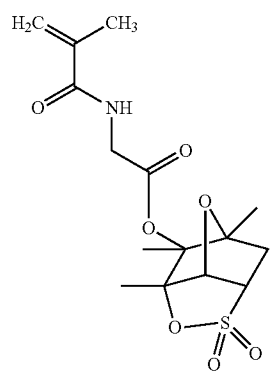
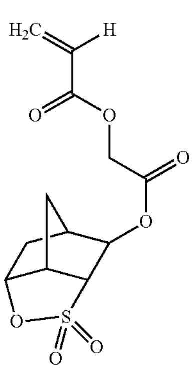
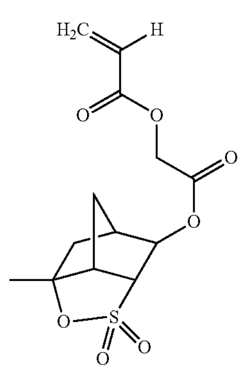
-continued
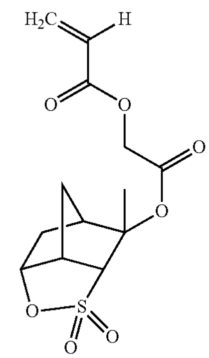
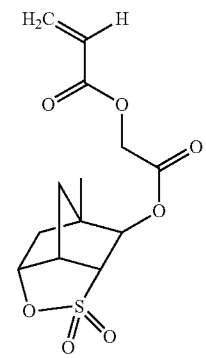
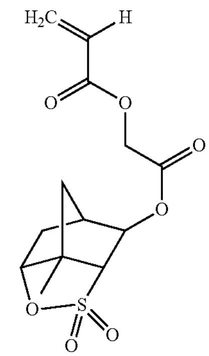
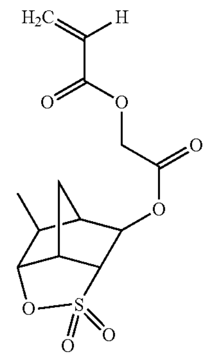
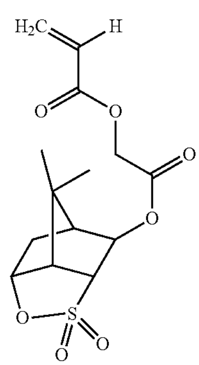
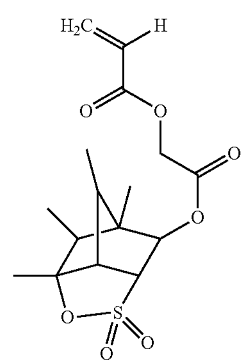
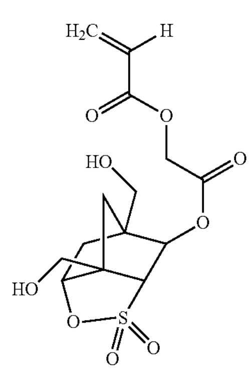
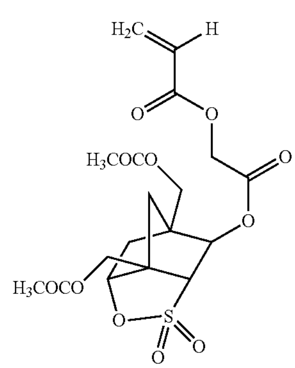

-continued
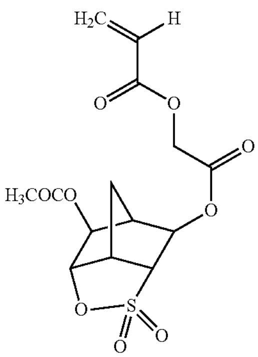
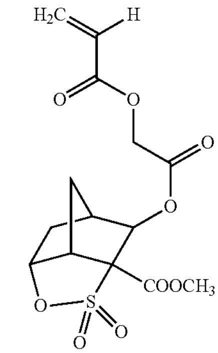
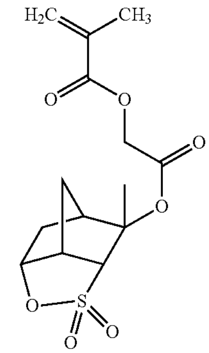
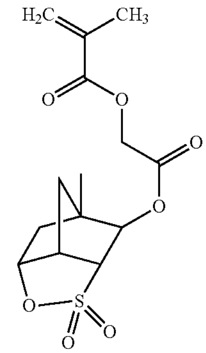
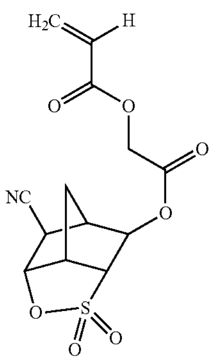
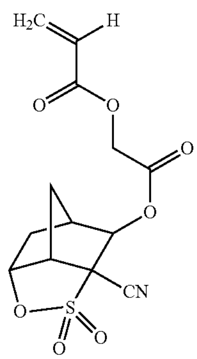
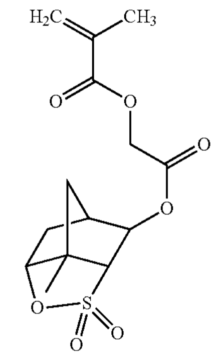
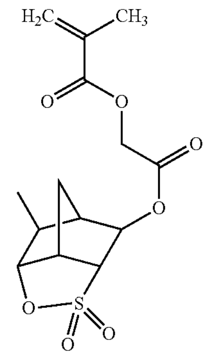
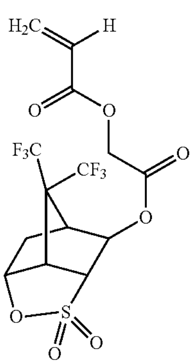
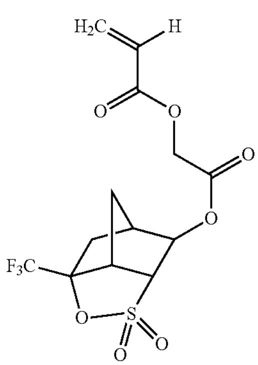
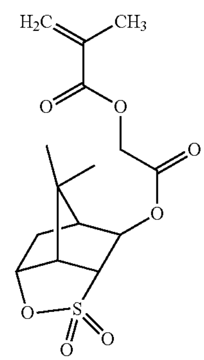
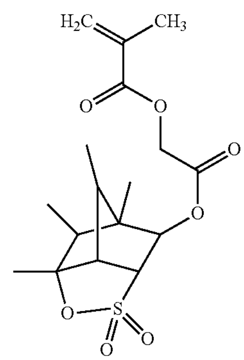
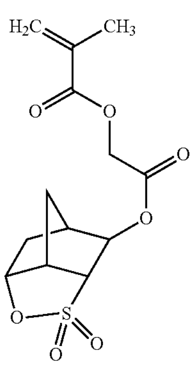
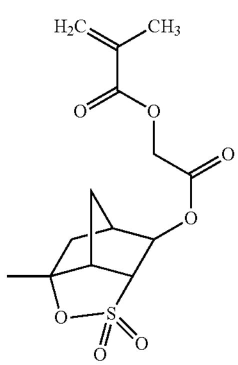
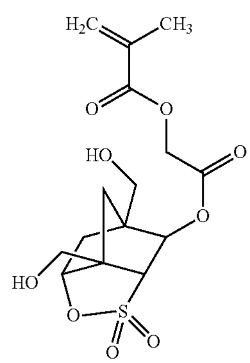
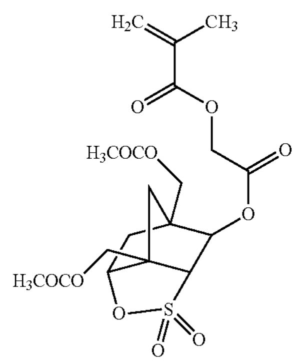

-continued
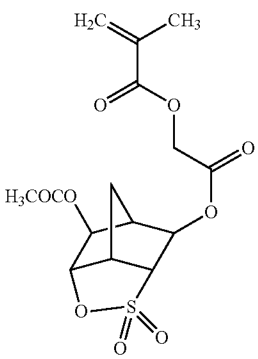
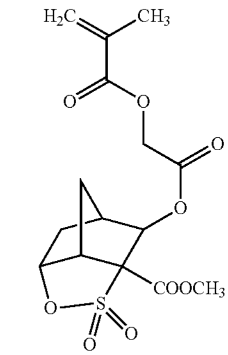
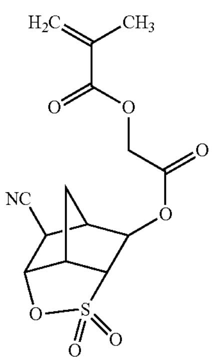
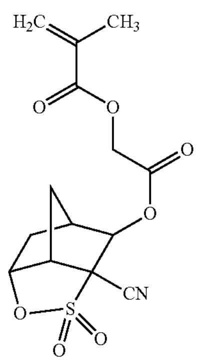
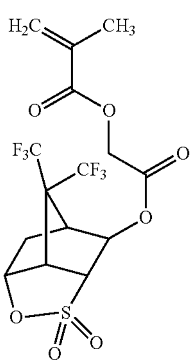
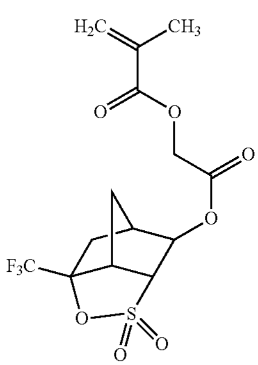
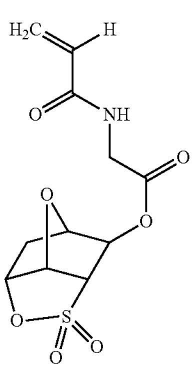
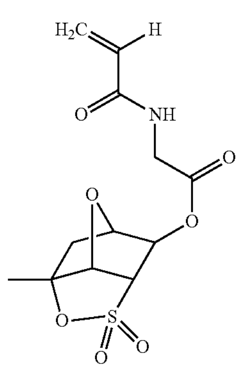
-continued
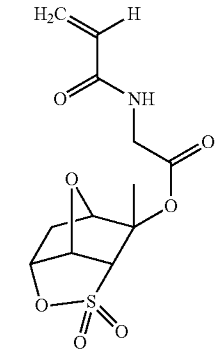
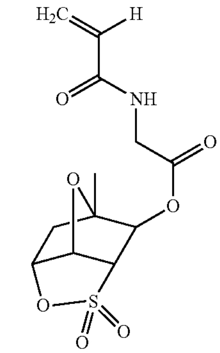
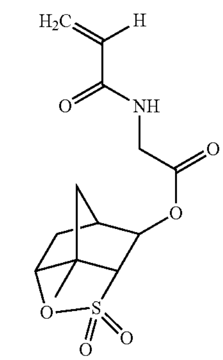
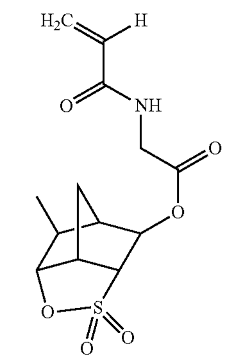
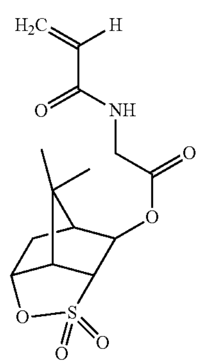
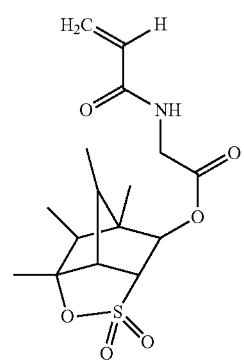
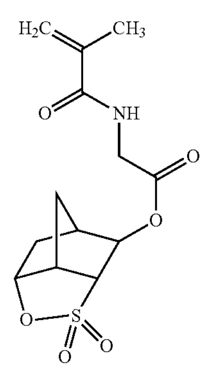
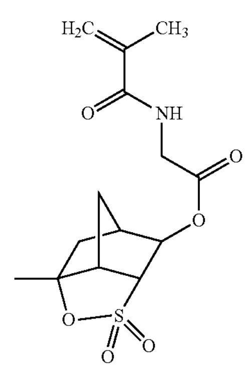

-continued
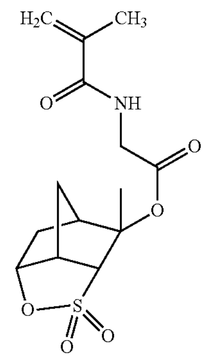
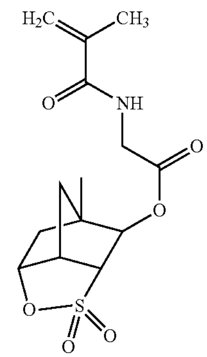
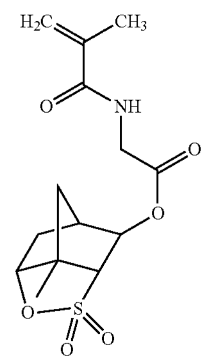
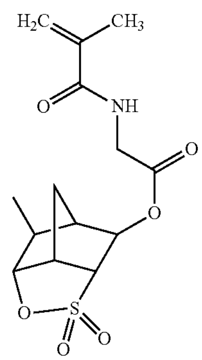
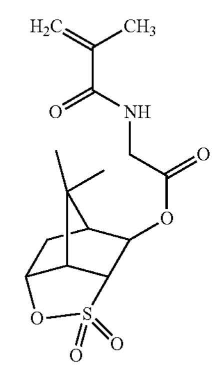
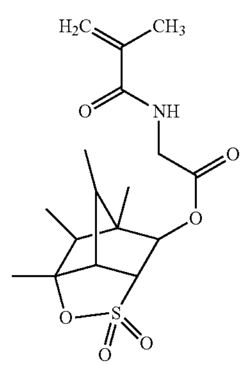
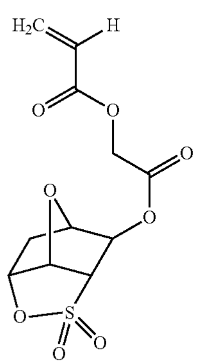
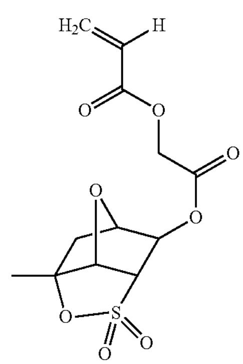
-continued
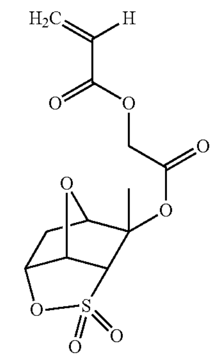
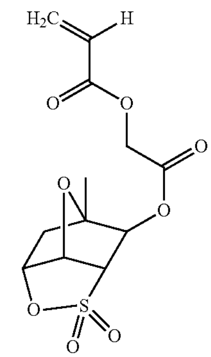
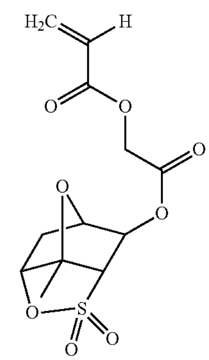
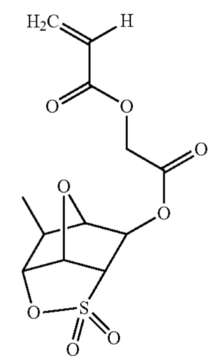
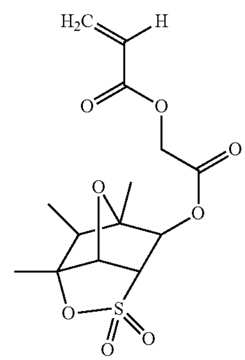
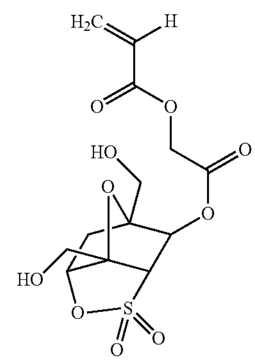
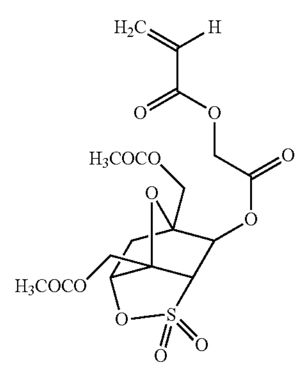
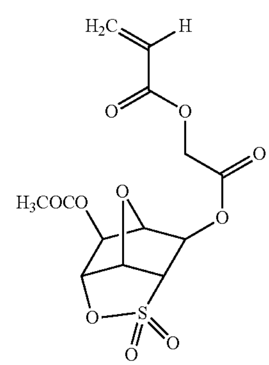

-continued
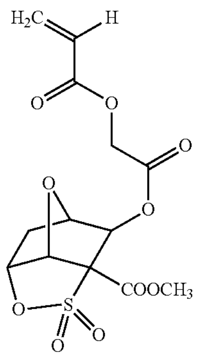
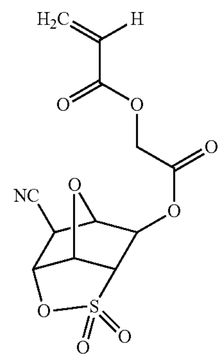
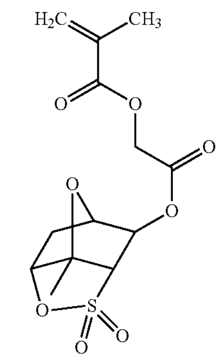
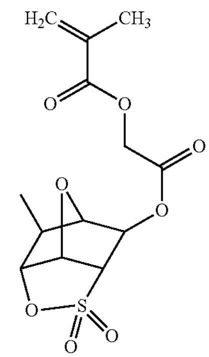
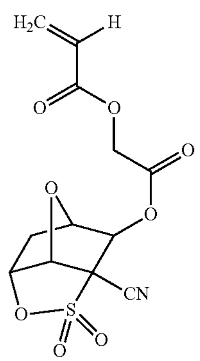
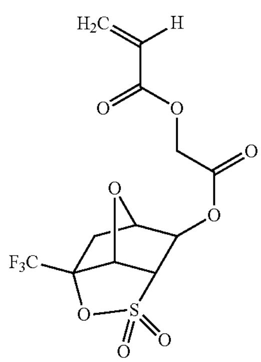
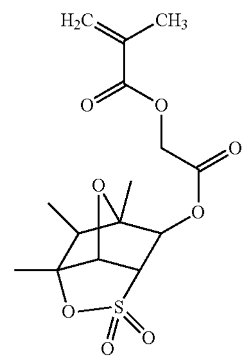
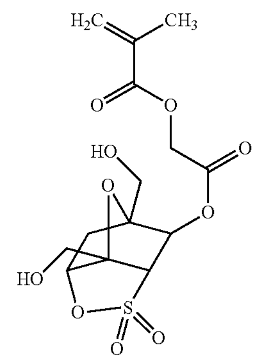
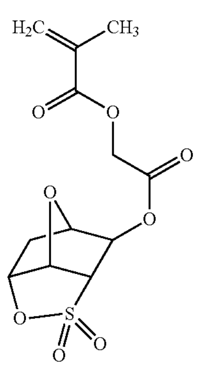
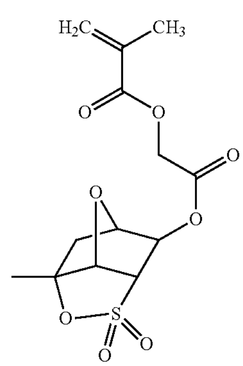
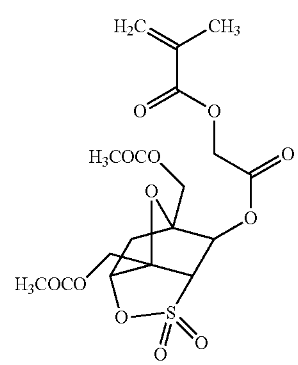
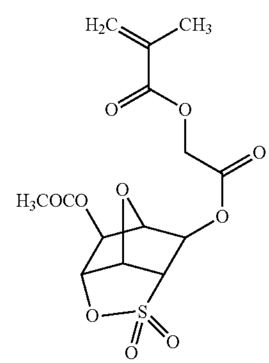
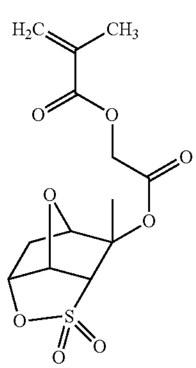
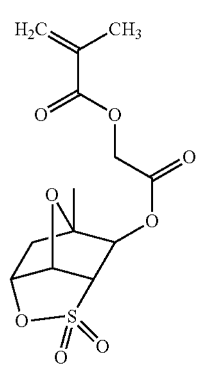
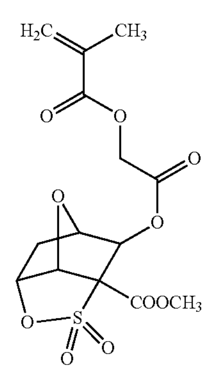
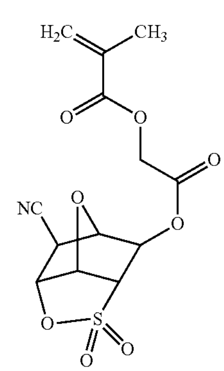

-continued

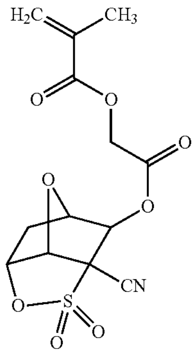
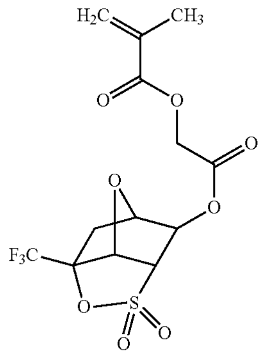
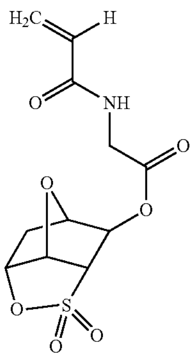
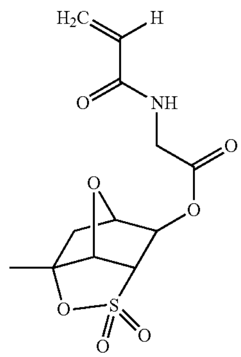
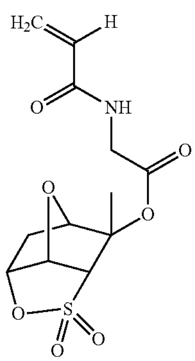
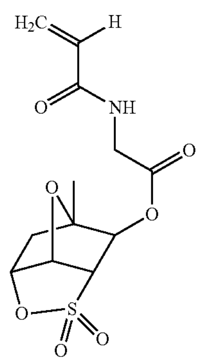
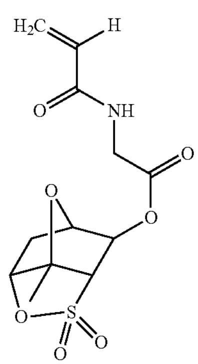
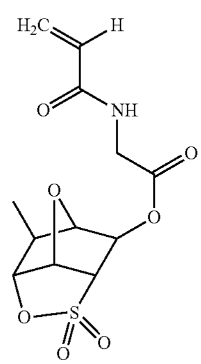

-continued

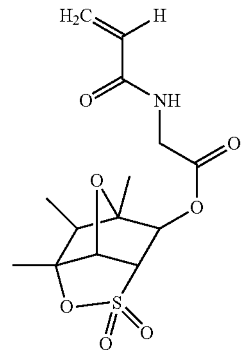
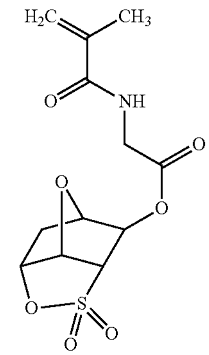
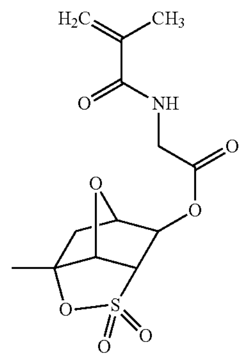
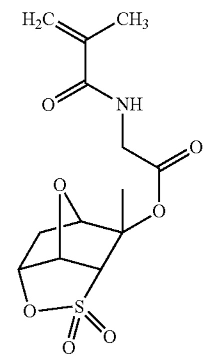
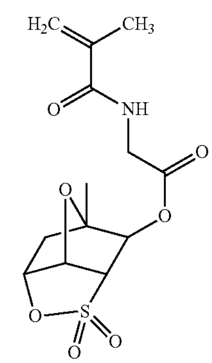
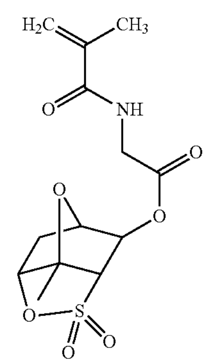
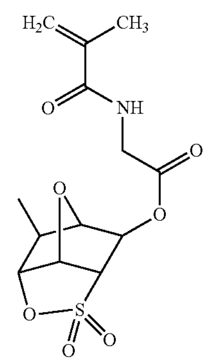
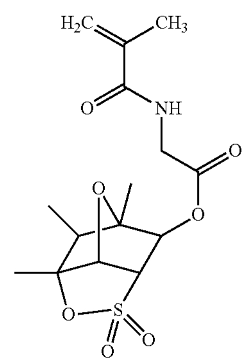

When the resin (A) contains the structural unit derived from the acid-stable monomer (a7) represented by the formula (a7-4), the proportion thereof is generally 2 to 40 mol %, preferably 3 to 35 mol %, and more preferably 5 to 30 mol %, with respect to the total structural units (100 mol %) constituting the resin (A).

<Acid-Stable Monomer (a8)>

An acid-stable monomer (a8) containing a fluorine atom as follows is used for manufacturing the resin (A),

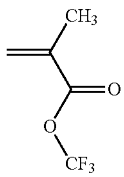
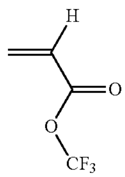
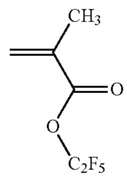
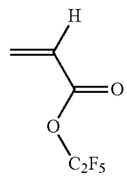
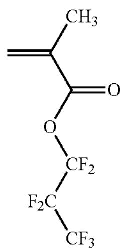
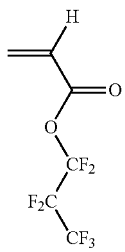
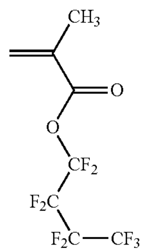
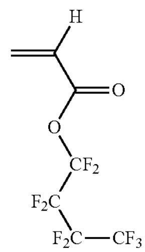
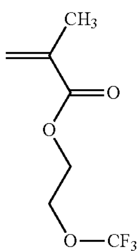
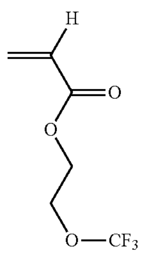
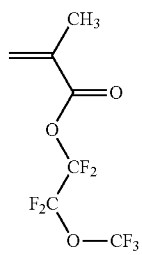
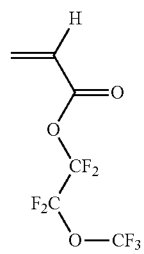
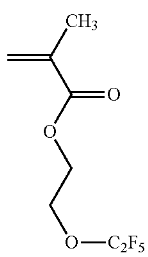
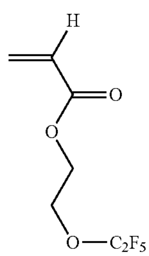
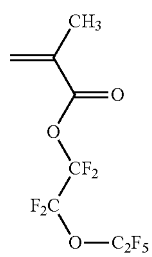
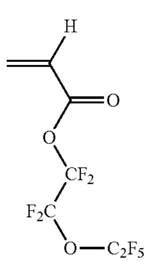
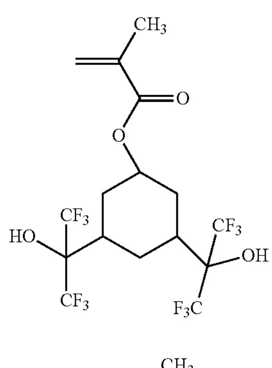
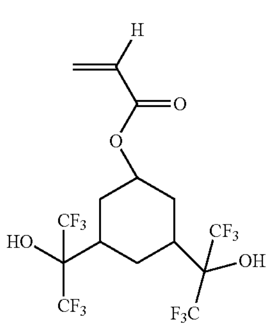
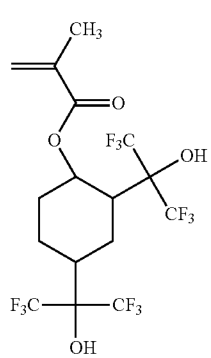
-continued
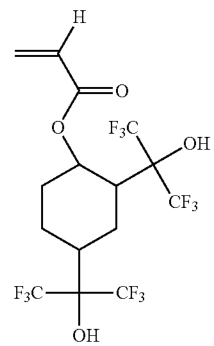
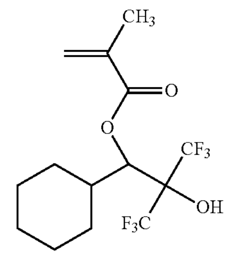
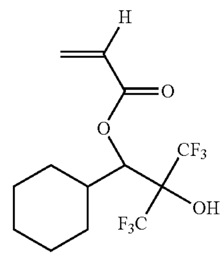
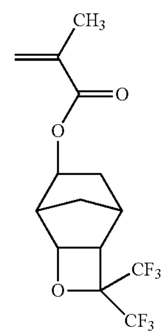
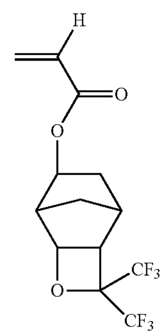
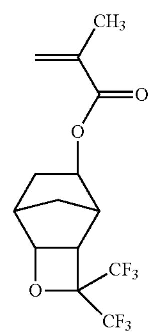
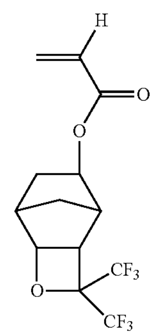
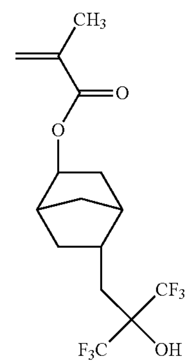
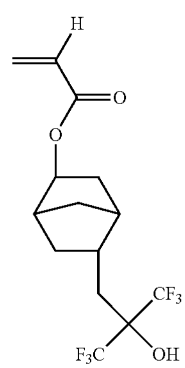
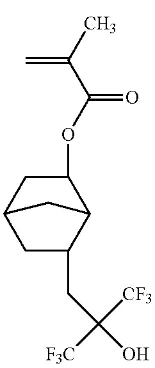
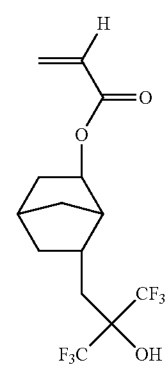
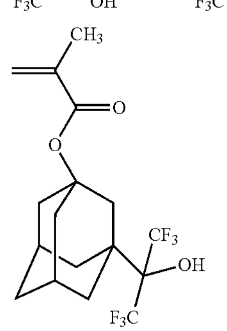
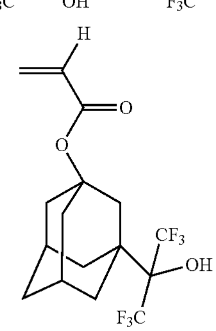

-continued

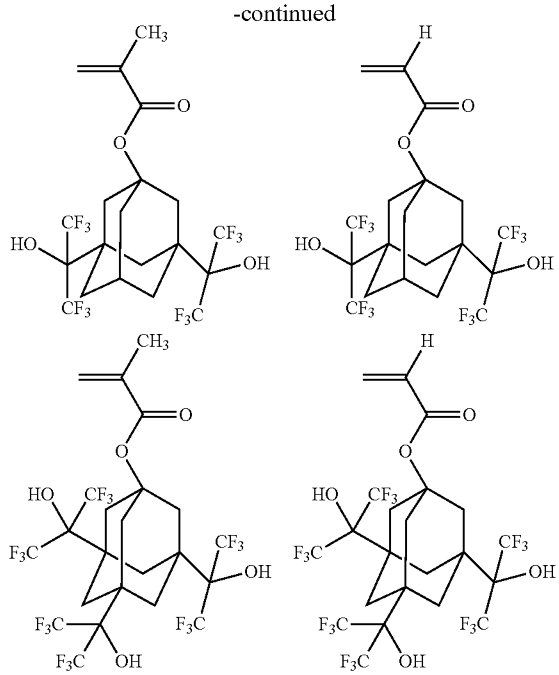

Among these, 5-(3,3,3-trifluoro-2-hydroxy-2-[trifluoromethyl]propyl) bicyclo[2.2.1]hept-2-yl(meth)acrylate, 6-(3,3,3-trifluoro-2-hydroxy-2-[trifluoromethyl]propyl)bicyclo [2.2.1]hept-2-yl(meth)acrylate, 4,4-bis(trifluoromethyl)-3-oxatricyclo[4.2.1.0$^{2,5}$]nonyl which have mono- or polyalicyclic hydrocarbon group are preferable.

When the resin (A) contains the structural unit derived from the acid stable monomer (a8), the proportion thereof is generally 1 to 20 mol %, preferably 2 to 15 mol %, and more preferably 3 to 10 mol %, with respect to the total structural units (100 mol %) constituting the resin (A).

<Production of the Resin>

The resin (A) may be a copolymer obtained by polymerizing the compound (I) and the monomer (a1), and the acid-stable monomer as needed, and preferably a copolymer polymerized the compound (I), the monomer (a1), and the acid-stable monomer (a2) and/or the acid-stable monomer (a3).

In the production of the resin (A), the monomer (a1) to be used is preferably at least one of the monomer having the adamantyl group (a1-1) and the monomer having the cycloalkyl group (a1-2), and more preferably the monomer having the adamantyl group (a1-1).

The acid-stable monomer is preferably the monomer having the hydroxyadamantyl group (a2-1) and the acid-stable monomer (a3). The monomer having the lactone ring (a3) is preferably at least one of the monomer having the γ-butyrolactone ring (a3-1), and the monomer having the condensed ring of the γ-butyrolactone ring and the norbornene ring (a3-2).

When the monomer having an adamantyl group is used as the monomer (a1), the proportion of the monomer having an adamantyl group (in particular, the monomer having the acid-labile group (a1-1)) is preferably 15 mol % or more with respect to the monomer having the acid-labile group (a1). As the mole ratio of the monomer having an adamantyl group increases within this range, the dry etching resistance of the resulting resist improves.

The resin (A) can be produced by a known polymerization method, for example, radical polymerization method. The monomer may be used as a single compound or as a mixture of two or more compounds.

The weight average molecular weight of the resin (A) is preferably 2500 or more (more preferably 3000 or more, and still more preferably 3500 or more), and 50,000 or less (more preferably 30,000 or less, and still more preferably 10,000 or less). The weight average molecular weight is a value determined by gel permeation chromatography using polystyrene as the standard product. The detailed condition of this analysis is described in Examples.

<Resist Composition>

A resist composition of the present invention contains;

a resin (hereinafter may be referred to as "resin (A)"), and an acid generator.

Further, the resist composition may contain a solvent and an additive such as a basic compound which is known as a quencher in this technical field, as needed.

By containing the resin (A), it is possible to form a resist pattern with an excellent MEF through the effect of the resin (A) and the acid generator.

<Acid Generator>

An acid generator (hereinafter may be referred to as "acid generator (B)) is classified into non-ionic-based or ionic-based acid generator. The present resist composition may be used either acid generators.

Examples of the non-ionic-based acid generator include organic halogenated compounds; sulfonate esters such as 2-nitrobenzyl ester, aromatic sulfonate, oxime sulfonate, N-sulfonyl oxyimide, sulfonyl oxyketone and diazo naphthoquinone 4-sulfonate; sulfones such as disulfone, ketosulf one and sulfone diazomethane.

Examples of the ionic acid generator includes onium salts containing onium cation such as diazonium salts, phosphonium salts, sulfonium salts, iodonium salts.

Examples of anion of onium salts include sulfonate anion, sulfonylimide anion and sulfonylmethyde anion.

For the acid generator (B), not only acid generators used in this field (particularly photo acid generators), but also photo initiators of photo cationic polymerization, known compounds which generate an acid by radiation (light) such as photo discharge agents of pigments and photo discoloring agents, and a combination thereof can be used. Examples thereof include compounds which generate an acid by radiation described in JP S63-26653-A, JP S55-164824-A, JP S62-69263-A, JP S63-146038-A, JP S63-163452-A, JP S62-153853-A, JP S63-146029-A, U.S. Pat. No. 3,779,778-B, U.S. Pat. No. 3,849,137-B, DE3,914,407-B and EP-126,712-A.

A fluorine-containing acid generator is preferable for the acid generator (B), and a sulfonic acid salt represented by the formula (B1) is more preferable, hereinafter, such acid generator may be referred to as "acid generator (B1)", as described below. In the acid generator (B1), electropositive $Z^+$ hereinafter may be referred to as "an organic cation", and electronegative one in which the organic cation has been removed from the compound may be referred to as "sulfonate anion". By containing the acid generator (B1) in the resist composition, it is possible to form a resist pattern with an excellent MEF.

(B1)

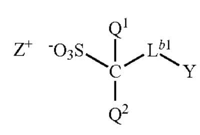

wherein $Q^1$ and $Q^2$ independently represent a fluorine atom or a $C_1$ to $C_6$ perfluoroalkyl group;

$L^{b1}$ represents an optionally substituted $C_1$ to $C_{17}$ divalent aliphatic hydrocarbon group, and a —$CH_2$— contained in the aliphatic hydrocarbon group may be replaced by —O— or —CO—;

Y represents an optionally substituted $C_1$ to $C_{18}$ aliphatic hydrocarbon group, and a —$CH_2$— contained in the aliphatic hydrocarbon group may be replaced by —O—, —CO— or —$SO_2$—; and $Z^+$ represents an organic cation.

Examples of the perfluoroalkyl group of $Q^1$ and $Q^2$ include trifluoromethyl, perfluoroethyl, perfluoropropyl, perfluoro-isopropyl, perfluorobutyl, perfluoro-sec-butyl, perfluoro-tert-butyl, perfluoropentyl and perfluorohexyl groups.

Among these, $Q^1$ and $Q^2$ independently are preferably trifluoromethyl or fluorine atom, and more preferably both a fluorine atom.

Examples of the a divalent aliphatic hydrocarbon group of $L^{b1}$ include an alkanediyl group described above and groups represented by the formula (KA-1) to the formula (KA-22) which are removed two hydrogen atoms.

Examples of the aliphatic hydrocarbon group of $L^{b1}$ in which a —$CH_2$-contained in the aliphatic hydrocarbon group is replaced by —O— or —CO— include groups represented by the formula (b1-1) to the formula (b1-6) below. Among these, the groups represented by the formula (b1-1) to the formula (b1-4) are preferable, and the group represented by the formula (b1-1) or the formula (b1-2) is more preferable.

In the formula (b1-1) to the formula (b1-6), the group is represented so as to correspond with two sides of the formula (B1), that is, the left side of the group bonds to $C(Q^1)(Q^2)$- and the right side of the group bonds to —Y (examples of the formula (b1-1) to the formula (b1-6) are the same as above). * represents a bond.

(b1-1)

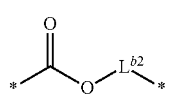

(b1-2)

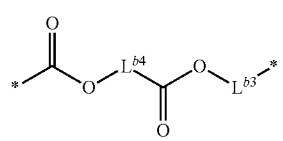

(b1-3)

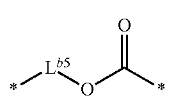

(b1-4)

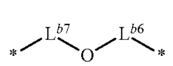

(b1-5)

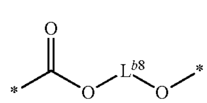

(b1-6)

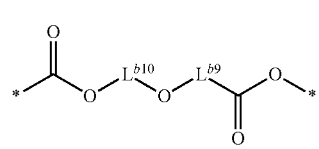

wherein $L^{b2}$ represents a single bond or a $C_1$ to $C_{15}$ divalent aliphatic hydrocarbon group, the aliphatic hydrocarbon group is preferably a saturated aliphatic hydrocarbon group;

$L^{b3}$ represents a single bond or a $C_1$ to $C_{12}$ divalent aliphatic hydrocarbon group, the aliphatic hydrocarbon group is preferably a saturated aliphatic hydrocarbon group;

$L^{b4}$ represents a $C_1$ to $C_{13}$ divalent aliphatic hydrocarbon group, the aliphatic hydrocarbon group is preferably a saturated aliphatic hydrocarbon group, the total number of the carbon atoms in $L^{b3}$ and $L^{b4}$ is at most 13;

$L^{b5}$ represents a $C_1$ to $C_{15}$ divalent saturated hydrocarbon group; $L^{b6}$ and $L^{b7}$ independently represent a $C_1$ to $C_{15}$ divalent aliphatic hydrocarbon group, the aliphatic hydrocarbon group is preferably a saturated aliphatic hydrocarbon group, the total number of the carbon atoms in $L^{b6}$ and $L^{b7}$ is at most 16;

$L^{b8}$ represents a $C_1$ to $C_{14}$ divalent aliphatic hydrocarbon group, the aliphatic hydrocarbon group is preferably a saturated aliphatic hydrocarbon group;

$L^{b9}$ and $L^{b10}$ independently represent a $C_1$ to $C_{11}$ divalent aliphatic hydrocarbon group, the aliphatic hydrocarbon group is preferably a saturated aliphatic hydrocarbon group, the total number of the carbon atoms in $L^{b9}$ and $L^{b10}$ is at most 12.

Among these, the divalent group represented by the formula (b1-1) is preferable, and the divalent group represented by the formula (b1-1) in which $L^{b2}$ represents a single bond or a —$CH_2$— is more preferable.

Specific examples of the divalent group represented by the formula (b1-1) include groups below. In the formula below, * represent a bond.

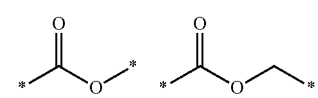

Specific examples of the divalent group represented by the formula (b1-2) include groups below.

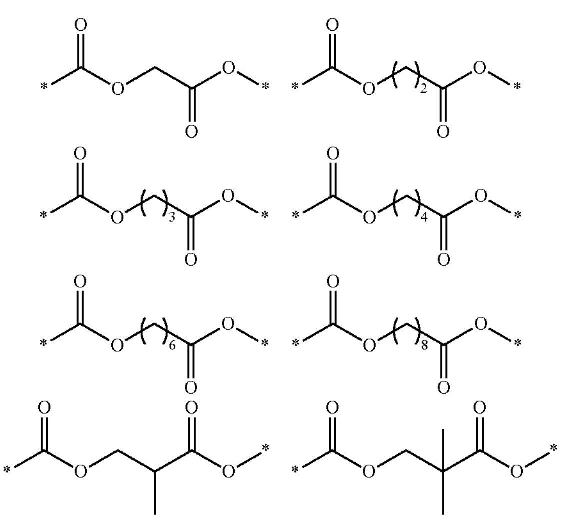

Specific examples of the divalent group represented by the formula (b1-3) include groups below.

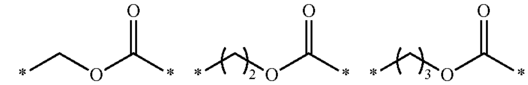

-continued

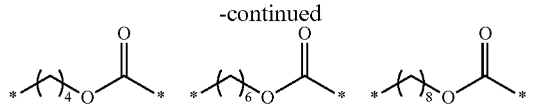

Specific examples of the divalent group represented by the formula (b1-4) include a group below.

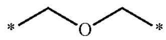

Specific examples of the divalent group represented by the formula (b1-5) include groups below.

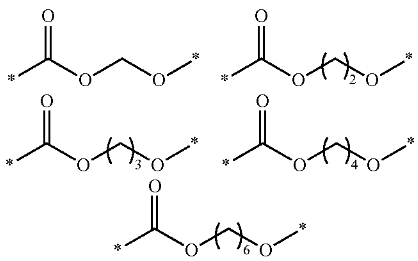

Specific examples of the divalent group represented by the formula (b1-6) include groups below.

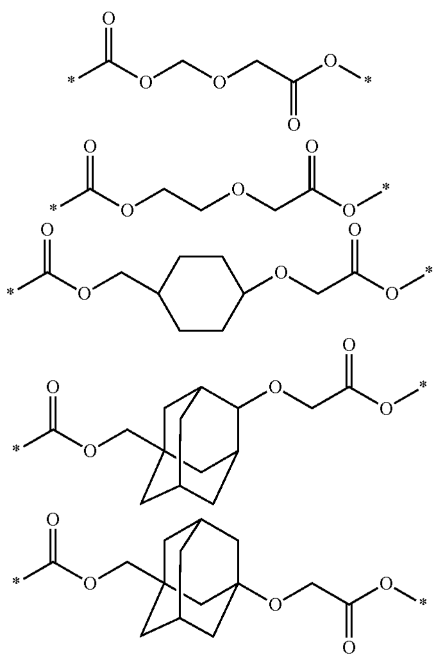

The aliphatic hydrocarbon group of $L^{a1}$ may have a substituent.

Examples of the substituent of the aliphatic hydrocarbon group of $L^{a1}$ include a halogen atom, a hydroxy group, a carboxy group, a $C_6$ to $C_{18}$ aromatic hydrocarbon group, a $C_7$ to $C_{21}$ aralkyl group, a $C_2$ to $C_4$ acyl group and a glycidyloxy group. Examples thereof include the same examples described above.

The aliphatic hydrocarbon group of Y is preferably an alkyl group and alicyclic hydrocarbon group or a combination group thereof, and more preferably a $C_1$ to $C_6$ alkyl group and a $C_3$ to $C_{12}$ alicyclic hydrocarbon group.

Examples of the substituent of Y include a halogen atom (other than a fluorine atom), a hydroxy group, a $C_1$ to $C_{12}$ alkoxy group, a $C_6$ to $C_{18}$ aromatic hydrocarbon group, a $C_7$ to $C_{21}$ aralkyl group, a $C_2$ to $C_4$ acyl group, a glycidyloxy group or a —$(CH_2)_{j2}$—O—CO—$R^{b1}$ group, wherein $R^{b1}$ represents a $C_1$ to $C_{16}$ hydrocarbon group, j2 represents an integer of 0 to 4. The aromatic hydrocarbon group and the aralkyl group may further have a substituent such as a $C_1$ to $C_6$ alkyl group, a halogen atom or a hydroxy group.

Examples of the hydrocarbon group of $R^{b1}$ include a $C_1$ to $C_{16}$ chain aliphatic hydrocarbon group, a $C_3$ to $C_{16}$ alicyclic hydrocarbon group and a $C_6$ to $C_{18}$ aromatic hydrocarbon group.

Examples of Y in which a —$CH_2$— contained in the aliphatic hydrocarbon group is replaced by —O—, —CO— or $SO_2$— include, for example,

- a cyclic ether group (a group replaced one or two —$CH_2$— by one or two —O—),
- a cyclic ketone group (a group replaced one or two —$CH_2$— by one or two —CO—),
- a sultone ring group (a group replaced adjacent two —$CH_2$— by —O— and —$SO_2$—, respectively as described in the formula (a7-4)), or
- a lactone ring group (a group replaced adjacent two —$CH_2$— by —O— and —CO—, respectively).

The aliphatic hydrocarbon group of Y is preferably groups represented by the formula (Y1) to the formula (Y5), more preferably a group represented by the formula (Y1), the formula (Y2), the formula (Y3) or the formula (Y5), and still more preferably a group represented by the formula (Y1) and the formula (Y2). The substituent thereof is preferably a hydroxy group.

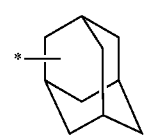

(Y1)

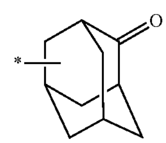

(Y2)

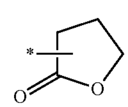

(Y3)

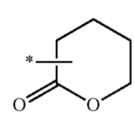

(Y4)

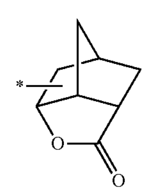

(Y5)

Examples of Y having alkyl group(s)-containing alicyclic hydrocarbon group include the groups below.

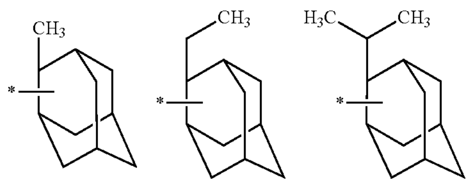

Examples of Y having a hydroxy group or a hydroxy group-containing alicyclic hydrocarbon group include the groups below.

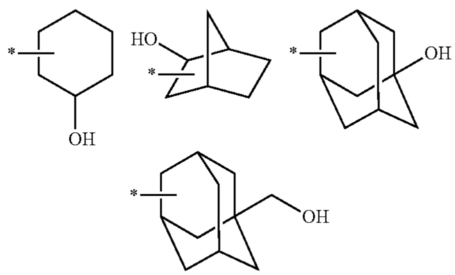

Examples of Y having an aromatic hydrocarbon group-containing alicyclic hydrocarbon group include the groups below.

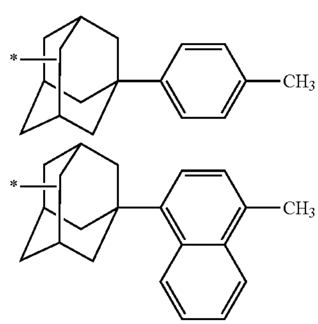

Examples of Y having a —$(CH_2)_{j2}$—O—CO—$R^{b1}$ group-containing alicyclic hydrocarbon group include the group below.

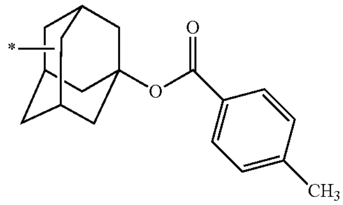

Y is preferably an adamantyl group which is optionally substituted, for example, a hydroxy group, and more preferably an adamantyl group and a hydroxyadamantyl group.

The sulfonate anion is preferably an anion represented by the formula (b1-1-1) to the formula (b1-1-9) below in which $L^{b1}$ is a group represented by the formula (b1-1).

In the formula (b1-1-1) to the formula (b1-1-9), $Q^1$, $Q^2$ and $L^{b2}$ represent the same meaning as defined above (preferably both fluorine atom for $Q^1$ and $Q^2$). $R^{b2}$ and $R^{b3}$ independently represent a group which is the same group described in the substituent of Y, is preferably a $C_1$ to $C_4$ aliphatic hydrocarbon group or a hydroxy group, and more preferably methyl group or a hydroxy group.

(b1-1-1)

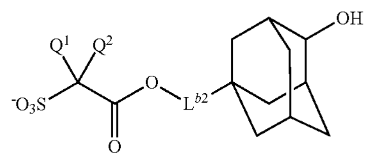

(b1-1-2)

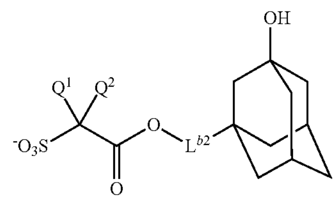

(b1-1-3)

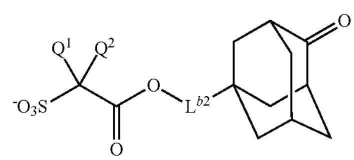

(b1-1-4)

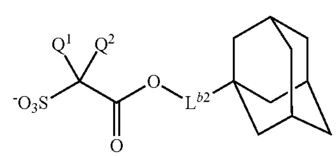

(b1-1-5)

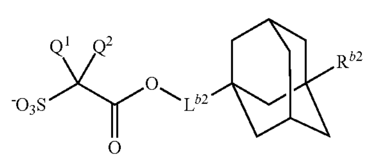

(b1-1-6)

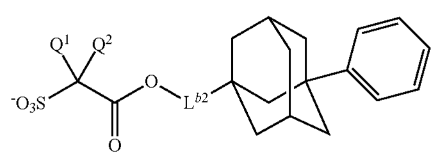

(b1-1-7)

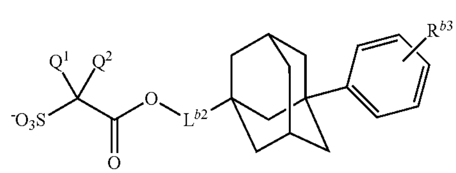

(b1-1-8)

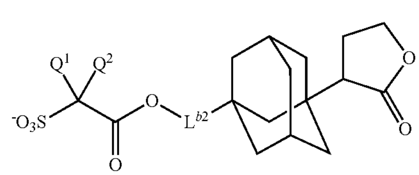

-continued (b1-1-9)

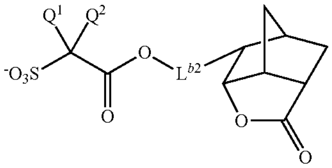

Examples of the sulfonate anion having a chain aliphatic hydrocarbon group or a non-substituted alicyclic hydrocarbon for Y, and a divalent group represented by the formula (b1-1) for $L^{a1}$ include anions below.

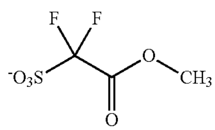
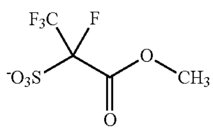
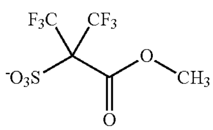
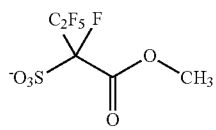
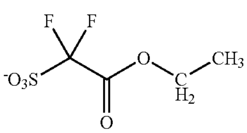
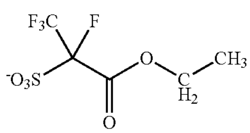
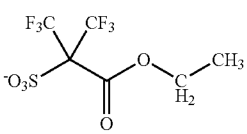
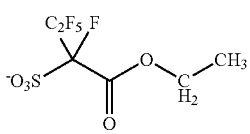
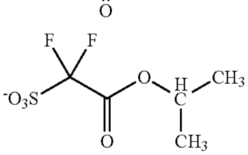
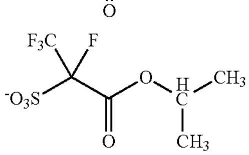
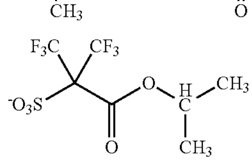

Examples of the sulfonate anion having a non-substituted alicyclic hydrocarbon group or an alicyclic hydrocarbon group substituted with an aliphatic hydrocarbon group for Y, and a divalent group represented by the formula (b1-1) for $L^{a1}$ include anions below.

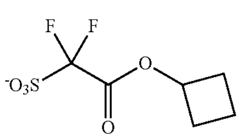
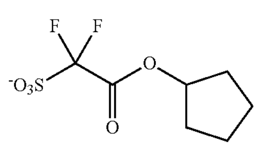
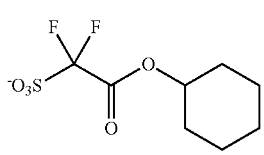
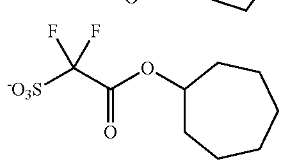

-continued

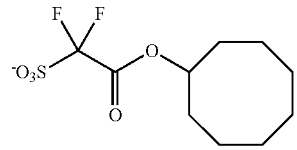
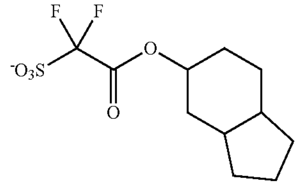
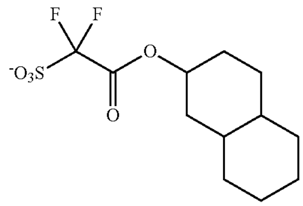
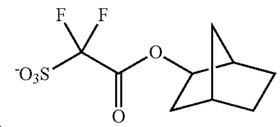
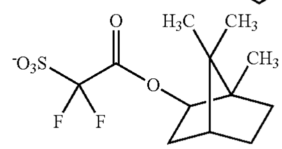
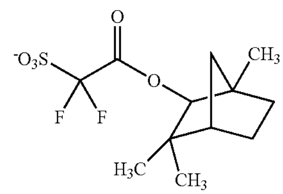
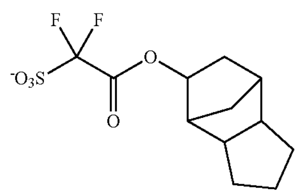
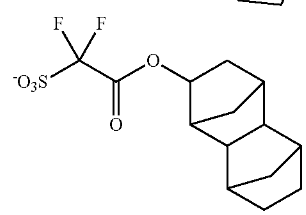
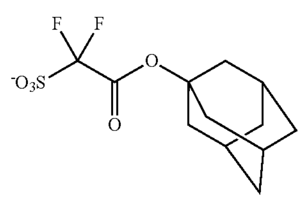
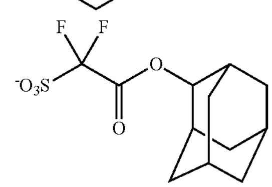
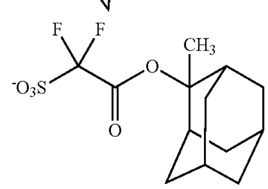
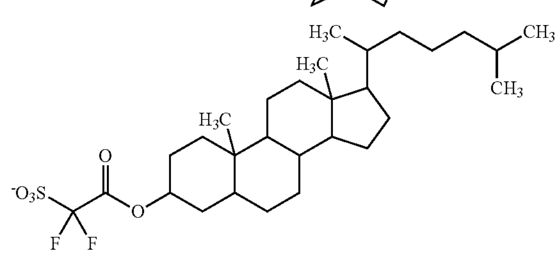

-continued
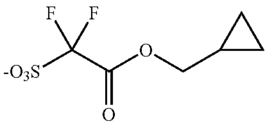
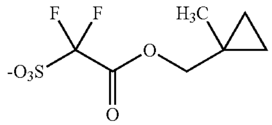
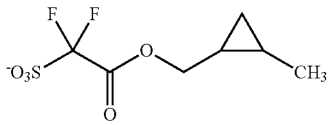
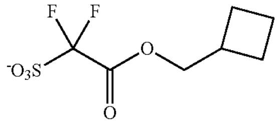
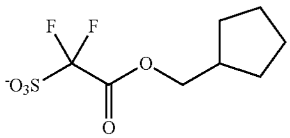
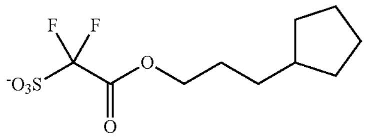
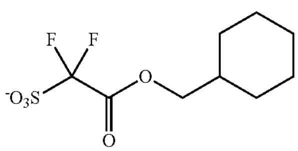
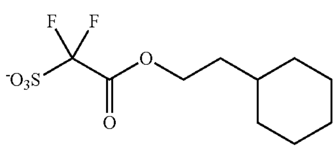
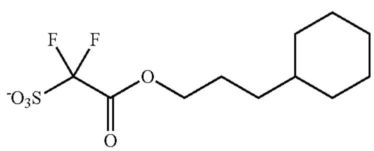
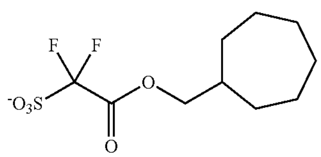
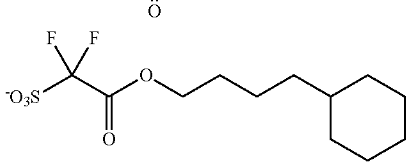
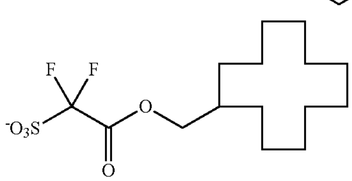
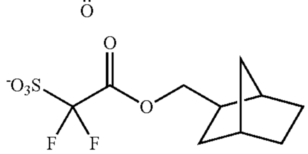
-continued
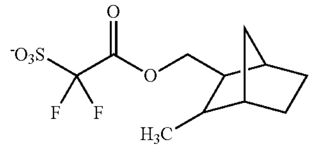
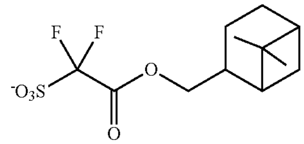
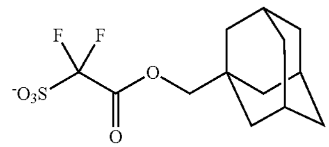
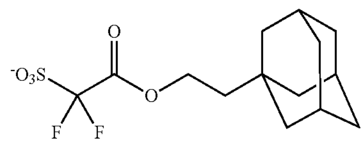
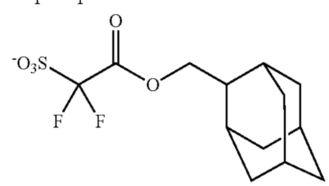
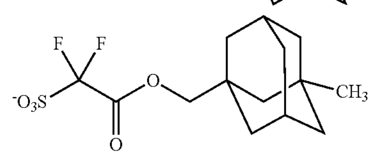
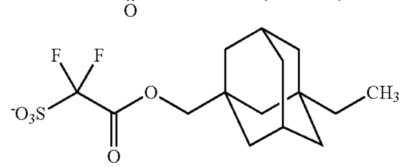
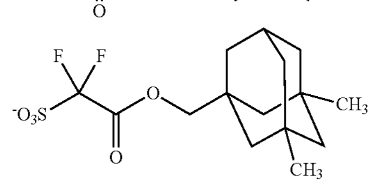
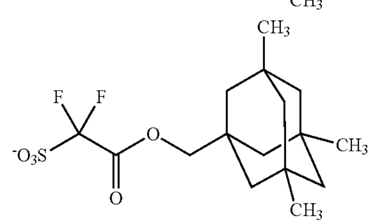
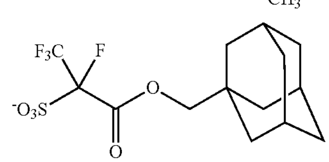
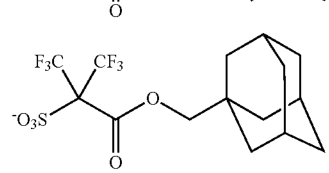

-continued

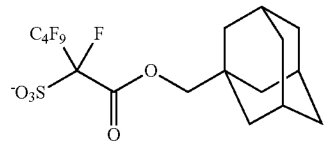

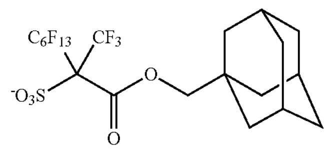

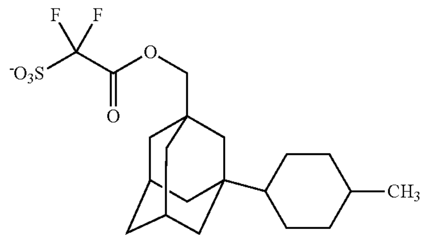

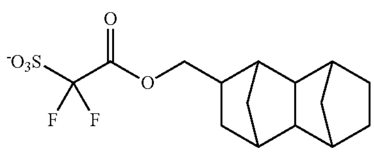

Examples of the sulfonate anion having an alicyclic hydrocarbon group substituted with a —$(CH_2)_{j2}$—CO—O—$R^{b1}$ group for Y, and a divalent group represented by the formula (b1-1) for $L^{a1}$ include anions below.

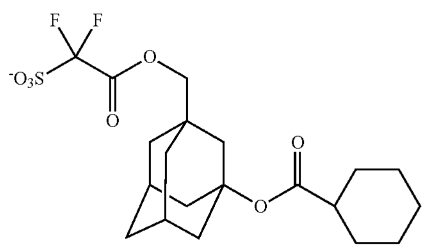

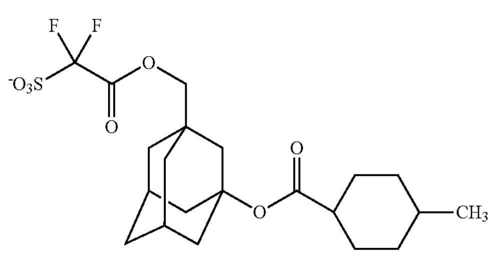

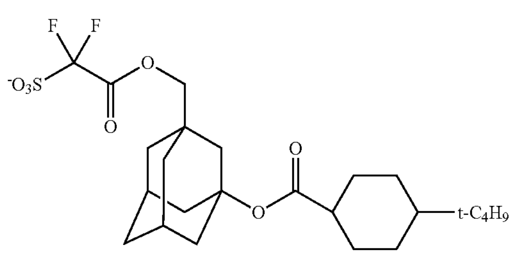

-continued

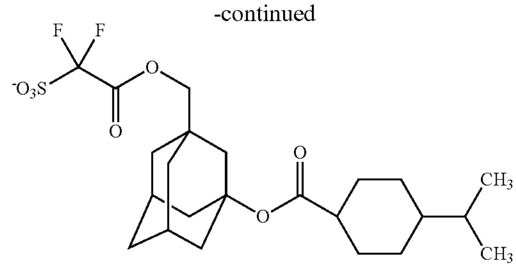

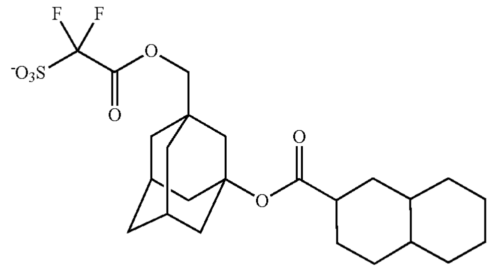

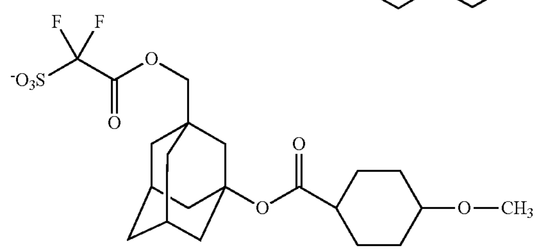

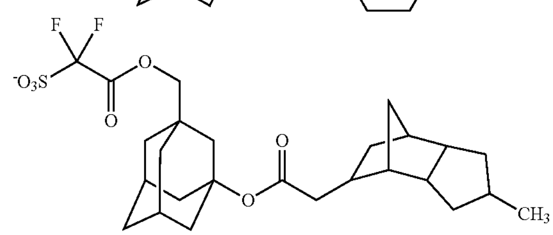

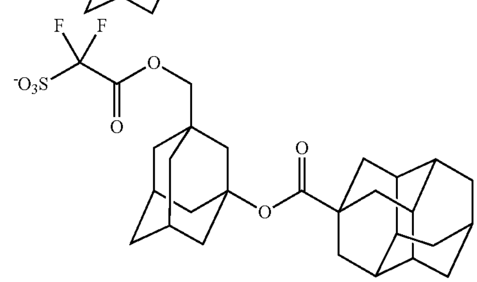

Examples of the sulfonate anion having an alicyclic hydrocarbon group substituted with a hydroxy group for Y, and a divalent group represented by the formula (b1-1) for $L^{a1}$ include anions below.

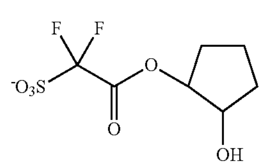

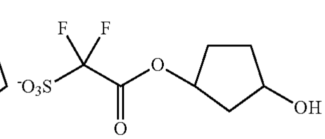

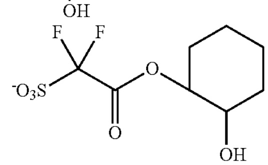

-continued
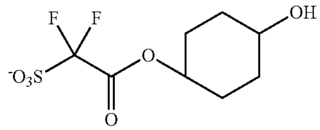
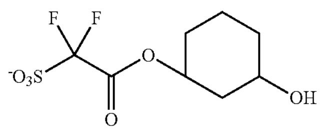
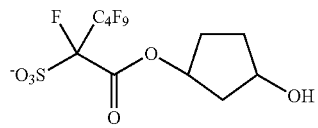
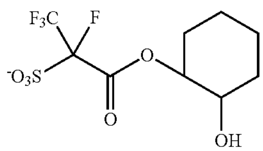
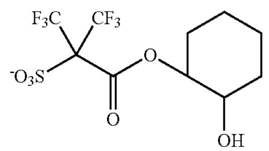
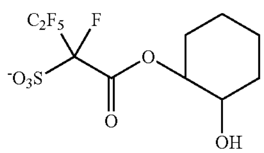
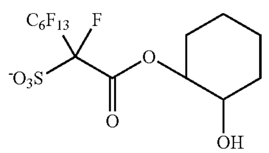
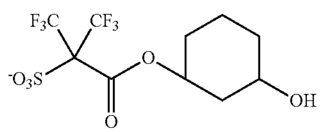
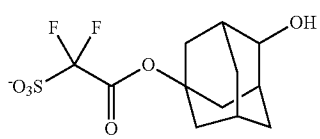
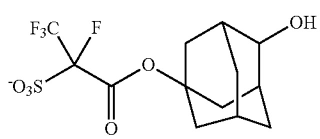
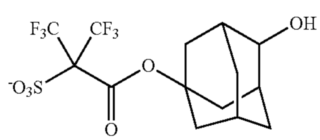
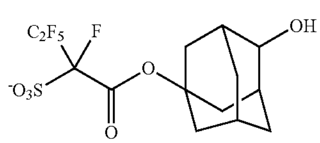
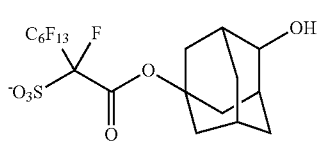
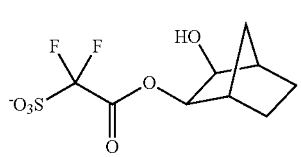
-continued
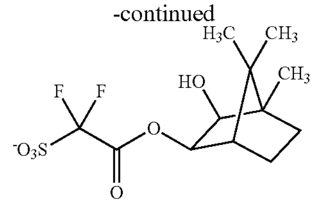
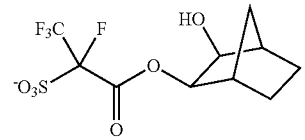
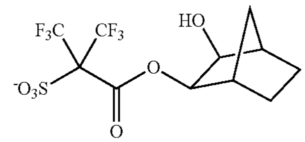
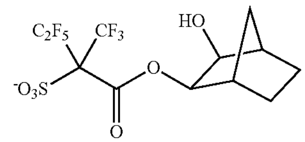
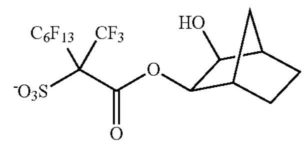
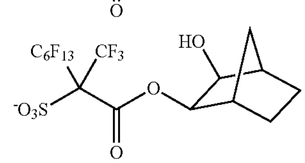
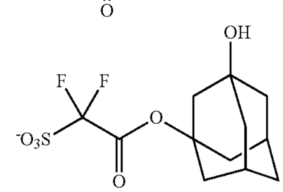
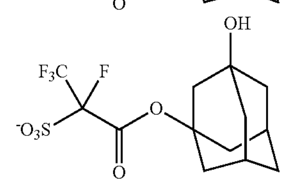
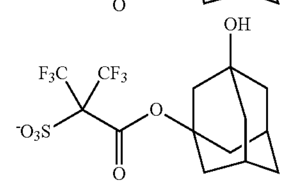
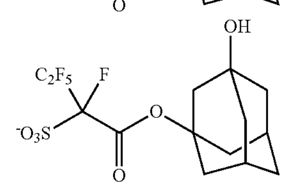
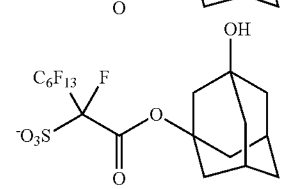

-continued
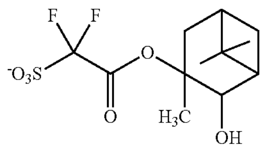
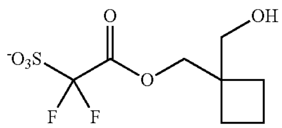
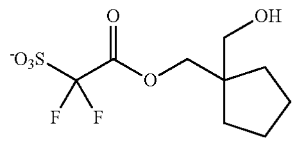
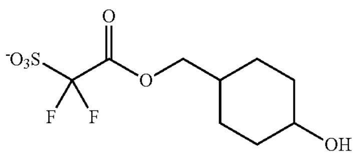
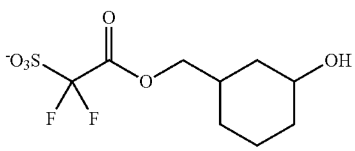
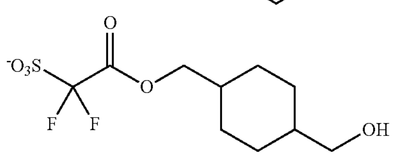
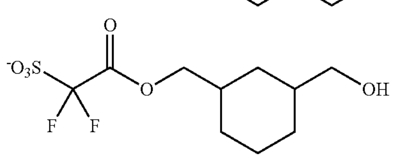
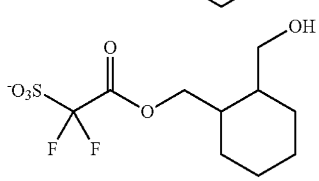
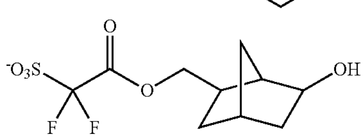
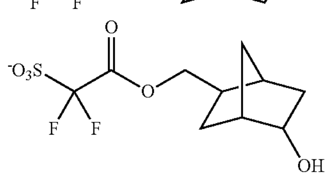
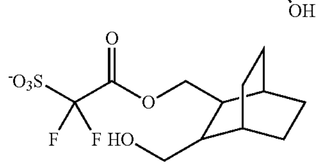
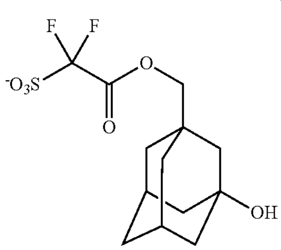
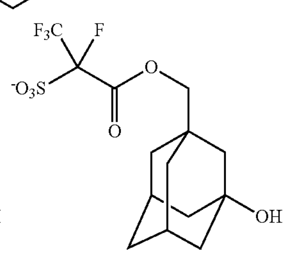
-continued
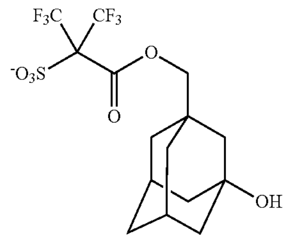
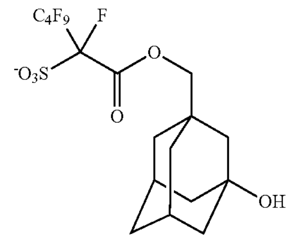
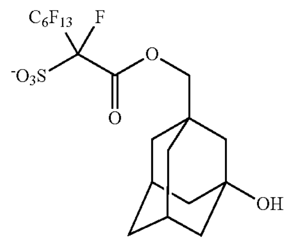
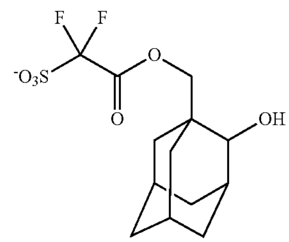
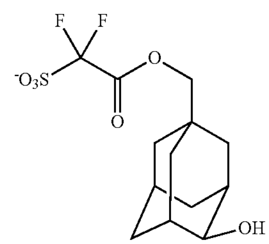
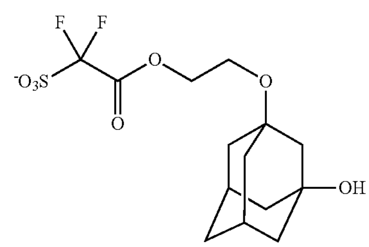
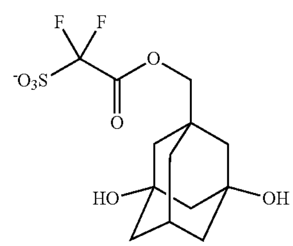
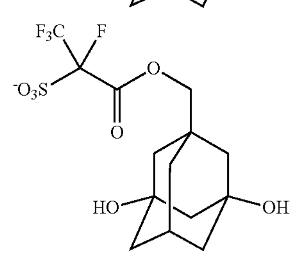
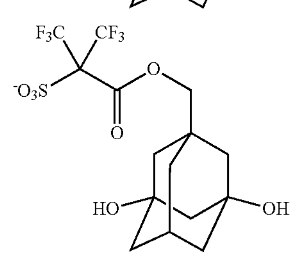

-continued
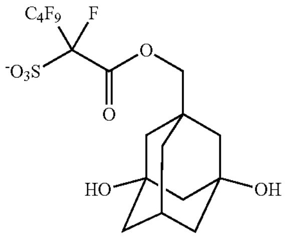
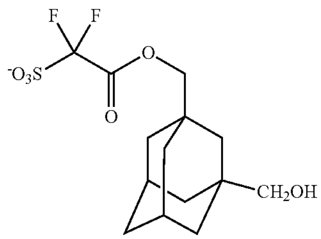
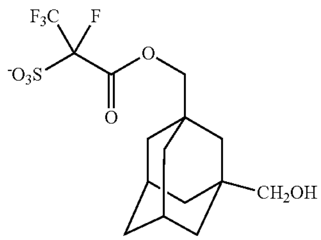
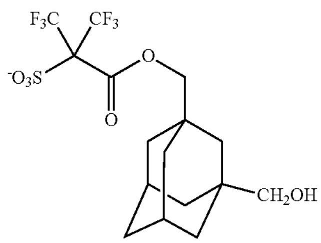
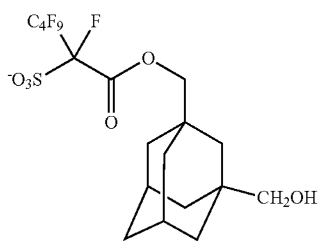
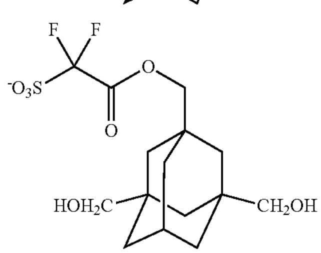
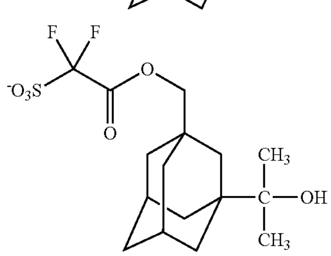
-continued
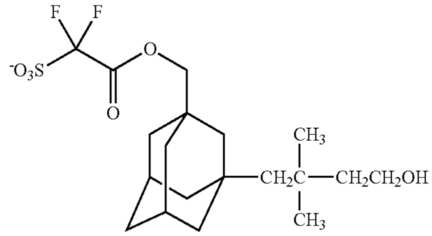
Examples of the sulfonate anion having an aliphatic hydrocarbon group substituted with an aromatic hydrocarbon group or a aralkyl group for Y, and a divalent group represented by the formula (b1-1) for $L^{a1}$ include anions below.
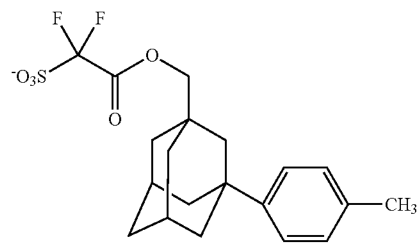
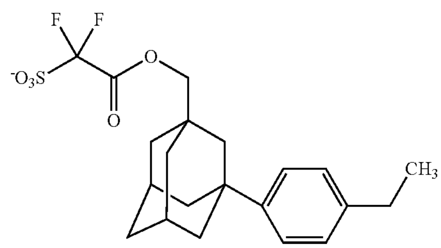
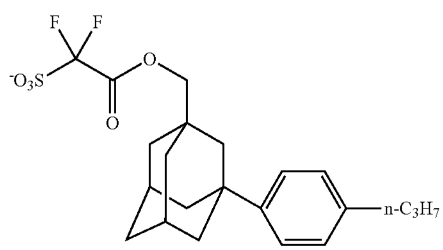
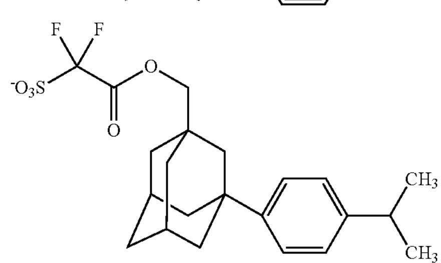
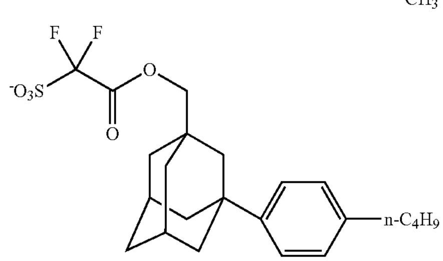

-continued
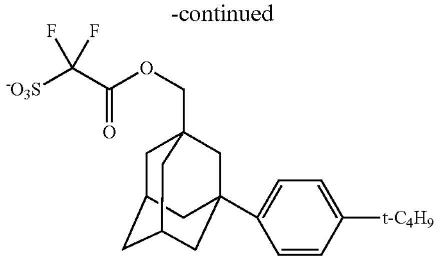
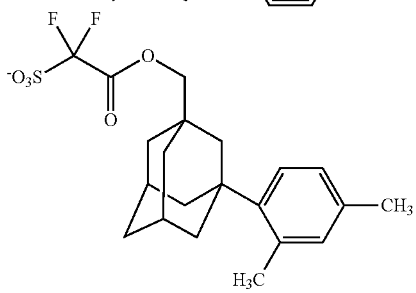
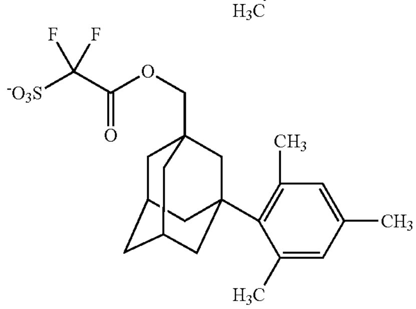
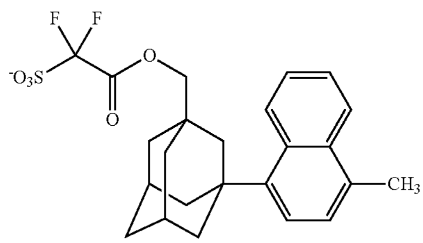
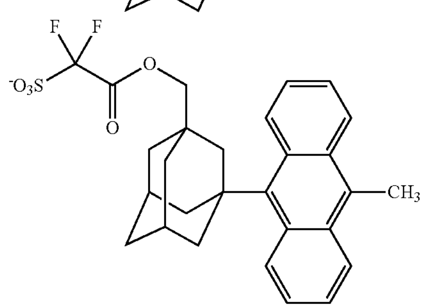
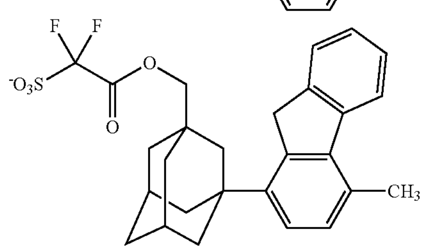
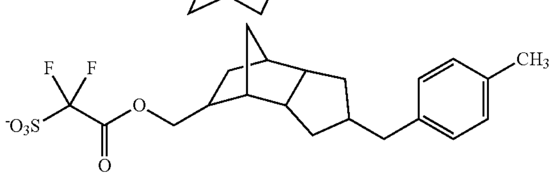
-continued
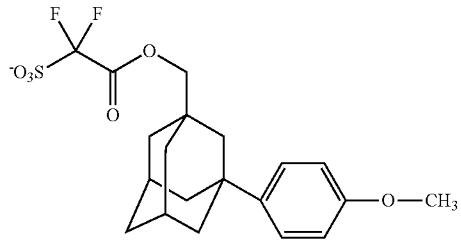
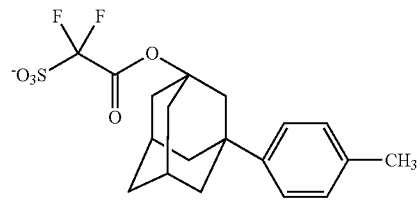
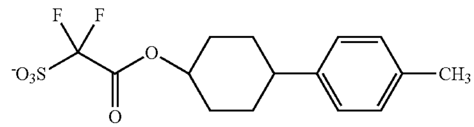
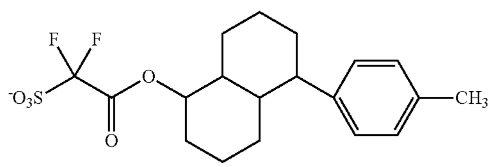
Examples of the sulfonate anion having a cyclic ether group for Y, and a divalent group represented by the formula (b1-1) for $L^{a1}$ include anion below.
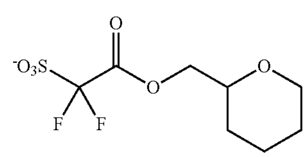
Examples of the sulfonate anion having a lactone ring for Y, and a divalent group represented by the formula (b1-1) for $L^{a1}$ include anions below.
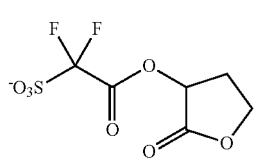
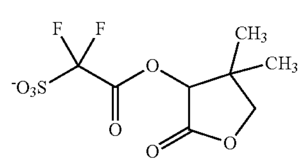
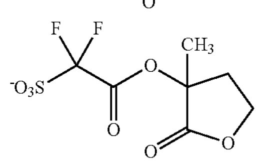
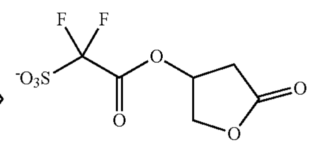
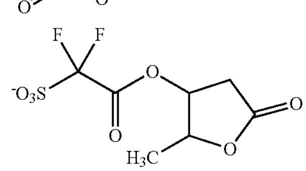

-continued
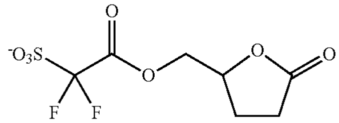
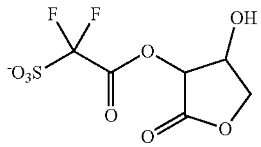
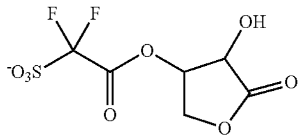
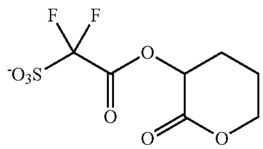
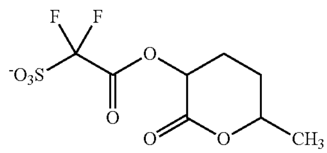
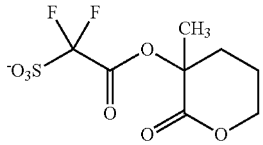
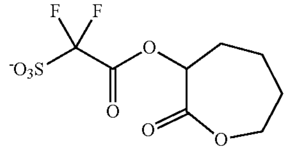
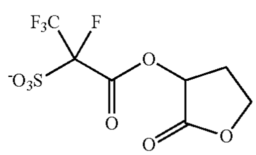
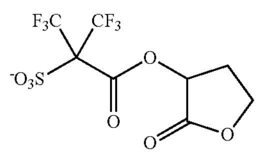
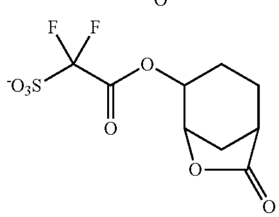
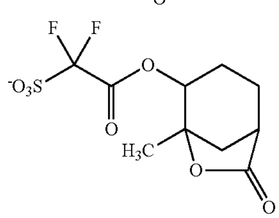
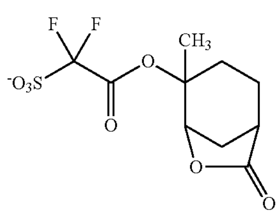
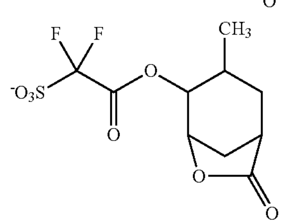
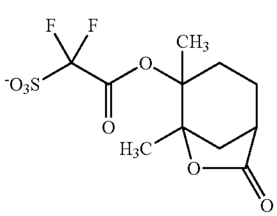
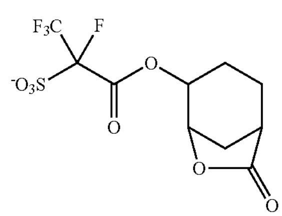
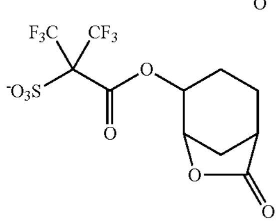
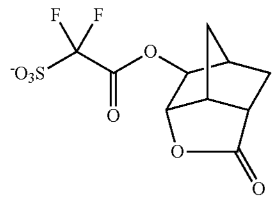
-continued
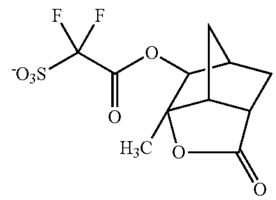
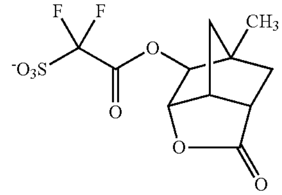
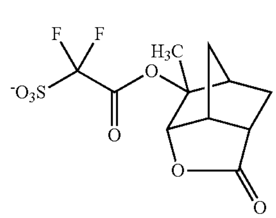
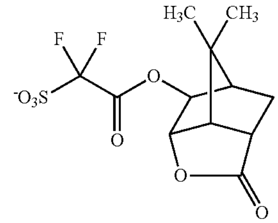
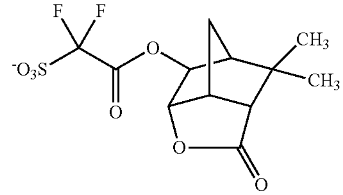
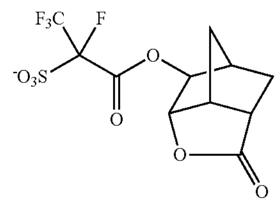
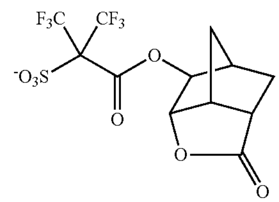
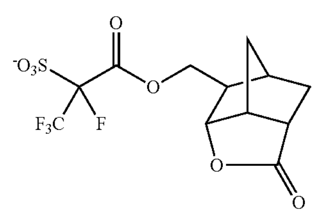
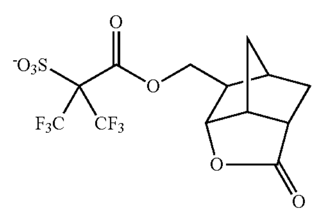
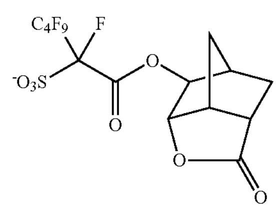
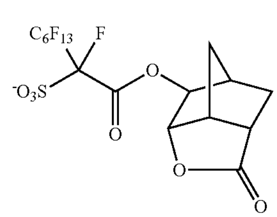

-continued
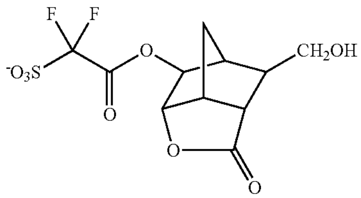
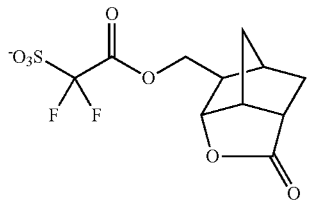
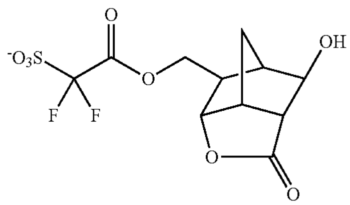
Examples of the sulfonate anion having a cyclic ketone group for Y, and a divalent group represented by the formula (b1-1) for $L^{a1}$ include anions below.
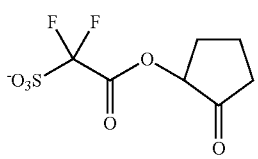
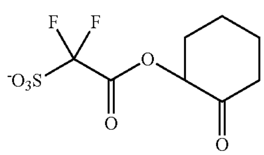
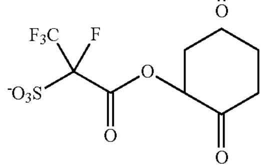
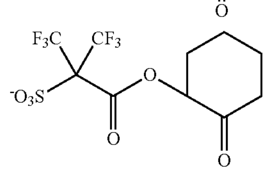
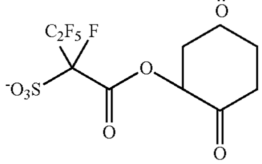
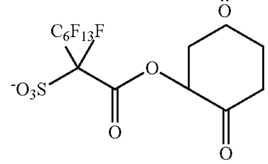
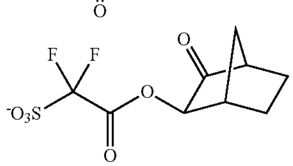
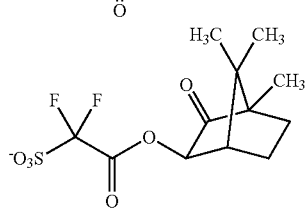
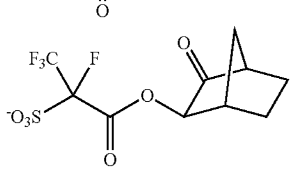
-continued
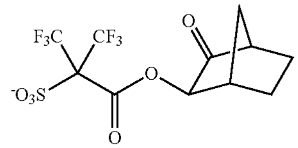
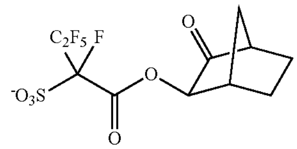
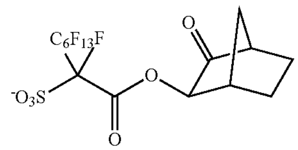
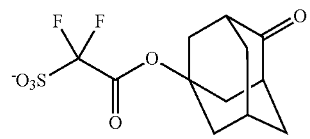
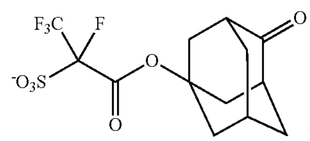
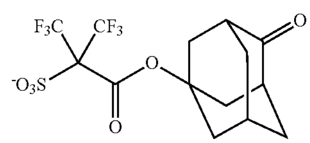
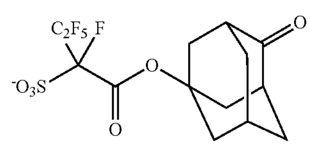
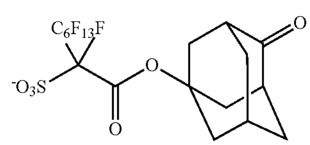
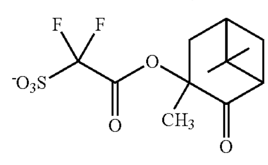
Examples of the sulfonate anion having a sultone ring group for Y, and a divalent group represented by the formula (b1-1) for $L^{a1}$ include anions below.
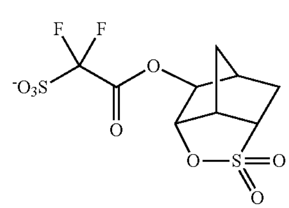
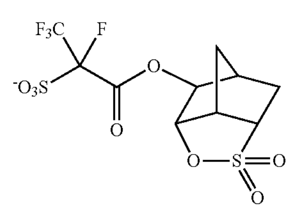

-continued
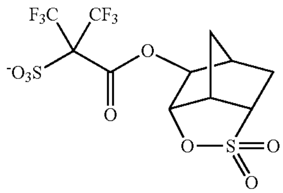
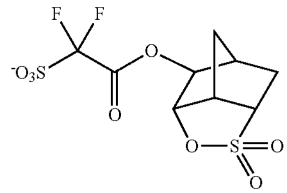
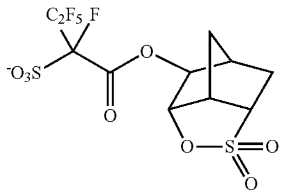
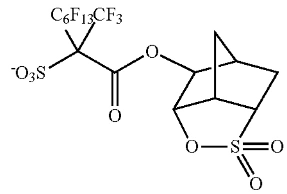
Examples of the sulfonate anion having a chain aliphatic hydrocarbon group or a non-substituted alicyclic hydrocarbon for Y, and a divalent group represented by the formula (b1-2) for $L^{a1}$ include anions below.
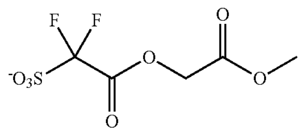
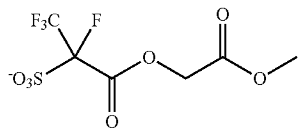
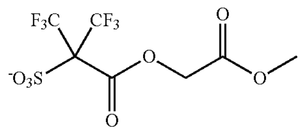
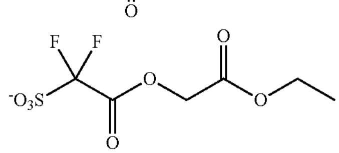
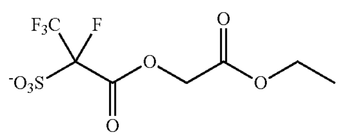
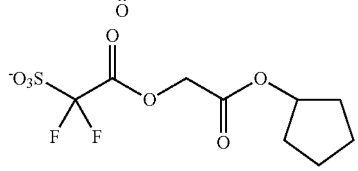
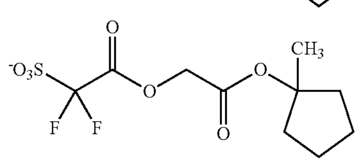
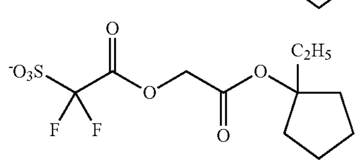
-continued
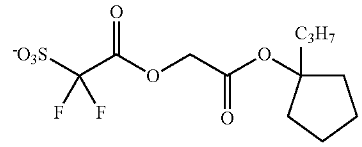
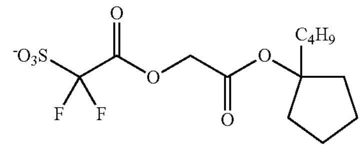
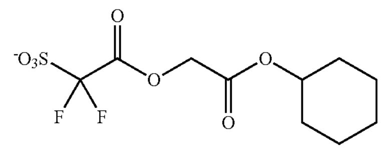
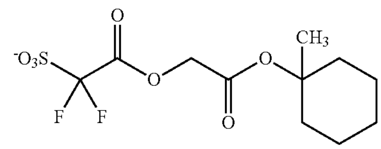
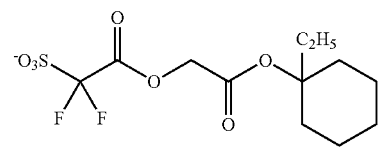
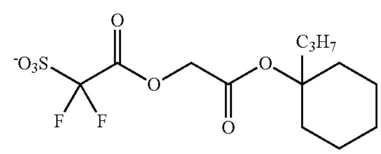
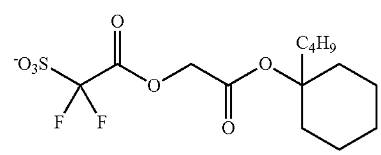
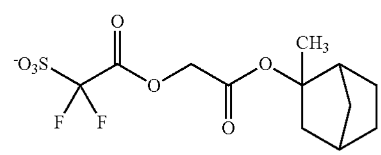
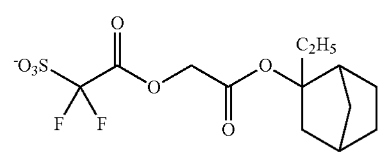
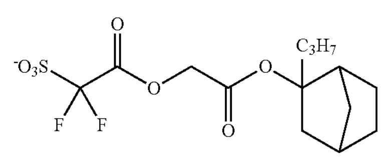
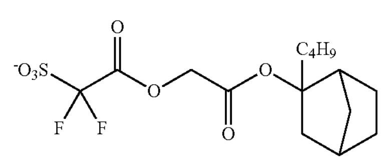

-continued
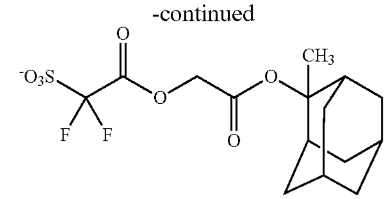
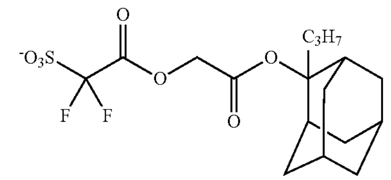
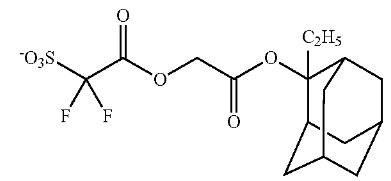
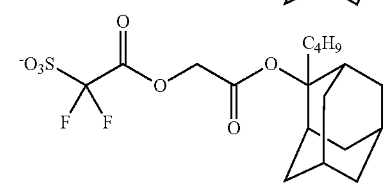
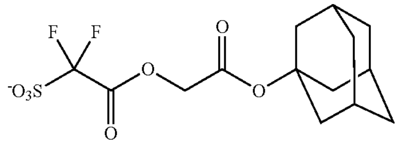
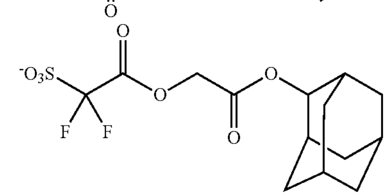
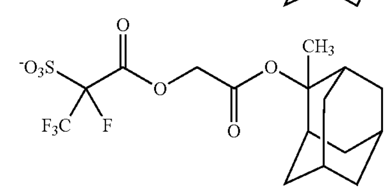
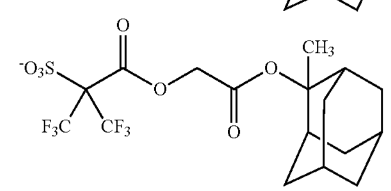
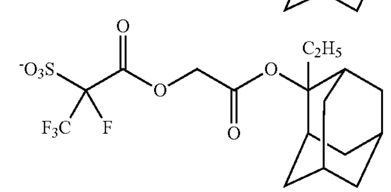
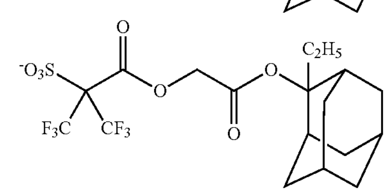
-continued
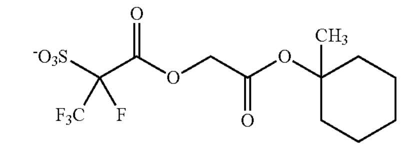
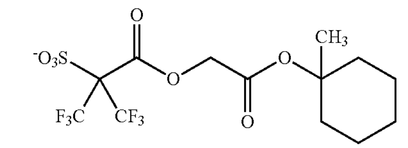
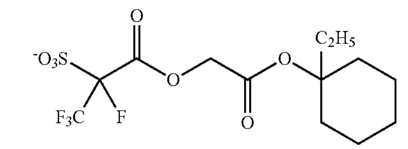
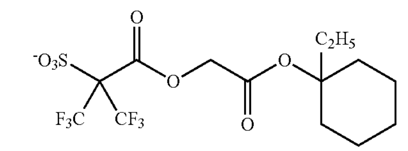
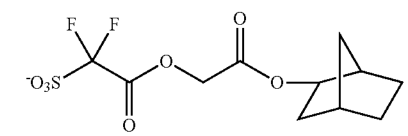
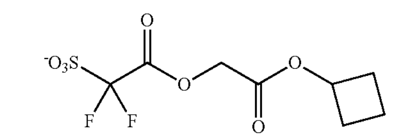
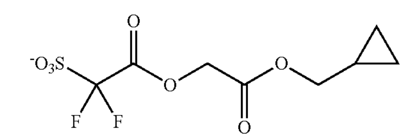
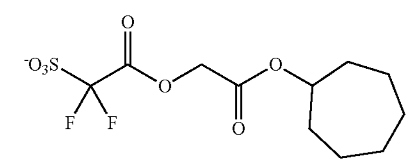
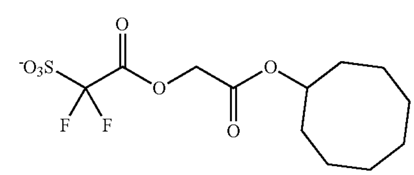
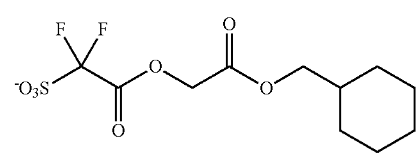
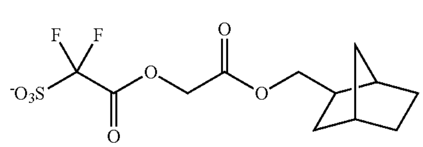

-continued

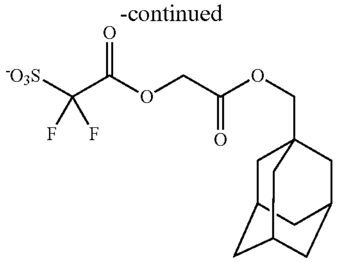

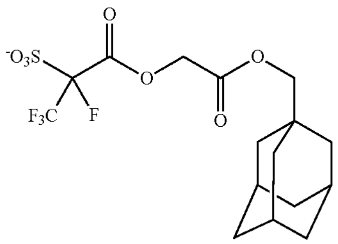

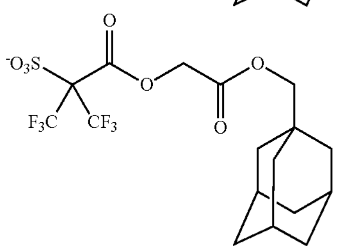

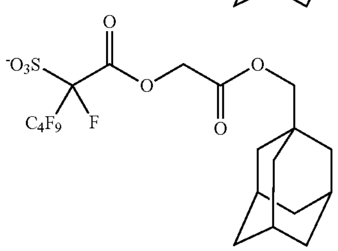

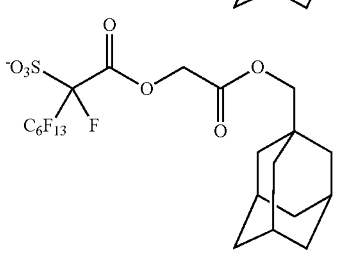

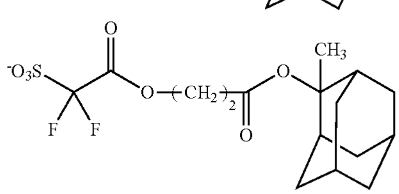

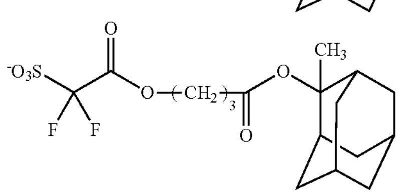

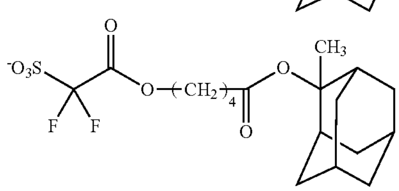

-continued

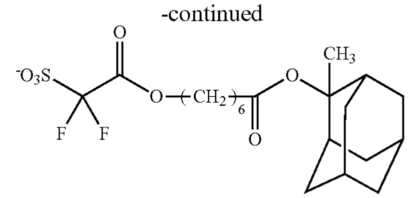

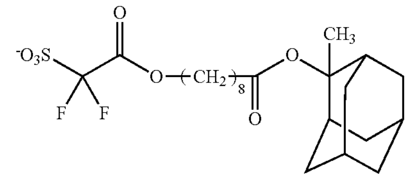

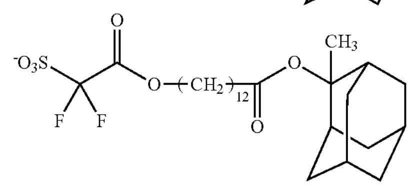

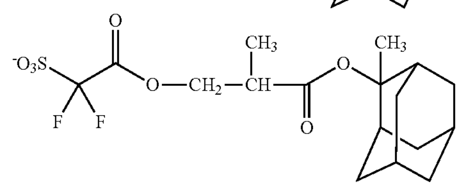

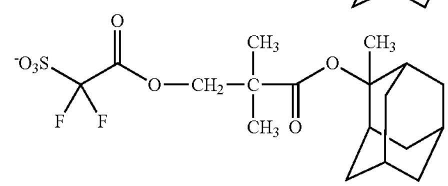

Examples of the sulfonate anion having an alicyclic hydrocarbon group substituted with a —$(CH_2)_p$—CO—O—$R^{b1}$ group for Y, and a divalent group represented by the formula (b1-2) for $L^{a1}$ include anions below.

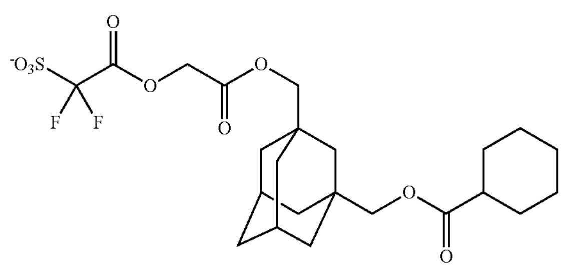

Examples of the sulfonate anion having an alicyclic hydrocarbon group substituted with a hydroxy group for Y, and a divalent group represented by the formula (b1-2) for $L^{a1}$ include anions below.

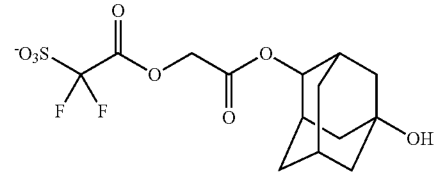

-continued
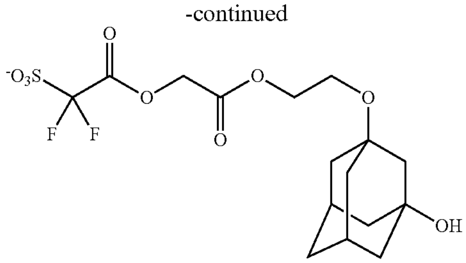
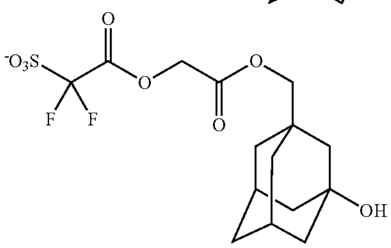
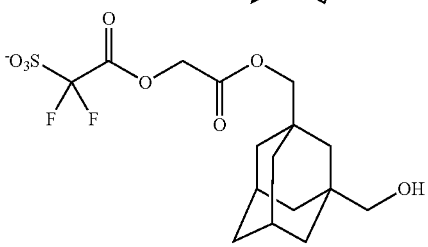
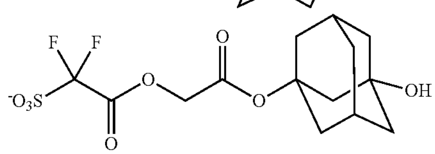
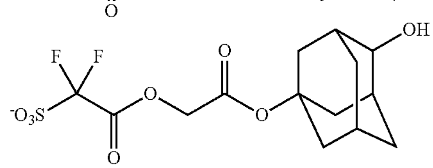
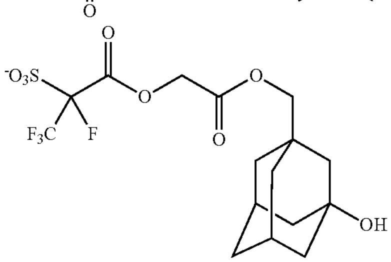
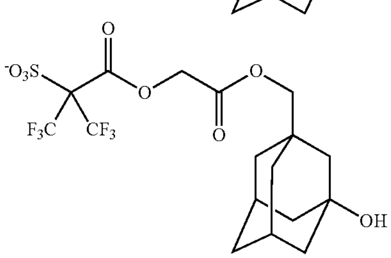
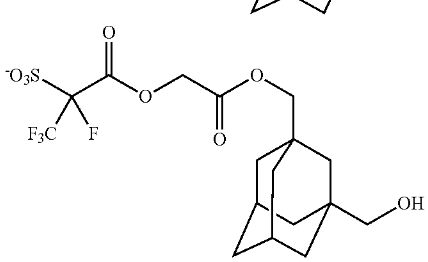
-continued
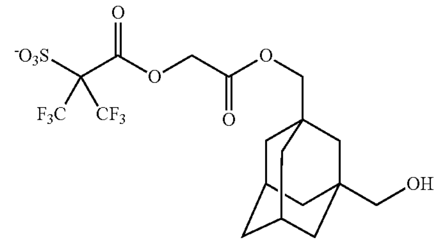
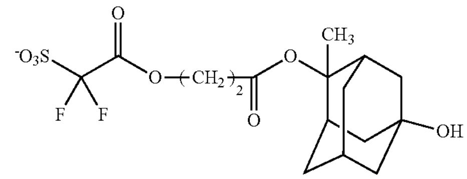
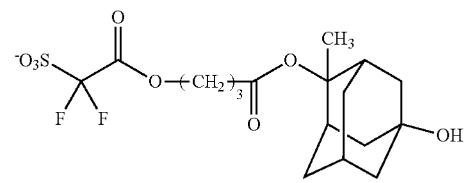
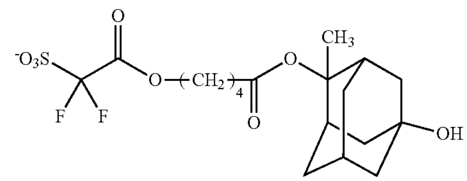
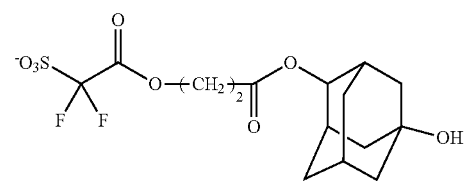
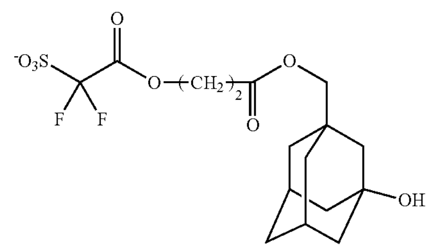
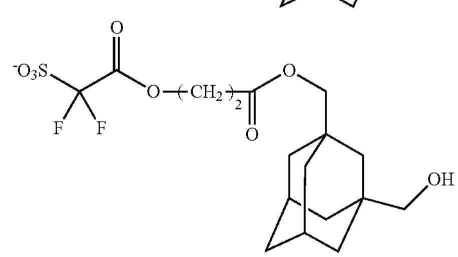
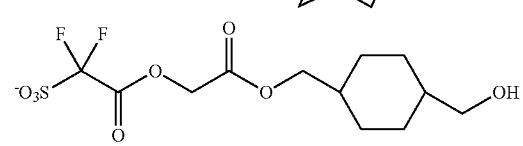
Examples of the sulfonate anion having an aliphatic hydrocarbon group substituted with an aromatic hydrocarbon group or a aralkyl group for Y, and a divalent group represented by the formula (b1-2) for $L^{a1}$ include anions below.

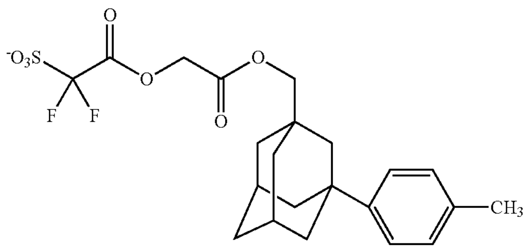
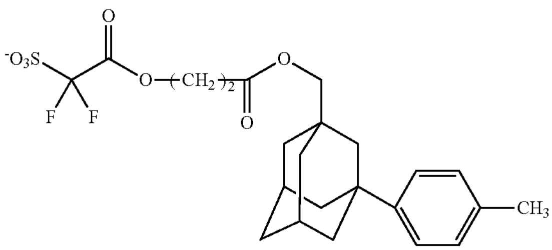
Examples of the sulfonate anion having a cyclic ether group for Y, and a divalent group represented by the formula (b1-2) for $L^{a1}$ include anion below.
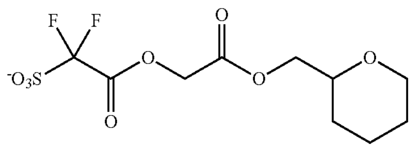
Examples of the sulfonate anion having a lactone ring for Y, and a divalent group represented by the formula (b1-2) for $L^{a1}$ include anions below.
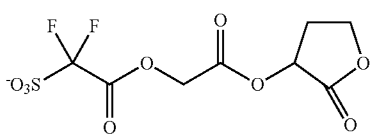
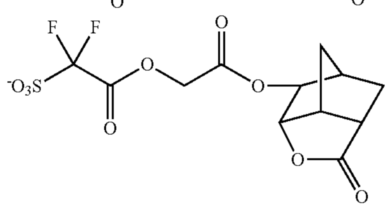
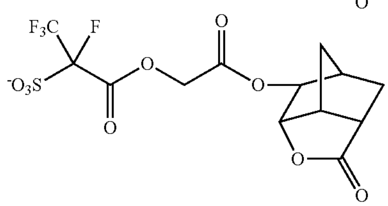
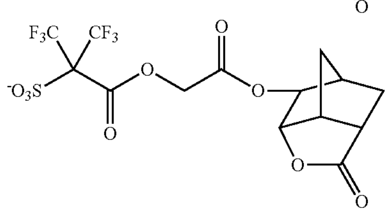
-continued
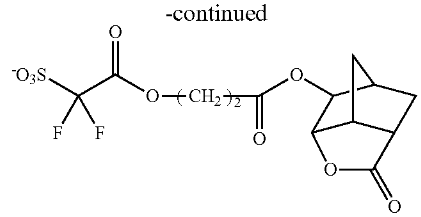
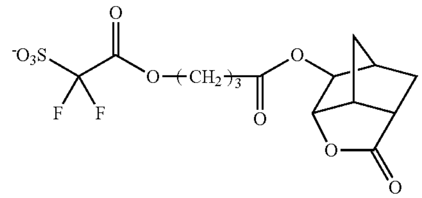
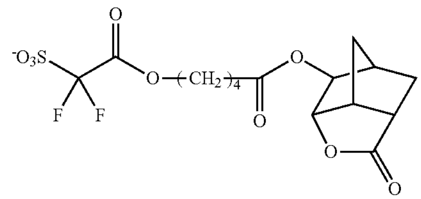
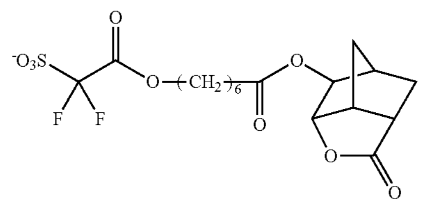
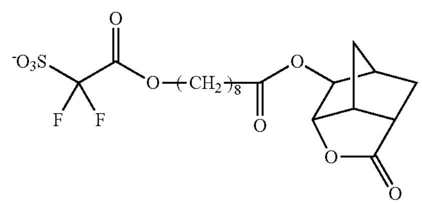
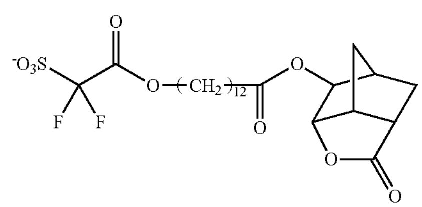
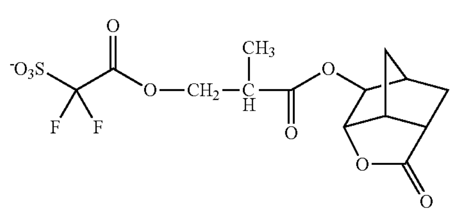
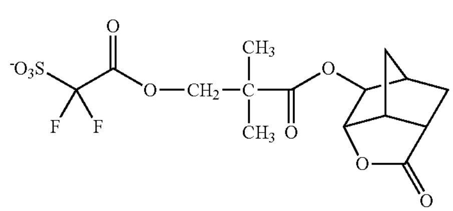

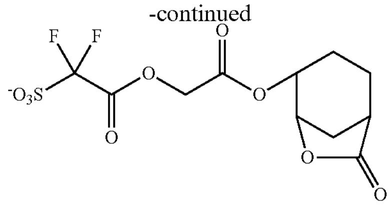
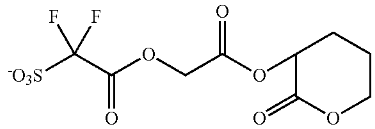
Examples of the sulfonate anion having a cyclic ketone group for Y, and a divalent group represented by the formula (b1-2) for $L^{a1}$ include anions below.
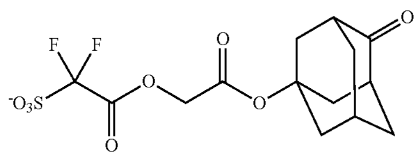
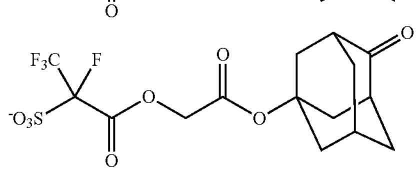
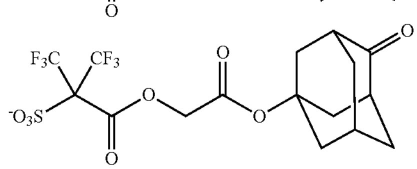
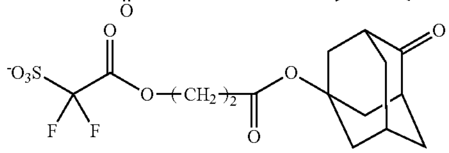
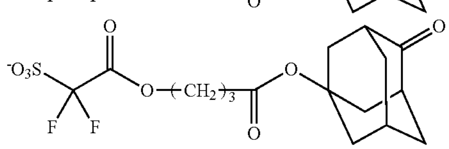
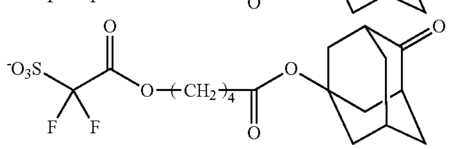
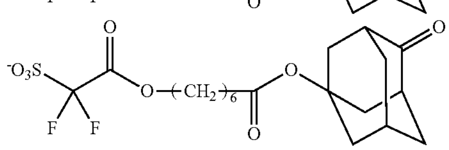
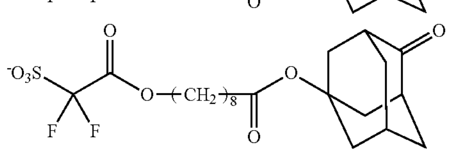
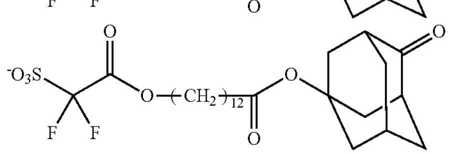
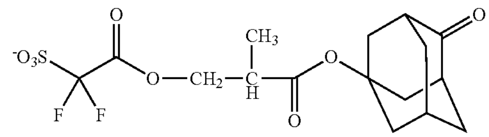
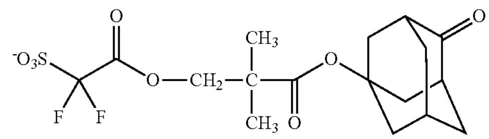
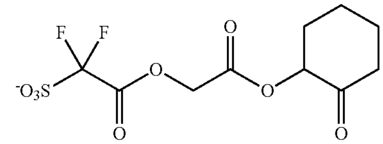
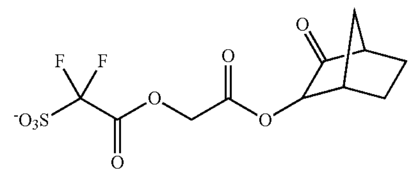
Examples of the sulfonate anion having a sultone ring group for Y, and a divalent group represented by the formula (b1-2) for $L^{a1}$ include anions below.
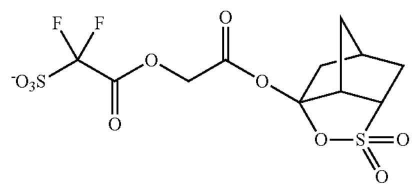
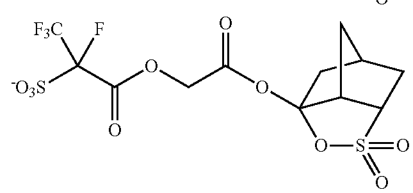
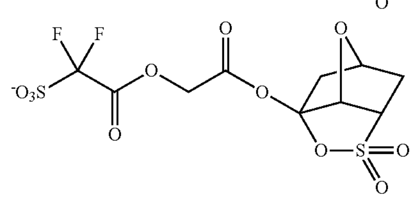
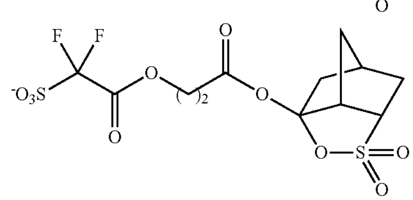
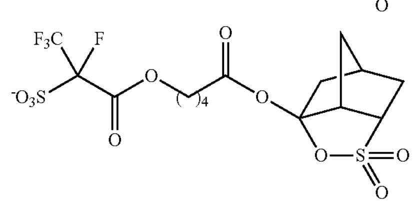

-continued

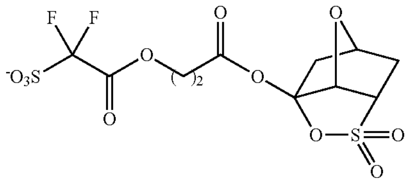

Examples of the sulfonate anion having a chain aliphatic hydrocarbon group for Y, and a divalent group represented by the formula (b1-3) for $L^{a1}$ include anions below.

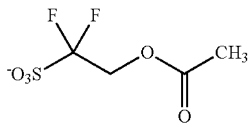

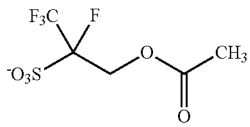

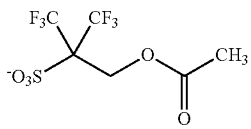

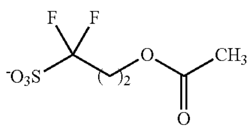

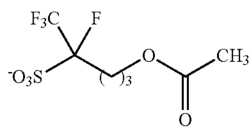

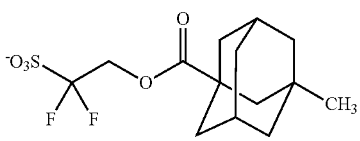

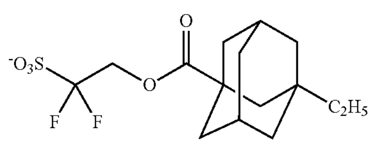

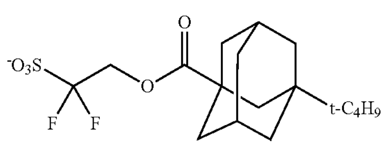

Examples of the sulfonate anion having an alicyclic hydrocarbon group substituted with an alkoxy group for Y, and a divalent group represented by the formula (b1-3) for $L^{a1}$ include anions below.

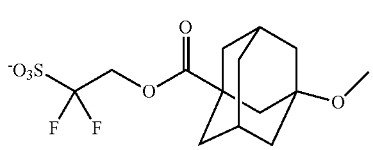

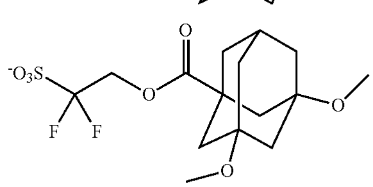

-continued

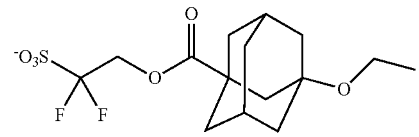

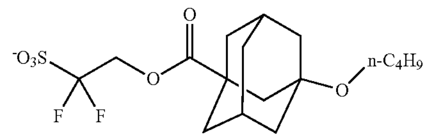

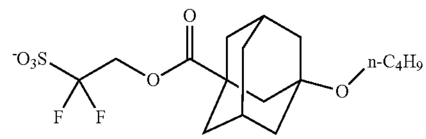

Examples of the sulfonate anion having an alicyclic hydrocarbon group substituted with a hydroxy group for Y, and a divalent group represented by the formula (b1-3) for $L^{a1}$ include anions below.

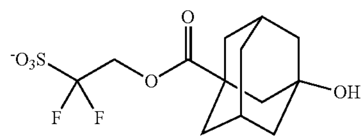

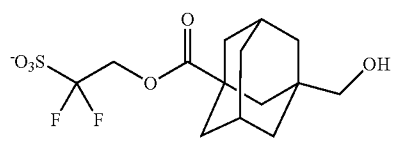

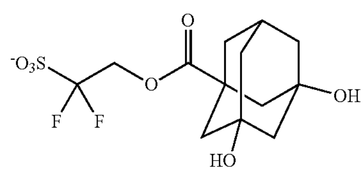

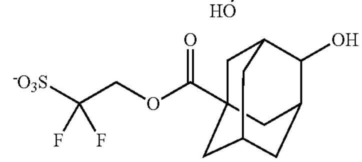

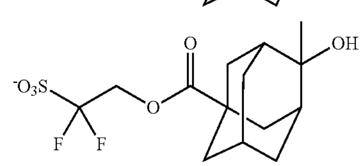

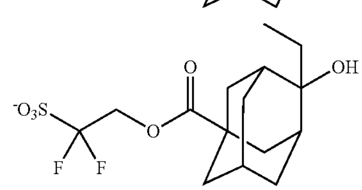

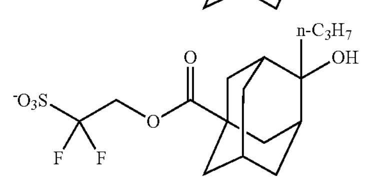

-continued

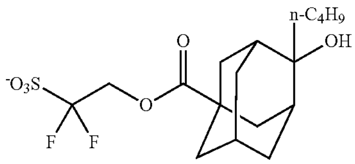

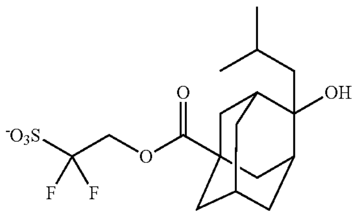

Examples of the sulfonate anion having a cyclic ketone group for Y, and a divalent group represented by the formula (b1-3) for $L^{a1}$ include anions below.

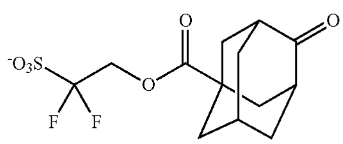

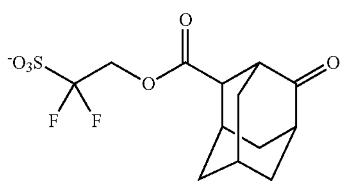

Examples of the sulfonate anion having a chain aliphatic hydrocarbon group for Y, and a divalent group represented by the formula (b1-4) for $L^{a1}$ include anion below.

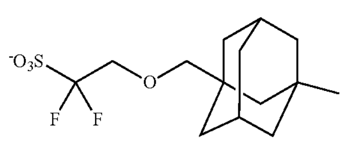

Examples of the sulfonate anion having an alicyclic hydrocarbon group substituted with an alkoxy group for Y, and a divalent group represented by the formula (b1-4) for $L^{a1}$ include anions below.

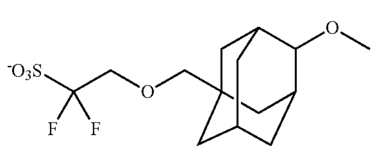

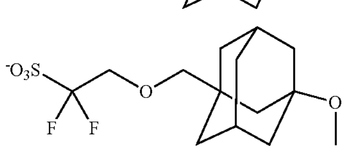

-continued

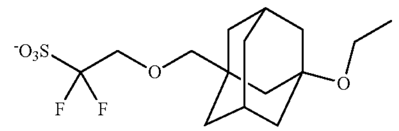

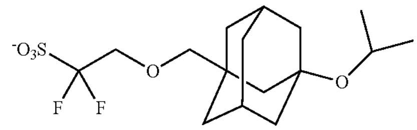

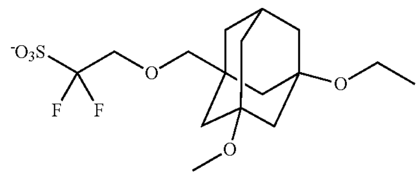

Examples of the sulfonate anion having an alicyclic hydrocarbon group substituted with a hydroxy group for Y, and a divalent group represented by the formula (b1-4) for $L^{a1}$ include anions below.

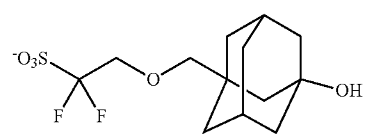

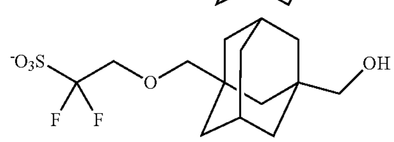

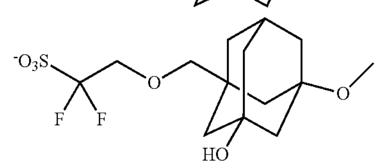

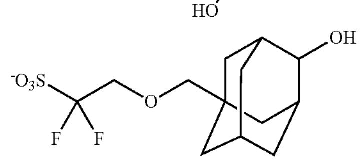

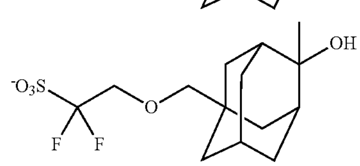

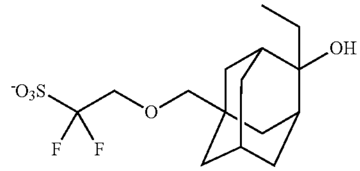

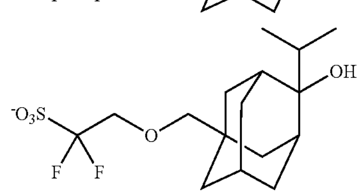

-continued

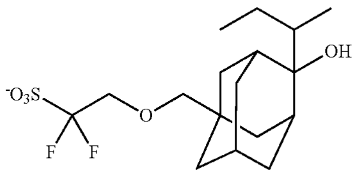

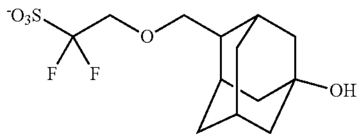

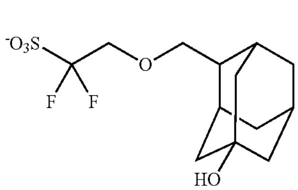

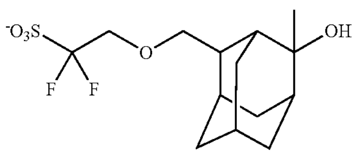

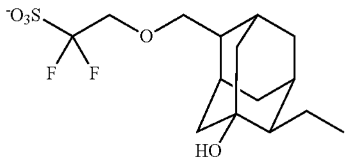

Examples of the sulfonate anion having a cyclic ketone group for Y, and a divalent group represented by the formula (b1-4) for $L^{a1}$ include anions below.

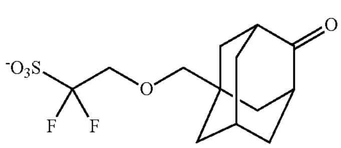

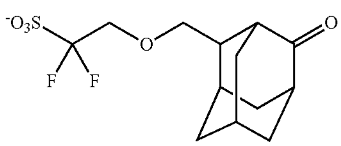

Among these, a sulfonate anion containing a divalent group represented by the formula (b1-1) for $L^{a1}$ is preferable. Specific examples of the preferable sulfonate anion include an anion below.

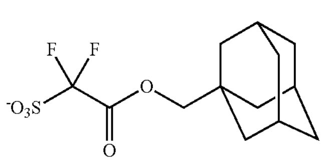

-continued

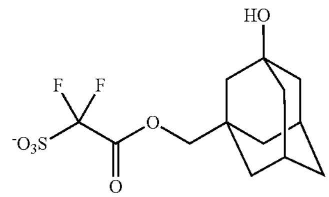

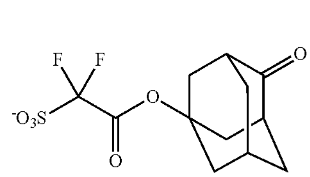

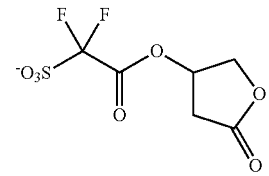

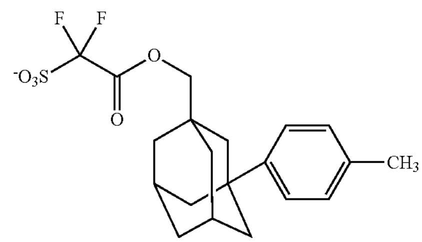

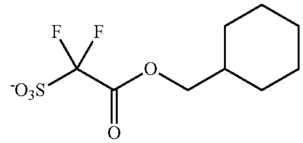

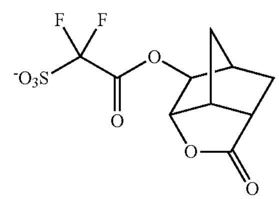

In particular, a sulfonate anion in which Y is an optionally substituted $C_3$ to $C_{18}$ alicyclic hydrocarbon group is more preferable.

Examples of the cation of the acid generator (B) include an onium cation, for example, sulfonium cation, iodonium cation, ammonium cation, benzothiazolium cation and phosphonium cation. Among these, sulfonium cation and iodonium cation are preferable, and organic cations represented by any of the formula (b2-1) to the formula (b2-4) are more preferable.

$Z^+$ of the formula (B1) is preferably represented by any of the formula (b2-1) to the formula (b2-4).

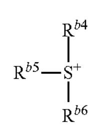

(b2-1)

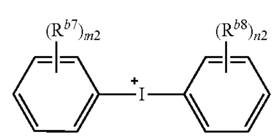

(b2-2)

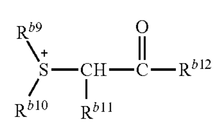

(b2-3)

-continued (b2-4)

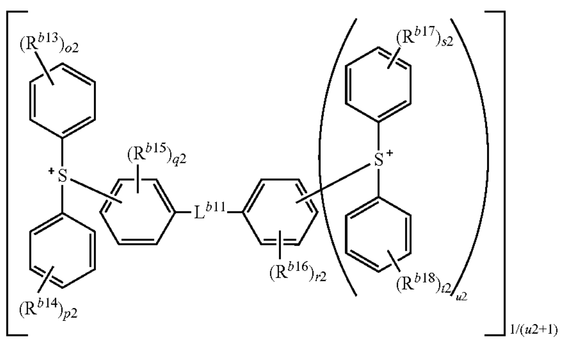

wherein $R^{b4}$, $R^{b5}$ and $R^{b6}$ independently represent a $C_1$ to $C_{30}$ hydrocarbon group which preferably includes a $C_1$ to $C_{30}$ alkyl group, a $C_3$ to $C_{18}$ alicyclic hydrocarbon group or a $C_6$ to $C_{18}$ aromatic hydrocarbon group, the alkyl group may be substituted with a hydroxy group, a $C_1$ to $C_{12}$ alkoxy group or a $C_6$ to $C_{18}$ aromatic hydrocarbon group, the alicyclic hydrocarbon group may be substituted with a halogen atom, a $C_2$ to $C_4$ acyl group and a glycidyloxy group, the aromatic hydrocarbon group may be substituted with a halogen atom, a hydroxy group, a $C_1$ to $C_{18}$ alkyl group, a $C_3$ to $C_{18}$ alicyclic hydrocarbon group or a $C_1$ to $C_{12}$ alkoxy group;

$R^{b7}$ and $R^{b8}$ in each occurrence independently represent a hydroxy group, a $C_1$ to $C_{12}$ alkyl group or a $C_1$ to $C_{12}$ alkoxyl group;

m2 and n2 independently represent an integer of 0 to 5;

$R^{b9}$ and $R^{b10}$ independently represent a $C_1$ to $C_{18}$ alkyl group or a $C_3$ to $C_{18}$ alicyclic hydrocarbon group, or $R^{b9}$ and $R^{b10}$ may be bonded together with a sulfur atom bonded thereto to form a sulfur-containing 3- to 12-membered (preferably 3- to 7-membered) alicyclic hydrocarbon ring, and a —$CH_2$— contained in the alicyclic hydrocarbon ring may be replaced by —O—, —S— or —CO—;

$R^{b11}$ represents a hydrogen atom, a $C_1$ to $C_{18}$ alkyl group, a $C_3$ to $C_{18}$ alicyclic hydrocarbon group or a $C_6$ to $C_{18}$ aromatic hydrocarbon group;

$R^{b12}$ represents a $C_1$ to $C_{18}$ hydrocarbon group which preferably includes a $C_1$ to $C_{18}$ alkyl group, a $C_3$ to $C_{18}$ alicyclic hydrocarbon group and a $C_6$ to $C_{18}$ aromatic hydrocarbon group, the aromatic hydrocarbon group may be substituted with a $C_1$ to $C_{12}$ alkyl group, a $C_1$ to $C_{12}$ alkoxy group, a $C_3$ to $C_{18}$ alicyclic hydrocarbon group or a $C_1$ to $C_{12}$ alkyl carbonyloxy group;

$R^{b11}$ and $R^{b12}$ may be bonded together with —CH—CO— bonded thereto to form a 3- to 12-membered (preferably a 3- to 7-membered) alicyclic hydrocarbon ring, and a —$CH_2$— contained in the alicyclic hydrocarbon ring may be replaced by —O—, —S— or —CO—;

$R^{b13}$, $R^{b14}$, $R^{b15}$, $R^{b16}$, $R^{b17}$ and $R^{b18}$ in each occurrence independently represent a hydroxy group, a $C_1$ to $C_{12}$ alkyl group or a $C_1$ to $C_{12}$ alkoxy group;

$L^{b11}$ represents —S— or —O—;

o2, p2, s2 and t2 independently represent an integer of 0 to 5;

q2 or r2 independently represent an integer of 0 to 4;

u2 represents an integer of 0 or 1.

Examples of the preferred alkyl group include methyl, ethyl, propyl, butyl, hexyl, octyl, and 2-ethylhexyl groups, in particular, the alkyl group of $R^{b9}$ to $R^{b11}$ is preferably a $C_1$ to $C_{12}$ alkyl group.

Examples of the preferred alicyclic hydrocarbon group include a cyclopropyl, cyclobutyl, cyclopentyl, cyclohexyl, cycloheptyl, cyclodecyl, 2-alkyladamantane-2-yl, 1-(adamantane-1-yl)alkane-1-yl and isobornyl groups, in particular, the alicyclic hydrocarbon group of $R^{b9}$ to $R^{b11}$ is preferably a $C_3$ to $C_{18}$ alicyclic hydrocarbon group and more preferably a $C_4$ to $C_{12}$ alicyclic hydrocarbon group.

Examples of the preferred aromatic hydrocarbon groups include phenyl, 4-methoxy phenyl, 4-etyhlphenyl, 4-tert-butylphenyl, 4-cyclohexylphenyl, 4-methoxyphenyl, biphenyl and naphthyl group.

Examples of the aromatic group substituted with an alkyl group typically represent an aralkyl group such as benzyl, phenethyl, phenylpropyl, trityl, naphthylmethyl and naphthylethyl groups.

Examples of the ring having —CH—CO— and formed by $R^{b9}$ and $R^{b10}$ bonded together include thiolane-1-ium ring (tetrahydrothiophenium ring), thian-1-ium ring and 1,4-oxathian-4-ium ring.

Examples of the ring having a sulfur atom and formed by $R^{b11}$ and $R^{b12}$ bonded together include oxocycloheptane ring, oxocyclohexane ring, oxonorbornane ring, and oxoadamantane ring.

Examples of the alkylcarbonyloxy group of the $R^{b12}$ include methylcarbonyloxy, ethylcarbonyloxy, n-propylcarbonyloxy, isopropylcarbonyloxy, n-butylcarbonyloxy, sec-butylcarbonyloxy, tert-butylcarbonyloxy, pentylcarbonyloxy, hexylcarbonyloxy, octylcarbonyloxy, and 2-ethylhexylcarbonyloxy.

Among the cations represented by the formula (b2-1) to the formula (b2-4), the cation represented by the formula (b2-1) is preferable, and triphenyl sulfonium cation (v2=w2=x2=0 in the formula (b2-1-1)) and tritolyl sulfonium cation (v2=w2=x2=1, and $R^{b19}$, $R^{b20}$ and $R^{b21}$ are a methyl group in the formula (b2-1-1)) are more preferable.

(b2-1-1)

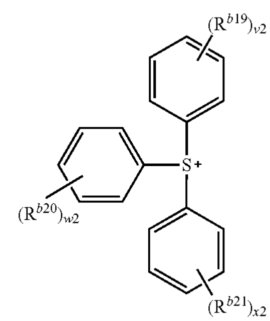

wherein $R^{b19}$, $R^{b20}$ and $R^{b21}$ in each occurrence independently represent a halogen atom, a hydroxy group, a $C_1$ to $C_{18}$ aliphatic hydrocarbon group or a $C_1$ to $C_{12}$ alkoxy group;

v2 to x2 independently represent an integer of 0 to 5.

The aliphatic hydrocarbon group is preferably a $C_1$ to $C_{12}$ aliphatic hydrocarbon group, and more preferably a $C_1$ to $C_{12}$ alkyl group or a $C_4$ to $C_{18}$ alicyclic hydrocarbon group.

In the formula (b2-1-1), $R^{b19}$ to $R^{b21}$ independently preferably represent a halogen atom (and more preferably fluorine atom), a hydroxy group, a $C_1$ to $C_{12}$ alkyl group or a $C_1$ to $C_{12}$ alkoxy group; and v2 to x2 independently represent preferably 0 or 1.

Specific examples of the cation of the formula (b2-1-1) include a cation below.

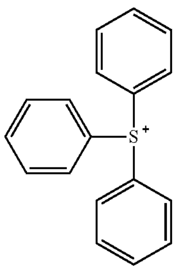
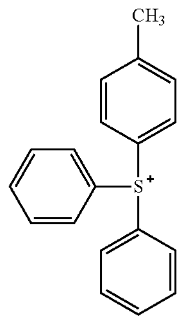
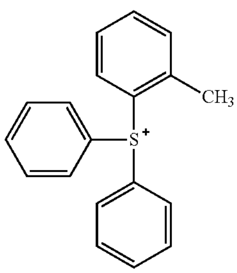
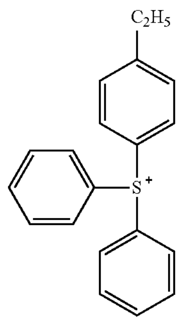
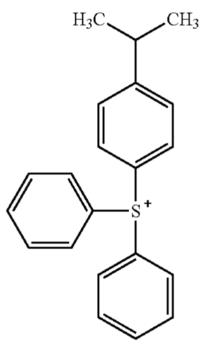
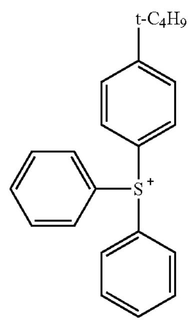
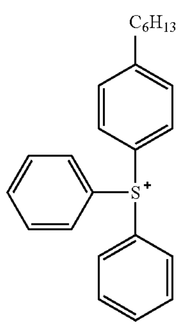
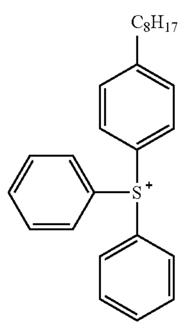
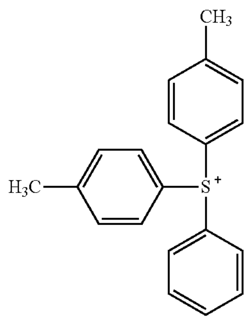
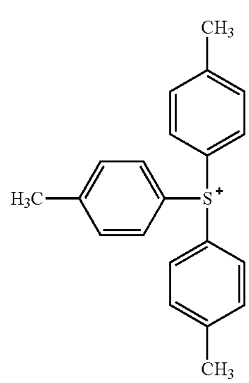
-continued
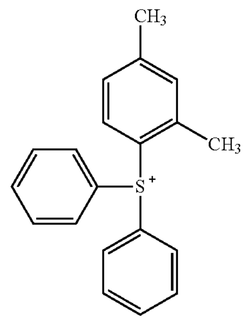
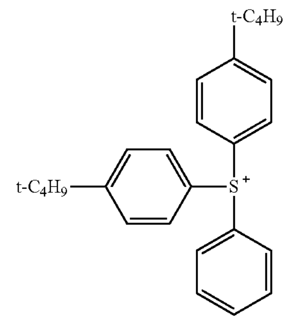
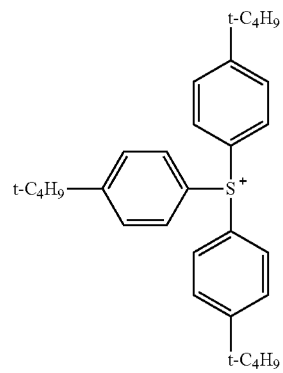
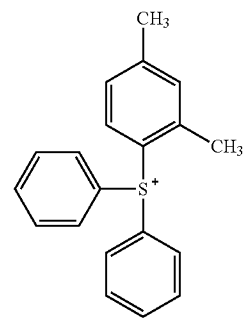
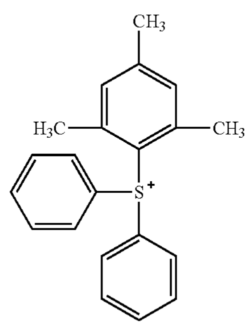
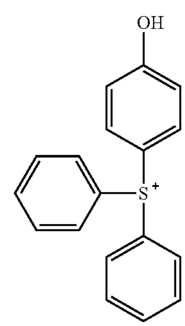
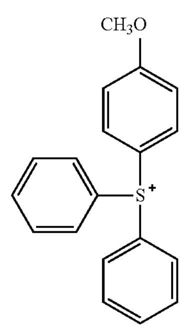
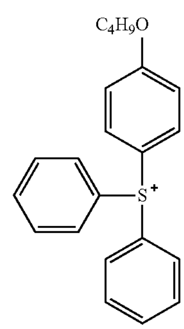
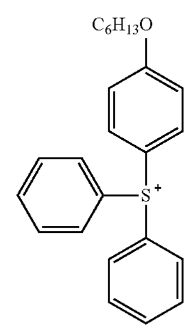
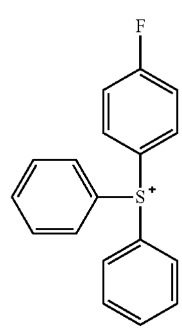
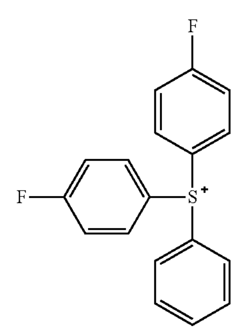

-continued
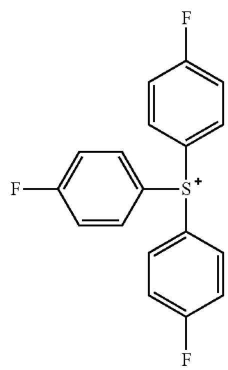 [SMILES: Fc1ccc([S+](c2ccc(F)cc2)c2ccc(F)cc2)cc1]
The resist composition including the acid generator (B1) having such organic cation can result in a good focus margin at producing the resist pattern.
Specific examples of the cation of the formula (b2-2) include a cation below.
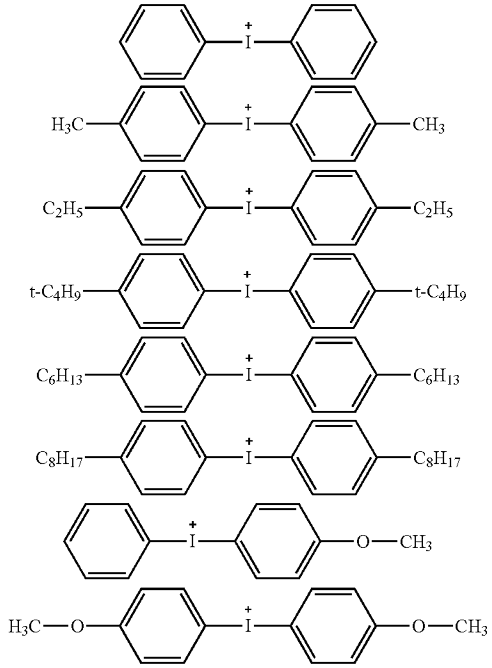
Specific examples of the cation of the formula (b2-3) include a cation below.
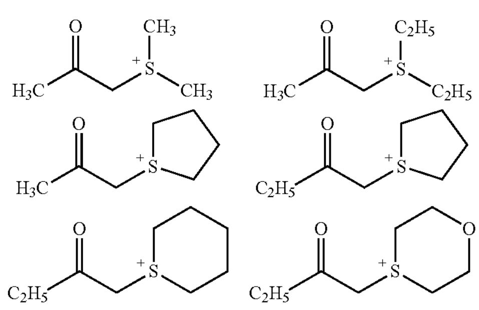
-continued
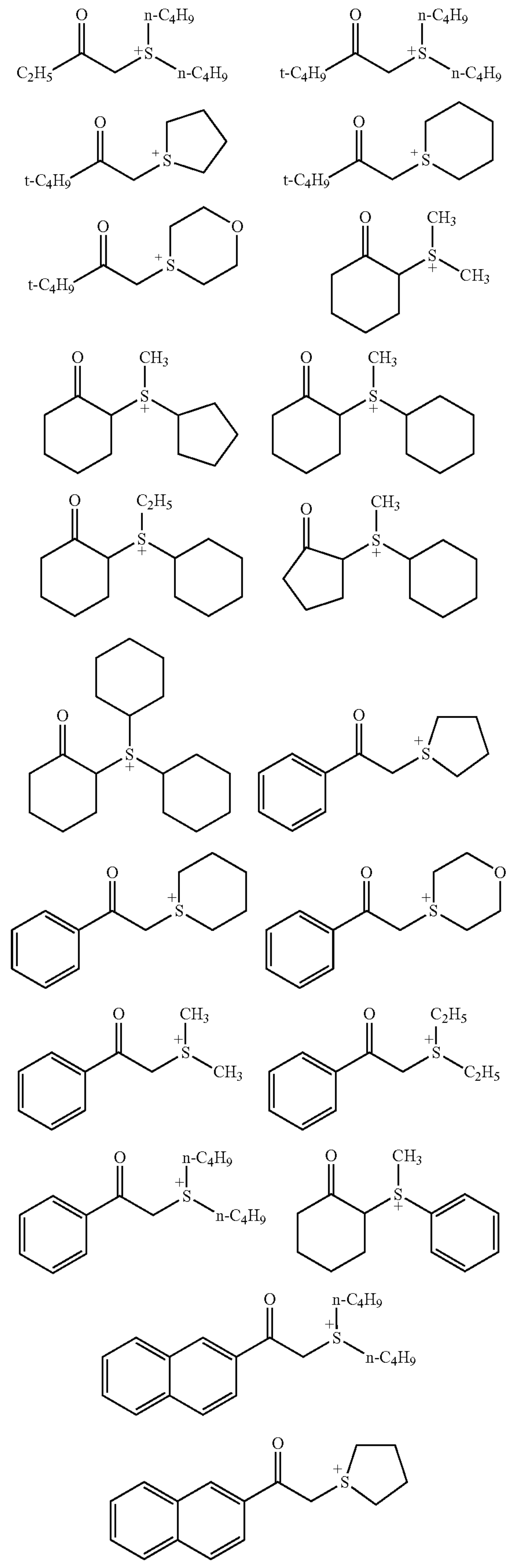

-continued
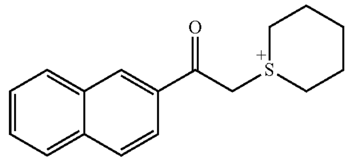
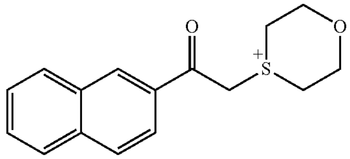
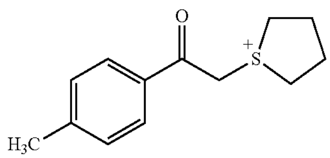
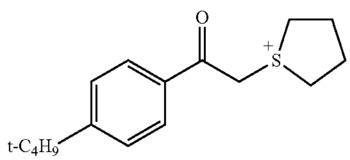
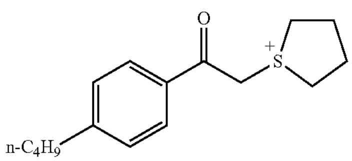
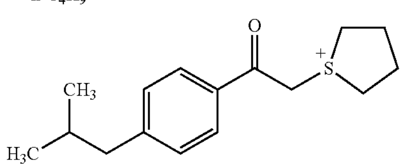
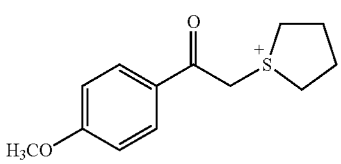
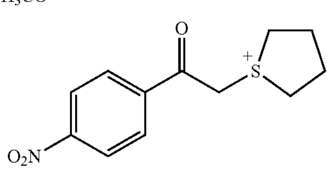
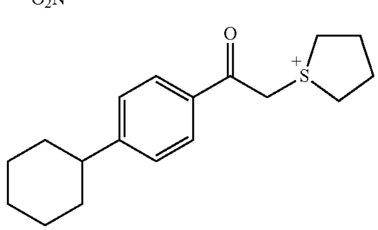
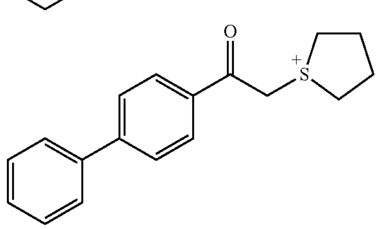
-continued
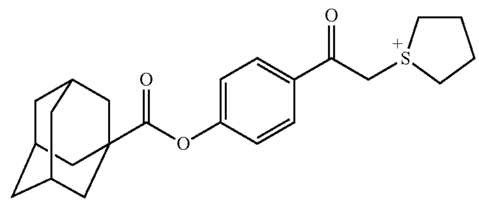
Specific examples of the cation of the formula (b2-4) include a cation below.
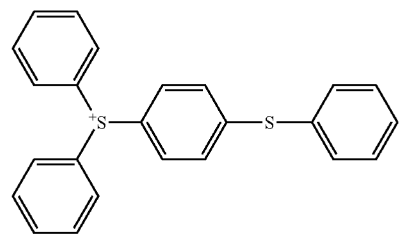
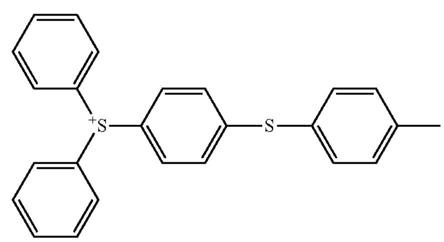
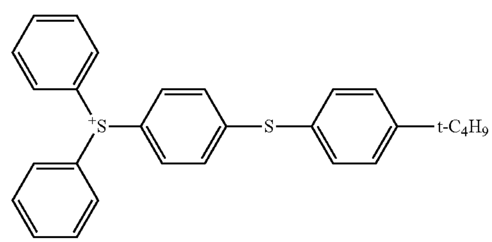
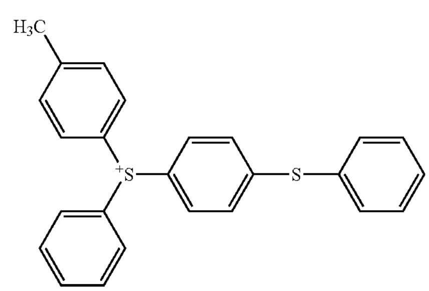
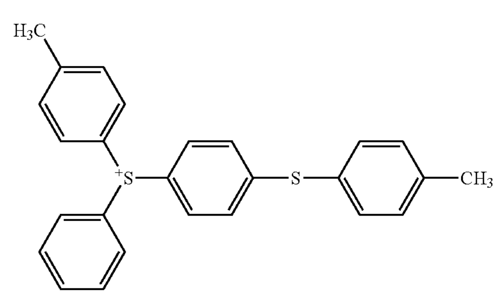

-continued
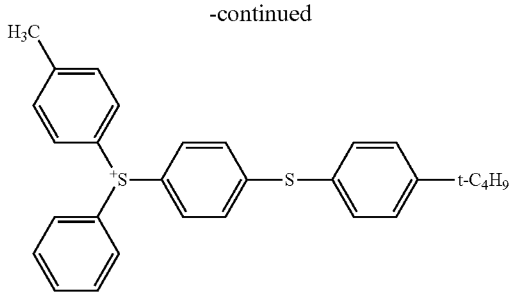
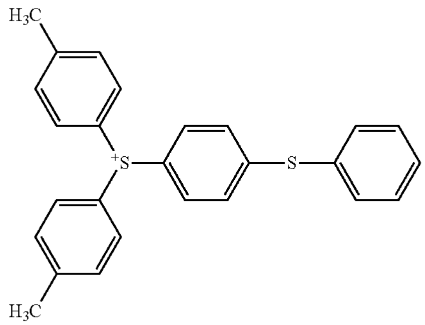
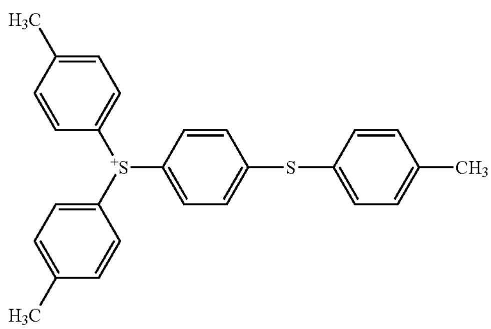
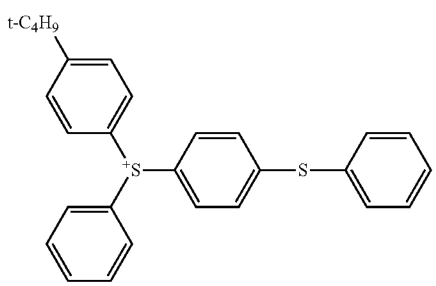
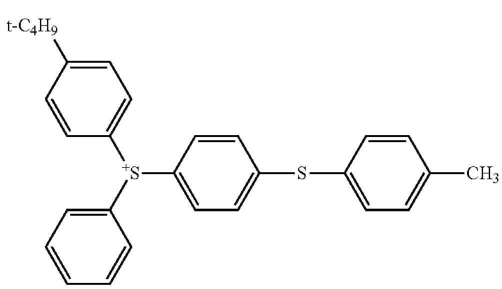
-continued
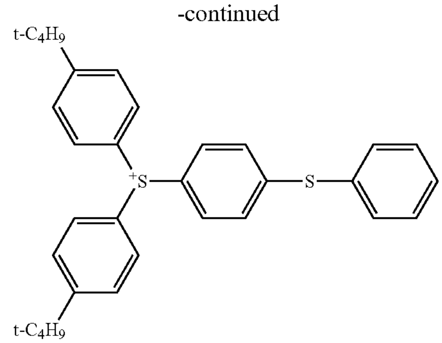
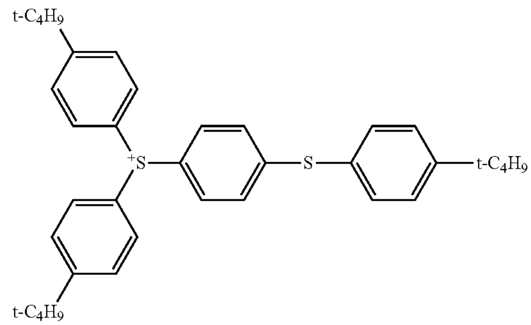
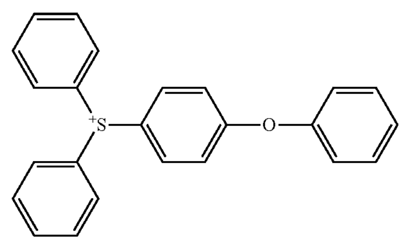
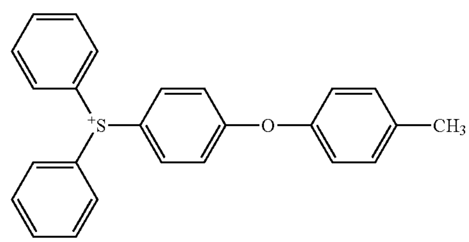
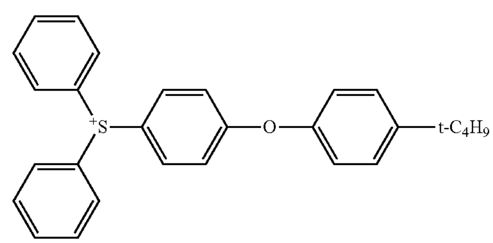
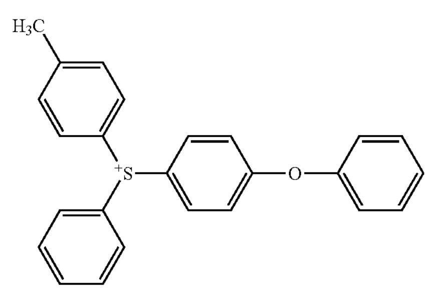

-continued
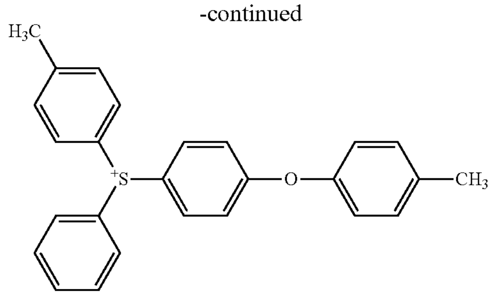
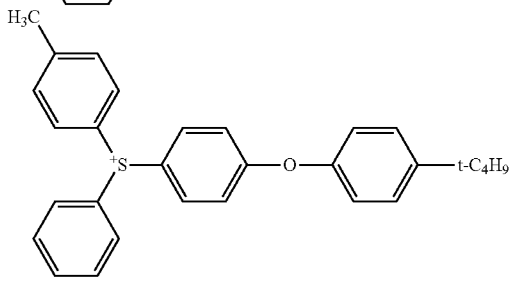
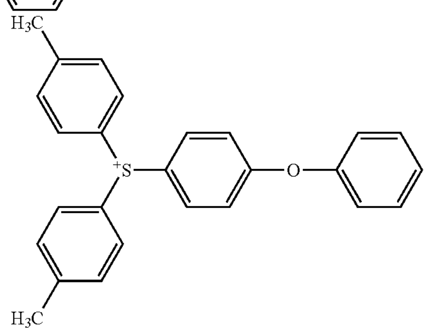
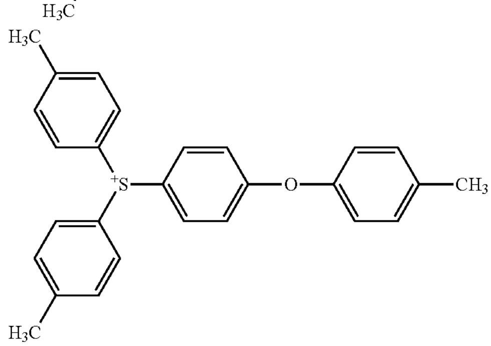
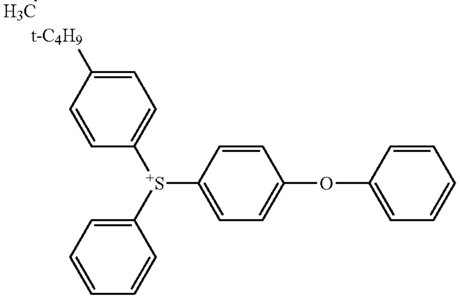
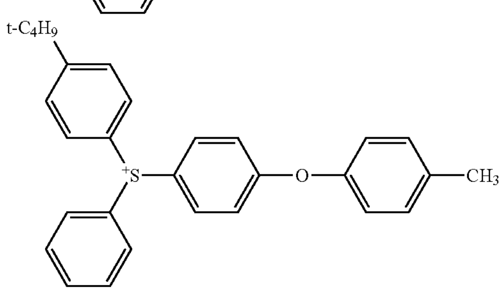
-continued
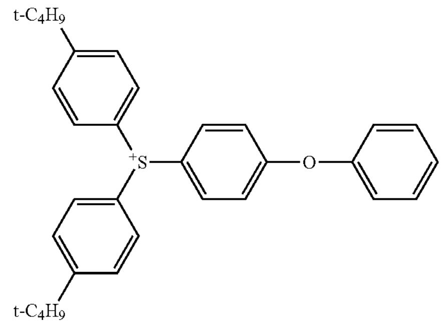
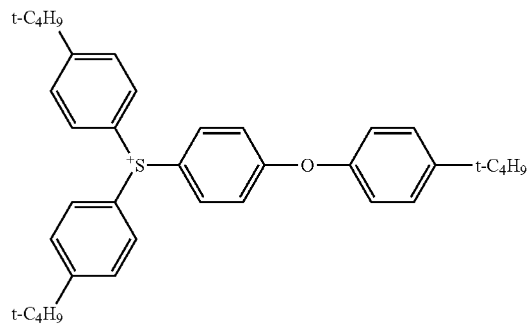
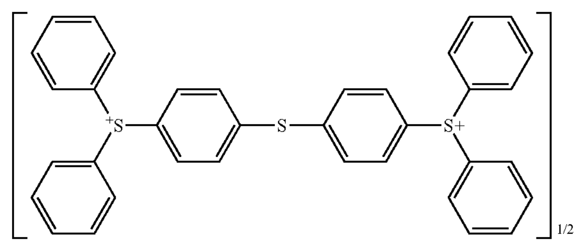
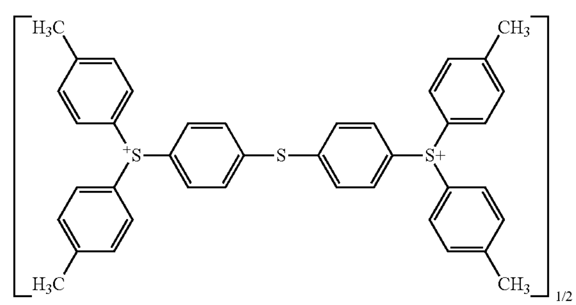
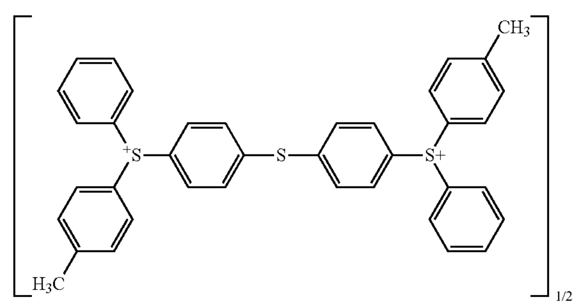

-continued

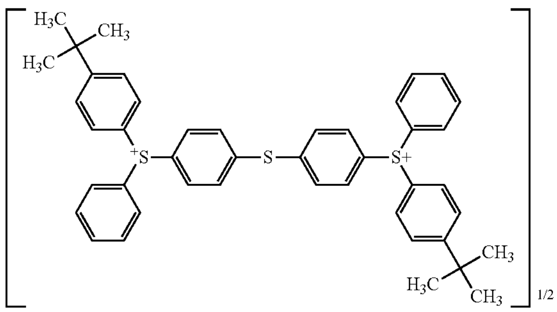

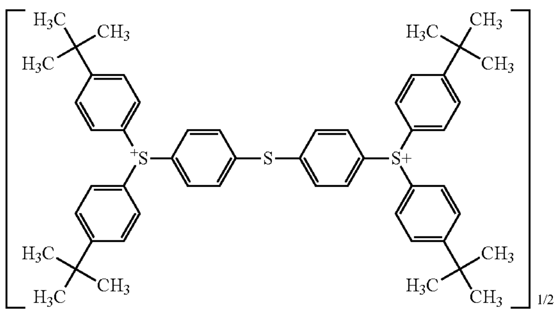

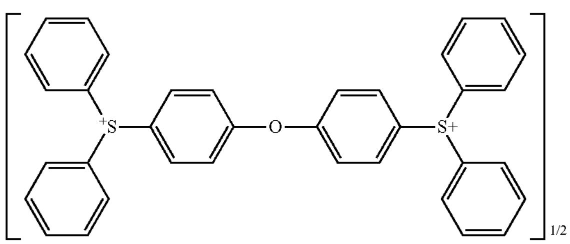

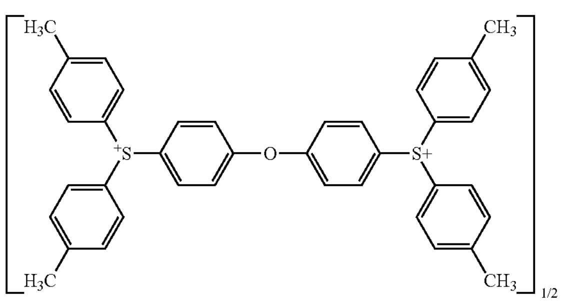

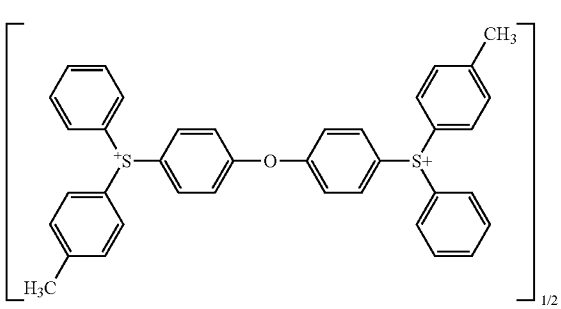

-continued

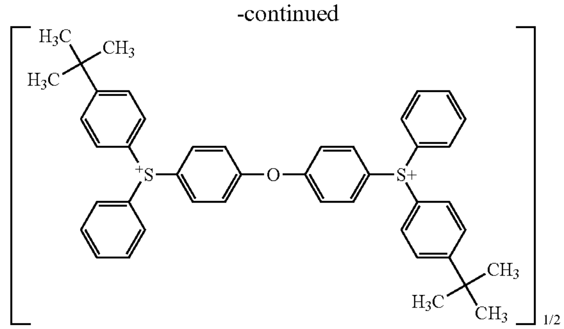

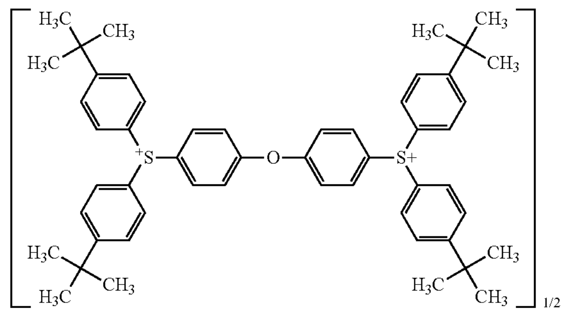

The acid generator (B1) is a compound in combination of the above sulfonate anion and an organic cation.

The above sulfonate anion and the organic cation may optionally be combined, a combination of any of the anion represented by the formula (b1-1-1) to the formula (b1-1-9) and the cation represented by the formula (b2-1-1), as well as a combination of any of the anion represented by the formula (b1-1-3) to the formula (b1-1-5) and the cation represented by the formula (b2-3) are preferable.

Preferred acid generators (B1) are a salt represented by the formula (B1-1) to the formula (B1-17). Among these, the formulae (B1-1), (B1-2), (B1-3), (B1-6), (B1-11), (B1-12), (B1-13) and (B1-14) which contain triphenyl sulfonium cation or tritolyl sulfonium cation are preferable.

(B1-1)

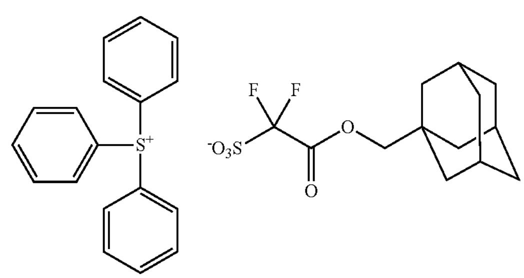

(B1-2)

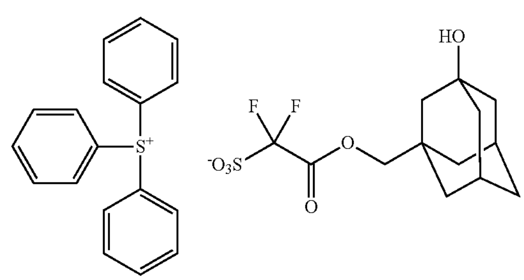

-continued
(B1-3)
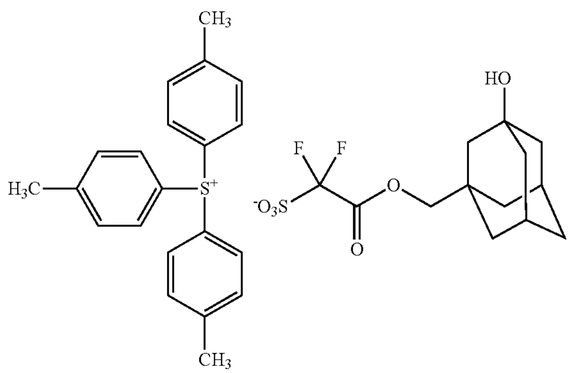
(B1-4)
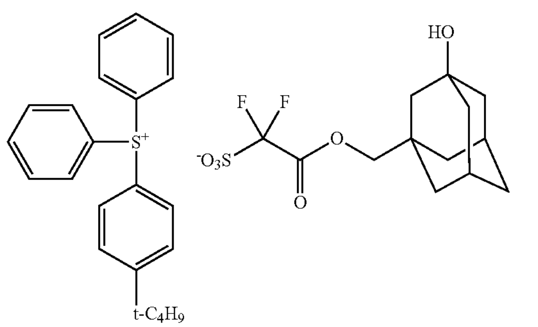
(B1-5)
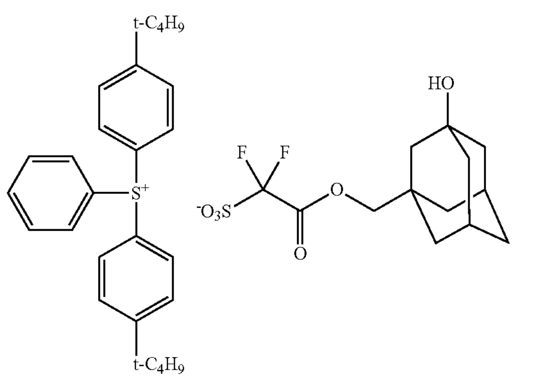
(B1-6)
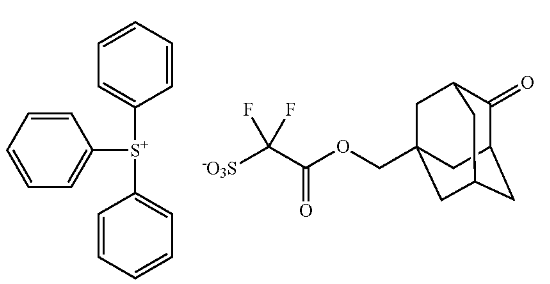
-continued
(B1-7)
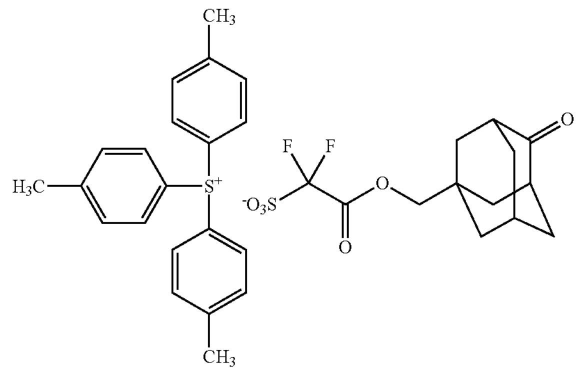
(B1-8)
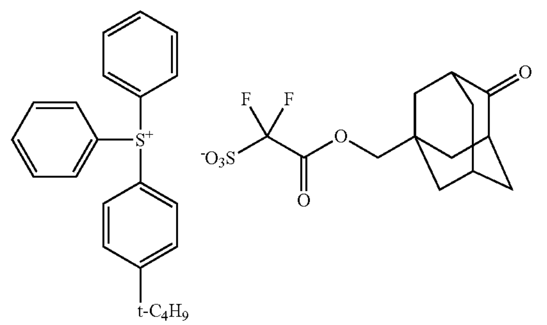
(B1-9)
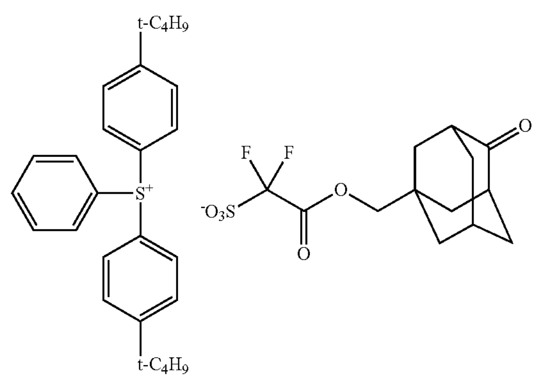
(B1-10)
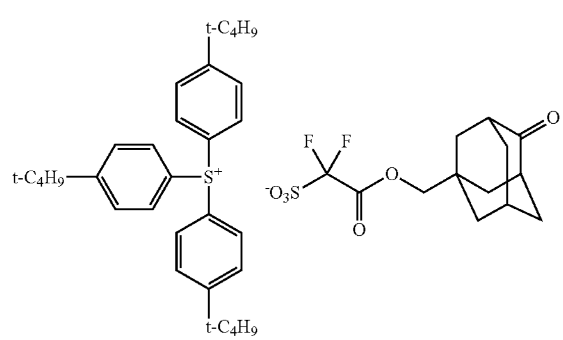

-continued (B1-11)

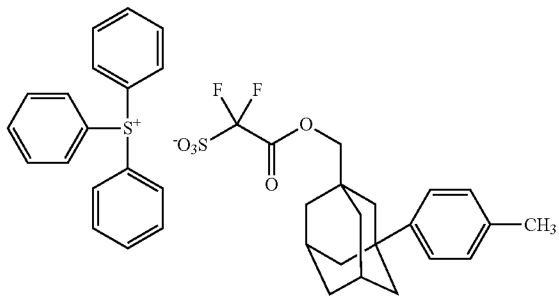

(B1-12)

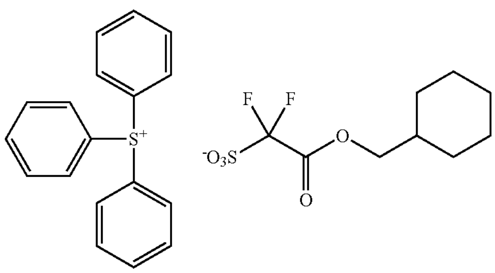

(B1-13)

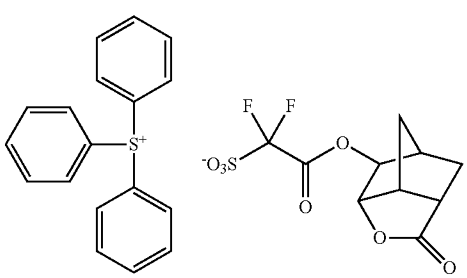

(B1-14)

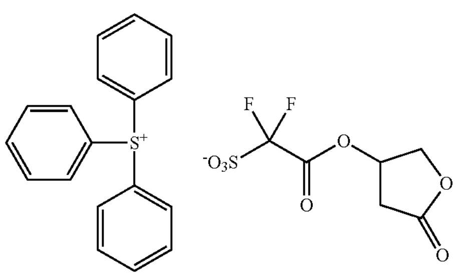

(B1-15)

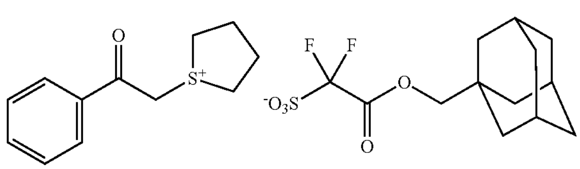

(B1-16)

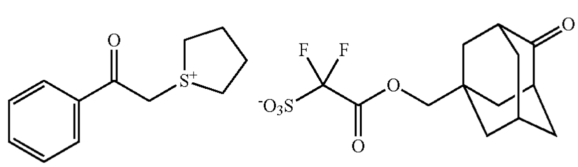

-continued (B1-17)

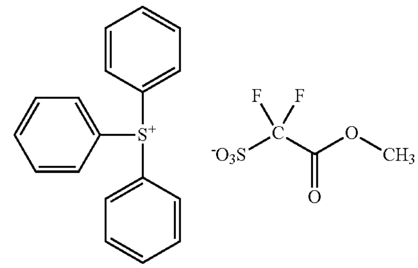

The acid generator (B) may include an acid generator other than the acid generator (B1). The proportion of the acid generator (B1) is preferably 70 weight % or more, more preferably 90 weight % or more, and still more preferably substantially 100 weight %, with respect to total weight of acid generator (B) (100 weight %).

<Basic Compound (Hereinafter May be Referred to as "Basic Compound (C)">

The resist composition of the present invention may contain a basic compound (C). The basic compound (C) is a compound having a property to quench an acid generated from the acid generator, and called "quencher".

As the basic compounds (C), nitrogen-containing basic compounds (for example, amine and ammonium salt) are preferable. The amine may be an aliphatic amine or an aromatic amine. The aliphatic amine includes any of a primary amine, secondary amine and tertiary amine. The aromatic amine includes an amine in which an amino group is bonded to an aromatic ring such as aniline, and a hetero-aromatic amine such as pyridine.

Preferred basic compounds (C) include an aromatic amine presented by the formula (C2), particularly an aromatic amine represented by the formula (C2-1).

(C2)

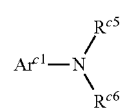

(C2-1)

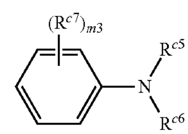

wherein $Ar^{c1}$ represents an aromatic hydrocarbon group;

$R^{c5}$ and $R^{c6}$ independently represent a hydrogen atom, an aliphatic hydrocarbon group (preferably a $C_1$ to $C_6$ chain aliphatic hydrocarbon group, i.e., alkyl group or $C_5$ to $C_{10}$ alicyclic hydrocarbon group, i.e., cycloalkyl group) or a aromatic hydrocarbon group (preferably a $C_6$ to $C_{10}$ aromatic hydrocarbon group), a hydrogen atom contained in the aliphatic hydrocarbon group, the alicyclic hydrocarbon group and the aromatic hydrocarbon group may be replaced by a hydroxy group, an amino group or a $C_1$ to $C_6$ alkoxyl group, a hydrogen atom contained in the amino group may be placed by a $C_1$ to $C_4$ alkyl group;

$R^{c7}$ in each occurrence independently represents a chain aliphatic hydrocarbon group (preferably a $C_1$ to $C_6$ alkyl), a $C_1$ to $C_6$ alkoxy group, an alicyclic hydrocarbon group (preferably a $C_5$ to $C_{10}$ alicyclic hydrocarbon group, and more preferably a $C_5$ to $C_{10}$ cycloalkyl group)

or a aromatic hydrocarbon group (preferably a $C_6$ to $C_{10}$ aromatic hydrocarbon group), a hydrogen atom contained in the aliphatic hydrocarbon group, the alkoxy group, the alicyclic hydrocarbon group and the aromatic hydrocarbon group may be replaced by a hydroxy group, an amino group or a $C_1$ to $C_6$ alkoxyl group, a hydrogen atom contained in the amino group may be placed by a $C_1$ to $C_4$ alkyl group;

m3 represents an integer of 0 to 3.

Specific examples of the aromatic amine represented by the formula (C2) include 1-naphtylamine and 2-naphtylamine.

Specific examples of the aniline represented by the formula (C2-1) include aniline, diisopropylaniline, 2-, 3- or 4-methylaniline, 4-nitroaniline, N-methylaniline, N,N-dimethylaniline, and diphenylamine.

Also, examples of the basic compound (C) include compounds represented by the formula (C3) to the formula (C11);

(C3)

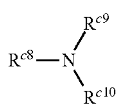

(C4)

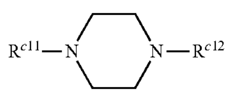

(C5)

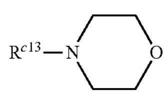

(C6)

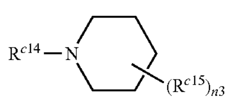

(C7)

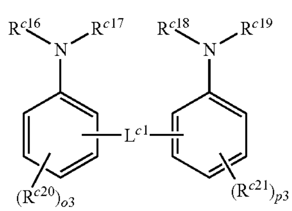

(C8)

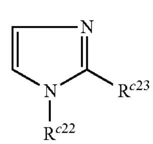

(C9)

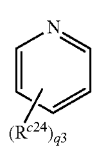

(C10)

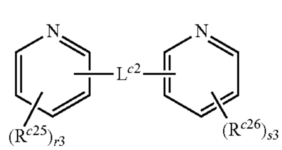

-continued (C11)

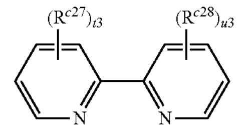

wherein $R^{c8}$, $R^{c20}$, $R^{c21}$, $R^{c23}$, $R^{c24}$, $R^{c25}$, $R^{c26}$, $R^{c27}$ and $R^{c28}$ in each occurrence independently represent any of the group as described in $R^{c7}$;

$R^{c9}$, $R^{c10}$, $R^{c11}$, $R^{c12}$, $R^{c13}$, $R^{c14}$, $R^{c16}$, $R^{c17}$, $R^{c18}$, $R^{c19}$ and $R^{c22}$ independently represent any of the group as described in $R^{c5}$ and $R^{c6}$;

$R^{c15}$ in each occurrence independently represents an aliphatic hydrocarbon group, an alicyclic hydrocarbon group or an alkanoyl group;

n3 represents an integer of 0 to 8;

o3, p3, q3, r3, s3, t3 and u3 independently represent an integer of 0 to 3;

$L^{c1}$ and $L^{c2}$ independently represent a divalent aliphatic hydrocarbon group (preferably a $C_1$ to $C_6$ aliphatic hydrocarbon group, and more preferably a $C_1$ to $C_6$ alkanediyl group), —CO—, —C(=NH)—, —C(=$NR^{c3}$)—, —S—, —S—S— or a combination thereof;

$R^{c3}$ represents a $C_1$ to $C_4$ alkyl group.

The aliphatic hydrocarbon group of $R^{c15}$ is preferably a $C_1$ to $C_6$ aliphatic hydrocarbon group, and more preferably a $C_3$ to $C_6$ alicyclic hydrocarbon group, and the alkanoyl group is preferably a $C_2$ to $C_6$ alkanoyl group.

Examples of the alkanoyl group include acetyl group, 2-methylacetyl group, 2,2-dimethylacetyl group, propionyl group, butylyl group, izobutylyl group, pentanoyl group, and 2,2-dimethylpropionyl group.

Specific examples of the compound represented by the formula (C4) include, for example, piperazine.

Specific examples of the compound represented by the formula (C5) include, for example, morpholine.

Specific examples of the compound represented by the formula (C6) include, for example, piperizine, a hindered amine compound having piperizine skeleton described in JP H11-52575-A.

Specific examples of the compound represented by the formula (C7) include, for example, 2,2'-methylenebisaniline.

Specific examples of the compound represented by the formula (C8) include, for example, imidazole and 4-methylimidazole.

Specific examples of the compound represented by the formula (C9) include, for example, pyrizine and 4-methylpyrizine.

Specific examples of the compound represented by the formula (C10) include, for example, 1,2-di(2-pyridyl)ethane, 1,2-di(4-pyridyl)ethane, 1,2-di(2-pyridyl)ethene, 1,2-di(4-pyridyl)ethene, 1,3-di(4-pyridyl)propane, 1,2-di(4-pyridyloxy)ethane, di(2-pyridyl)ketone, 4,4'-dipyridyl sulfide, 4,4'-dipyridyl disulfide, 2,2'-dipyridylamine and 2,2'-dipicolylamine.

Specific examples of the compound represented by the formula (C11) include, for example, bipyridine.

Specific examples of the compound represented by the formula (C3) include, for example, hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethydipentylamine, ethyldihexylamine, ethydiheptylamine, ethyldioctylamine, ethyldinonylamine, ethyldidecylamine, dicyclohexylmethylamine, tris[2-(2-methoxyethoxy)ethyl]amine, triisopropanolamine, ethylene diamine, tetramethylene diamine, hexamethylene diamine, 4,4'-diamino-1,2-diphenylethane, 4,4'-diamino-3,3'-dimethyldiphenylmethane and 4,4'-diamino-3,3'-diethyldiphenylmethane.

Examples of the ammonium hydroxide include tetramethylammonium hydroxide, tetraisopropylammonium hydroxide, tetrabutylammonium hydroxide, tetrahexylammonium hydroxide, tetraoctylammonium hydroxide, phenyltrimethyl ammonium hydroxide, 3-(trifluoromethyl)phenyltrimethylammonium hydroxide, tetra-n-butyl ammonium salicylate and choline.

Among these, diisopropylaniline (particularly 2,6-diisopropylaniline) is preferable as the basic compounds (C) contained in the present resist compound.

<Solvent (Hereinafter May be Referred to “Solvent (D)”>

The resist composition of the present invention may include a solvent (D). The solvent (D) can be preferably selected depending on the kinds and an amount of the resin (A) having the structural unit derived from the compound (I), and a kind and an amount of the acid generator from a viewpoint of good coating properties.

Examples of the solvent (D) include glycol ether esters such as ethylcellosolve acetate, methylcellosolve acetate and propylene glycol monomethyl ether acetate; ethers such as diethylene glycol dimethyl ether; esters such as ethyl lactate, butyl acetate, amyl acetate and ethyl pyruvate; ketones such as acetone, methyl isobutyl ketone, 2-heptanone and cyclohexanone; and cyclic esters such as γ-butyrolactone. These solvents may be used as a single solvent or as a mixture of two or more solvents.

<Other Ingredient (Hereinafter May be Referred to “Other Ingredient (F)”>

The resist composition can also include various additives as needed.

Examples of the other ingredient (F) include sensitizers, dissolution inhibitors, surfactants, stabilizers and dyes.

<Preparing the Resist Composition>

The present resist composition can be prepared by mixing the resin (A) and the acid generator (B), or by mixing the resin (A), the acid generator (B1), the basic compound (C), the solvent (D) and the other ingredient (F) as needed. There is no particular limitation on the order of mixing. The mixing may be performed in an arbitrary order. The temperature of mixing may be adjusted to an appropriate temperature within the range of 10 to 40° C., depending on the kinds of the resin having the structural unit derived from the compound (I) and solubility in the solvent (D) of the resin having the structural unit derived from the compound (I). The time of mixing may be adjusted to an appropriate time within the range of 0.5 to 24 hours, depending on the mixing temperature. There is no particular limitation to the tool for mixing. An agitation mixing may be adopted.

The resist composition of the present invention preferably contains 80 weight % or more and 99 weight % or less of the resin (A) with respect to the total solid proportion of the resist composition.

In the specification, the term “solid proportion of the resist composition” means the entire proportion of all ingredients other than the solvent (D). For example, if the proportion of the solvent (D) is 90 weight %, the solid proportion of the resist composition is 10 weight %.

In the resist composition of the present invention, the proportion of the acid generator (B) is preferably 1 part by weight or more (and more preferably 3 parts by weight or more), and also preferably 30 parts by weight or less (and more preferably 25 parts by weight or less), with respect to 100 parts by weight of the resin (A).

When the resist composition includes the basic compound (C), the proportion thereof is preferably 0.01 to 1 weight % with respect to the total solid proportion of the resist composition.

The proportion of the solvent may be adjusted depending on the kinds of the resin (A), and it may be 90 weight % or more, preferably 92 weight % or more, and more preferably 94 weight % or more, and also preferably 99.9 weight % or less and more preferably 99 weight % or less. If the resist composition contains the solvent within such range, such resist composition is preferable for forming the thin resist film which can be used for producing a composition layer of 30 to 300 nm thick.

The proportion of the resin (A), the acid generator (B), the basic compound (C), and solvent (D) can be adjusted depending on each ingredient used during the preparation of the present resist composition, and can be measured with a known analytical method such as, for example, liquid chromatography and gas chromatography, after preparing the present resist composition.

If the other ingredient (F) is used in the present resist composition, the proportion thereof can also be adjusted depending on the kinds thereof.

After mixing the above ingredients, the present resist compositions can be prepared by filtering the mixture through a filter having about 0.01 to 0.2 μm pore diameter.

<Method for Forming Resist Pattern>

The method for forming resist pattern of the present invention includes the steps of:

(1) applying the resist composition of the present invention onto a substrate;

(2) drying the applied composition to form a composition layer;

(3) exposing the composition layer using an exposure apparatus;

(4) heating the exposed composition layer, and (5) developing the heated composition layer using a developing apparatus.

Applying the resist composition onto the substrate can generally be carried out through the use of a resist application device, such as a spin coater known in the field of semiconductor microfabrication technique. The thickness of the applied resist composition layer can be adjusted by controlling the variable conditions of the resist application device. These conditions can be selected based on a pre-experiment carried out beforehand. The substrate can be selected from various substrates intended to be microfabricated. The substrate may be washed, and an organic antireflection film may be formed on the substrate by use of a commercially available antireflection composition, before the application of the resist composition.

Drying the applied composition layer, for example, can be carried out using a heating device such as a hotplate (so-called “prebake”), a decompression device, or a combination thereof. Thus, the solvent evaporates from the resist composition and a composition layer with the solvent removed is formed. The condition of the heating device or the decompression device can be adjusted depending on the kinds of the solvent used. The temperature in this case is generally within the range of 50 to 200° C. Moreover, the pressure is generally within the range of 1 to $1.0\times10^5$ Pa.

The composition layer thus obtained is generally exposed using an exposure apparatus or a liquid immersion exposure apparatus. The exposure is generally carried out through a mask that corresponds to the desired pattern. Various types of exposure light source can be used, such as irradiation with ultraviolet lasers such as KrF excimer laser (wavelength: 248 nm), ArF excimer laser (wavelength: 193 nm), $F_2$ excimer laser (wavelength: 157 nm), or irradiation with far-ultraviolet wavelength-converted laser light from a solid-state laser source (YAG or semiconductor laser or the like), or vacuum ultraviolet harmonic laser light or the like. Also, the exposure device may be one which irradiates electron beam or extreme-ultraviolet light (EUV).

The composition layer may be formed with an exposed portion and an unexposed portion by the above exposure carried out through the mask. In the exposed portion, acid is produced from the acid generator contained in the resist composition upon receiving the energy of the exposure. Thus, the acid-labile group contained in the resin (A) reacts with the acid to eliminate the protecting group and generate the hydrophilic group. As the result, the resin in the exposed portion of the composition layer becomes soluble in an alkali aqueous solution. On the other hand, in the unexposed portion, the resin (A) remains insoluble or poorly soluble in an alkali aqueous solution because of the lack of exposure. In this way, the solubility in the alkali solution will be different between the composition layer in the exposed portion and the composition layer in the unexposed portion.

After exposure, the composition layer is subjected to a heat treatment (so-called "post-exposure bake") to promote the deprotection reaction. The heat treatment can be carried out using a heating device such as a hotplate. The heating temperature is generally in the range of 50 to 200° C., preferably in the range of 70 to 150° C.

The composition layer is developed after the heat treatment, generally with an alkaline developing solution and using a developing apparatus. The development here means to bring the composition layer after the heat treatment into contact with an alkaline solution. Thus, the exposed portion of the composition layer is dissolved by the alkaline solution and removed, and the unexposed portion of the composition layer remains on the substrate, whereby producing a resist pattern. Here, as the alkaline developing solution, various types of aqueous alkaline solutions used in this field can be used. Examples include aqueous solutions of tetramethylammonium hydroxide and (2-hydroxyethyl)trimethylammonium hydroxide (common name: choline).

After the development, it is preferable to rinse the substrate and the pattern with ultrapure water and to remove any residual water thereon.

According to the method for producing resist pattern of the present invention, it is possible to form a resist pattern with an excellent MEF.

<Application>

The resist composition of the present invention is useful as the resist composition for excimer laser lithography such as with ArF, KrF or the like, and the resist composition for electron beam (EB) exposure lithography and extreme-ultraviolet (EUV) exposure lithography, as well as liquid immersion exposure lithography.

The resist composition of the present invention can be used in semiconductor microfabrication and in manufacture of liquid crystals, thermal print heads for circuit boards and the like, and furthermore in other photofabrication processes, which can be suitably used in a wide range of applications.

EXAMPLES

The present invention will be described more specifically by way of examples, which are not construed to limit the scope of the present invention.

All percentages and parts expressing the proportion or amounts used in the Examples and Comparative Examples are based on weight, unless otherwise specified.

The weight average molecular weight is a value determined by gel permeation chromatography using polystyrene as the standard product.

Column: TSKgel Multipore HXL-Mx3 connecting+guardcolumn (Tosoh Co. ltd.)

Eluant: tetrahydrofuran

Flow rate: 1.0 mL/min

Detecting device: RI detector

Column temperature: 40° C.

Injection amount: 100 μL

Standard material for calculating molecular weight: standard polysthylene (Tosoh Co., Ltd.)

Synthetic Example of the Resin

The monomers used the synthesis of the resin are shown below.

(A)

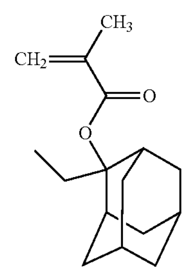

(B)

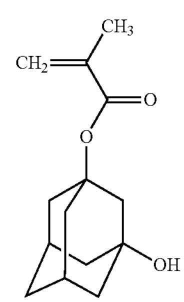

(C)

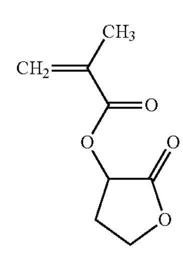

-continued (D)

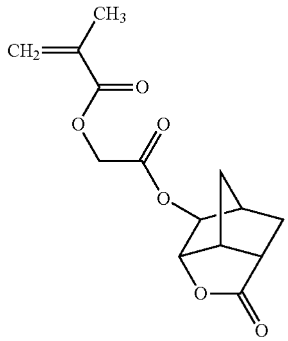

(E)

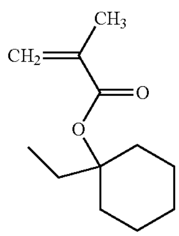

(F)

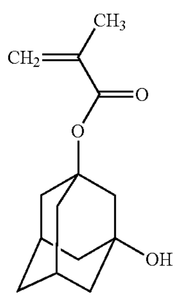

(G)

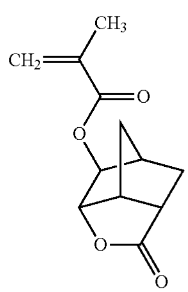

(H)

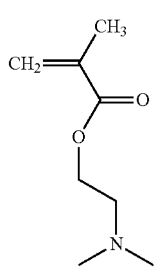

-continued (I)

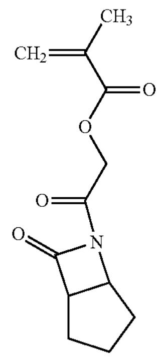

(J)

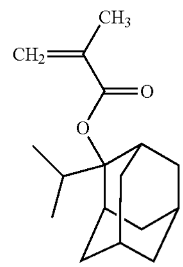

(K)

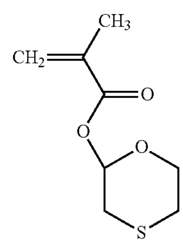

These monomers are referred to as "monomer (A)" to "monomer (K)".

Synthesis of Resin A1

Monomer (A), monomer (E), monomer (B), monomer (C) and monomer (I) were mixed together with a mole ratio of monomer (A):monomer (E):monomer (B):monomer (C): monomer (I)=25:18:3:45:9, and dioxane was added thereto in an amount equal to 1.5 times by weight of the total amount of monomers so as to obtain a solution. Azobisisobutyronitrile and azobis(2,4-dimethylvaleronitrile) was added as an initiator to the obtained solution, in an amount of 1 mol % and 3 mol % respectively with respect to the entire amount of monomers, and the resultant mixture was heated for about 5 hours at 75° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 69% yield of copolymer having a weight average molecular weight of about 7600. This copolymer, which had the structural units derived from the monomers of the following formula, was referred to as Resin A1.

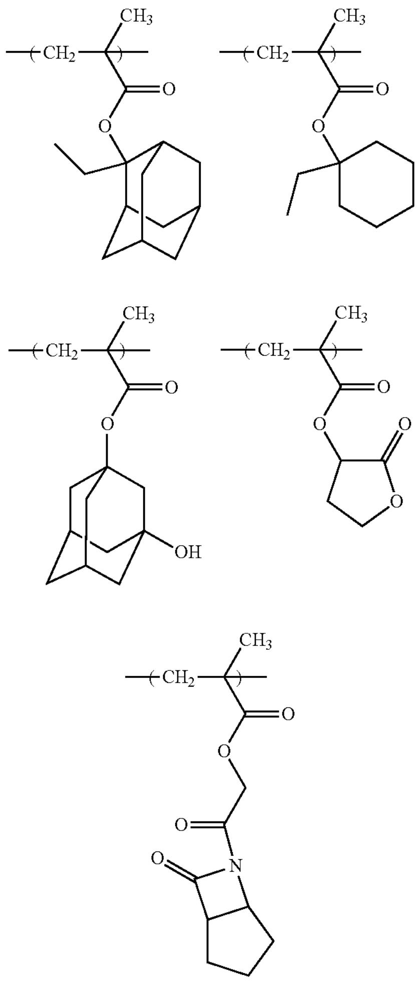

Synthesis of Resin A2

Monomer (A), monomer (E), monomer (B), monomer (C), monomer (D) and monomer (I) were mixed together with a mole ratio of monomer (A):monomer (E):monomer (B):monomer (C):monomer (D):monomer (I)=32:7:8:10:38:5, and dioxane was added thereto in an amount equal to 1.5 times by weight of the total amount of monomers so as to obtain a solution. Azobisisobutyronitrile and azobis(2,4-dimethylvaleronitrile) was added as an initiator to the obtained solution, in an amount of 1 mol % and 3 mol % respectively with respect to the entire amount of monomers, and the resultant mixture was heated for about 5 hours at 73° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 62% yield of copolymer having a weight average molecular weight of about 7800. This copolymer, which had the structural units derived from the monomers of the following formula, was referred to as Resin A2.

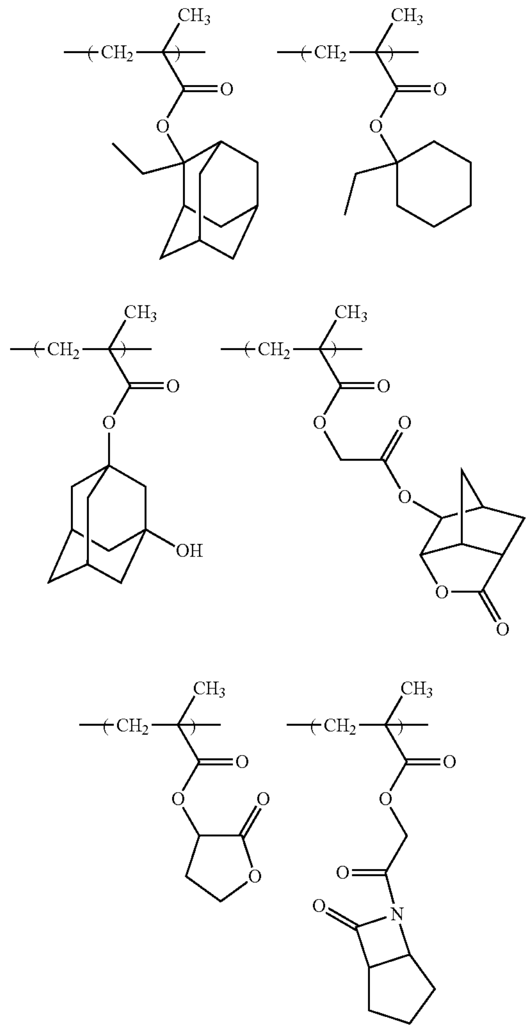

Synthesis of Resin A3

Monomer (A), monomer (B), monomer (C) and monomer (I) were mixed together with a mole ratio of monomer (A):monomer (B):monomer (C):monomer (I)=50:20:20:10, and dioxane was added thereto in an amount equal to 1.5 times by weight of the total amount of monomers so as to obtain a solution. Azobisisobutyronitrile and azobis(2,4-dimethylvaleronitrile) was added as an initiator to the obtained solution, in an amount of 1 mol % and 3 mol % respectively with respect to the entire amount of monomers, and the resultant mixture was heated for about 5 hours at 75° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 70% yield of copolymer having a weight average molecular weight of about 7300. This copolymer, which had the structural units derived from the monomers of the following formula, was referred to as Resin A3.

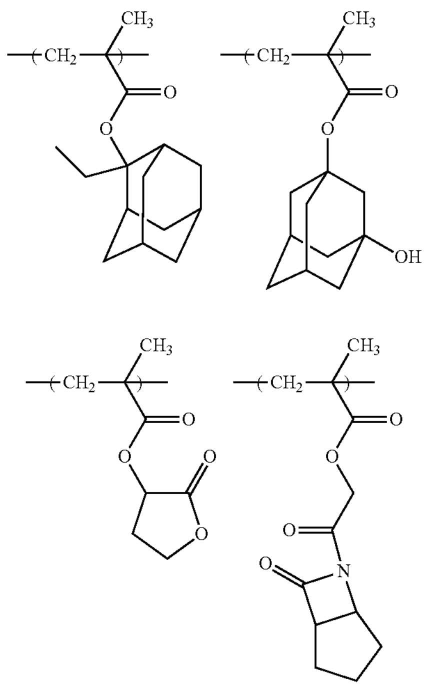

Synthesis of Resin A4

Monomer (H), monomer (G), monomer (F) and monomer (A) were mixed together with a mole ratio of monomer (H): monomer (G):monomer (F):monomer (A)=0.3:39:20.7:40, and dioxane was added thereto in an amount equal to 1.5 times by weight of the total amount of monomers so as to obtain a solution. Azobisisobutyronitrile and azobis(2,4-dimethylvaleronitrile) was added as an initiator to the obtained solution, in an amount of 0.9 mol % and 2.7 mol % respectively with respect to the entire amount of monomers, and the resultant mixture was heated for about 5 hours at 70° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 68% yield of copolymer having a weight average molecular weight of about 10000. This copolymer, which had the structural units derived from the monomers of the following formula, was referred to as Resin A4.

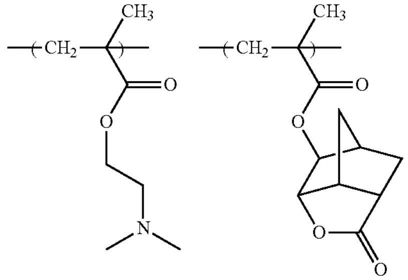

-continued

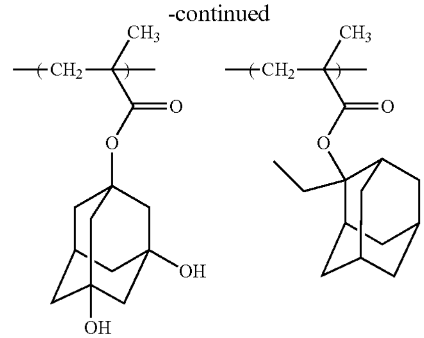

Synthesis of Resin A5 Monomer (G), monomer (F) and monomer (A) were mixed together with a mole ratio of monomer (G):monomer (F):monomer (A)=40:20:40, and dioxane was added thereto in an amount equal to 1.5 times by weight of the total amount of monomers so as to obtain a solution. Azobisisobutyronitrile and azobis(2,4-dimethylvaleronitrile) was added as an initiator to the obtained solution, in an amount of 1 mol % and 3 mol % respectively with respect to the entire amount of monomers, and the resultant mixture was heated for about 5 hours at 70° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 82% yield of copolymer having a weight average molecular weight of about 8800. This copolymer, which had the structural units derived from the monomers of the following formula, was referred to as Resin A5.

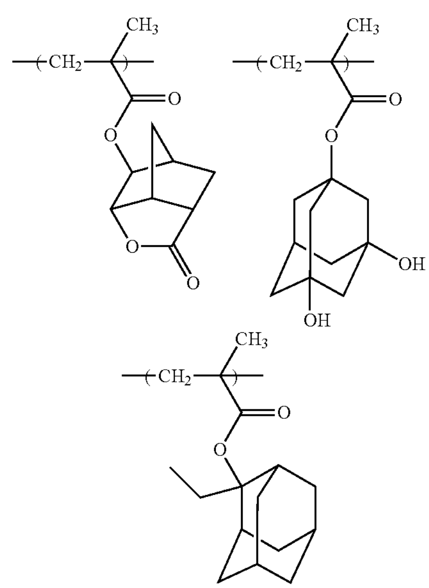

Synthesis of Resin A6

Monomer (J), monomer (E), monomer (B), monomer (C), monomer (D) and monomer (I) were mixed together with a mole ratio of monomer (J):monomer (E):monomer (B): monomer (C):monomer (D):monomer (I)=30:14:6:20:20:10, and dioxane was added thereto in an amount equal to 1.5 times by weight of the total amount of monomers so as to obtain a solution. Azobisisobutyronitrile and azobis(2,4-dimethylvaleronitrile) was added as an initiator thereto to the obtained solution, in an amount of 1 mol % and 3 mol % respectively with respect to the entire amount of monomers, and the resultant mixture was heated for about 5 hours at 70° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and ion-exchanged water to precipitate a resin. The obtained resin was filtrated. These operations described in the last two sentences were repeated for 2 times, resulting in a 61% yield of copolymer having a weight average molecular weight of about 7600. This copolymer, which had the structural units derived from the monomers of the following formula, was referred to as Resin A6.

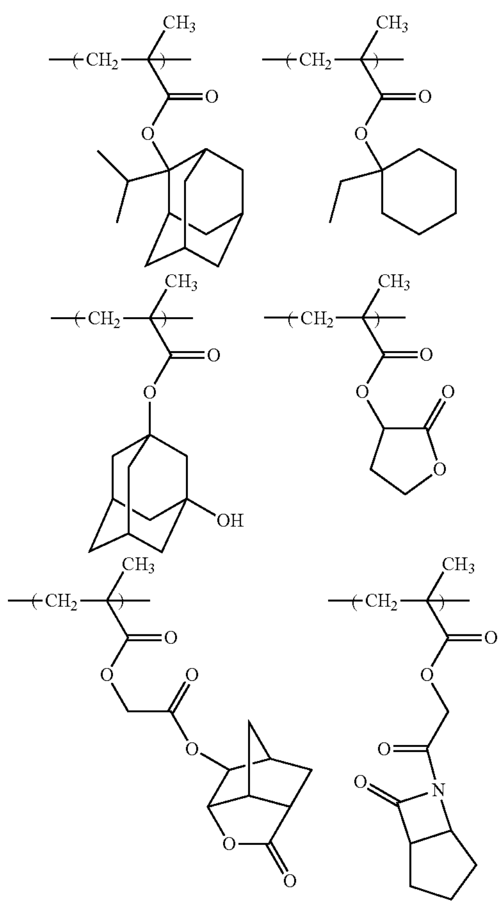

Synthesis of Resin A7

Monomer (J), monomer (K), monomer (B), monomer (C), monomer (D) and monomer (I) were mixed together with a mole ratio of monomer (J):monomer (K):monomer (B):monomer (C):monomer (D):monomer (I)=30:14:6:20:20:10, and dioxane was added thereto in an amount equal to 1.5 times by weight of the total amount of monomers so as to obtain a solution. Azobisisobutyronitrile and azobis(2,4-dimethylvaleronitrile) was added as an initiator thereto to the obtained solution, in an amount of 1 mol % and 3 mol % respectively with respect to the entire amount of monomers, and the resultant mixture was heated for about 5 hours at 70° C. After that, the obtained reacted mixture was poured into a large amount of mixture of methanol and water to precipitate a resin. The obtained resin was filtrated. The thus obtained resin was dissolved in another dioxane to obtain a solution, and the solution was poured into a mixture of methanol and water to precipitate a resin. The obtained resin was filtrated. These operations described in the last two sentences were repeated for 2 times, resulting in a 61% yield of copolymer having a weight average molecular weight of about 7800. This copolymer, which had the structural units derived from the monomers of the following formula, was referred to as Resin A7.

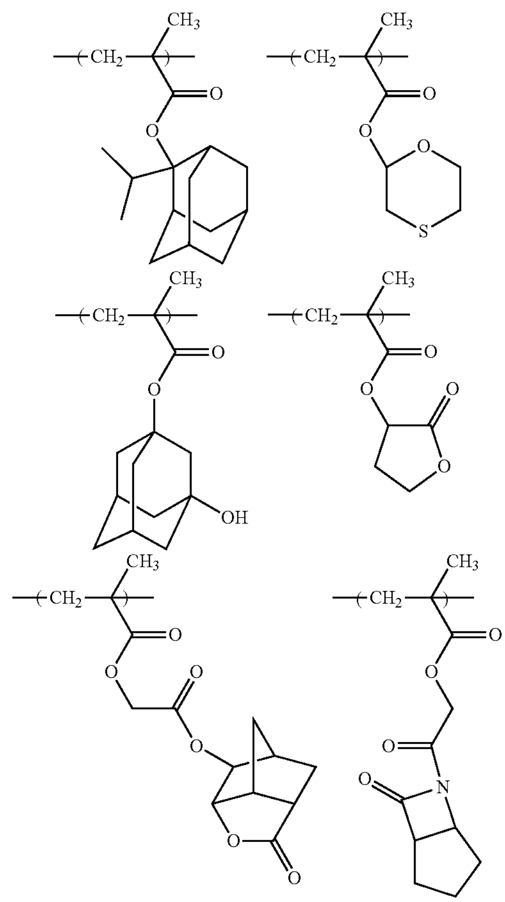

(Preparing Resist Composition)

Resist compositions were prepared by mixing and dissolving each of the components shown in Table 1, and then filtrating through a fluororesin filter having 0.2 μm pore diameter.

TABLE 1

| | Resin (parts) | Acid generator (parts) | Basic Comp. (parts) | PB/PEB (° C./° C.) |
|---|---|---|---|---|
| Ex. 1 | A1 = 10 | B1 = 0.70 | C1 = 0.07 | 110/105 |
| Ex. 2 | A2 = 10 | B1 = 0.70 | C1 = 0.07 | 110/105 |
| Ex. 3 | A3 = 10 | B1 = 0.70 | C1 = 0.07 | 110/105 |
| Ex. 4 | A3/A5 = 5/5 | B1 = 0.70 | C1 = 0.07 | 110/105 |
| Ex. 5 | A3/A5 = 5/5 | B2 = 0.70 | C1 = 0.07 | 110/105 |
| Ex. 6 | A6 = 10 | B1 = 0.70 | C1 = 0.07 | 100/95 |
| Ex. 7 | A7 = 10 | B1 = 0.70 | C1 = 0.07 | 100/95 |
| Comp. Ex. 1 | A4/A5 = 5/5 | B2 = 0.70 | C1 = 0.07 | 110/105 |

<Resin>

A1 to A7: Resin A1 to Resin A7 prepared by the Synthetic Examples

<Acid Generator>

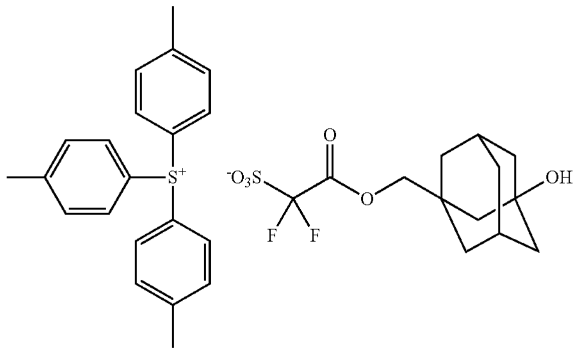

Acid generator B2: triphenyl sulfonium nonaflate ($C_4F_9SO_3^-$)

<Qencher>

C1: 2,6-diisopropylaniline

<Solvent>

| | |
|---|---|
| Propylene glycol monomethyl ether acetate | 265.0 parts |
| Propylene glycol monomethyl ether | 20.0 parts |
| 2-Heptanone | 20.0 parts |
| γ-butyrolactone | 3.5 parts |

(Producing Resist Pattern)

A composition for an organic antireflective film ("ARC-29", by Nissan Chemical Co. Ltd.) was applied onto silicon wafers and baked for 60 seconds at 205° C. to form a 78 nm thick organic antireflective film on each of the silicon wafers.

The above resist compositions were then applied thereon by spin coating so that the thickness of the resulting composition layer became 85 nm after drying.

The obtained wafers were then pre-baked for 60 seconds on a direct hot plate at the temperatures given in the "PB" column in Table 1 to form a composition layer.

Contact hole patterns were then exposed using a mask pattern (hole pitch: 100 nm, hole diameter: 70 nm) through stepwise changes in exposure quantity using an ArF excimer laser stepper for immersion lithography ("XT:1900Gi" by ASML Ltd.: NA=1.35, 3/42 annular X-Y polarization), on the wafers on which the composition layer had thus been formed. The ultrapure water was used as medium of immersion.

After the exposure, post-exposure baking was carried out for 60 seconds at the temperatures given in the "PEB" column in Table 1.

Then, puddle development was carried out with 2.38 wt % tetramethylammonium hydroxide aqueous solution for 60 seconds to obtain resist patterns.

Each resist pattern is produced based on the resist composition using the mask pattern (hole pitch: 100 nm, hole diameter: 70 nm) as described above. The exposure amount at which a 55 nm-hole diameter is achieved in the pattern is defined as the effective sensitivity.

(Mask Error Factor (MEF) Evaluation)

The resist patterns were formed by the same method described above except using masks in which mask sizes of the line patterns were 72 nm, 71 nm, 70 nm, 69 nm and 68 nm, respectively. The pitch width of the masks was 100 nm.

The obtained results are plotted with the mask size being set as the horizontal axis and the line width of the line pattern formed using the mask being set as the vertical axis, and the slope of a regression line obtained from each plot was measured as the MEF.

Table 2 shows the results thereof.

TABLE 2

| | MEF |
|---|---|
| Ex. 1 | 2.24 |
| Ex. 2 | 2.18 |
| Ex. 3 | 2.44 |
| Ex. 4 | 2.83 |
| Ex. 5 | 2.94 |
| Ex. 6 | 2.15 |
| Ex. 7 | 2.13 |
| Comp. Ex. 1 | 3.35 |

The present resist composition was possible to achieve an excellent MEF when producing the resist patterns.

Meanwhile, with the Comparative Example 1, there were a poor MEF when producing the resist pattern.

According to the resist composition of the present invention, it is possible to produce a resist pattern with excellent MEF when producing the resist pattern. Therefore, the present resist composition can be used for semiconductor microfabrication.

What is claimed is:

1. A resin having a structural unit derived from a compound represented by the formula (I)

(I)

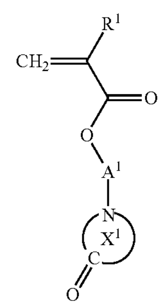

wherein $R^1$ represents a $C_1$ to $C_6$ alkyl group that optionally has a halogen atom, a hydrogen atom or a halogen atom;

$A^1$ represents a group represented by the formula (a-1);

$$—A^{10}—(X^{10}—A^{11})_s—X^{11}—A^{12}— \tag{a-1}$$

wherein s represents an integer of 0 to 2;

$A^{10}$ and $A^{11}$ in each occurrence independently represent an optionally substituted $C_1$ to $C_5$ aliphatic hydrocarbon group;

$A^{12}$ represents an optionally substituted $C_1$ to $C_5$ aliphatic hydrocarbon group or a single bond;

$X^{10}$ and $X^{11}$ in each occurrence independently represents an oxygen atom, a carbonyl group, a carbonyloxy group or an oxycarbonyl group;

provided that a total number of the carbon atom of $A^{10}$, $A^{11}$, $A^{12}$, $X^{10}$ and, $X^{11}$ is 12 or less;

ring $X^1$ represents a $C_2$ to $C_{36}$ heterocyclic ring, a hydrogen atom contained in the heterocyclic ring may be substituted with a halogen atom, a hydroxy group, a $C_1$ to $C_{24}$ hydrocarbon group, a $C_1$ to $C_{12}$ alkoxy group, a $C_2$ to $C_4$ acyl group or a $C_2$ to $C_4$ acyloxy group.

2. The resin according to claim 1, wherein the compound represented by the formula (I) is a compound represented by the formula (III)

(III)

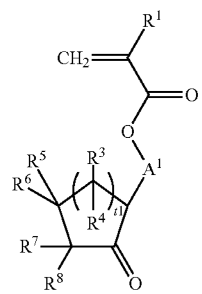

wherein $R^1$ and $A^1$ represent the same meaning as described above;

$R^3$, $R^4$, $R^5$, $R^6$, $R^7$ and $R^8$ in each occurrence independently represent a hydrogen atom or a $C_1$ to $C_{24}$ hydrocarbon group, and at least two of $R^3$ to $R^8$ may be bonded together to form a $C_3$ to $C_{30}$ ring, a hydrogen atom contained in the hydrocarbon group or the ring may be replaced by a halogen atom, a hydroxy group, a $C_1$ to $C_{12}$ alkyl group, a $C_1$ to $C_{12}$ alkoxyl group, a $C_2$ to $C_4$ acyl group or a $C_2$ to $C_4$ acyloxy group, and a —$CH_2$— contained in the hydrocarbon group or the ring may be replaced by —CO— or —O—;

t1 represents an integer of 0 to 3.

3. The resin according to claim 1, wherein the compound represented by the formula (I) is a compound represented by the formula (IV)

(IV)

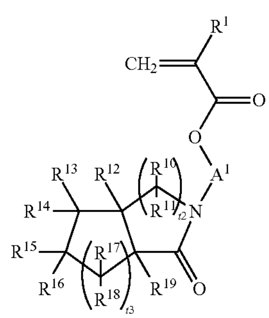

wherein $R^1$ and $A^1$ represent the same meaning as described above;

$R^{10}$, $R^{11}$, $R^{12}$, $R^{13}$, $R^{14}$, $R^{15}$, $R^{16}$, $R^{17}$, $R^{18}$ and $R^{19}$ in each occurrence independently represent a hydrogen atom or a $C_1$ to $C_{12}$ hydrocarbon group, and at least two of $R^{10}$ to $R^{19}$ may be bonded together to form a $C_3$ to $C_{24}$ ring, a hydrogen atom contained in the hydrocarbon group or the ring may be replaced by a halogen atom, a hydroxy group, a $C_1$ to $C_{12}$ alkyl group, a $C_1$ to $C_{12}$ alkoxyl group, a $C_2$ to $C_4$ acyl group or a $C_2$ to $C_4$ acyloxy group, and a —$CH_2$— contained in the hydrocarbon group or the ring may be replaced by —CO— or —O—;

t2 and t3 independently represent an integer of 0 to 3.

4. The resin according to claim 1, wherein the compound represented by the formula (I) is a compound represented by the formula (V)

(V)

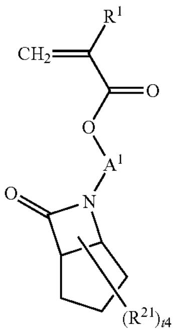

wherein $R^1$ and $A^1$ represent the same meaning as described above;

$R^{21}$ in each occurrence represents a halogen atom, a hydroxy group, a $C_1$ to $C_{12}$ alkyl group, a $C_1$ to $C_{12}$ alkoxyl group, a $C_2$ to $C_4$ acyl group or a $C_2$ to $C_4$ acyloxy group;

t4 represents an integer of 0 to 8.

5. The resin according to claim 1, which comprises an acid-labile group, and being insoluble or poorly soluble in aqueous alkali solution, but becoming soluble in aqueous alkali solution by the action of acid.

6. A resist composition comprising a resin according to claim 1, and an acid generator.

7. The resist composition according to claim 6, which further comprises a solvent.

8. The resist composition according to claim 6, which further comprises a basic compound.

9. The resist composition according to claim 7, which further comprises a basic compound.

10. A method for producing a resist pattern comprising steps of:

(1) lying the resist composition according to claim 6 onto a substrate;

(2) drying the applied composition to form a composition layer;

(3) exposing the composition layer using an exposure apparatus;

(4) heating the exposed composition layer; and (5) developing the heated composition layer using a developing apparatus.

11. A method for producing a resist pattern comprising steps of:

(1) lying the resist composition according to claim 7 onto a substrate;

(2) drying the applied composition to form a composition layer;

(3) exposing the composition layer using an exposure apparatus;

(4) heating the exposed composition layer; and (5) developing the heated composition layer using a developing apparatus.

12. A method for producing a resist pattern comprising steps of:

(1) lying the resist composition according to claim 8 onto a substrate;

(2) drying the applied composition to form a composition layer;

(3) exposing the composition layer using an exposure apparatus;
(4) heating the exposed composition layer; and
(5) developing the heated composition layer using a developing apparatus.

* * * * *